US009691992B2

(12) United States Patent
Choi et al.

(10) Patent No.: US 9,691,992 B2
(45) Date of Patent: Jun. 27, 2017

(54) ORGANIC LIGHT-EMITTING DIODE

(71) Applicant: SAMSUNG DISPLAY CO., LTD., Yongin, Gyeonggi-Do (KR)

(72) Inventors: Jong-Won Choi, Yongin (KR); Yoon-Hyun Kwak, Yongin (KR); Bum-Woo Park, Yongin (KR); Sun-Young Lee, Yongin (KR); Wha-Il Choi, Yongin (KR); So-Yeon Kim, Yongin (KR); Ji-Youn Lee, Yongin (KR)

(73) Assignee: Samsung Displey Co., Ltd., Yongin-si (KR)

( * ) Notice: Subject to any disclaimer, the term of this patent is extended or adjusted under 35 U.S.C. 154(b) by 665 days.

(21) Appl. No.: 14/169,119

(22) Filed: Jan. 30, 2014

(65) Prior Publication Data

US 2014/0209880 A1  Jul. 31, 2014

(30) Foreign Application Priority Data

Jan. 30, 2013 (KR) ........................ 10-2013-0010717

(51) Int. Cl.
*H01L 51/00* (2006.01)
*H01L 51/50* (2006.01)

(52) U.S. Cl.
CPC ...... *H01L 51/0067* (2013.01); *H01L 51/0072* (2013.01); *H01L 51/0073* (2013.01); *H01L 51/0087* (2013.01); *H01L 51/5016* (2013.01)

(58) Field of Classification Search
None
See application file for complete search history.

(56) References Cited

U.S. PATENT DOCUMENTS 6,465,115 B2  10/2002  Shi et al.
6,596,415 B2  7/2003  Shi et al.
(Continued)

FOREIGN PATENT DOCUMENTS

JP  2003-133074 A  5/2003
JP  2005-310733 A  11/2005
(Continued)

OTHER PUBLICATIONS

Adachi, Chihaya et al., High-efficiency organic electrophosphorescent devices with tris(2-phenylpyridine)iridium doped into electron-transporting materials, Appl. Phys. Lett., Aug. 7, 2000, 4 pages, vol. 77, No. 6, 2000 American Institute of Physics.

(Continued)

*Primary Examiner* — Nathan T Leong
(74) *Attorney, Agent, or Firm* — Lewis Roca Rothgerber Christie LLP

(57) ABSTRACT

An organic light-emitting diode includes a substrate, a first electrode, a second electrode facing the first electrode, and an organic layer between the first electrode and the second electrode. The organic layer includes an emission layer, and the emission layer includes a first compound represented by Formula 1 and a second compound represented by Formula 100.

(Continued)

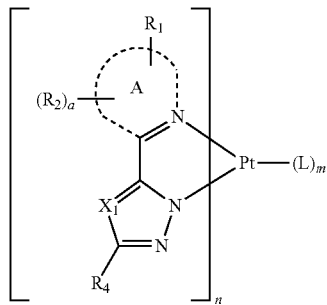

<Formula 1>

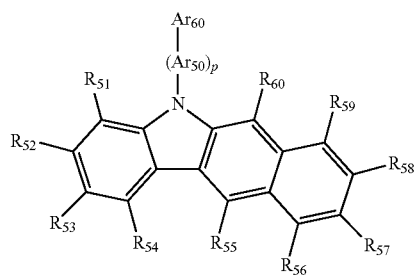

<Formula 100>

20 Claims, 1 Drawing Sheet

(56) References Cited

U.S. PATENT DOCUMENTS

| | | | |
|---|---|---|---|
| 7,759,490 B2* | 7/2010 | Tao | C07F 15/002 |
| | | | 428/690 |
| 7,915,414 B2 | 3/2011 | Chi et al. | |
| 2001/0019782 A1 | 9/2001 | Igarashi et al. | |
| 2002/0134984 A1 | 9/2002 | Igarashi | |
| 2006/0182992 A1 | 8/2006 | Nii et al. | |
| 2009/0171087 A1 | 7/2009 | Chi et al. | |
| 2011/0210318 A1 | 9/2011 | Bae et al. | |
| 2014/0117318 A1* | 5/2014 | Choi | H01L 51/0085 |
| | | | 257/40 |

FOREIGN PATENT DOCUMENTS

| | | |
|---|---|---|
| KR | 10-2010-0023783 A | 3/2010 |
| KR | 10-2010-0108924 A | 10/2010 |
| KR | 1020120116881 | * 10/2012 |
| WO | WO 2010/114264 A2 | 10/2010 |

OTHER PUBLICATIONS

Baldo, M.A. et al., Highly efficient phosphorescent emission from organic electroluminescent devices, Nature, Sep. 10, 1998, 4 pages, vol. 395, Macmillan Publishers Ltd. 1998.

Baldo, M.A. et al., Very high-efficiency green organic light-emitting devices based on electrophosphorescence, Appl. Phys. Lett., Jul. 5, 1999, 4 pages, vol. 75, No. 1, 1999 American Institute of Physics.

Chi, Yun et al., Light Emitting Materials for Organic Electronics, Mar. 26, 2008, 6 pages, vol. 21, No. 3, Journal of Photopolymer Science and Technology.

Hsieh, Hsi-Ying et al., Platinum(II) complexes with spatially encumbered chelates; syntheses, structure and photophysics, Inorganica Chimica Acta, 2009, 6 pages, 2009 Elsevier B.V.

Kohler, Anna et al., Advanced Engineering Materials Progress Report on Fluorescence and Phosphorescence in Organic Materials, Advanced Engineering Materials, 2002, 7 pages, vol. 4, No. 7, Wiley-VCH Verlag GmbH.

Kwong, Raymond C. et al., High operational stability of electrophosphorescent devices, Appl. Phys. Lett.; Jul. 1, 2002, vol. 81, No. 1, 4 pages, 2002 American Institute of Physics.

Lamansky, Sergey et al., Synthesis and Characterization of Phosphorescent Cyclometalated Iridium Complexes, Inorg. Chem., Mar. 1, 2001, vol. 40, No. 7, 8 pages, 2001 American Chemical Society.

Lamansky, Sergey et al., Highly Phosphorescent Bis-Cyclometalated Iridium Complexes: Synthesis, Photophysical Characterization, and Use in Organic Light Emitting Diodes, J. Am. Chem. Soc., Apr. 13, 2001, vol. 123, No. 18, 9 pages, 2001 American Chemical Society.

* cited by examiner

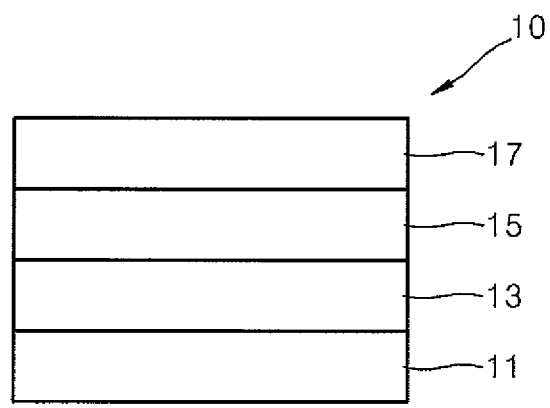

ORGANIC LIGHT-EMITTING DIODE

CROSS-REFERENCE TO RELATED APPLICATION

This application claims priority to and the benefit of Korean Patent Application No. 10-2013-0010717, filed on Jan. 30, 2013 in the Korean Intellectual Property Office, the entire content of which is incorporated herein by reference.

BACKGROUND

1. Technical Field

An organic light-emitting diode is disclosed.

2. Description of the Related Art

Organic light-emitting diodes (OLEDs) are self-emitting diodes having advantages such as wide viewing angles, good contrast, quick response speeds, high brightness, and good driving voltage characteristics. Also, OLEDs can provide multicolored images.

A typical OLED has a structure including a substrate, and an anode, a hole transport layer (HTL), an emission layer (EML), an electron transport layer (ETL), and a cathode sequentially stacked on the substrate. In this regard, the HTL, EML, and ETL are organic thin films formed of organic compounds.

An operating principle of an OLED having the above-described structure is as follows. When a voltage is applied between the anode and cathode, holes injected from the anode move to the EML via the HTL, and electrons injected from the cathode move to the EML via the ETL. The holes and electrons recombine in the EML to generate excitons. When the excitons drop from an excited state to a ground state, light is emitted.

SUMMARY

Embodiments of the present invention are directed to an organic light-emitting diode (OLED) having a novel structure.

Additional aspects will be set forth in part in the description which follows and, in part, will be apparent from the description, or may be learned by practice of the presented embodiments.

According to an aspect of the present invention, an organic light-emitting diode (OLED) includes a substrate; a first electrode; a second electrode facing the first electrode; and an organic layer between the first electrode and second electrode. The organic layer includes an emission layer, and the emission layer includes a first compound represented by Formula 1 below and a second compound represented by Formula 100 below:

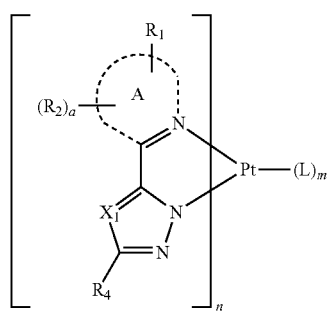

<Formula 1>

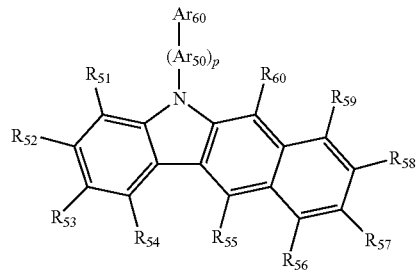

<Formula 100>

In Formula 1, ring A is a 6-membered ring including at least one nitrogen atom (N), a 6-membered ring fused with at least one 5-membered ring and including at least one N, or a 6-membered ring fused with at least one 6-membered ring and including at least one N. $X_1$ is N or $C(R_3)$.

$R_1$ to $R_4$ are each independently selected from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, —$N(Q_1)(Q_2)$, —Si$(Q_3)(Q_4)(Q_5)$, —C(=O)($Q_6$) (where $Q_1$ to $Q_6$ may be each independently a hydrogen atom, a substituted or unsubstituted $C_1$-$C_{60}$ alkyl group, a substituted or unsubstituted $C_6$-$C_{60}$ aryl group, or a substituted or unsubstituted $C_2$-$C_{60}$ heteroaryl group), or a binding site of an adjacent ligand via a single bond or a divalent linking group. $R_3$ and $R_4$ are optionally linked to each other to form a substituted or unsubstituted $C_4$-$C_{20}$ alicyclic group, a substituted or unsubstituted $C_2$-$C_{20}$ heteroalicyclic, a substituted or unsubstituted $C_6$-$C_{20}$ aromatic group, or a substituted or unsubstituted $C_2$-$C_{20}$ heteroaromatic group.

Also, in Formula 1, a is an integer from 0 to 10, and when a is 2 or greater, the at least two $R_2$s may be identical to or different from each other.

In Formula 1, n is 1 or 2, and when n is 2, the two groups represented by

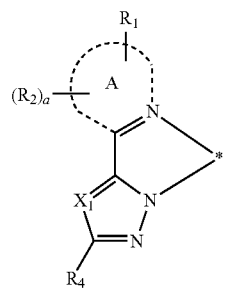

are identical to or different from each other.

In addition, L is an organic ligand, and m is an integer from 0 to 2.

In Formula 100, i) $R_{56}$ and $R_{57}$ are fused together to form a substituted or unsubstituted $C_3$-$C_{60}$ cyclic moiety or a substituted or unsubstituted $C_2$-$C_{60}$ heterocyclic moiety, and $R_{51}$ to $R_{55}$ and $R_{58}$ to $R_{60}$ may be each independently a substituent represented by —$(Ar_{51})_q$-$(Ar_{61})$; or ii) $R_{58}$ and $R_{59}$ are fused together to form a substituted or unsubstituted $C_3$-$C_{60}$ cyclic moiety or a substituted or unsubstituted $C_2$-$C_{60}$ heterocyclic moiety, and $R_{51}$ to $R_{57}$ and $R_{60}$ may be each independently a substituent represented by —$(Ar_{51})_q$-$(Ar_{61})$;

$Ar_{50}$ and $Ar_{51}$ are each independently selected from a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, $C_2$-$C_{10}$ heterocycloalkenylene group, a substituted or unsubstituted $C_6$-$C_{60}$ arylene group, or a substituted or unsubstituted $C_2$-$C_{60}$ heteroarylene group;

$Ar_{51}$ and $Ar_{6i}$ are each independently selected from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, $C_2$-$C_{10}$ heterocycloalkenyl group, a substituted or unsubstituted $C_6$-$C_{60}$ aryl group, a substituted or unsubstituted $C_2$-$C_{60}$ heteroaryl group, —$N(Q_{21})(Q_{22})$, or —$Si(Q_{23})(Q_{24})(Q_{25})$ (where $Q_{21}$ and $Q_{22}$ may be each independently selected from a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, or a substituted or unsubstituted $C_2$-$C_{60}$ heteroaryl group; and $Q_{23}$ to $Q_{25}$ may be each independently selected from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, or a substituted or unsubstituted $C_2$-$C_{60}$ heteroaryl); and p and q are each independently an integer from 0 to 5.

An organic layer included in an OLED may include i) at least one of a hole injection layer, a hole transport layer, a functional layer having both hole injection and hole transport capabilities, a buffer layer, or an electron blocking layer between the first electrode and the emission layer; and ii) at least one of a hole blocking layer, an electron transport layer, or an electron injection layer between the emission layer and the second electrode.

BRIEF DESCRIPTION OF THE DRAWINGS

The above and other features and advantages of the present invention will become more apparent by reference to the following detailed description when considered in conjunction with the attached drawings, in which:

FIG. 1 is a schematic view of a structure of an organic light-emitting diode according to an embodiment of the present invention.

DETAILED DESCRIPTION

Reference will now be made to embodiments, examples of which are illustrated in the accompanying drawings, wherein like reference numerals refer to like elements throughout. The presented embodiments may have different forms and should not be construed as limited to the descriptions set forth herein. Accordingly, the embodiments are described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

FIG. 1 is a schematic view of a structure of an organic light-emitting diode (OLED) 10 according to an embodiment of the present invention. Hereinafter, a structure and manufacturing method of an OLED of the present invention will be described with reference to FIG. 1.

The substrate 11 may be any substrate used in existing OLEDs, but in some embodiments, the substrate 11 may be a glass substrate or a transparent plastic substrate with mechanical strength, thermal stability, transparency, surface smoothness, ease of handling, and water resistance.

A first electrode 13 may be formed by depositing or sputtering a first electrode-forming material on the substrate 11. When the first electrode 13 is an anode, a material having a high work function may be used as the first electrode-forming material to facilitate hole injection. The first electrode 13 may be a reflective electrode or a transmission electrode. Transparent and conductive materials such as ITO, IZO, $SnO_2$, and ZnO may be used as the first electrode-forming materials to form the first electrode 13. The first electrode 13 may be formed as a reflective electrode using magnesium (Mg), aluminum (Al), aluminum-lithium (Al—Li), calcium (Ca), magnesium-indium (Mg—In), magnesium-silver (Mg—Ag), or the like.

The first electrode 13 may have a single-layer structure or a multi-layered structure including at least two layers. For example, the first electrode 13 may have a three-layered structure of ITO/Ag/ITO, but is not limited thereto.

An organic layer 15 may be disposed on the first electrode 13. The organic layer 15 may include a hole injection layer (HIL), a hole transport layer (HTL), a buffer layer, an emission layer (EML), an electron transport layer (ETL), and an electron injection layer (EIL).

The HIL may be formed on the first electrode 13 using vacuum deposition, spin coating, casting, Langmuir-Blodgett (LB) deposition, or the like. When the HIL is formed using vacuum deposition, the deposition conditions may vary depending on the compound used to form the HIL, or the desired structural and thermal properties of the HIL to be formed. For example, the deposition may be performed at a temperature of about 100° C. to about 500° C., a pressure of about $10^{-8}$ torr to about $10^{-3}$ torr, and a rate of about 0.01 Å/sec to about 100 Å/sec, but the deposition conditions are not limited thereto.

When the HIL is formed using spin coating, the coating conditions may vary depending on the compound used to form the HIL, or a desired structural and thermal properties of the HIL to be formed. For example, the coating may be performed at a rate in a range of about 2,000 rpm to about 5,000 rpm, and a temperature at which heat treatment is performed to remove solvent after coating in a range of about 80° C. to about 200° C., but the coating conditions are not limited thereto.

The HIL may be formed of any material that is commonly used to form a HIL. Examples of materials that can be used to form the HIL include N,N'-diphenyl-N,N'-bis-[4-(phenyl-m-tolyl-amino)-phenyl]-biphenyl-4,4'-diamine, (DNTPD), a phthalocyanine compound such as copper phthalocyanine, 4,4',4"-tris(3-methylphenylphenylamino) triphenylamine (m-MTDATA), N,N'-di(1-naphthyl)-N,N'-diphenylbenzidine (NPB), TDATA, 2T-NATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), and polyaniline/poly(4-styrenesulfonate (PANI/PSS), but the HIL material is not limited thereto.

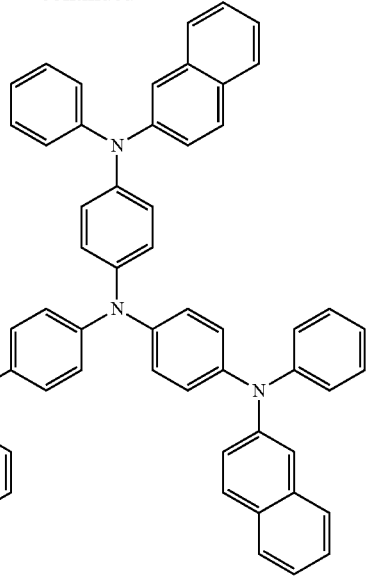

2-TNATA

The thickness of the HIL may be about 100 Å to about 10,000 Å, and in some embodiments, may be about 100 Å to about 1,000 Å. When the thickness of the HIL is within these ranges, the HIL may have good hole injecting ability without a substantial increase in driving voltage.

Then, a HTL may be formed on the HIL using any of a variety of methods such as vacuum deposition, spin coating, casting, LB deposition, or the like. When the HTL is formed using vacuum deposition or spin coating, the deposition or coating conditions may be similar to those described above for the formation of the HIL, although the conditions may vary depending on the compound that is used to form the HTL.

Examples of the material that can be used to form the HTL include carbazole derivatives such as N-phenylcarbazole or polyvinylcarbazole, N,N'-bis(3-methylphenyl)-N,N'-diphenyl-[1,1-biphenyl]-4,4'-diamine (TPD), 4,4',4"-tris(N-carbazolyl)triphenylamine (TCTA), and N,N'-di(1-naphthyl)-N,N'-diphenylbenzidine) (NPB), but the HTL material is not limited thereto.

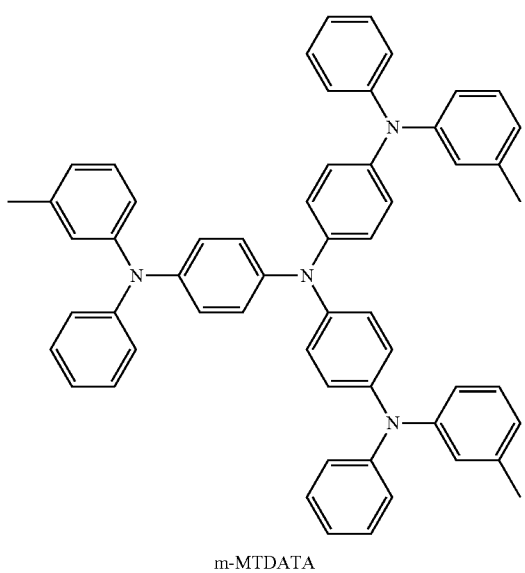

m-MTDATA

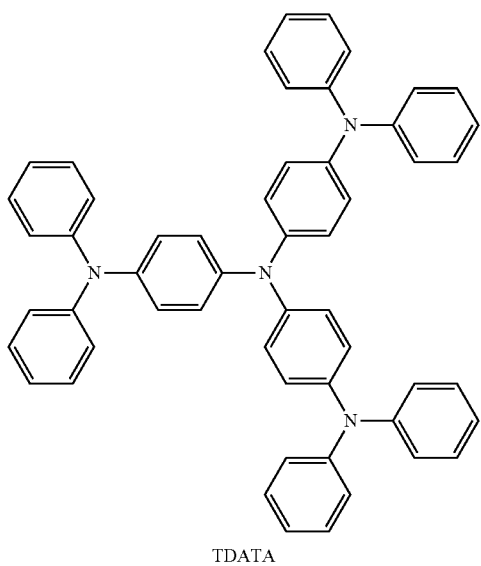

TDATA

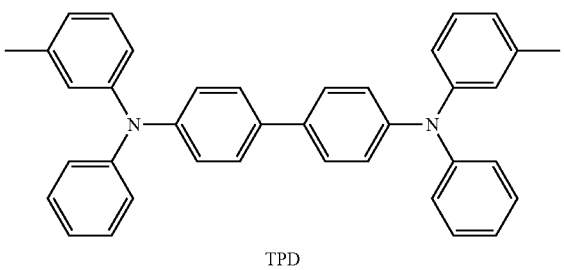

TPD

The thickness of the HTL may be about 50 Å to about 2,000 Å, and in some embodiments, may be about 100 Å to about 1,500 Å. When the thickness of the HTL is within these ranges, the HTL may have good hole injecting ability without a substantial increase in driving voltage.

Alternatively, instead of the HIL and HTL, a H-functional layer (namely, a functional layer having both hole injection and hole transport capabilities) may be used. The H-functional layer may include at least one HIL material and at least one HTL material. The thickness of the H-functional layer may be about 100 Å to about 10,000 Å, and in some embodiments, may be about 100 Å to about 1,000 Å. When the thickness of the H-functional layer is within these ranges, the H-functional layer may have good hole injection and transport capabilities without a substantial increase in driving voltage.

In some embodiments, at least one of the HIL, HTL, and H-functional layer may include at least one of the compounds represented by Formulas 300 and 301 below:

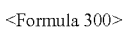

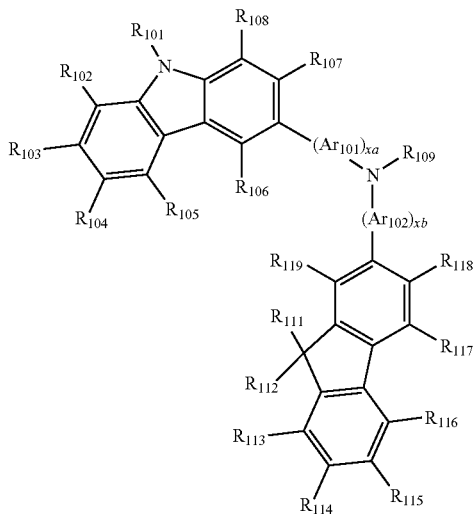

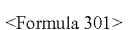

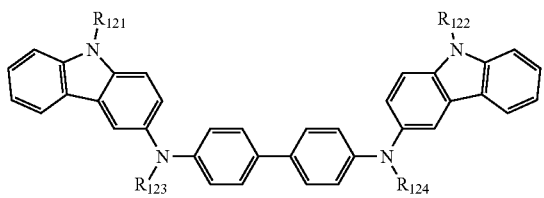

In Formula 300, $Ar_{101}$ and $Ar_{102}$ may be each independently a substituted or unsubstituted $C_6$-$C_{60}$ arylene group. For example, $Ar_{101}$ and $Ar_{102}$ may be each independently selected from a phenylene group, a pentalenylene group, an indenylene group, a naphthalene group, an azulenylene group, a heptalenylene group, an acenaphthalene group, a fluorenylene group, a phenalenylene group, a phenanthrenylene group, an anthracenylene group, a fluoranthenylene group, a triphenylenylene group, a pyrenylenylene group, a chrysenylenylene group, a naphthacenylene group, a picenylene group, a perylenylene group, or a pentacenylene group; or a phenylene group, a pentalenylene group, an indenylene group, a naphthalene group, an azulenylene group, a heptalenylene group, an acenaphthalene group, a fluorenylene group, a phenalenylene group, a phenanthrenylene group, an anthrylene group, a fluoranthenylene group, a triphenylenylene group, a pyrenylenylene group, a chrysenylenylene group, a naphthacenylene group, a picenylene group, a perylenylene group, or a pentacenylene group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, or a $C_2$-$C_{60}$ heteroaryl group.

In Formula 300, xa and xb may be each independently an integer of 0 to 5, and in some embodiments, may be an integer of 0, 1, or 2. For example, xa may be 1 and xb may be 0, but xa and xb are not limited thereto.

In Formulas 300 and 301, $R_{101}$ to $R_{108}$, $R_{111}$ to $R_{119}$, and $R_{121}$ to $R_{124}$ may be each independently selected from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_5$-$C_{60}$ aryl group, a substituted or unsubstituted $C_5$-$C_{60}$ aryloxy group, or a substituted or unsubstituted $C_5$-$C_{60}$ arylthio group.

In some embodiments, $R_{101}$ to $R_{108}$, $R_{111}$ to $R_{119}$, and $R_{121}$ to $R_{124}$ may be each independently selected from:

a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{10}$ alkyl group (e.g., a methyl group, an ethyl group, a propyl group, a butyl group, a pentyl group, a hexyl group, or the like) or a $C_1$-$C_{10}$ alkoxy group (e.g., a methoxy group, an ethoxy group, a propoxy group, a butoxy group, a pentoxy group, or the like);

a $C_1$-$C_{10}$ alkyl group or a $C_1$-$C_{10}$ alkoxy group substituted with at least one of a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, or a phosphoric acid group or a salt thereof;

a phenyl group, a naphthyl group, an anthryl group, a fluorenyl group or a pyrenyl group; or a phenyl group, a naphthyl group, an anthryl group, a fluorenyl group, or a pyrenyl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{10}$ alkyl group, or a $C_1$-$C_{10}$ alkoxy group, but $R_{101}$ to $R_{108}$, $R_{111}$ to $R_{119}$, and $R_{121}$ to $R_{124}$ are not limited thereto.

In Formula 300, $R_{109}$ may be selected from:

a phenyl group, a naphthyl group, an anthryl group, a biphenyl group or a pyridyl group; or a phenyl group, a naphthyl group, an anthryl group, a biphenyl group, or a pyridyl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{20}$ alkyl group, or a substituted or unsubstituted $C_1$-$C_{20}$ alkoxy group.

In some embodiments, the compound of Formula 300 may be represented by Formula 300A below, but is not limited thereto:

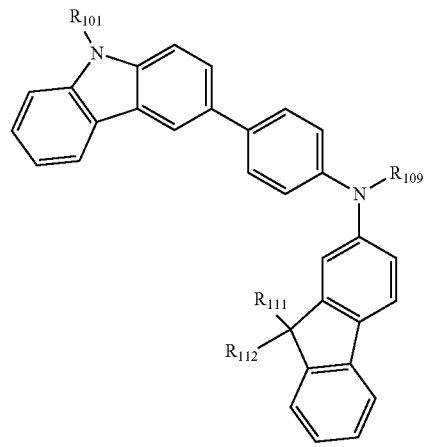

<Formula 300A>

In Formula 300A, $R_{101}$, $R_{111}$, $R_{112}$, and $R_{109}$ may be as defined above with respect to Formula 300.

For example, at least one of the HIL, HTL, and H-functional layer may include at least one of Compounds 301 to 320, but the present invention is not limited thereto:

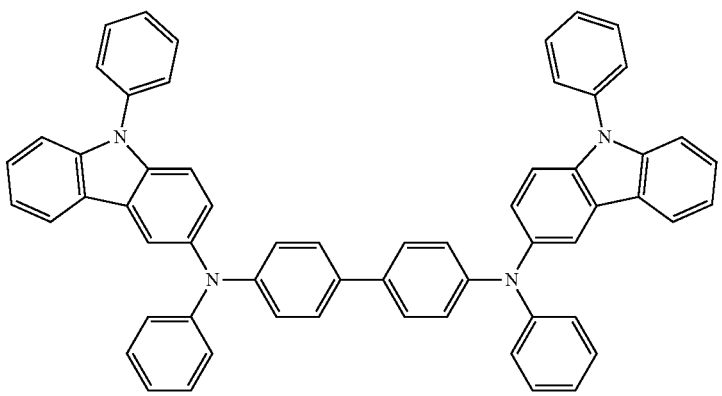

301

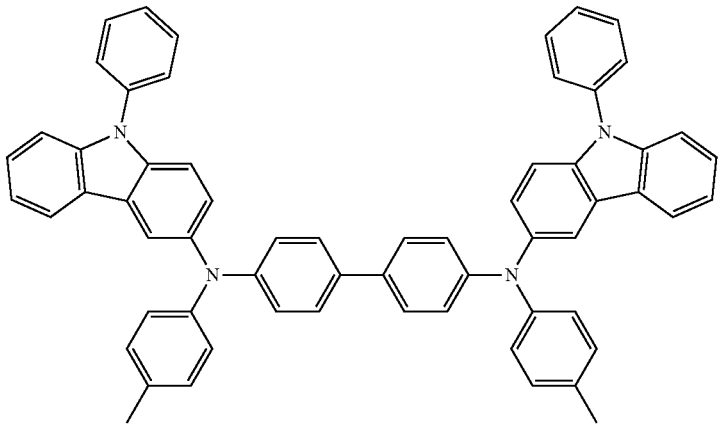

302

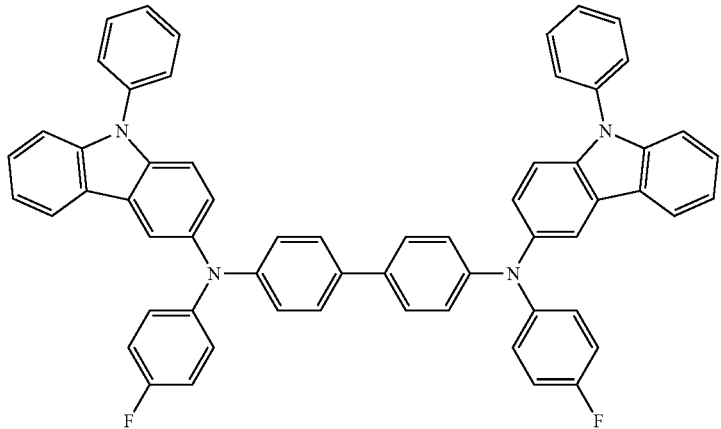
303
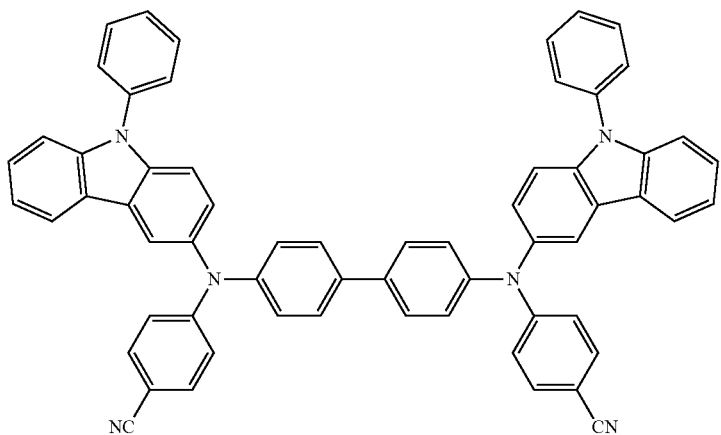
304
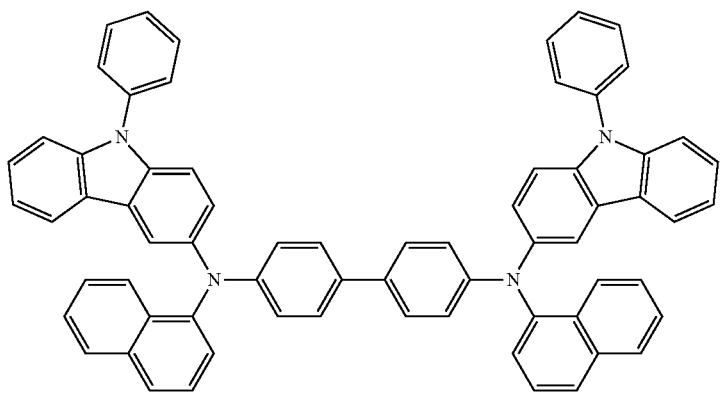
305

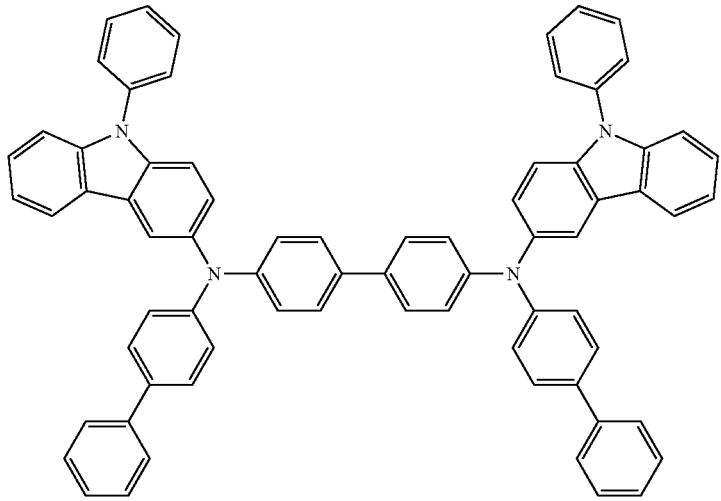
306
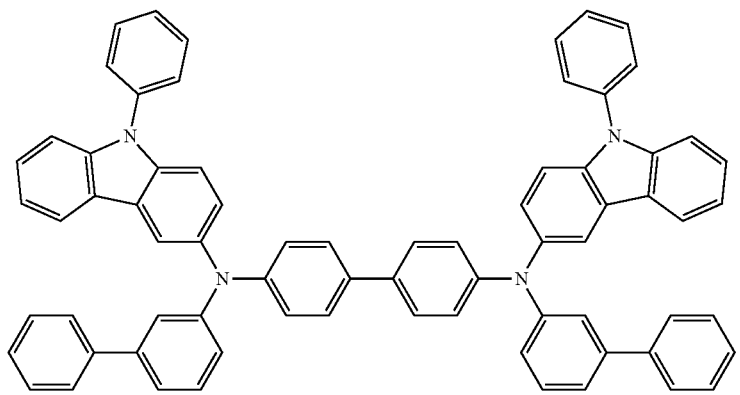
307
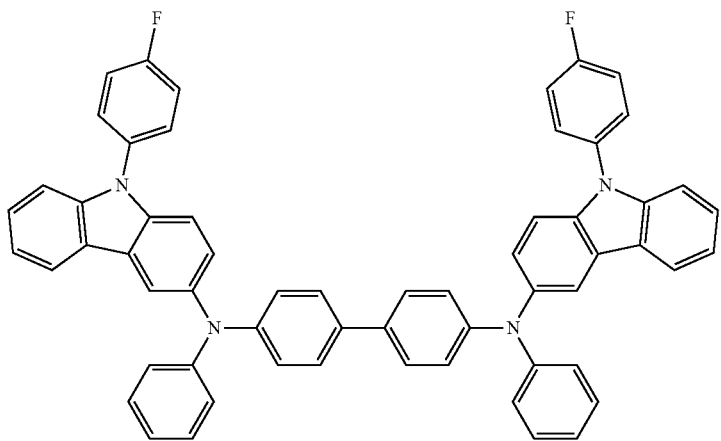
308

-continued
309
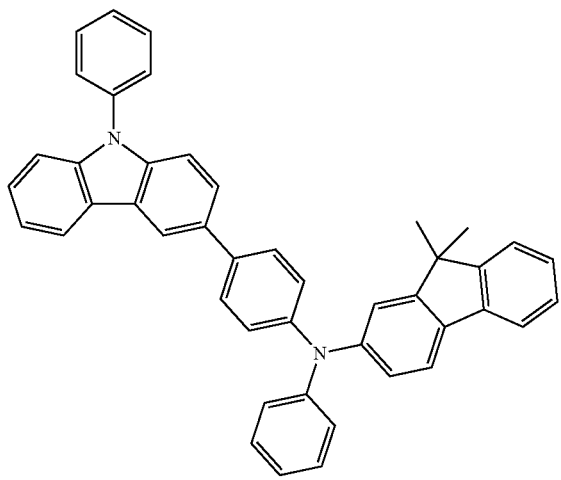
310
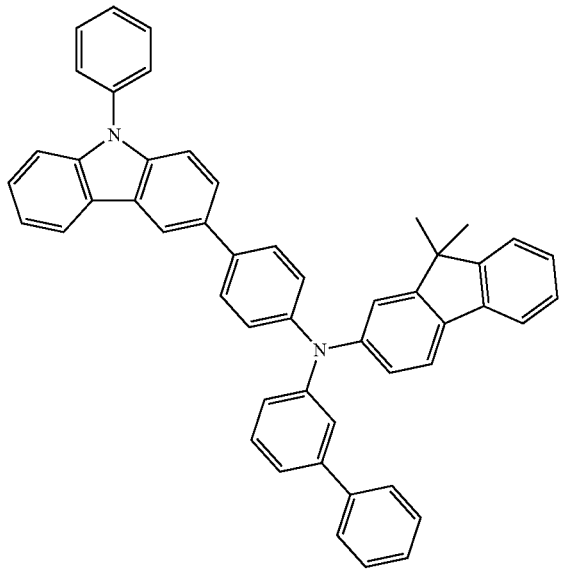
311
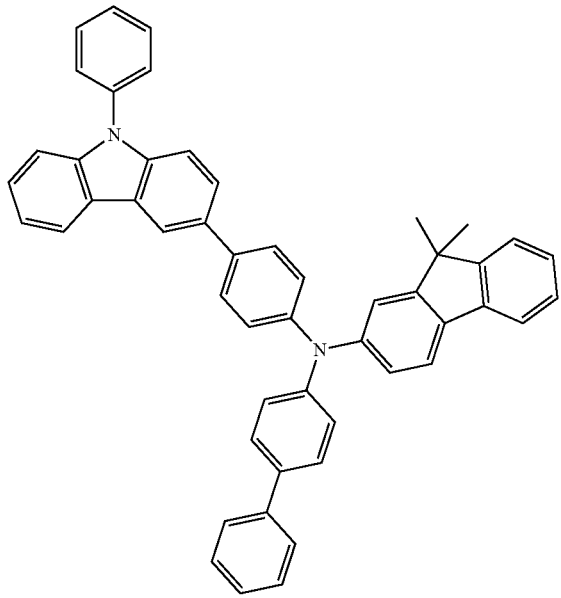

-continued
312
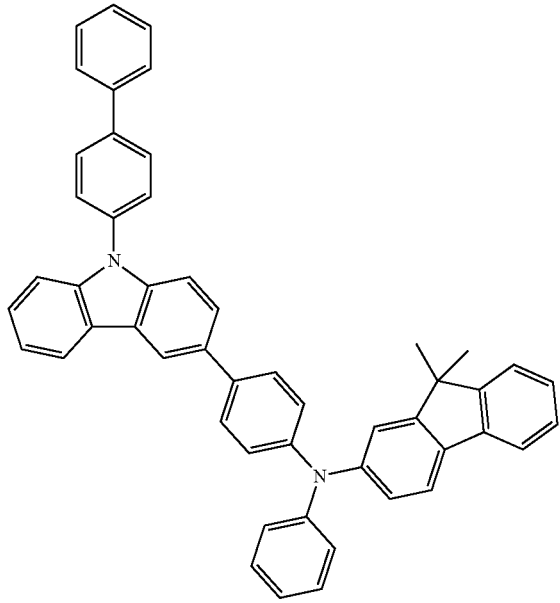
313
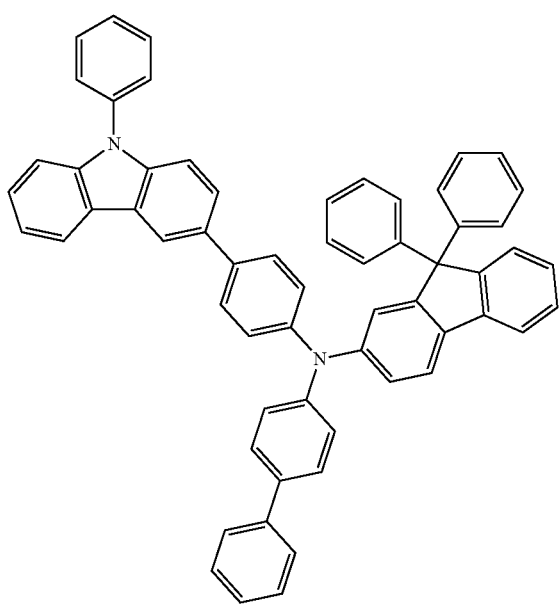

314
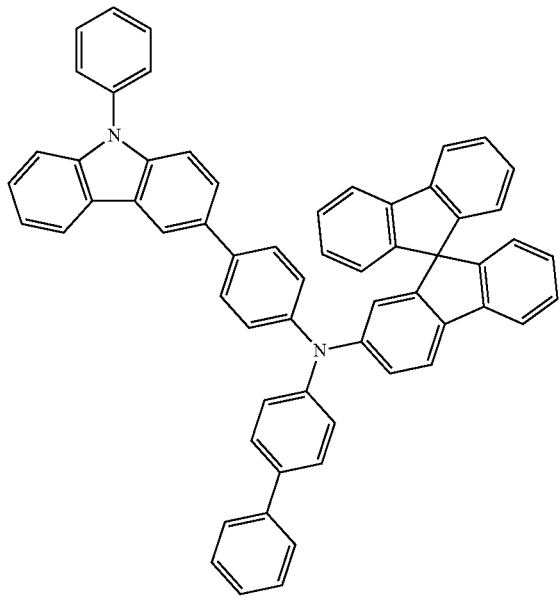
315
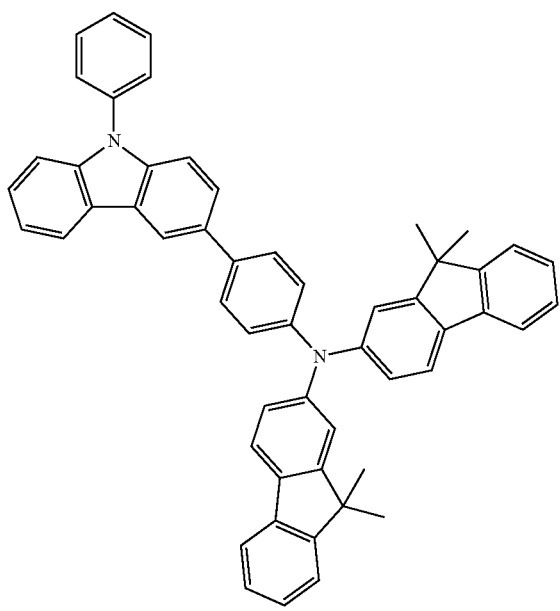

316
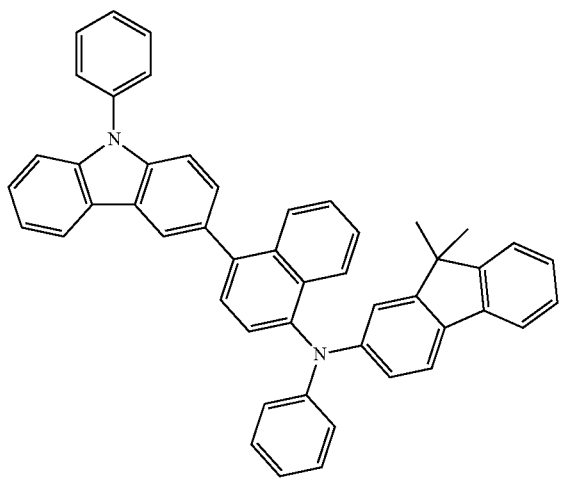
317
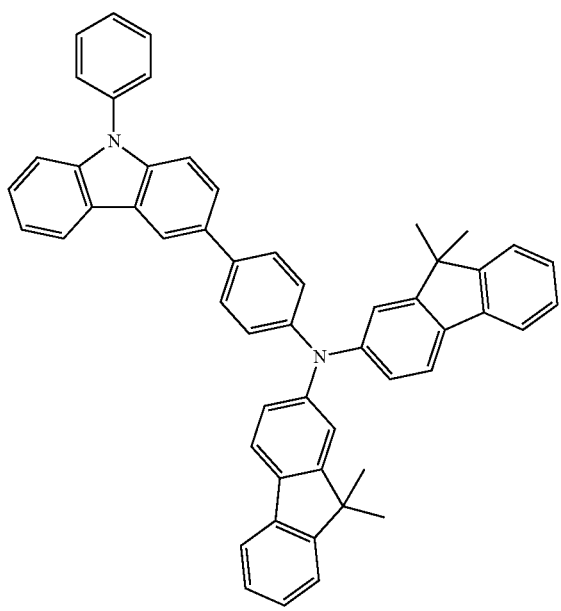

-continued
318
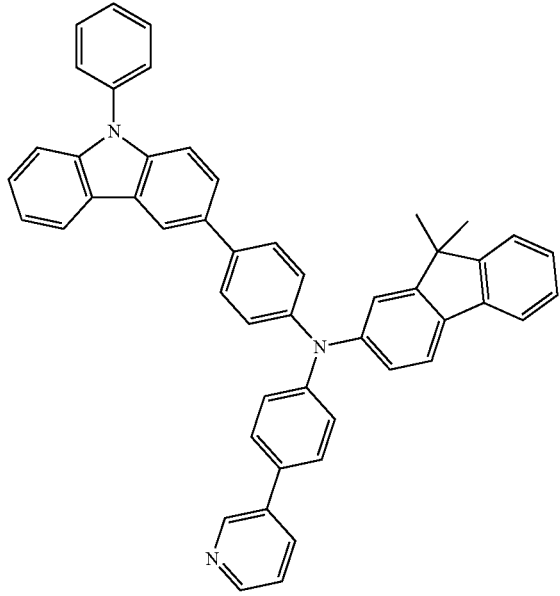
319
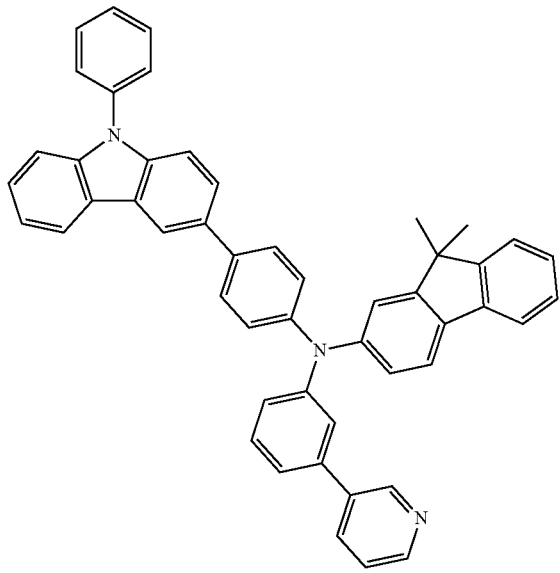
320
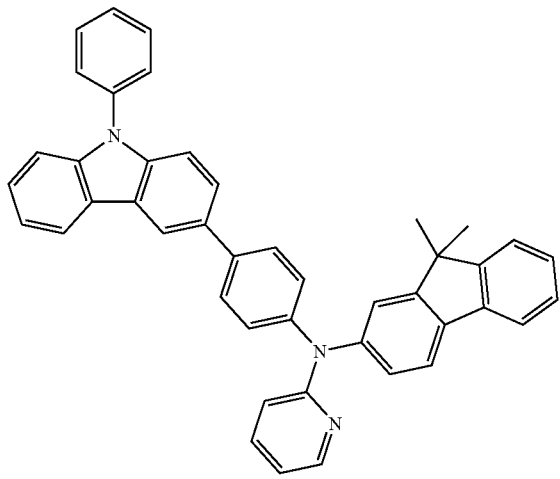

At least one of the HIL, HTL, and H-functional layer may further include a charge-generating material to improve layer conductivity, in addition to the hole injecting material, the transporting material, and/or the material having both hole injection and hole transport capabilities, as described above.

The charge-generating material may be, for example, a p-dopant. The p-dopant may be one of a quinone derivative, a metal oxide, and a compound with a cyano group, but is not limited thereto. Non-limiting examples of the p-dopant include quinone derivatives such as tetracyanoquinonedimethane (TCNQ) and 2,3,5,6-tetrafluoro-tetracyano-1,4-benzoquinonedimethane (F4-TCNQ); metal oxides such as tungsten oxide and molybdenum oxide; and compounds with a cyano group such as Compound 200 below.

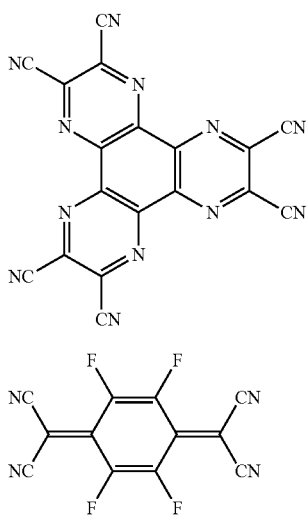

<Compound 200>

<F4-TCNQ>

When the HIL, HTL, or H-functional layer further includes the charge-generating material, the charge-generating material may be variously modified by being homogeneously dispersed or inhomogeneously distributed in the HIL, HTL or H-functional layer.

A buffer layer may be disposed between the EML and at least one of the HIL, HTL, and H-functional layer. The buffer layer may compensate for an optical resonance distance of light according to the wavelength of the light emitted from the EML, and thus may increase efficiency. The buffer layer may include any known hole injecting materials or hole transporting materials. In some other embodiments, the buffer layer may include the same material as one of the materials included in the HIL, HTL, and H-functional layer that underlie the buffer layer.

Then, an EML may be formed on the HTL, H-functional layer, or buffer layer using vacuum deposition, spin coating, casting, LB deposition, or the like. When the EML is formed using vacuum deposition or spin coating, the deposition or coating conditions may be similar to those described above for the formation of the HIL, although the conditions may vary depending on the compound that is used to form the EML.

The EML includes a first compound represented by Formula 1 and a second compound represented by Formula 2. The first compound may act as a dopant, and the second compound may act as a host.

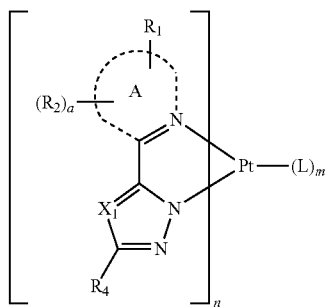

<Formula 1>

In Formula 1, the ring A is a 6-membered ring including at least one nitrogen atom (N), a 6-membered ring fused with at least one 5-membered ring and including at least one N, or a 6-membered ring fused with at least one 6-membered ring and including at least one N. The ring A may include substituents $R_1$ and/or $R_2$, as identified in Formula 1 above, and detailed descriptions of $R_1$ and $R_2$ are provided below.

In Formula 1, the ring A may be selected from pyridine, pyrazine, pyrimidine, pyridazine, purine, isoquinoline, quinoline, phthalazine, 1,8-naphthyridine, quinoxaline, quinazoline, cinnoline, phenanthridine, 1,7-phenanthroline, or pyrrolopyrimidine, but the ring A is not limited thereto.

For example, the ring A may be selected from pyridine, pyrimidine, isoquinoline, or quinazoline, but is not limited thereto.

In Formula 1, $X_1$ may be N or $C(R_3)$, and $R_1$ to $R_4$ may be each independently selected from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, $-N(Q_1)(Q_2)$, $-Si(Q_3)(Q_4)(Q_5)$, $-C(=O)(Q_6)$ (where $Q_1$ to $Q_6$ may be each independently a hydrogen atom, a substituted or unsubstituted $C_1$-$C_{60}$ alkyl group, a substituted or unsubstituted $C_6$-$C_{60}$ aryl group, or a substituted or unsubstituted $C_2$-$C_{60}$ heteroaryl group), or a binding site of an adjacent ligand via a single bond or a divalent linking group. $R_3$ and $R_4$ may be optionally linked to each other to form a substituted or unsubstituted $C_4$-$C_{20}$ alicyclic group, a substituted or unsubstituted $C_2$-$C_{20}$ heteroalicyclic group, a substituted or unsubstituted $C_6$-$C_{20}$ aromatic group, or a substituted or unsubstituted $C_2$-$C_{20}$ heteroaromatic group.

In Formula 1, $R_1$ may be a substituted or unsubstituted linear or branched $C_2$-$C_{60}$ alkyl group. For example, $R_1$ may be a substituted or unsubstituted linear or branched $C_2$-$C_{10}$ alkyl group.

In some embodiments, in Formula 1, $R_1$ may be selected from an ethyl group, an n-propyl group, an i-propyl group, an n-butyl group, an i-butyl group, a t-butyl group, a pentyl group, a hexyl group, a heptyl group, an octyl group, a nonyl group, or a decyl group; or an ethyl group, an n-propyl group, an i-propyl group, an n-butyl group, an i-butyl group, a t-butyl group, a pentyl group, a hexyl group, a heptyl group, an octyl group, a nonyl group, or a decyl group substituted with at least one of a deuterium atom, —F, a hydroxyl group, a cyano group, a nitro group, or an amino group, but $R_1$ is not limited thereto.

In Formula 1, a (which indicates the number of $R_2$ substituents of the ring A) may be an integer from 0 to 10. When a is 0, the ring A in Formula 1 does not include the $R_2$ substituent. When a is 2 or greater, the at least two $R_2$ substituents may be identical to or different from each other.

In some embodiments, in Formula 1, a may be an integer of 1 to 10, and at least one the $R_2$s may be a substituted or unsubstituted linear or branched $C_1$-$C_{60}$ alkyl group. For example, in Formula 1, a may be an integer of 1 to 10, and at least one of the $R_2$s may be a methyl group, an ethyl group, an n-propyl group, an i-propyl group, an n-butyl group, an l-butyl group, a t-butyl group, a pentyl group, a hexyl group, a heptyl group, an octyl group, a nonyl group, or a decyl group; or a methyl group, an ethyl group, an n-propyl group, an i-propyl group, an n-butyl group, an i-butyl group, a t-butyl group, a pentyl group, a hexyl group, a heptyl group, an octyl group, a nonyl group, or a decyl group substituted with at least one of a deuterium atom, —F, a hydroxyl group, a cyano group, a nitro group, or an amino group, but $R_2$ is not limited thereto.

In some embodiments, in Formula 1, $X_1$ may be $C(R_3)$, and $R_1$ to $R_4$ may be each independently selected from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof;

a methyl group, an ethyl group, an n-propyl group, an i-propyl group, an n-butyl group, an i-butyl group, a t-butyl group, a pentyl group, a hexyl group, a heptyl group, an octyl group, a nonyl group, a decyl group, a methoxy group, an ethoxy group, a propoxy group, a butoxy group, or a pentoxy group; or a methyl group, an ethyl group, an n-propyl group, an i-propyl group, an n-butyl group, an i-butyl group, a t-butyl group, a pentyl group, a hexyl group, a heptyl group, an octyl group, a nonyl group, a decyl group, a methoxy group, an ethoxy group, a propoxy group, a butoxy group, and a pentoxy group, substituted with at least one of a deuterium atom, —F, a hydroxyl group, a cyano group, a nitro group, or an amino group.

Alternatively, $R_3$ and $R_4$ may be optionally linked to each other to form a substituted or unsubstituted $C_4$-$C_{20}$ alicyclic group, a substituted or unsubstituted $C_2$-$C_{20}$ heteroalicyclic, a substituted or unsubstituted $C_6$-$C_{20}$ aromatic group, or a substituted or unsubstituted $C_2$-$C_{20}$ heteroaromatic group.

In some embodiments, $R_3$ and $R_4$ may be optionally linked to each other to form cyclopropane, cyclobutane, cyclopentane, cyclohexane, cycloheptane, cyclooctane, cyclopentene, cyclopentadiene, cyclohexadiene, cycloheptadiene, bicyclo-heptane, bicyclo-octane, benzene, pentalene, indene, naphthalene, azulene, heptalene, indacene, acenaphthalene, fluorene, spiro-fluorene, phenalene, phenanthrene, anthracene, fluoranthene, triphenylene, pyrene, or chrysene; or cyclopropane, cyclobutane, cyclopentane, cyclohexane, cycloheptane, cyclooctane, cyclopentene, cyclopentadiene, cyclohexadiene, cycloheptadiene, bicyclo-heptane, bicyclo-octane, benzene, pentalene, indene, naphthalene, azulene, heptalene, indacene, acenaphthalene, fluorine, spiro-fluorene, phenalene, phenanthrene, anthracene, fluoranthene, triphenylene, pyrene, or chrysene substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_1$-$C_{60}$ alkyl group substituted with at least one halogen atom, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_5$-$C_{60}$ arylthio group, a $C_2$-$C_{60}$ heteroaryl group, —$N(Q_{11})(Q_{12})$ or —$Si(Q_{13})(Q_{14})(Q_{15})$ (where $Q_{11}$ to $Q_{15}$ may be each independently a hydrogen atom, a $C_1$-$C_{10}$ alkyl group, a $C_6$-$C_{20}$ aryl group, or a $C_2$-$C_{20}$ heteroaryl group), but $R_3$ and $R_4$ are not limited thereto.

In Formula 1, n indicates the number of ligands represented by

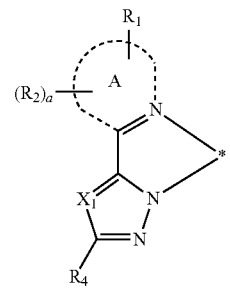

and may be an integer of 1 or 2. When n is 2, the two ligands represented by

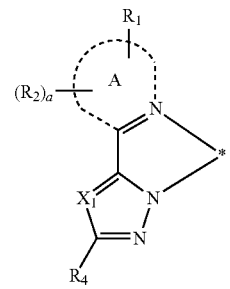

may be identical to or different from each other.

In Formula 1, L indicates an organic ligand, which may act as an auxiliary ligand relative to the ligand represented by

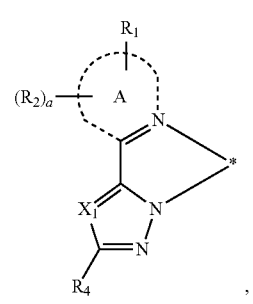

, and m (which indicates the number of Ls) may be an integer from 0 to 2.

In Formula 1, L may include a ligand represented by one of Formulas 2A to 2F:

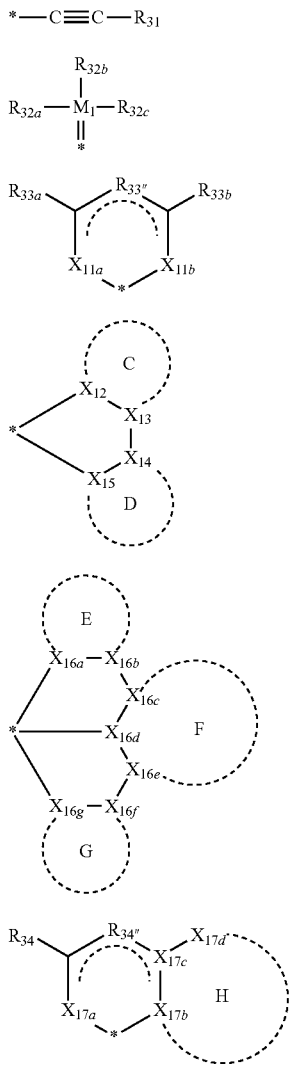

Formula 2A
Formula 2B
Formula 2C
Formula 2D
Formula 2E
Formula 2F

In Formulas 2A to 2F, $M_1$ may be P or As.

$X_{11a}$, $X_{11b}$, $X_{12}$, $X_{13}$, $X_{14}$, $X_{15}$, $X_{16a}$, $X_{16b}$, $X_{16c}$, $X_{16d}$, $X_{16e}$, $X_{16f}$, $X_{16g}$, $X_{17a}$, $X_{17b}$, $X_{17c}$, and $X_{17d}$ may be each independently C, N, O, N($R_{35}$), P($R_{36}$)($R_{37}$), or As($R_{38}$)($R_{39}$).

$R_{33''}$ and $R_{34''}$ may be each independently a single bond, a substituted or unsubstituted $C_1$-$C_5$ alkylene group, or a substituted or unsubstituted $C_2$-$C_5$ alkenylene group.

$R_{31}$, $R_{32a}$, $R_{32b}$, $R_{32c}$, $R_{33a}$, $R_{33b}$, $R_{34}$, $R_{35}$, $R_{36}$, $R_{37}$, $R_{38}$, and $R_{39}$ may be each independently selected from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, or a substituted or unsubstituted $C_2$-$C_{60}$ heteroaryl group.

The ring C, the ring D, the ring E, the ring F, the ring G, and the ring H may be each independently a 5-membered to 20-membered saturated ring or a 5-membered to 20-membered unsaturated ring.

* may be a binding site of M in Formula 1.

In some embodiments, in Formulas 2A to 2F, $R_{31}$, $R_{32a}$, $R_{32b}$, $R_{32c}$, $R_{33a}$, $R_{33b}$, $R_{34}$, $R_{35}$, $R_{36}$, $R_{37}$, $R_{33}$, and $R_{39}$ may be each independently selected from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, or a $C_1$-$C_{20}$ alkoxy group;

a $C_1$-$C_{20}$ alkyl group or a $C_1$-$C_{20}$ alkoxy group substituted with at least one of a deuterium atom, a halogen atom, a hydroxyl group, a cyano group, a nitro group, or an amino group;

a phenyl group, a naphthyl group, an anthryl group, a fluorenyl group, a carbazolyl group, a pyridinyl group, a pyrimidinyl group, or a triazinyl group; or a phenyl group, a naphthyl group, an anthryl group, a fluorenyl group, a carbazolyl group, a pyridinyl group, a pyrimidinyl group, or a triazinyl group substituted at least one of a deuterium atom, a halogen atom, a hydroxyl group, a cyano group, a nitro group, an amino group, a $C_1$-$C_{20}$ alkyl group, a $C_1$-$C_{20}$ alkoxy group, a phenyl group, a naphthyl group, an anthryl group, a fluorenyl group, a carbazolyl group, a pyridinyl group, a pyrimidinyl group, or a triazinyl group.

In some embodiments, L in Formula 1 may include a ligand represented by Formula 2B above. In Formula 2B, $M_1$ may be P, and $R_{32a}$, $R_{32b}$, and $R_{32c}$ may be each independently selected from:

a $C_1$-$C_{20}$ alkyl group;

a $C_1$-$C_{20}$ alkyl group substituted with at least one of a deuterium atom, a halogen atom, a hydroxyl group, a cyano group, a nitro group, and an amino group;

a phenyl group, a naphthyl group, an anthryl group, a fluorenyl group, a carbazolyl group, a pyridinyl group, a pyrimidinyl group, or a triazinyl group; or a phenyl group, a naphthyl group, an anthryl group, a fluorenyl group, a carbazolyl group, a pyridinyl group, a pyrimidinyl group, or a triazinyl group substituted with at least one of a deuterium atom, a halogen atom, a hydroxyl group, a cyano group, a nitro group, an amino group, a $C_1$-$C_{20}$ alkyl group, a $C_1$-$C_{20}$ alkoxy group, a phenyl group, a naphthyl group, an anthryl group, a fluorenyl group, a carbazolyl group, a pyridinyl group, a pyrimidinyl group, or a triazinyl group.

In some other embodiments, L in Formula 1 may include a ligand represented by Formula 2C above. In Formula 2C, $X_{11a}$ and $X_{11b}$ may be P($R_{36}$)($R_{37}$), and $R_{33''}$ may be a $C_1$-$C_5$ alkylene group or a $C_2$-$C_5$ alkenylene group, and $R_{36}$ and $R_{37}$ may be each independently selected from:

a $C_1$-$C_{20}$ alkyl group;

a $C_1$-$C_{20}$ alkyl group substituted with at least one of a deuterium atom, a halogen atom, a hydroxyl group, a cyano group, a nitro group, or an amino group;

a phenyl group, a naphthyl group, an anthryl group, a fluorenyl group, a carbazolyl group, a pyridinyl group, a pyrimidinyl group, or a triazinyl group; or a phenyl group, a naphthyl group, an anthryl group, a fluorenyl group, a carbazolyl group, a pyridinyl group, a pyrimidinyl group, or a triazinyl group substituted with at least one of a deuterium atom, a halogen atom, a hydroxyl group, a cyano group, a nitro group, an amino group, a $C_1$-$C_{20}$ alkyl group, a $C_1$-$C_{20}$ alkoxy group, a phenyl group, a naphthyl group, an anthryl group, a fluorenyl group, a carbazolyl group, a pyridinyl group, a pyrimidinyl group, or a triazinyl group.

In some other embodiments, L in Formula 1 may include a ligand represented by Formula 2C above. In Formula 2C, $X_{11a}$ and $X_{11b}$ may be O, and $R_{33''}$ may be selected from:
a $C_1$-$C_5$ alkylene group;
a $C_2$-$C_5$ alkenylene group;
a $C_1$-$C_5$ alkylene group substituted with at least one of a deuterium atom, a halogen atom, a hydroxyl group, a cyano group, a nitro group, an amino group, a $C_1$-$C_{10}$ alkyl group, or a $C_1$-$C_{10}$ alkoxy group; or
a $C_2$-$C_5$ alkenylene group substituted with at least one of a deuterium atom, a halogen atom, a hydroxyl group, a cyano group, a nitro group, an amino group, a $C_1$-$C_{10}$ alkyl group, or a $C_1$-$C_{10}$ alkoxy group, but $R_{33''}$ is not limited thereto.

In Formula 1, n may be 1 or 2, and m may be 0, 1, or 2, but n and m are not limited thereto. For example, in Formula 1, n may be 2 and m may be 0. Alternatively, n may be 1 and m may be 1.

The first compound may be a compound represented by Formula 1(1) below:

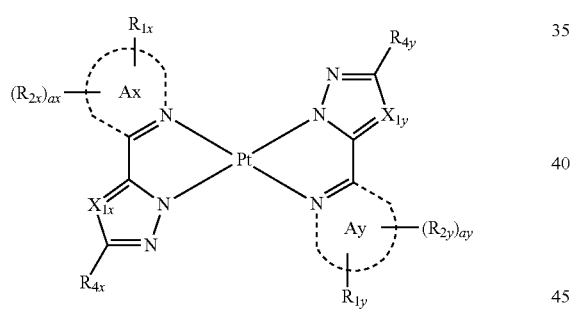

<Formula 1(1)>

In Formula 1(1), the ring Ax and the ring Ay are the same as the ring A, described above with respect to Formula 1.

In Formula 1(1), $X_{1x}$ may be N or C($R_{3x}$), and $X_{1y}$ may be N or C($R_{3y}$).

In Formula 1(1), $R_{1x}$ to $R_{4x}$ and $R_{1y}$ to $R_{4y}$ are the same as $R_2$ described above with respect to Formula 1.

In Formula 1(1), $R_{1x}$ and $R_{1y}$ may be each independently a substituted or unsubstituted linear or branched $C_2$-$C_{60}$ alkyl group. For example, in Formula 1(1), $R_{1x}$ and $R_{1y}$ may be each independently selected from an ethyl group, an n-propyl group, an i-propyl group, an n-butyl group, an l-butyl group, a t-butyl group, a pentyl group, a hexyl group, a heptyl group, an octyl group, a nonyl group, or a decyl group; or
an ethyl group, an n-propyl group, an i-propyl group, an n-butyl group, an i-butyl group, a t-butyl group, a pentyl group, a hexyl group, a heptyl group, an octyl group, a nonyl group, and a decyl group, substituted at least one of a deuterium atom, —F, a hydroxyl group, a cyano group, a nitro group, or an amino group.

In Formula 1(1), $a_x$ and $a_y$ may be each independently an integer from 1 to 10. At least one of the $R_{2x}$s may be a substituted or unsubstituted linear or branched $C_1$-$C_{60}$ alkyl group, and at least one of the $R_{2y}$s may be a substituted or unsubstituted linear or branched $C_1$-$C_{60}$ alkyl group.

In Formula 1(1), $a_x$ and $a_y$ may be each independently an integer of 0 to 10. $a_x$ and $a_y$ are the same as a as described above with respect to Formula 1.

The first compound of Formula 1 may be represented by one of Formulas 1A to 1R below, but is not limited thereto:

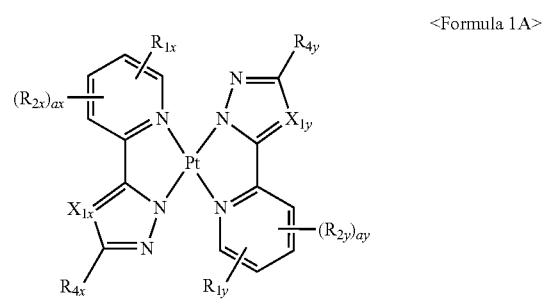

<Formula 1A>

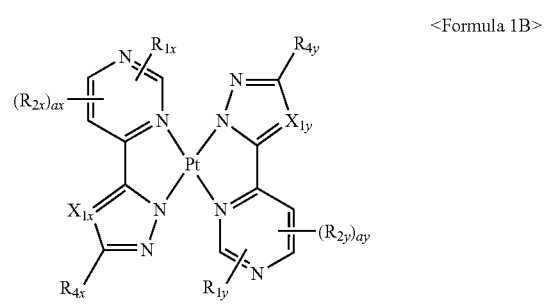

<Formula 1B>

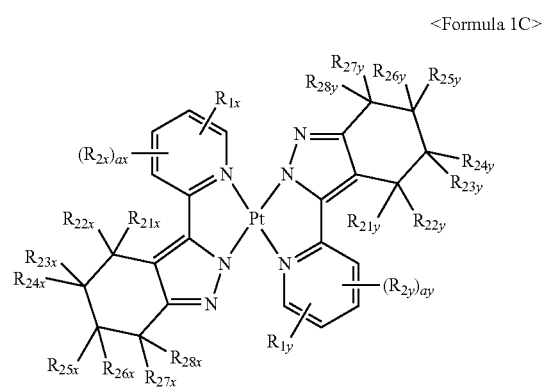

<Formula 1C>

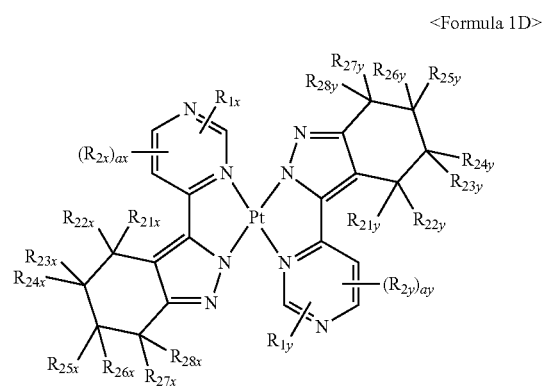

<Formula 1D>

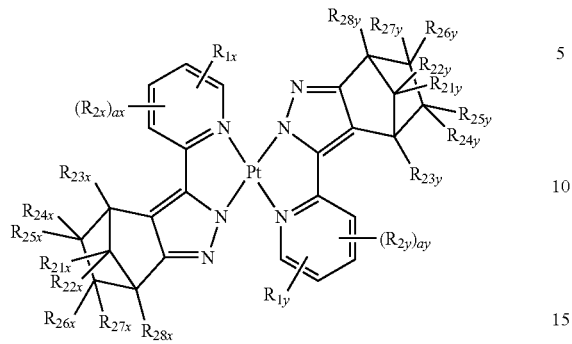
<Formula 1E>
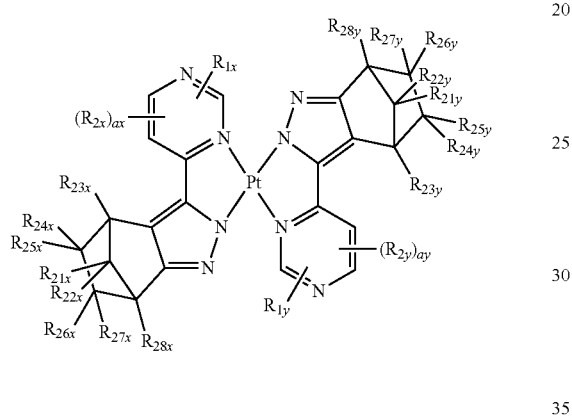
<Formula 1F>
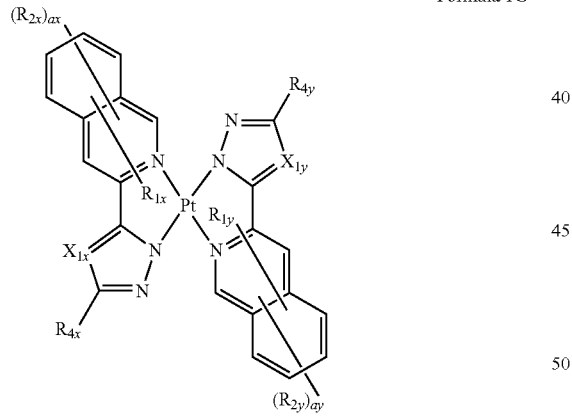
<Formula 1G>
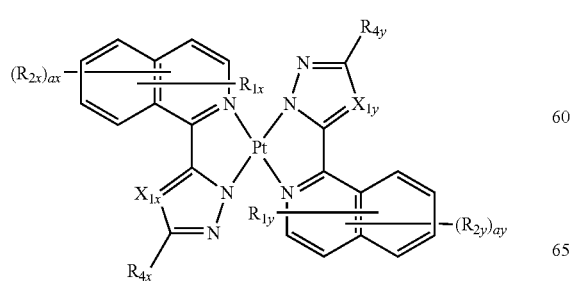
<Formula 1H>
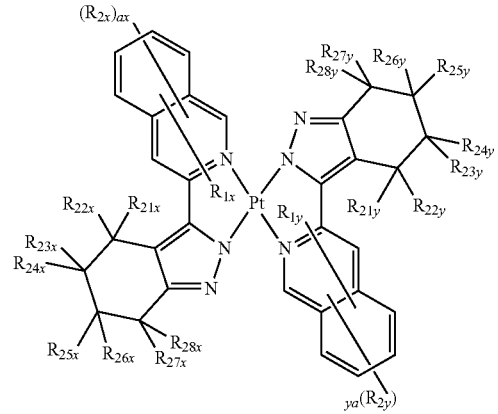
<Formula 1I>
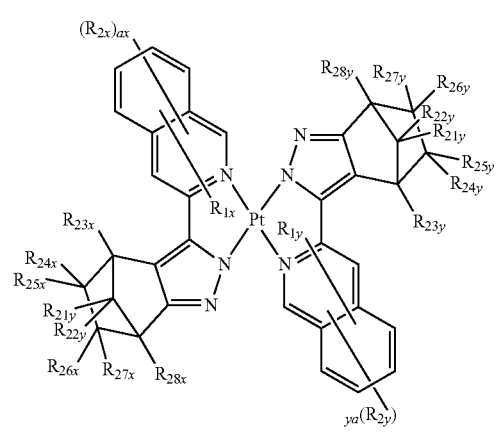
<Formula 1J>
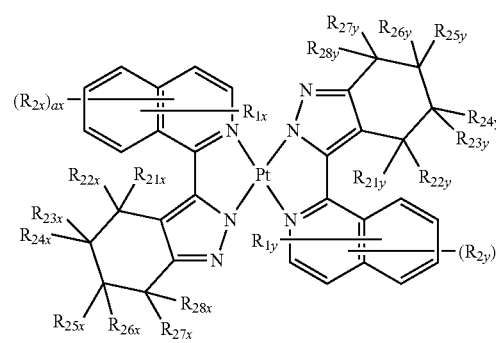
<Formula 1K>
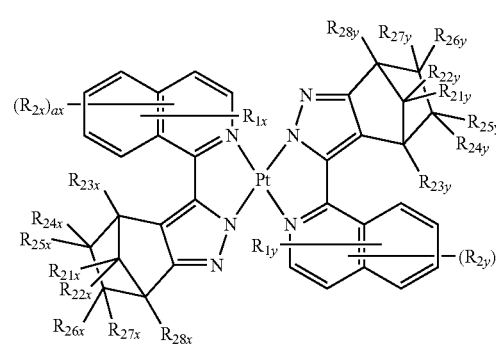
<Formula 1L>

<Formula 1M>

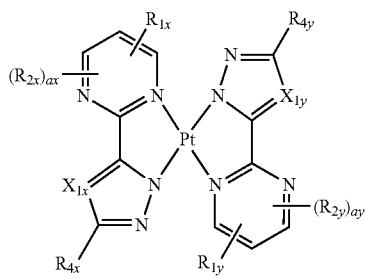

<Formula 1N>

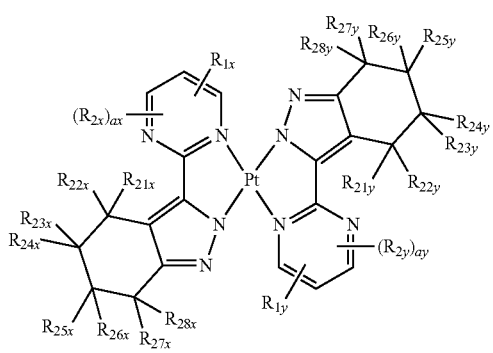

<Formula 1O>

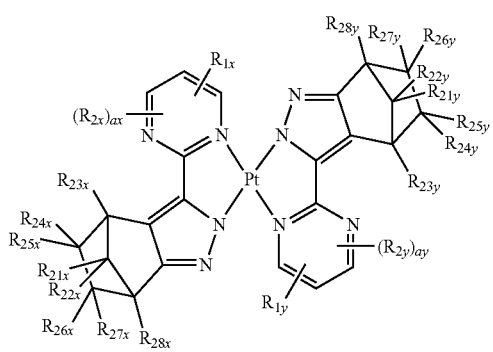

<Formula 1P>

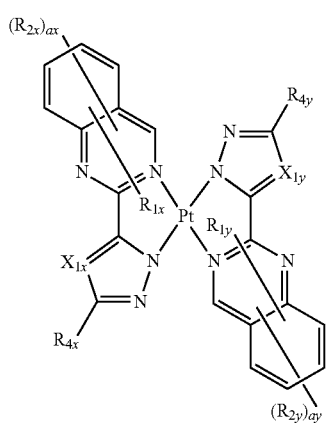

<Formula 1Q>

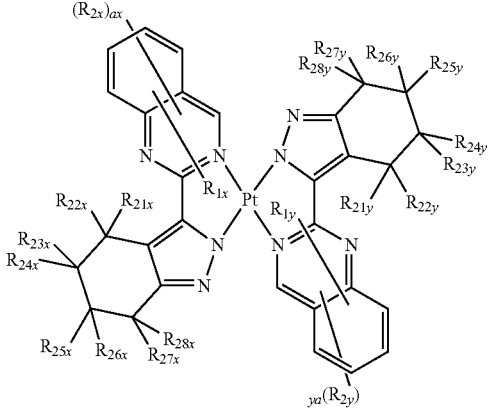

<Formula 1R>

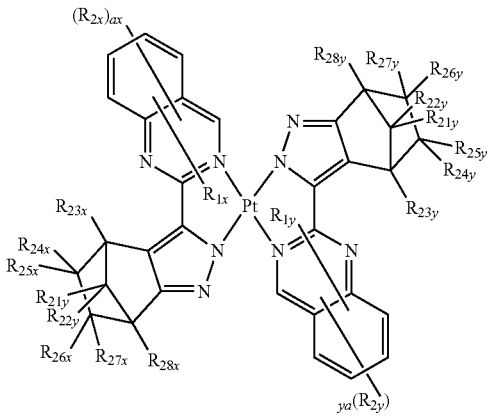

In Formulas 1A to 1R, the substituents are as defined above.

For example, in Formulas 1A to 1R, $X_{1x}$ may be N or $C(R_{3x})$, $X_{1y}$ may be N or $C(R_{3y})$;

$R_{1x}$ and $R_{1y}$ may be each independently:

an ethyl group, an n-propyl group, an i-propyl group, an n-butyl group, an i-butyl group, a t-butyl group, a pentyl group, a hexyl group, a heptyl group, an octyl group, a nonyl group, or a decyl group; or an ethyl group, an n-propyl group, an i-propyl group, an n-butyl group, an i-butyl group, a t-butyl group, a pentyl group, a hexyl group, a heptyl group, an octyl group, a nonyl group, or a decyl group substituted with at least one of a deuterium atom, —F, a hydroxyl group, a cyano group, a nitro group, or an amino group; and $R_{2x}$ to $R_{4x}$, $R_{21x}$ to $R_{28x}$, $R_{2y}$ to $R_{4y}$, and $R_{21y}$ to $R_{28y}$ may be each independently selected from:

a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, or a phosphoric acid group or a salt thereof;

a methyl group, an ethyl group, an n-propyl group, an i-propyl group, an n-butyl group, an i-butyl group, a t-butyl group, a pentyl group, a hexyl group, a heptyl group, an octyl group, a nonyl group, a decyl group, a methoxy group, an ethoxy group, a propoxy group, a butoxy group, or a pentoxy group; or a methyl group, an ethyl group, an n-propyl group, an i-propyl group, an n-butyl group, an i-butyl group, a t-butyl group, a pentyl group, a hexyl group, a heptyl group, an octyl group, a nonyl group, a decyl group, a methoxy group, an ethoxy group, a propoxy group, a butoxy group, or a pentoxy group substituted with at least one of a deuterium atom, —F, a hydroxyl group, a cyano group, a nitro group, or an amino group; and $a_x$ and $a_y$ may be each independently an integer from 1 to 3, but the present invention is not limited thereto.

In Formulas 1A to 1R, n may be 2 and m may be 0, or n may be 1 and m may be 1.

For example, in Formula 1, n may be 2, and the two ligands represented by

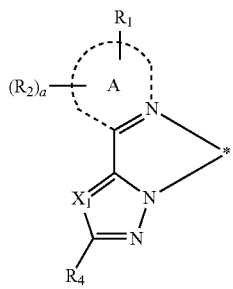

may be identical to each other. The first compound of Formula 1 may be in trans configuration.

For example, the two ligands in Formula 1(1) may be the same.

In some other embodiments, the two ligands in each of Formulas 1A to 1R may be the same.

For example, the first compound may be a compound represented by one of Formulas 1A(1), 1A(2), 1A(3), 1B(1), 1C(1), 1D(1), 1D(2), 1E(1), 1F(1), 1G(1), 1H(1), 1J(1), 1M(1), 1M(2), 1N(1), 1N(2), 1O(1), 1P(1), and 1S(1) below, but is not limited thereto:

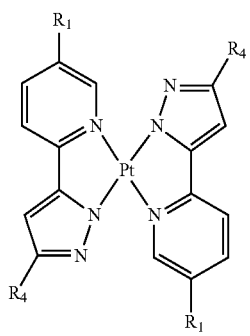

<Formula 1A(1)>

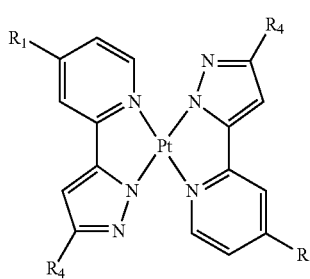

<Formula 1A(2)>

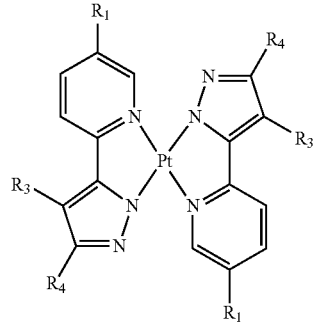

<Formula 1A(3)>

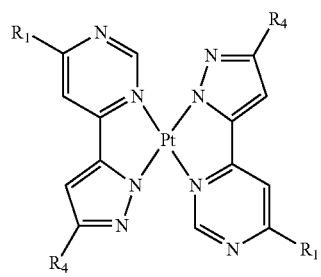

<Formula 1B(1)>

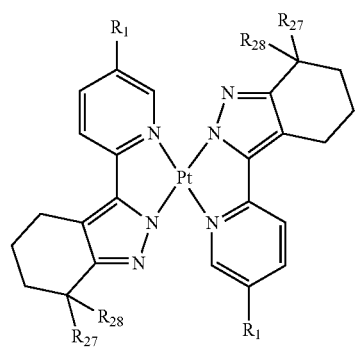

<Formula 1C(1)>

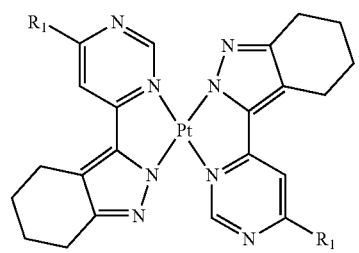

<Formula 1D(1)>

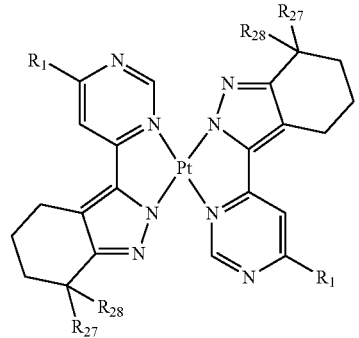

<Formula 1D(2)>

<Formula 1E(1)>
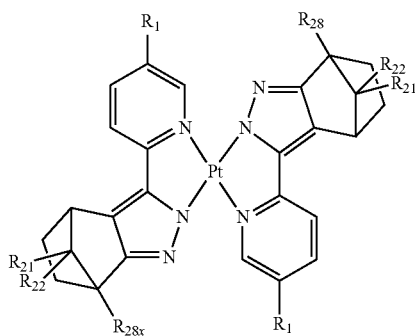
<Formula 1F(1)>
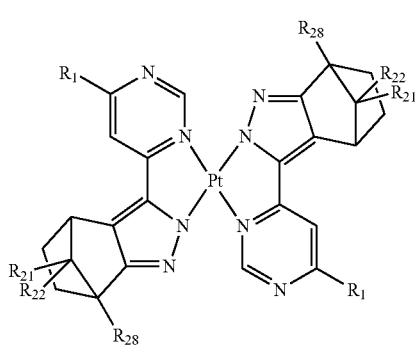
<Formula 1G(1)>
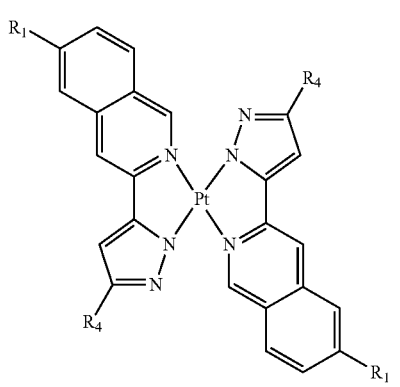
<Formula 1H(1)>
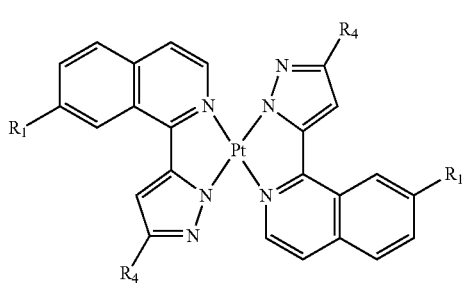
<Formula 1J(1)>
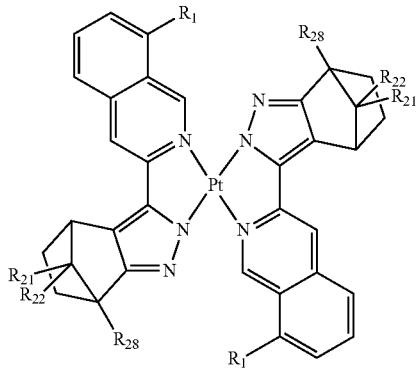
<Formula 1M(1)>
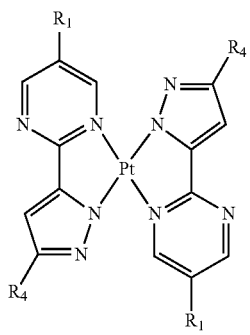
<Formula 1M(2)>
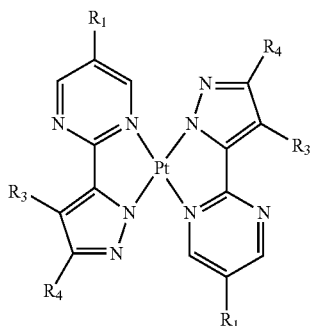
<Formula 1N(1)>
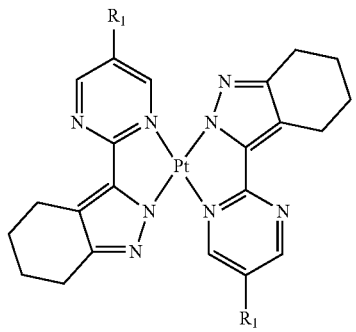

-continued

<Formula 1N(2)>

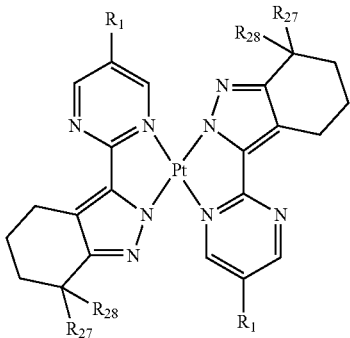

<Formula 1O(1)>

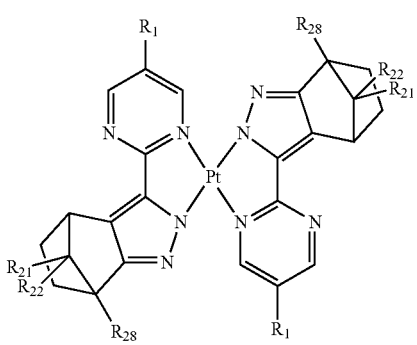

<Formula 1P(1)>

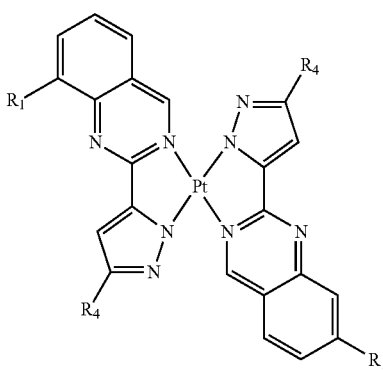

<Formula 1S(1)>

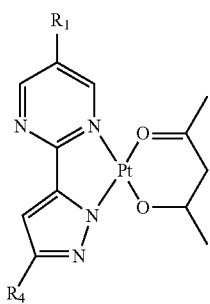

$R_1$, $R_3$, $R_4$, $R_{21}$, $R_{22}$, $R_{27}$, and $R_{28}$ in Formulas 1A(1), 1A(2), 1A(3), 1B(1), 1C(1), 1D(1), 1D(2), 1E(1), 1F(1), 1G(1), 1H(1), 1J(1), 1M(1), 1M(2), 1N(1), 1N(2), 1O(1), 1P(1), and 1S(1) are as defined above.

For example, in Formulas 1A(1), 1A(2), 1A(3), 1B(1), 1C(1), 1D(1), 1D(2), 1E(1), 1F(1), 1G(1), 1H(1), 1J(1), 1M(1), 1M(2), 1N(1), 1N(2), 1O(1), 1P(1), and 1S(1), $R_1$ may be selected from:

an ethyl group, an n-propyl group, an i-propyl group, an n-butyl group, an i-butyl group, a t-butyl group, a pentyl group, a hexyl group, a heptyl group, an octyl group, a nonyl group, or a decyl group; or an ethyl group, an n-propyl group, an i-propyl group, an n-butyl group, an i-butyl group, a t-butyl group, a pentyl group, a hexyl group, a heptyl group, an octyl group, a nonyl group, or a decyl group substituted with at least one of a deuterium atom, —F, a hydroxyl group, a cyano group, a nitro group, or an amino group.

$R_3$, $R_4$, $R_{21}$, $R_{22}$, $R_{27}$, and $R_{28}$ may be each independently selected from:

a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, or a phosphoric acid group or a salt thereof;

a methyl group, an ethyl group, an n-propyl group, an i-propyl group, an n-butyl group, an i-butyl group, a t-butyl group, a pentyl group, a hexyl group, a heptyl group, an octyl group, a nonyl group, a decyl group, a methoxy group, an ethoxy group, a propoxy group, a butoxy group, or a pentoxy group; or a methyl group, an ethyl group, an n-propyl group, an i-propyl group, an n-butyl group, an i-butyl group, a t-butyl group, a pentyl group, a hexyl group, a heptyl group, an octyl group, a nonyl group, a decyl group, a methoxy group, an ethoxy group, a propoxy group, a butoxy group, or a pentoxy group substituted with at least one of a deuterium atom, —F, a hydroxyl group, a cyano group, a nitro group, or an amino group, but the present invention is not limited thereto.

The first compound may comprise at least one of Compounds D1 to D35 below, but is not limited thereto:

D1

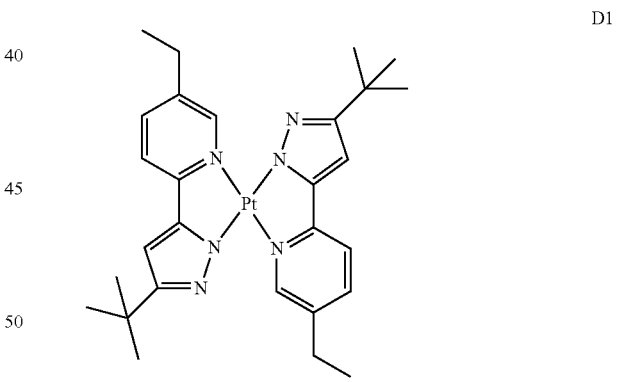

D2

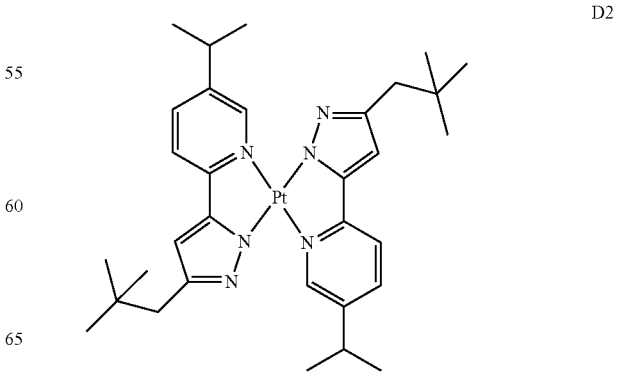

-continued
D3
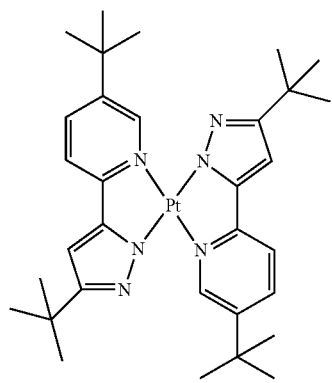
D4
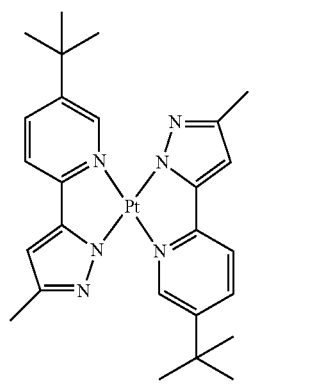
D5
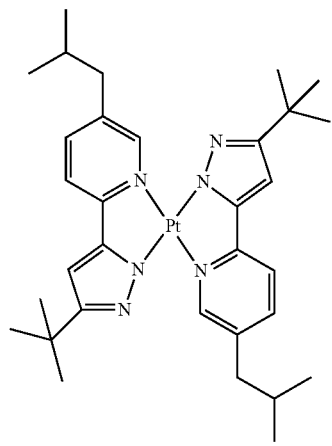
D6
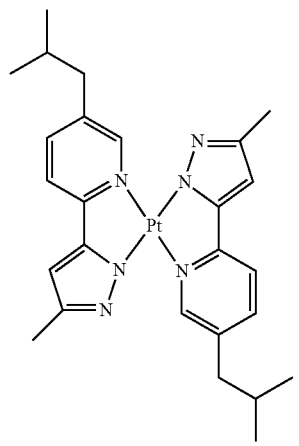
-continued
D7
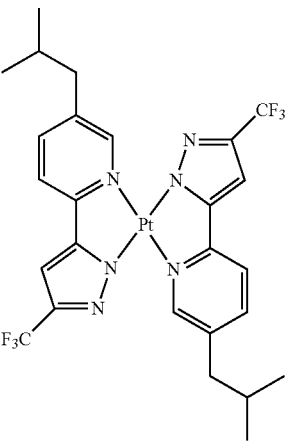
D8
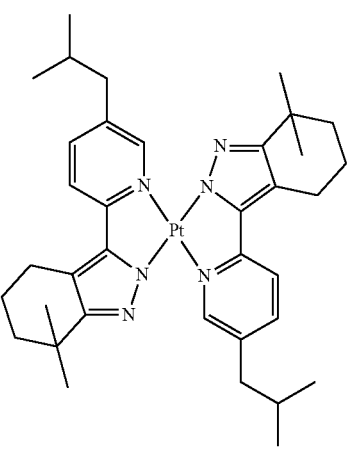
D9
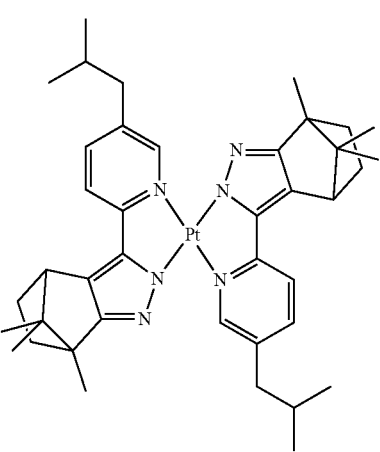

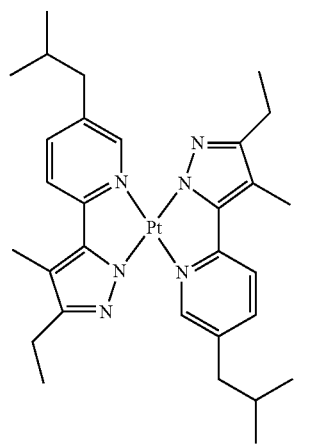 D10
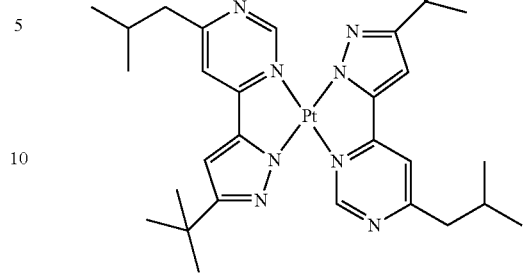 D14
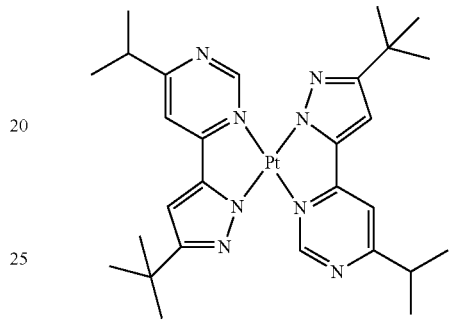 D15
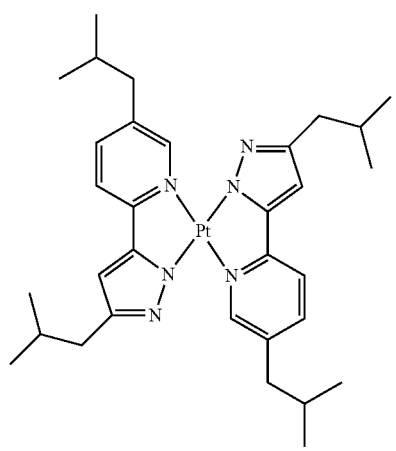 D11
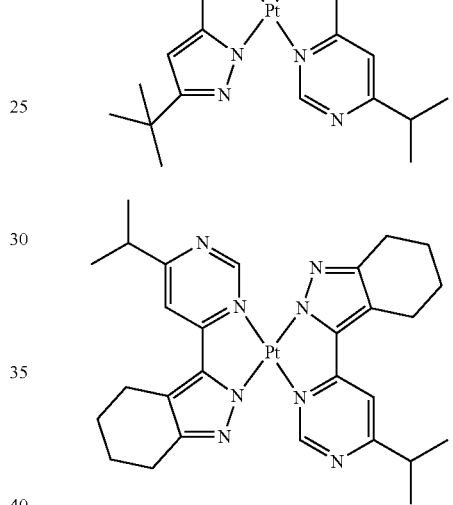 D16
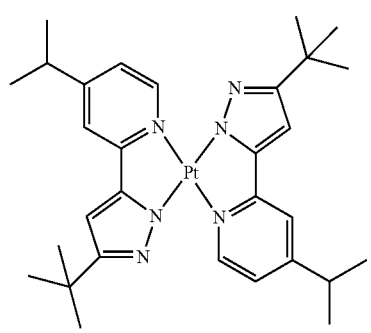 D12
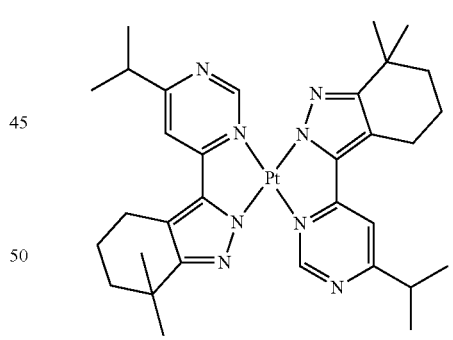 D17
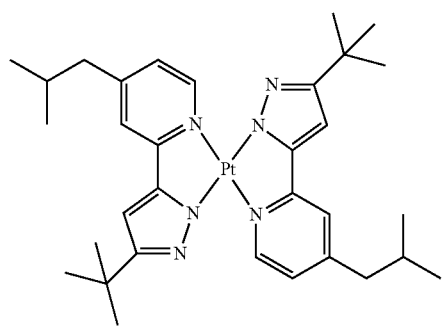 D13
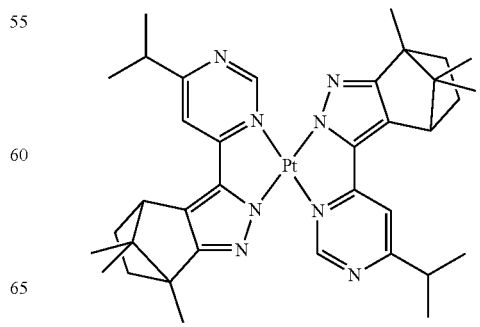 D18

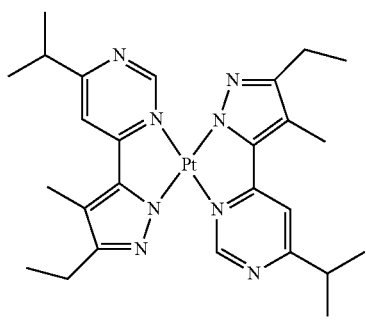
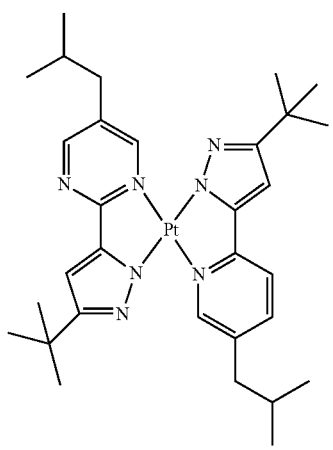
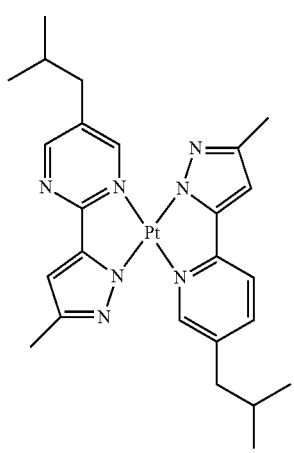
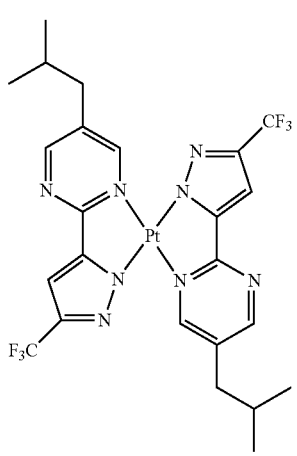
D19
D20
D21
D22
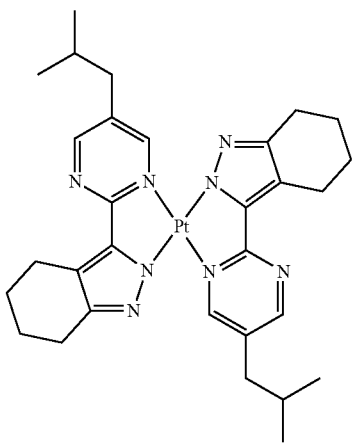
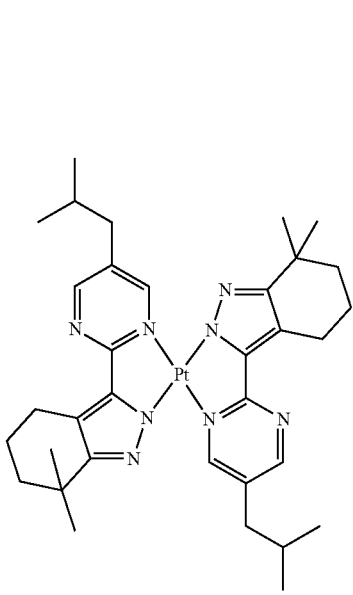
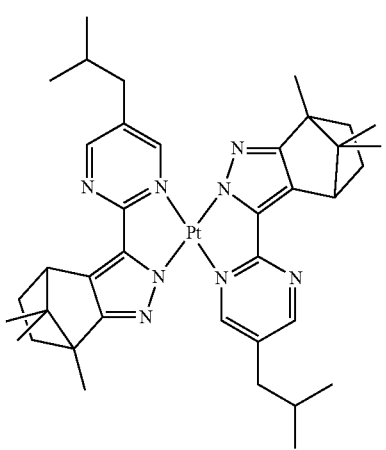
D23
D24
D25

-continued
D26
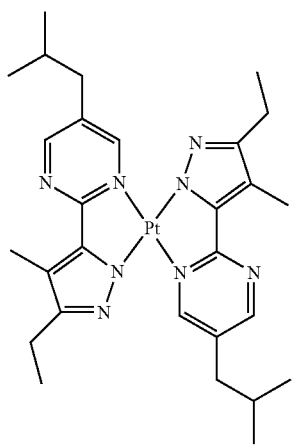
D27
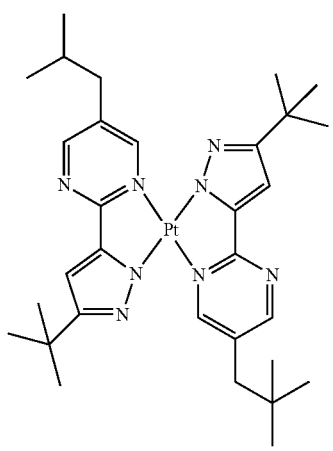
D28
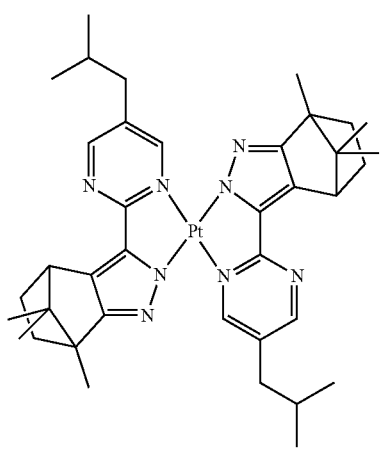
-continued
D29
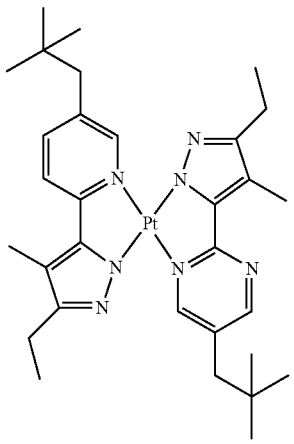
D30
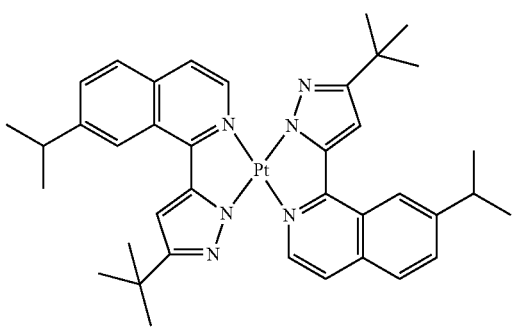
D31
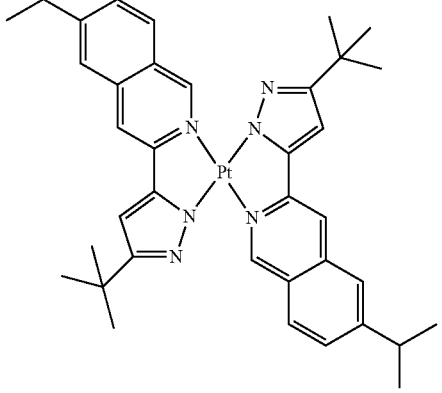
D32
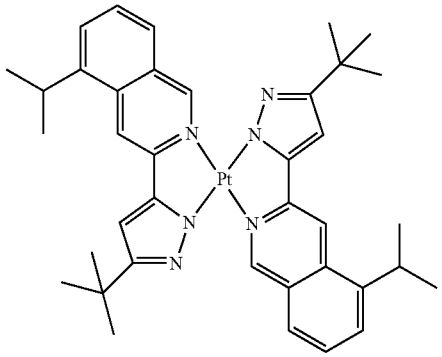

-continued

D33
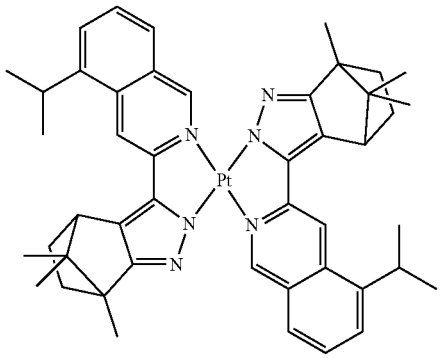

D34
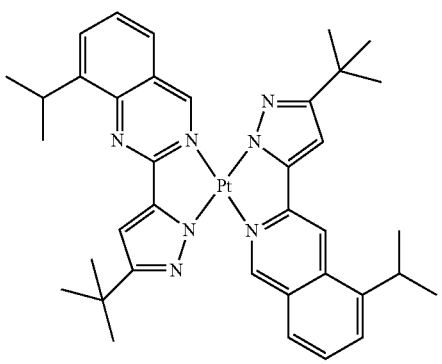

D35
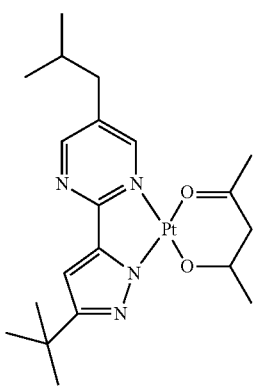

The first compound of Formula 1 may have high light-emitting efficiency by a phosphorescent light-emitting mechanism. Also, when $R_1$ in the first compound of Formula 1 is a substituted or unsubstituted linear or branched $C_2$-$C_{60}$ alkyl group (that is, an alkyl group having at least "two" carbon atoms), molecular aggregation in the first compound may be minimized or substantially prevented. Therefore, an OLED including the first compound of Formula 1 as a dopant may have high light-emitting efficiency.

The second compound may be represented by Formula 100 below:

<Formula 100>

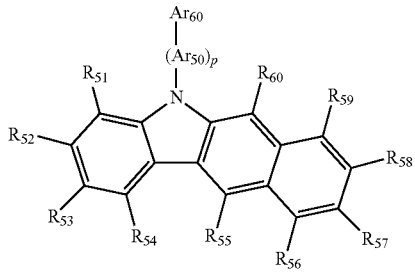

In Formula 100,

1) $R_{56}$ and $R_{57}$ are linked to each other to form a substituted or unsubstituted $C_3$-$C_{60}$ cyclic moiety or a substituted or unsubstituted $C_2$-$C_{60}$ heterocyclic moiety, and $R_{51}$ to $R_{55}$ and $R_{58}$ to $R_{60}$ may be each independently a substituent represented by —$(Ar_{51})_q$-$(Ar_{61})$; or ii) $R_{58}$ and $R_{59}$ are linked to each other to form a substituted or unsubstituted $C_3$-$C_{60}$ cyclic moiety or a substituted or unsubstituted $C_2$-$C_{60}$ heterocyclic moiety, and $R_{51}$ to $R_{57}$ and $R_{60}$ may be each independently a substituent represented by —$(Ar_{51})_q$-$(Ar_{61})$.

In some embodiments, the second compound of Formula 1 may be represented by Formula 100A or Formula 100B below:

<Formula 100A>

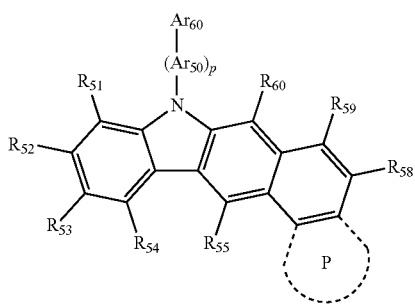

<Formula 100B>

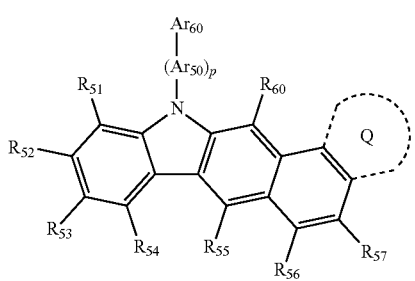

$R_{51}$ to $R_{60}$ in Formulas 100A and 100B are as defined above.

In Formulas 100A and 100B, the ring P and the ring Q may be each independently selected from:

i) cyclopropane, cyclobutane, cyclopentane, cyclohexane, cycloheptane, cyclooctane, cyclopentene, cyclopentadiene, cyclohexene, cyclohexadiene, cycloheptadiene, pyrrole, pyrazole, benzene, furan, thiophene, pyridine, pyrazine, pyrimidine, pyridazine, naphthalene, anthracene, fluorene, pyrolizine, indolizine, isoindole, indole, indazole, purine, quinolizine, isoquinoline, quinoline, phthalazine, naphthyridine, quinoxaline, quinazoline, cinnoline, carbazole, phenanthridine, acridine, phenazine, benzofuran, benzothiophene, dibenzofuran, or dibenzothiophene; or ii) cyclopropane, cyclobutane, cyclopentane, cyclohexane, cycloheptane, cyclooctane, cyclopentene, cyclopentadiene, cyclohexene, cyclohexadiene, cycloheptadiene, pyrrole, pyrazole, benzene, furan, thiophene, pyridine, pyrazine, pyrimidine, pyridazine, naphthalene, anthracene, fluorene, pyrolizine, indolizine, isoindole, indole, indazole, purine, quinolizine, isoquinoline, quinoline, phthalazine, naphthyridine, quinoxaline, quinazoline, cinnoline, carbazole, phenanthridine, acridine, phenazine, benzofuran, benzothiophene, dibenzofuran, or dibenzothiophene substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, or a $C_1$-$C_{20}$ alkoxy group;

a $C_1$-$C_{20}$ alkyl group or a $C_1$-$C_{60}$ alkoxy group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, or a phosphoric acid group or a salt thereof;

a $C_6$-$C_{20}$ aryl group, a $C_6$-$C_{20}$ aryloxy group, a $C_6$-$C_{20}$ arylthio group, or a $C_2$-$C_{20}$ heteroaryl group;

a $C_6$-$C_{20}$ aryl group, a $C_6$-$C_{20}$ aryloxy group, a $C_6$-$C_{20}$ arylthio group, or a $C_2$-$C_{20}$ heteroaryl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a dimethylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group; or —N($Q_{11}$)($Q_{12}$) or —Si($Q_{13}$)($Q_{14}$)($Q_{15}$) (where $Q_{11}$ and $Q_{12}$ may be each independently a $C_6$-$C_{20}$ aryl group or a $C_2$-$C_{20}$ heteroaryl group, $Q_{13}$ to $Q_{15}$ may be each independently a $C_1$-$C_{20}$ alkyl group, a $C_1$-$C_{20}$ alkoxy group, a $C_6$-$C_{20}$ aryl group, or a $C_2$-$C_{20}$ heteroaryl group).

For example, the ring P and the ring Q may be each independently selected from:

i) benzene, naphthalene, fluorene, carbazole, dibenzofuran, or dibenzothiophene; or ii) benzene, naphthalene, fluorene, carbazole, dibenzofuran, or dibenzothiophene, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, or a $C_1$-$C_{20}$ alkoxy group;

a $C_1$-$C_{20}$ alkyl group or a $C_1$-$C_{60}$ alkoxy group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, or a phosphoric acid group or a salt thereof;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, or an isoquinolinyl group;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, or an isoquinolinyl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group; or —N($Q_{11}$)($Q_{12}$) (where $Q_{11}$ and $Q_{12}$ may be each independently a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group).

In some embodiments, $R_{51}$ to $R_{54}$ in Formulas 100A and 100B may all be hydrogen atoms.

In some other embodiments, the second compound may be represented by one of Formulas 100A-1 to 100A-8 and 100B-1 to 100B-8 below, but is not limited thereto:

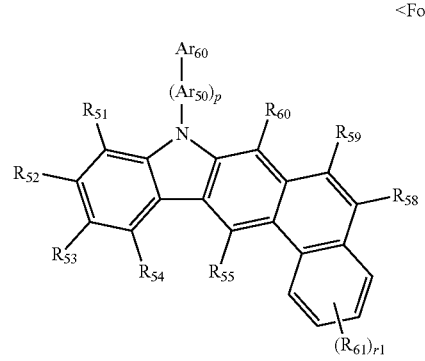

<Formula 100A-1>

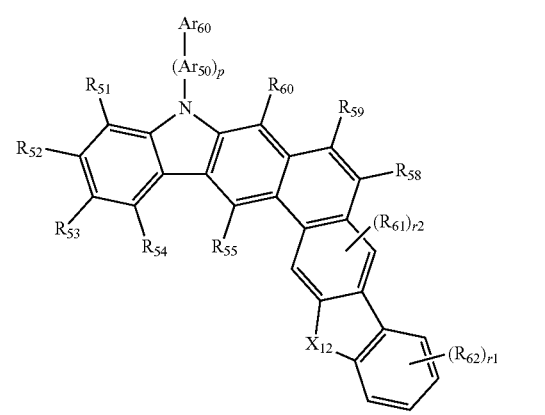

<Formula 100A-2>

<Formula 100A-3>
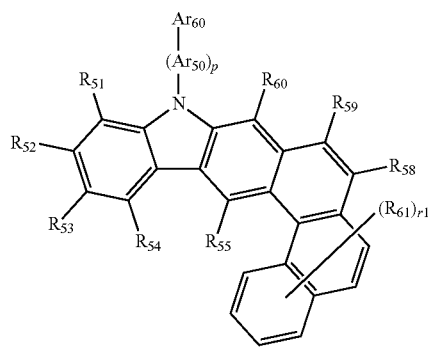
<Formula 100A-4>
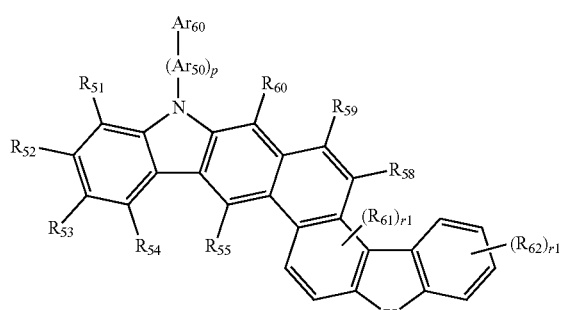
<Formula A100-5>
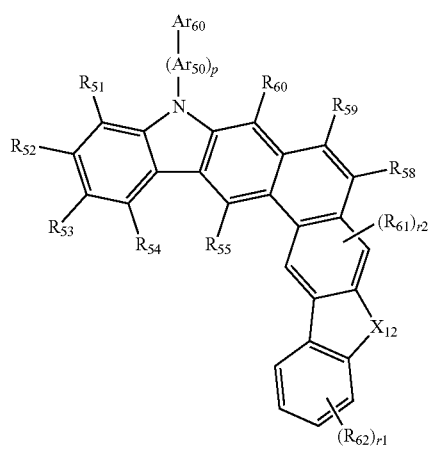
<Formula 100A-6>
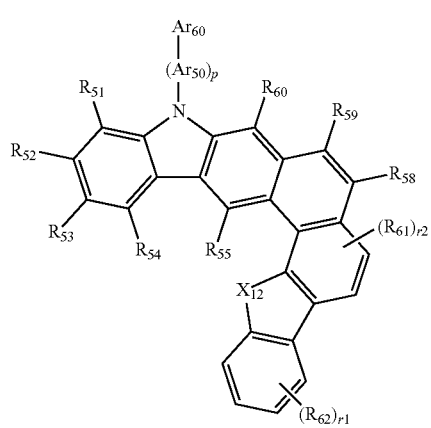
<Formula 100A-7>
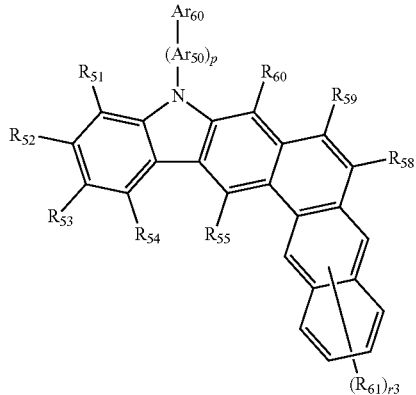
<Formula 100A-8>
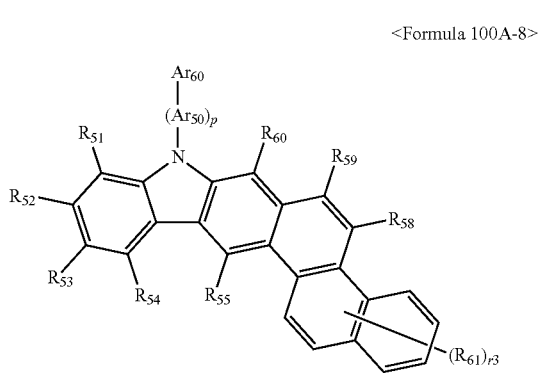
<Formula 100B-1>
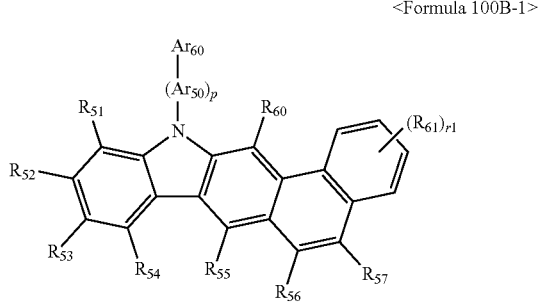
<Formula 100B-2>
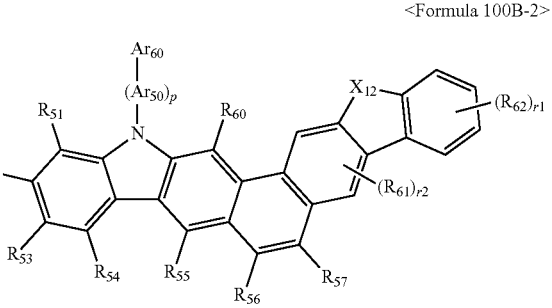

<Formula 100B-3>
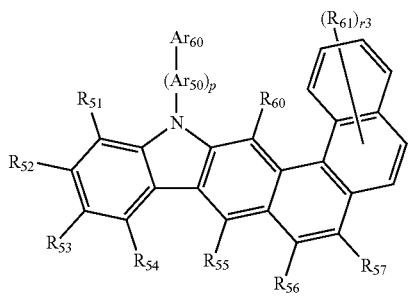

<Formula 100B-4>
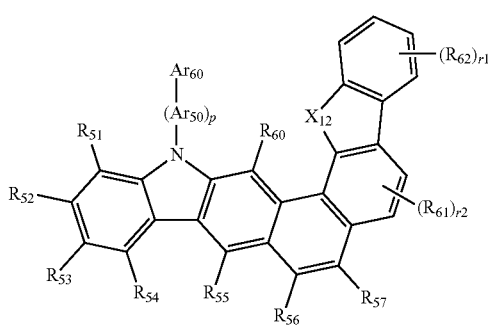

<Formula 100B-5>
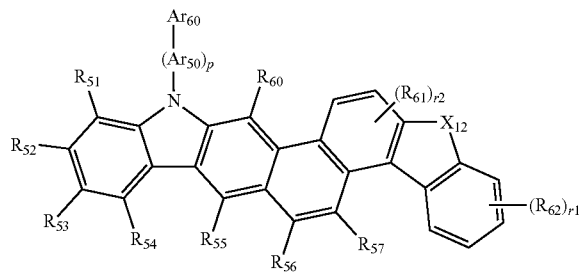

<Formula 100B-6>
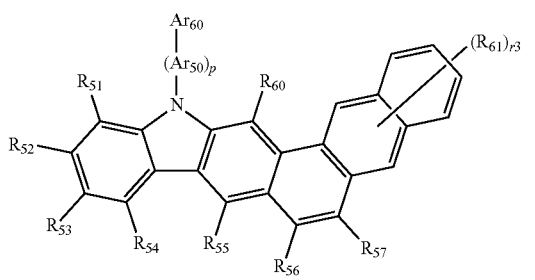

<Formula 100B-7>
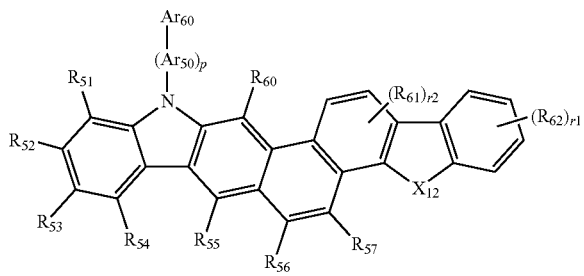

<Formula 100B-8>
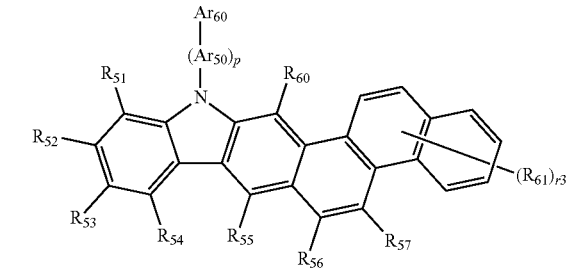

$R^{51}$ to $R_{60}$, $Ar_{50}$, $Ar_{60}$, and p in Formulas 100A-1 to 100A-8 and 100B-1 to 100B-8 may be as defined above.

In Formulas 100A-1 to 100A-8 and 100B-1 to 100B-8, $X_{12}$ may be O, S, $C(R_{71})(R_{72})$, or $N(R_{73})$.

In Formulas 100A-1 to 100A-8 and 100B-1 to 100B-8, $R_{61}$, $R_{62}$, and $R_{71}$ to $R_{73}$ may be each independently selected from:

i) a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

ii) a $C_1$-$C_{60}$ alkyl group, a $C_2$-$C_{60}$ alkenyl group, a $C_2$-$C_{60}$ alkynyl group, or a $C_1$-$C_{60}$ alkoxy group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, or a phosphoric acid group or a salt thereof;

iii) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, or a $C_2$-$C_{60}$ heteroaryl group;

iv) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, or a $C_2$-$C_{60}$ heteroaryl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group; or v) —$N(Q_{11})(Q_{12})$ and —$Si(Q_{13})(Q_{14})(Q_{15})$ (where $Q_{11}$ and $Q_{12}$ may be each independently a $C_6$-$C_{60}$ aryl group or a $C_2$-$C_{60}$ heteroaryl group, and $Q_{13}$ to $Q_{15}$ may be each independently a $C_1$-$C_{60}$ alkyl group, a $C_1$-$C_{60}$ alkoxy group, a $C_6$-$C_{60}$ aryl group, or a $C_2$-$C_{60}$ heteroaryl group).

In Formulas 100A-1 to 100A-8 and 100B-1 to 100B-8, r1 may be an integer from 1 to 4; r2 may be 1 or 2; r3 may be 1 to 6.

In some embodiments, in Formulas 100A-1 to 100A-8 and 100B-1 to 100B-8, $R_{61}$, $R_{62}$, and $R_{71}$ to $R_{73}$ may be each independently selected from:

i) a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, or a $C_1$-$C_{20}$ alkoxy group;

ii) a $C_1$-$C_{20}$ alkyl group or a $C_1$-$C_{60}$ alkoxy group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, or a phosphoric acid group or a salt thereof;

iii) a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, or an isoquinolinyl group;

iv) a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, or an isoquinolinyl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group;

v) —N($Q_{11}$)($Q_{12}$) or —Si($Q_{13}$)($Q_{14}$)($Q_{15}$) (where $Q_{11}$ and $Q_{12}$ may be each independently a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group, and $Q_{13}$ to $Q_{15}$ may be each independently a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group), but the present invention is not limited thereto.

In Formula 2, $Ar_{50}$ and $Ar_{51}$ may be each independently selected from a substituted or unsubstituted a phenylene group, a substituted or unsubstituted a pentalenylene group, a substituted or unsubstituted an indenylene group, a substituted or unsubstituted a naphthalene group, a substituted or unsubstituted an azulenylene group, a substituted or unsubstituted heptalenylene, a substituted or unsubstituted indacenylene, a substituted or unsubstituted acenaphthalene group, a substituted or unsubstituted a fluorenylene group, a substituted or unsubstituted spiro-fluorenylene group, a substituted or unsubstituted phenalenylene, a substituted or unsubstituted a phenanthrenylene group, a substituted or unsubstituted an anthryl group, a substituted or unsubstituted a fluoranthenylene group, a substituted or unsubstituted a triphenylene group, a substituted or unsubstituted a pyrenylenylene group, a substituted or unsubstituted chrysenylene, a substituted or unsubstituted naphthacenylene group, a substituted or unsubstituted a picenylene group, a substituted or unsubstituted perylenylene, a substituted or unsubstituted pentaphenylene, a substituted or unsubstituted hexacenylene, a substituted or unsubstituted pyrrolylene, a substituted or unsubstituted imidazolylene, a substituted or unsubstituted pyrazolylene, a substituted or unsubstituted pyridinylene, a substituted or unsubstituted pyrazinylene, a substituted or unsubstituted pyrimidinylene, a substituted or unsubstituted pyridazinylene, a substituted or unsubstituted isoindolylene, a substituted or unsubstituted indolylene, a substituted or unsubstituted indazolylene, a substituted or unsubstituted purinylene, a substituted or unsubstituted quinolinylene, a substituted or unsubstituted benzoquinolinylene, a substituted or unsubstituted phthalazinylene, a substituted or unsubstituted naphthyridinylene, a substituted or unsubstituted quinoxalinylene, a substituted or unsubstituted quinazolinylene, a substituted or unsubstituted cinnolinylene, a substituted or unsubstituted carbazolylene, a substituted or unsubstituted phenanthridinylene, a substituted or unsubstituted acridinylene, a substituted or unsubstituted phenanthrolinylene, a substituted or unsubstituted phenazinylene, a substituted or unsubstituted benzooxazolylene, a substituted or unsubstituted benzoimidazolylene, a substituted or unsubstituted furanylene, a substituted or unsubstituted benzofuranylene, a substituted or unsubstituted thiophenylene, a substituted or unsubstituted benzothiophenylene, a substituted or unsubstituted thiazolylene, a substituted or unsubstituted isothiazolylene, a substituted or unsubstituted benzothiazolylene, a substituted or unsubstituted isoxazolylene, a substituted or unsubstituted oxazolylene, a substituted or unsubstituted triazolylene, a substituted or unsubstituted tetrazolylene, a substituted or unsubstituted oxadiazolylene, a substituted or unsubstituted triazinylene, a substituted or unsubstituted benzooxazolylene, a substituted or unsubstituted dibenzopuranylene, a substituted or unsubstituted dibenzothiophenylene, or a benzocarbazolyl group, but $Ar_{50}$ and $Ar_{51}$ are not limited thereto.

In some embodiments, in Formula 2, $Ar_{50}$ and $Ar_{51}$ may be each independently selected from:

i) a phenylene group, a naphthalene group, a fluorenylene group, a pyridinyl group, a pyrazinylene group, a pyrimidinyl group, a pyridazinyl group, a quinolinyl group, a carbazolylene group, a triazinylene group, a dibenzofuranylene group, or a dibenzothiophenylene group; or ii) a phenylene group, a naphthalene group, a fluorenylene group, a pyridinyl group, a pyrazinylene group, a pyrimidinyl group, a pyridazinyl group, a quinolinyl group, a carbazolylene group, a triazinylene group, a dibenzofuranylene group, and a dibenzothiophenylene group, substituted with one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group.

In some other embodiments, in Formula 2, $Ar_a$) and $Ar_{51}$ may be each independently selected from one of Formulas 102-1 to 102-5 below:

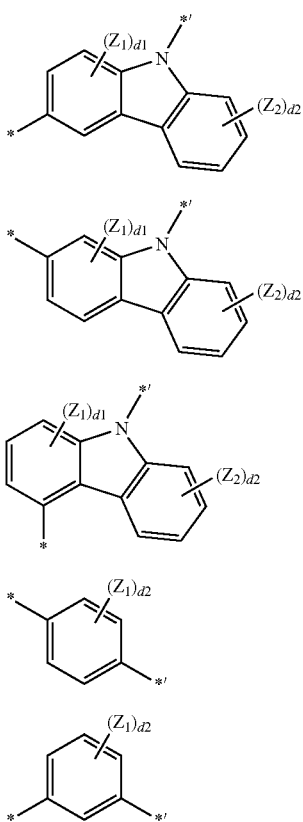

Formula 102-1

Formula 102-2

Formula 102-3

Formula 102-4

Formula 102-5

In Formulas 102-1 to 102-5, $Z_1$ and $Z_2$ may be each independently selected from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group;

$d_1$ may be an integer from 1 to 3;

$d_2$ may be an integer from 1 to 4;

* may indicate a binding site of a core of Formula 100 or a binding site of a $Ar_{50}$ or $Ar_{51}$ adjacent to the core of Formula 100; and

*' may indicate a binding site of another $Ar_{50}$ or $Ar_{51}$ that is spaced apart from the core of Formula 100 or a binding site of $Ar_{60}$ or $Ar_{61}$, but the present invention is not limited thereto.

In Formula 2, $Ar_{60}$ and $Ar_{61}$ may be each independently selected from a substituted or unsubstituted a phenyl group, a substituted or unsubstituted pentalenyl, a substituted or unsubstituted indenyl group, a substituted or unsubstituted a naphthyl group, a substituted or unsubstituted azulenyl group, a substituted or unsubstituted heptalenyl group, a substituted or unsubstituted indacenyl group, a substituted or unsubstituted acenaphthyl group, a substituted or unsubstituted a fluorenyl group, a substituted or unsubstituted spiro-fluorenyl group, a substituted or unsubstituted phenalenyl group, a substituted or unsubstituted phenanthrenyl group, a substituted or unsubstituted an anthryl group, a substituted or unsubstituted fluoranthenyl group, a substituted or unsubstituted triphenylenyl group, a substituted or unsubstituted a pyrenyl group, a substituted or unsubstituted chrysenyl group, a substituted or unsubstituted naphthacenyl group, a substituted or unsubstituted picenyl group, a substituted or unsubstituted perylenyl group, a substituted or unsubstituted pentaphenyl group, a substituted or unsubstituted hexacenyl group, a substituted or unsubstituted pyrrolyl group, a substituted or unsubstituted imidazolyl group, a substituted or unsubstituted pyrazolyl group, a substituted or unsubstituted a pyridinyl group, a substituted or unsubstituted a pyrazinyl group, a substituted or unsubstituted a pyrimidinyl group, a substituted or unsubstituted a pyridazinyl group, a substituted or unsubstituted isoindolyl group, a substituted or unsubstituted indolyl group, a substituted or unsubstituted indazolyl group, a substituted or unsubstituted purinyl group, a substituted or unsubstituted quinolinyl group, a substituted or unsubstituted benzoquinolinyl group, a substituted or unsubstituted phthalazinyl group, a substituted or unsubstituted naphthyridinyl group, a substituted or unsubstituted quinoxalinyl group, a substituted or unsubstituted quinazolinyl group, a substituted or unsubstituted cinnolinyl group, a substituted or unsubstituted a carbazolyl group, a substituted or unsubstituted phenanthridinyl group, a substituted or unsubstituted acridinyl group, a substituted or unsubstituted phenanthrolinyl group, a substituted or unsubstituted phenazinyl group, a substituted or unsubstituted benzooxazolyl group, a substituted or unsubstituted benzoimidazolyl group, a substituted or unsubstituted furanyl group, a substituted or unsubstituted benzofuranyl group, a substituted or unsubstituted thiophenyl group, a substituted or unsubstituted benzothiophenyl group, a substituted or unsubstituted thiazolyl group, a substituted or unsubstituted isothiazolyl group, a substituted or unsubstituted benzothiazolyl group, a substituted or unsubstituted isoxazolyl group, a substituted or unsubstituted oxazolyl group, a substituted or unsubstituted triazolyl group, a substituted or unsubstituted tetrazolyl group, a substituted or unsubstituted oxadiazolyl group, a substituted or unsubstituted triazinyl group, a substituted or unsubstituted benzooxazolyl group, a substituted or unsubstituted dibenzopuranyl group, a substituted or unsubstituted dibenzothiophenyl group, a substituted or unsubstituted benzocarbazolyl group, or —N($Q_{21}$)($Q_{22}$) (where $Q_{21}$ and $Q_{22}$ may be each independently selected from among a phenyl group, a naphthyl group, an anthryl group, a fluorenyl group, dimethyfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group).

In some embodiments, $Ar_{11}$ may be selected from Formulas 103-1 to 103-16 below:

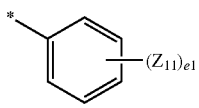

Formula 103-1

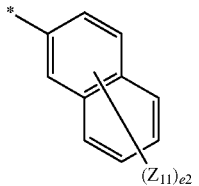

Formula 103-2

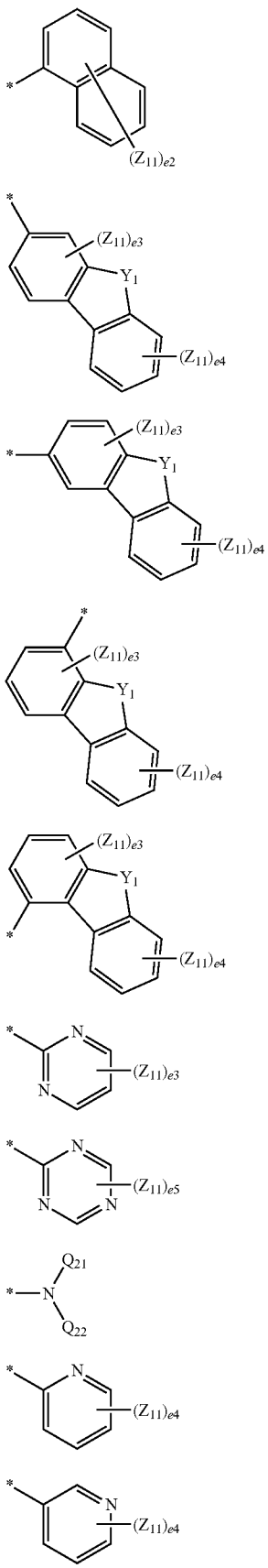

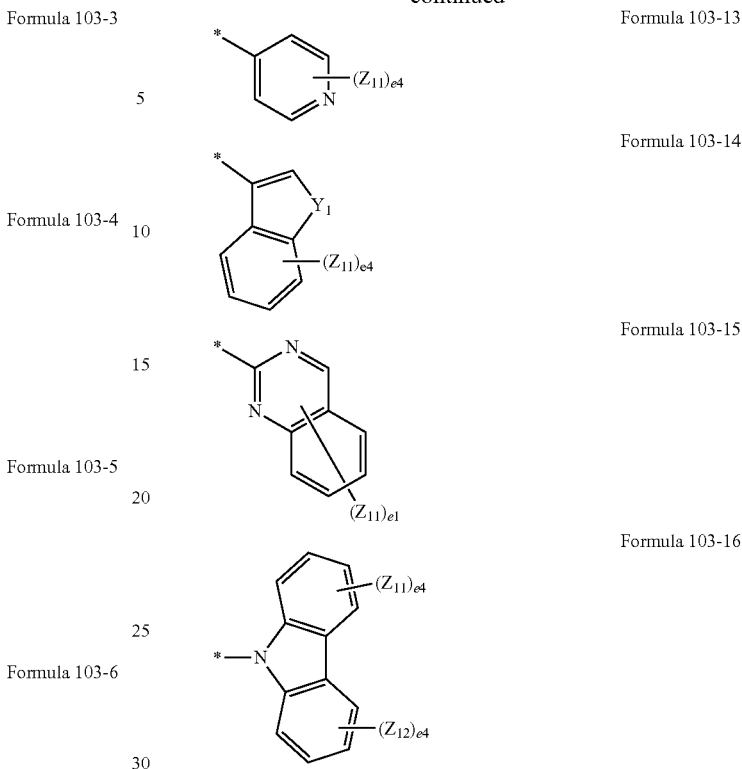

In Formula 103-1 to 103-16, $Y_1$ may be O, S, $C(Z_{21})(Z_{22})$, or $N(Z_{23})$;

$Z_{11}$, $Z_{12}$, and $Z_{21}$ to $Z_{23}$ may be each independently selected from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethyfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group;

$Q_{21}$ and $Q_{22}$ may be each independently selected from a phenyl group, a naphthyl group, an anthryl group, a fluorenyl group, a dimethyfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group;

e1 may be an integer from 1 to 5;
e2 may be an integer from 1 to 7;
e3 may be an integer from 1 to 3;
e4 may be an integer from 1 to 4; and
e5 may be an integer of 1 or 2, but the present invention is not limited thereto.

In Formula 2, p in $-(Ar_{50})_p-(Ar_{60})$ indicates the number of $Ar_{50}$ groups, and may be an integer of 0 to 5. When p is 0, $Ar_{50}$ is directly linked to N in Formula 2. When p is 2 or greater, the at least two $Ar_{50}$ groups may be identical to or different from each other. In Formula 2, q in $-(Ar_{51})_q-(Ar_{61})$ may indicate the number of $Ar_{51}$ groups, and may be an integer of 0 to 5. When q is 0, $Ar_{51}$ is directly linked to the core of Formula 2. When q is 2 or greater, the at least two Ar$_{51}$ groups may be identical to or different from each other.

For example, the second compound may be represented by Formulas 100A-1(1), 100A-6(1), 100A-7(1), 100A-8(1), 100B-1(1), 100B-6(1), 100B-7(1), or 100B-8(1) below:

<Formula 100A-1(1)>

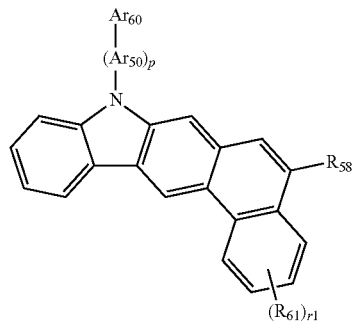

<Formula 100A-6(1)>

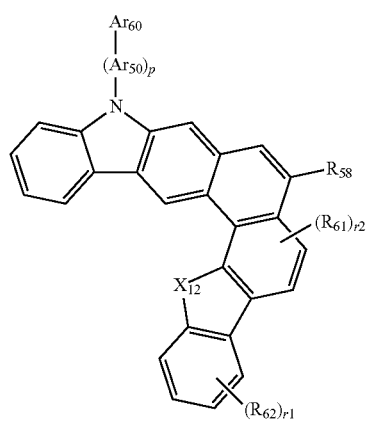

<Formula 100A-7(1)>

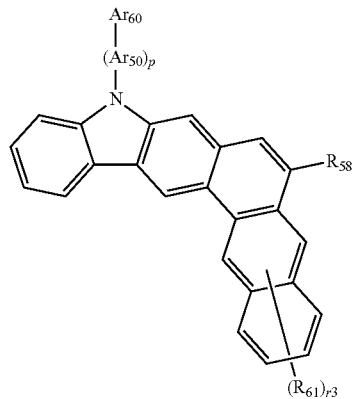

<Formula 100A-8(1)>

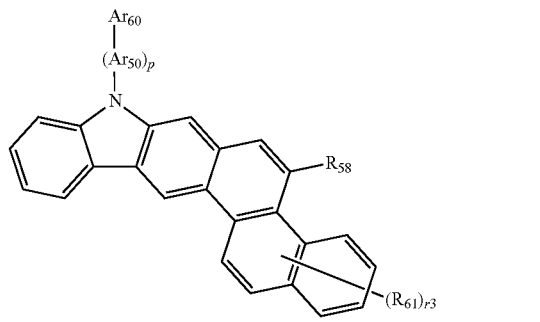

<Formula 100B-1(1)>

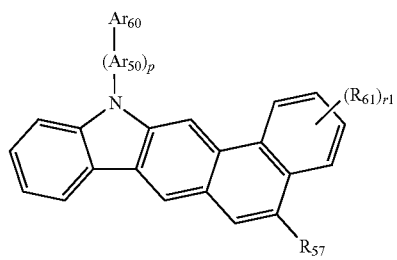

<Formula 100B-6(1)>

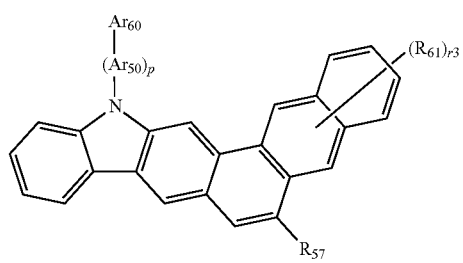

<Formula 100B-7(1)>

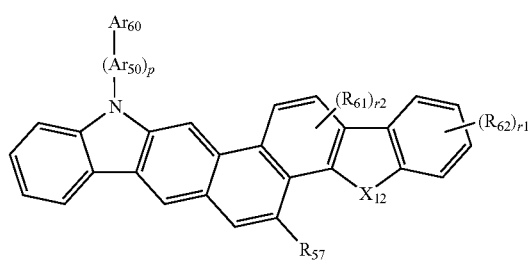

<Formula 100B-8(1)>

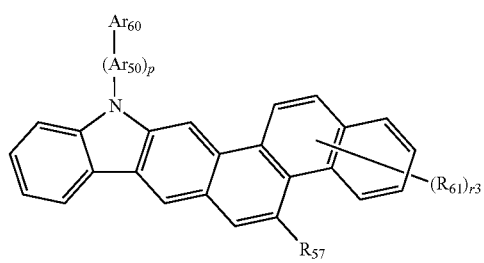

In Formula 100A-1(1), 100A-6(1), 100A-7(1), 100A-8(1), 100B-1(1), 100B-6(1), 100B-7(1), and 100B-8(1), $R_{56}$ to $R_{59}$ may be each independently a substituent represented by —(Ar$_{51}$)$_q$-(Ar$_{61}$), and Ar$_{50}$, Ar$_{51}$, Ar$_{60}$, Ar$_{61}$, p, and q are as defined above.

For example, 100A-1(1), 100A-6(1), 100A-7(1), 100A-8(1), 100B-1(1), 100B-6(1), 100B-7(1), and 100B-8(1), $R_{56}$ to $R_{59}$ may be each independently a substituent represented by $—(Ar_{51})_q-(Ar_{61})$; $Ar_{50}$ and $Ar_{51}$ may be each independently selected from Formulas 102-1 to 102-5; p and q may be each independently an integer of 0 to 3; $Ar_{60}$ and $Ar_{61}$ may be each independently selected from Formulas 103-1 to 103-16.

The second compound may be represented by Formulas 100A-H1, 100A-H2, 100B-H1, or 100B-H2 below:

<Formula 100A-H1>

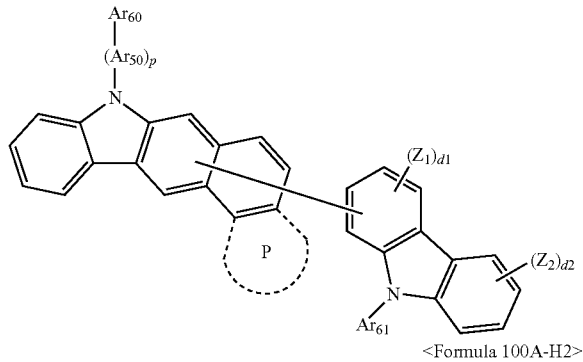

<Formula 100A-H2>

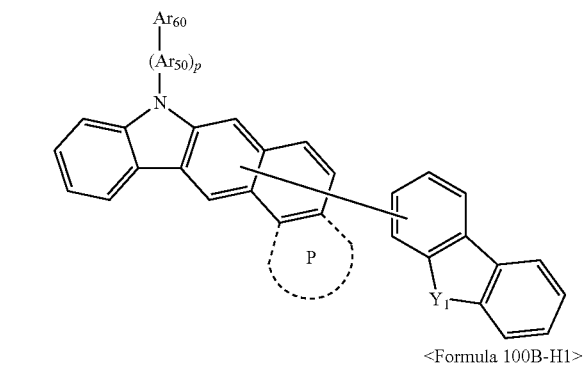

<Formula 100B-H1>

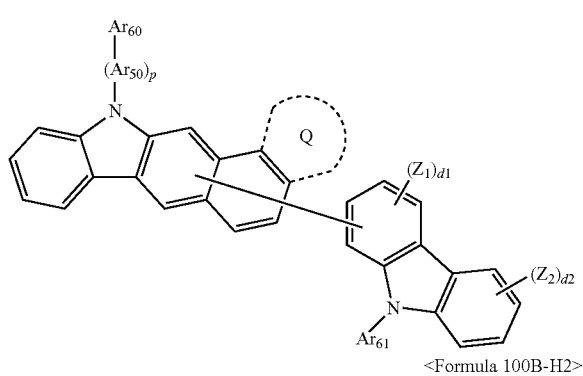

<Formula 100B-H2>

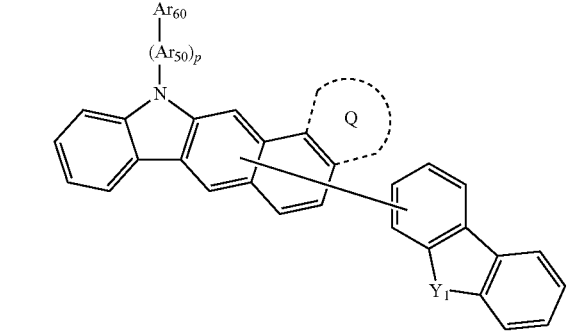

In Formulas 100A-H1, 100A-H2, 100B-H1, and 100B-H2, the ring P, the ring Q, $Ar_{50}$, $Ar_{60}$, $Z_1$, $Ar_{61}$, $Z_2$, d1, d2, and $Y_1$ are as defined above.

For example, in Formulas 100A-H1, 100A-H2, 100B-H1, or 100B-H2, the P ring and the Q ring may be each independently selected from:

i) benzene, naphthalene, fluorene, carbazole, dibenzofuran, or dibenzothiophene; or ii) benzene, naphthalene, fluorene, carbazole, dibenzofuran, or dibenzothiophene substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, or a $C_1$-$C_{20}$ alkoxy group;

a $C_1$-$C_{20}$ alkyl group or a $C_1$-$C_{60}$ alkoxy group substituted from at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, or a phosphoric acid group or a salt thereof;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, or an isoquinolinyl group;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, dimethyfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group; or $—N(Q_{11})(Q_{12})$ (where $Q_{11}$ and $Q_{12}$ may be each independently a phenyl group, a naphthyl group, an anthryl group, a fluorenyl group, dimethyfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group);

$Z_1$ and $Z_2$ may be each independently selected from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethyfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group;

$d_1$ may be an integer from 1 to 3;
$d_2$ may be an integer from 1 to 4;
$Y_1$ may be O or S; and Ar$_{61}$ may be selected from Formulas 103-1 to 103-16 above, but the present invention is not limited thereto.
In some embodiments, the second compound may include at least one of Compounds H1 to H64 below:
H1
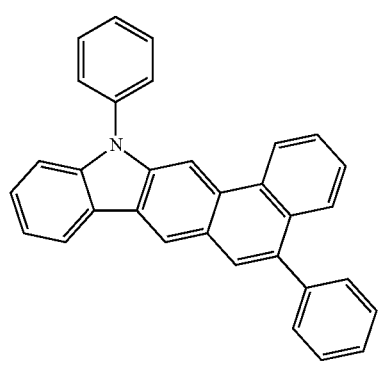
H2
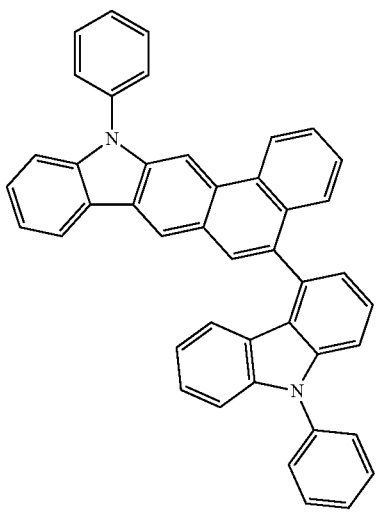
H3
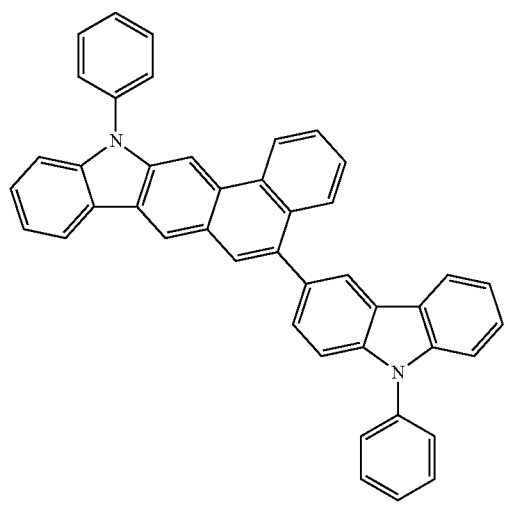
H4
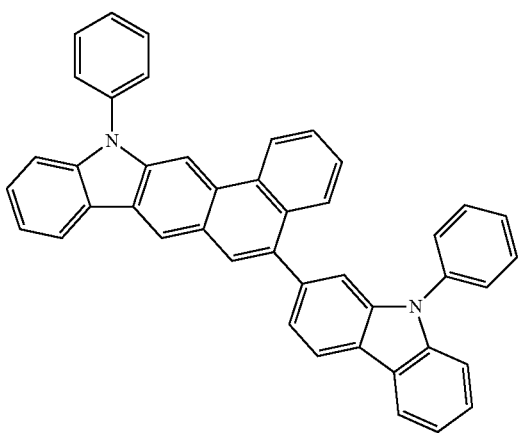
H5
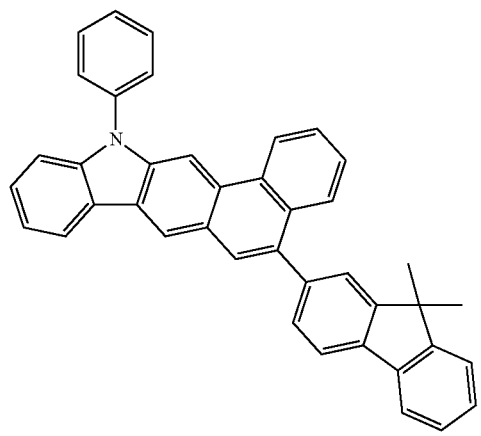
H6
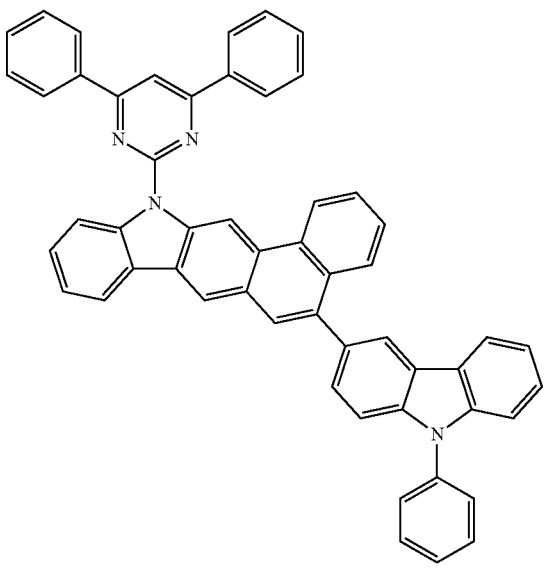

-continued
H7
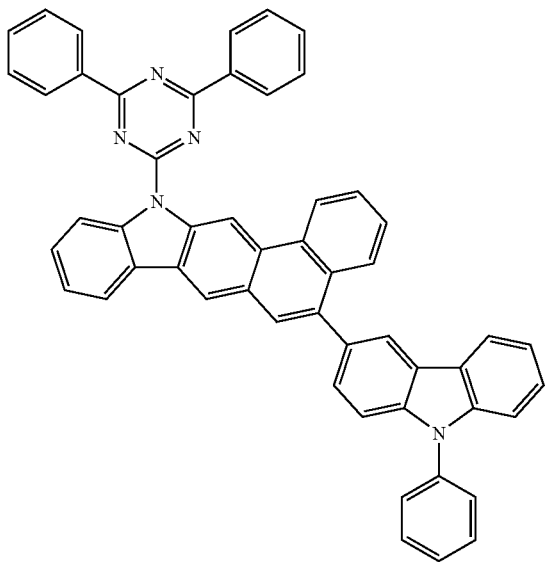
H8
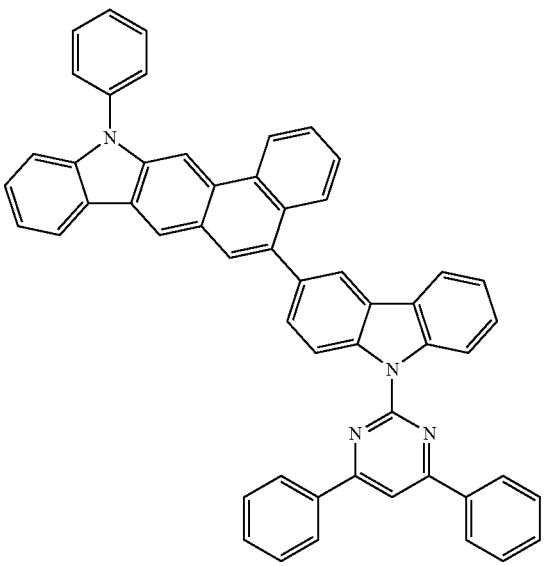
H9
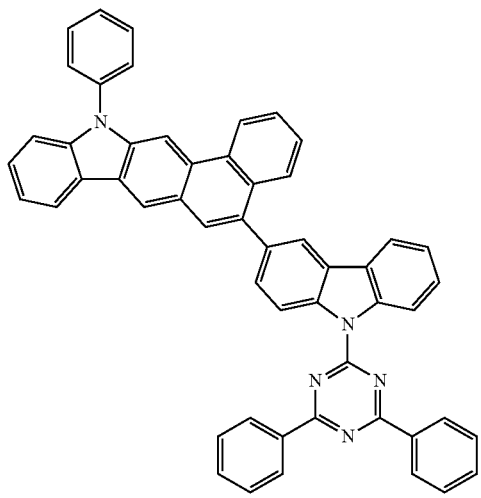
H10
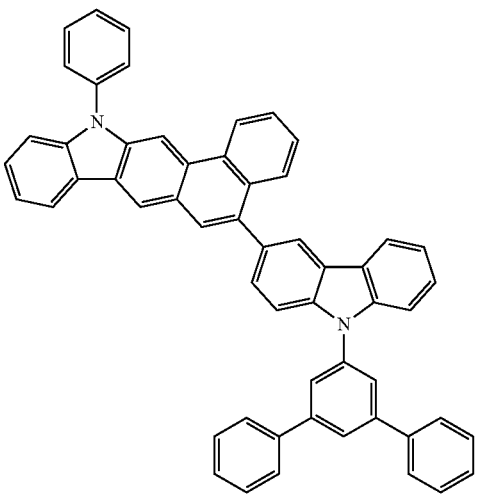

-continued
H11
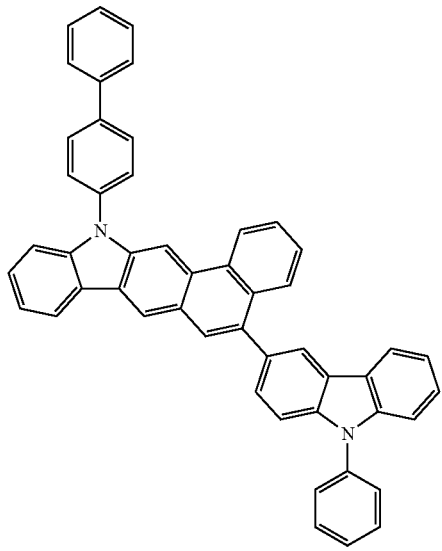
H12
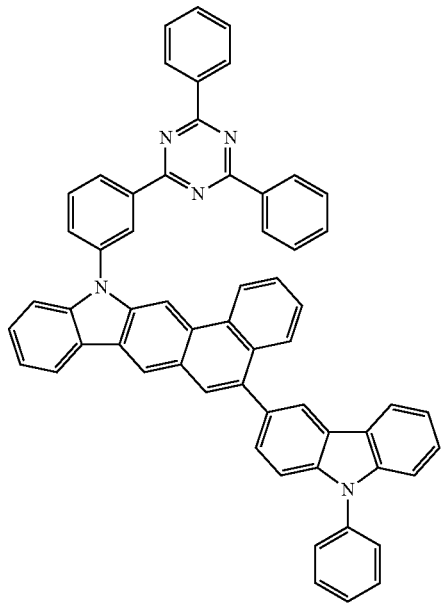
H13
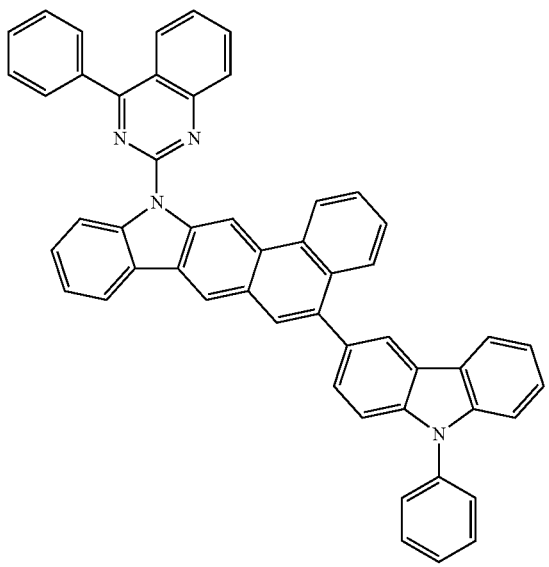
H14
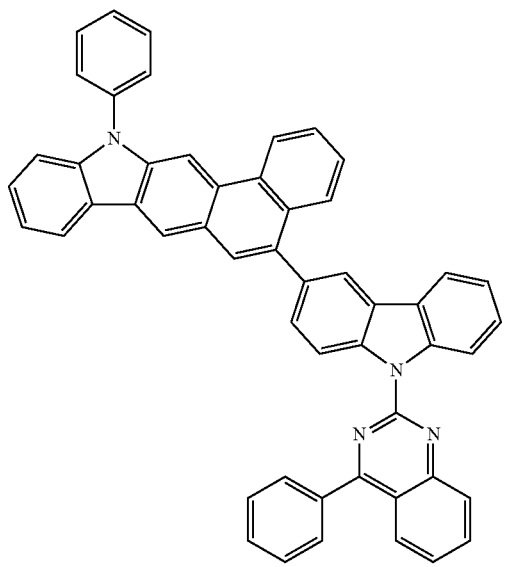

-continued
H15
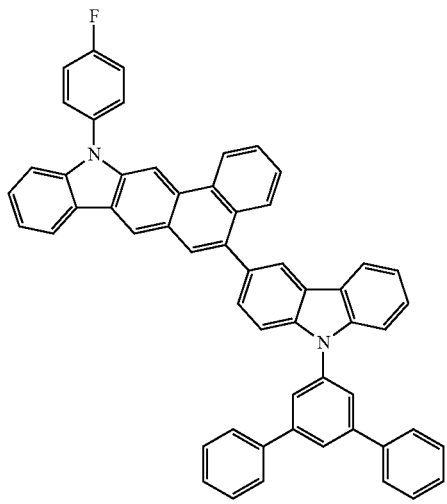
H16
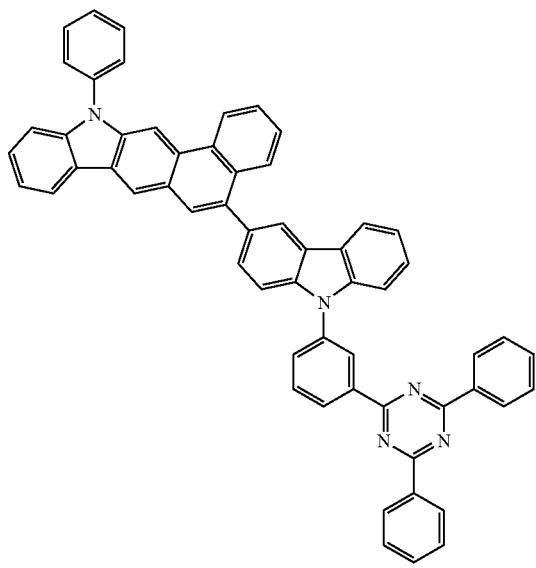
H17
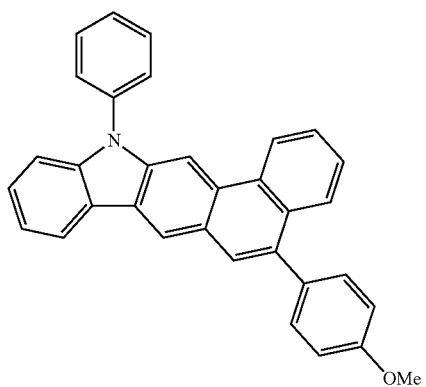
H18
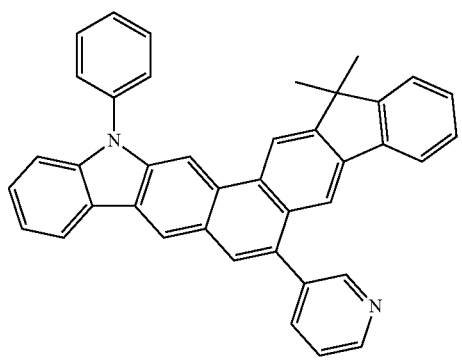
H19
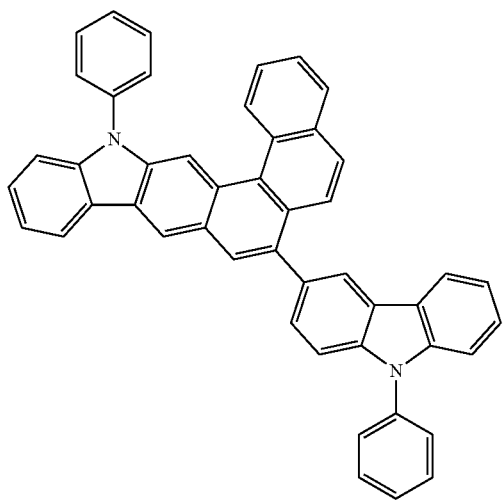
H20
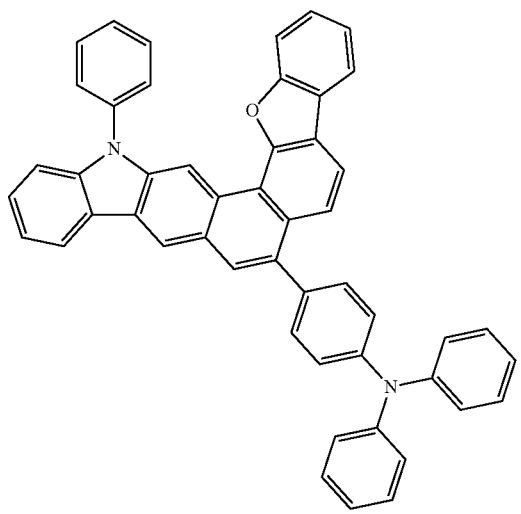

-continued
H21
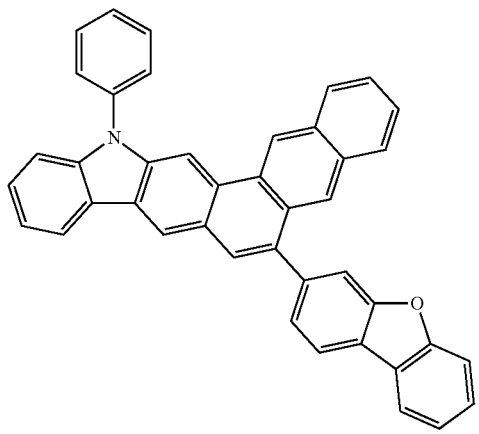
H22
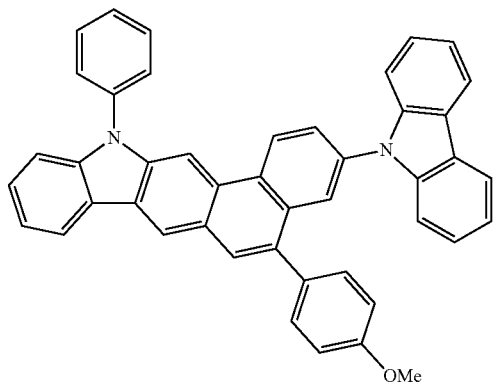
H23
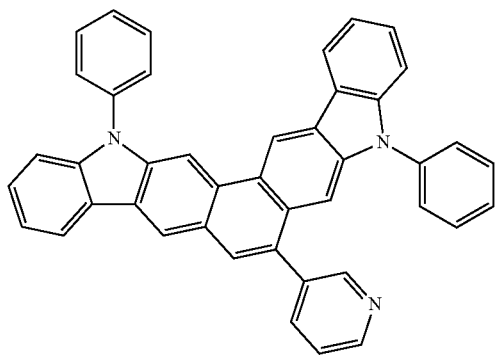
H24
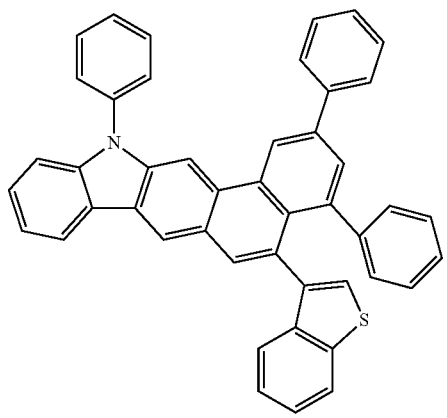
H25
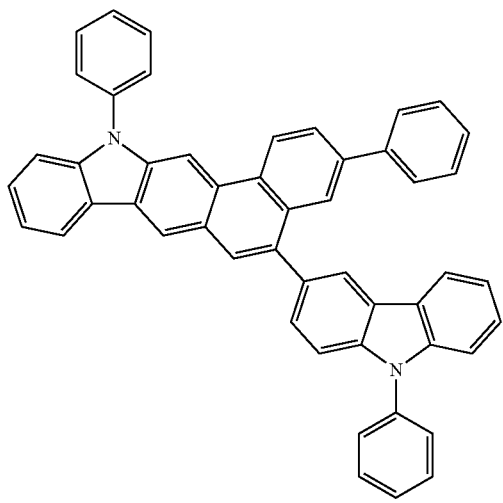
H26
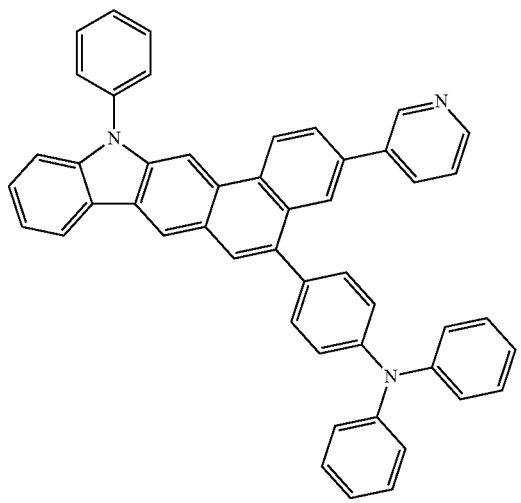

-continued
H27
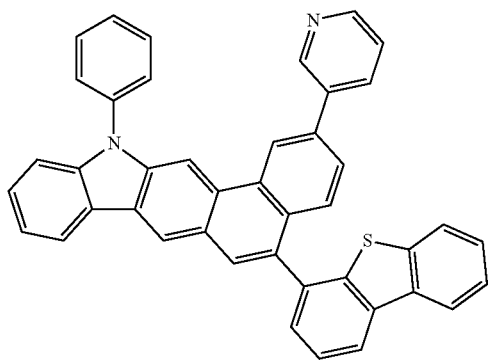
H28
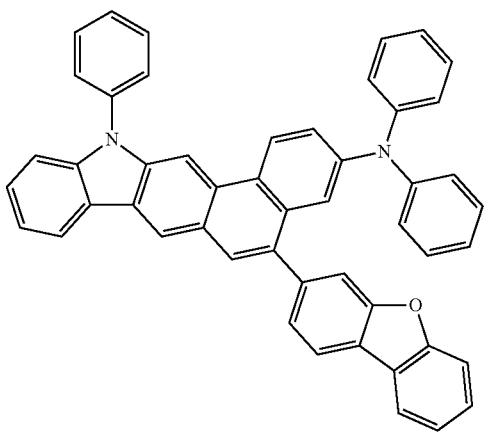
H29
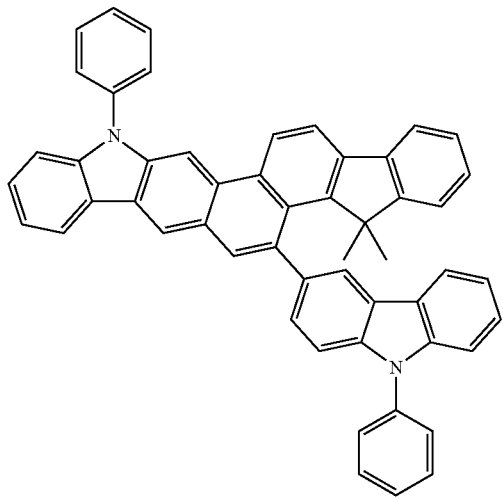
H30
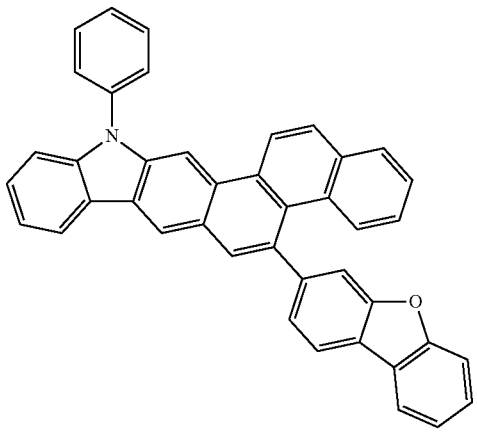
H31
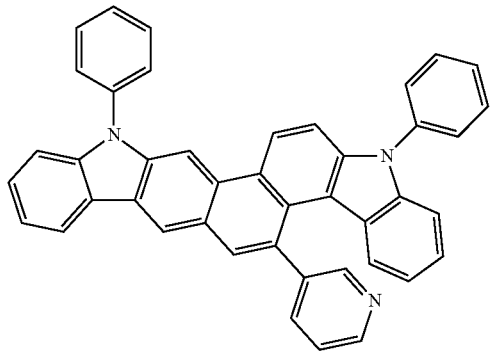
H32
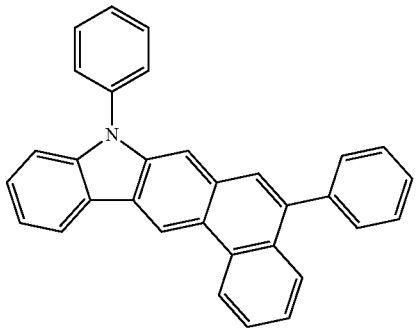
H33
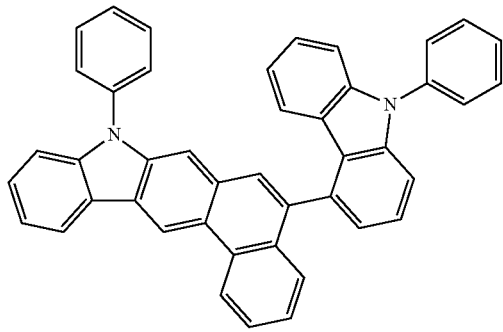
H34
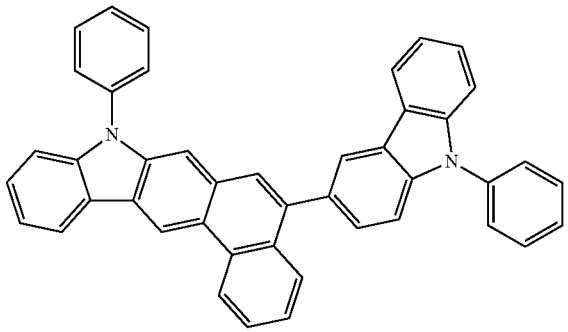

-continued
H35
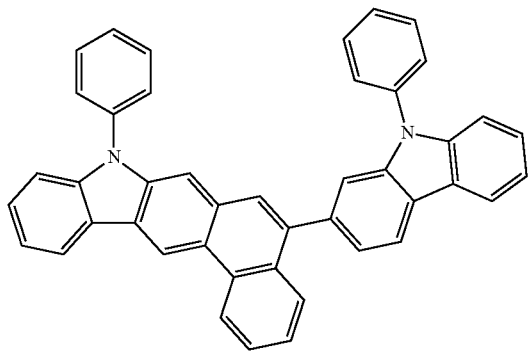
H36
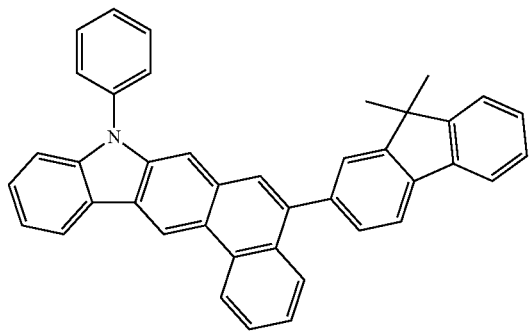
H37
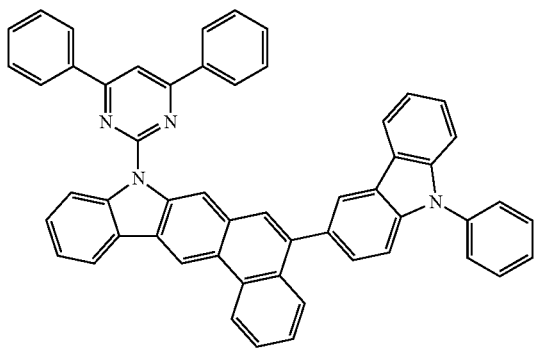
H38
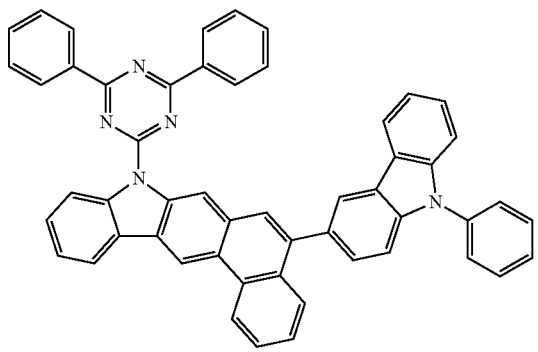
H39
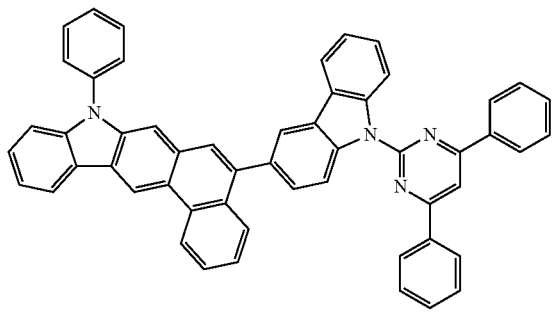
H40
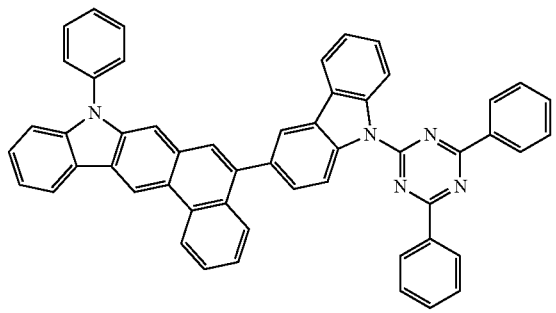
H41
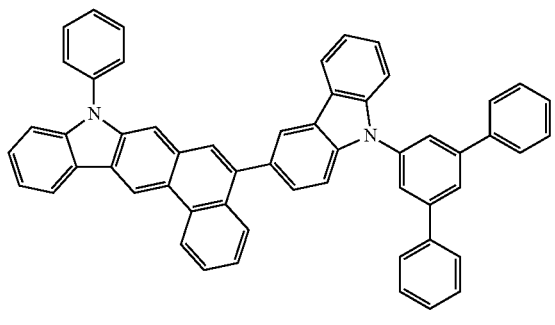
H42
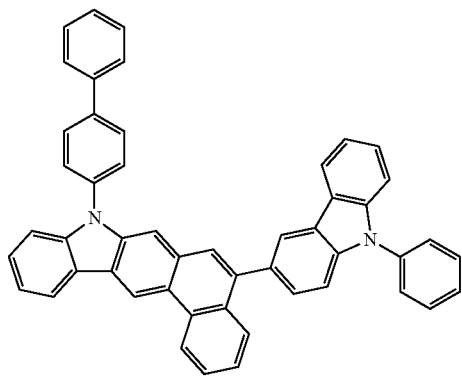

-continued
H43
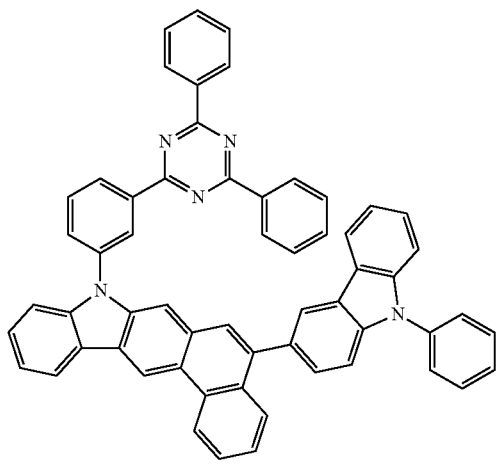
H44
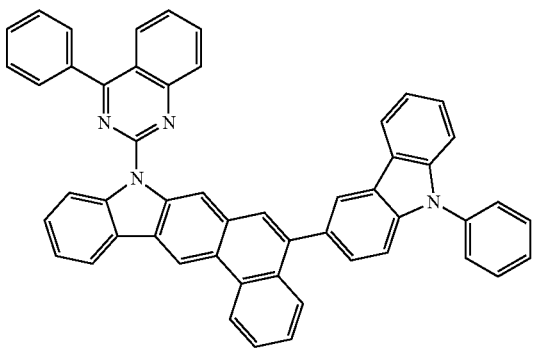
H45
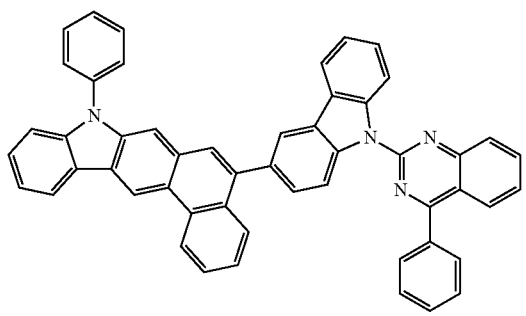
H46
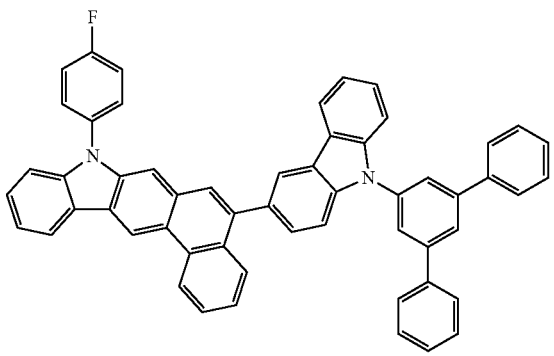
H47
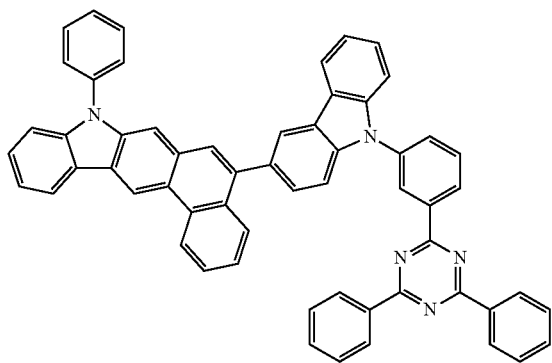
H48
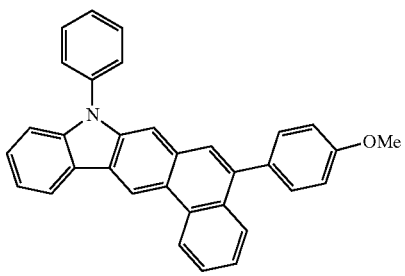

-continued
H49
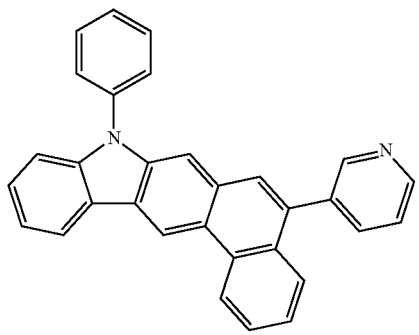
H50
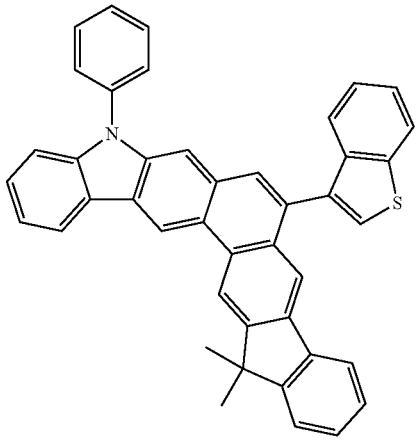
H51
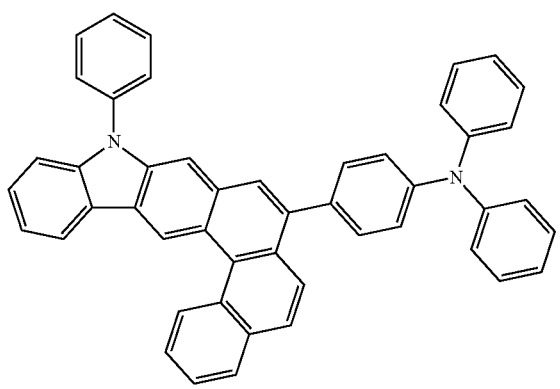
H52
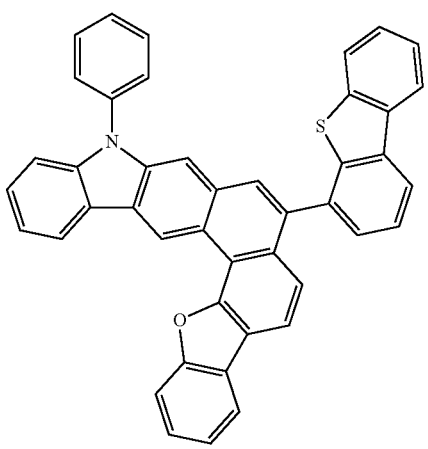
H53
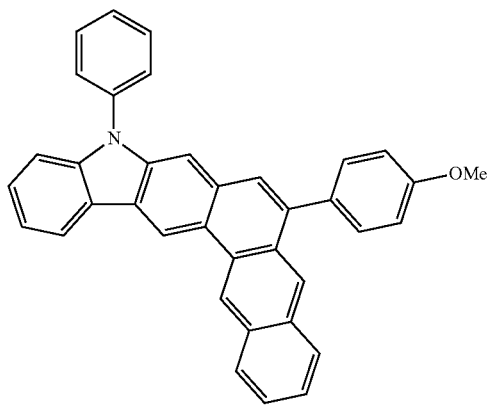
H54
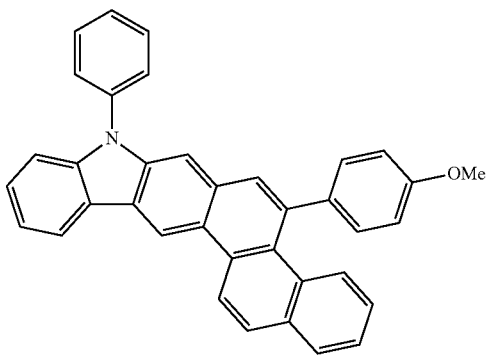

-continued
H55
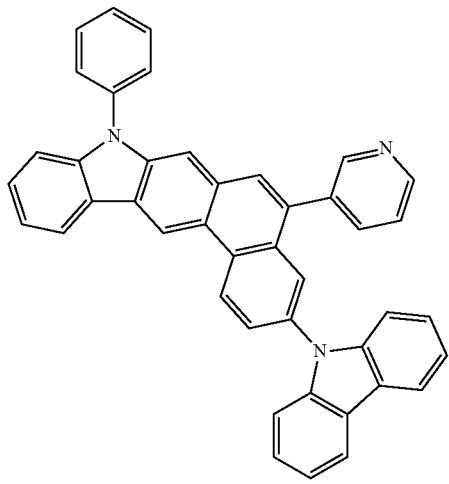
H56
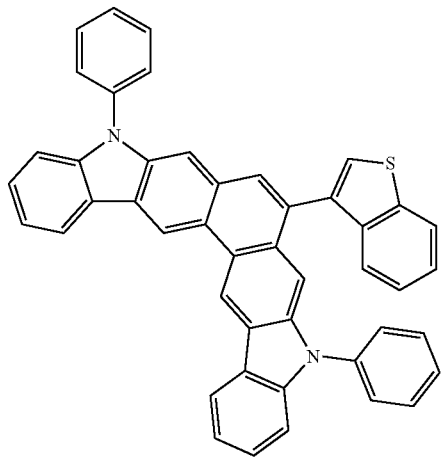
H57
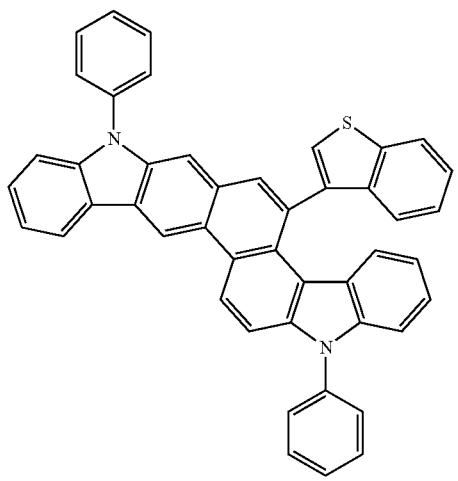
H58
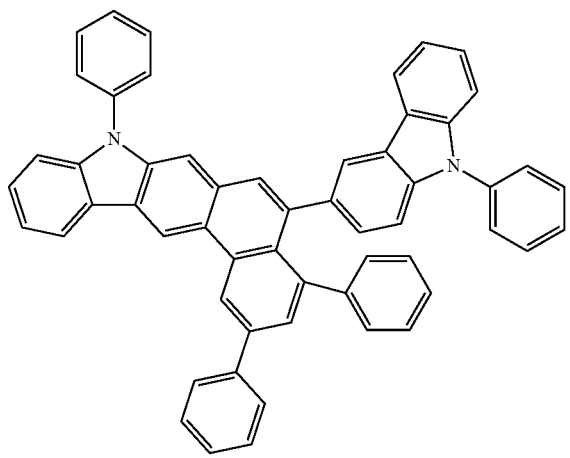
H59
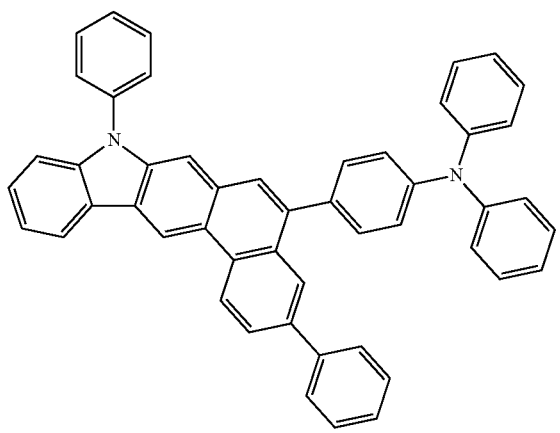
H60
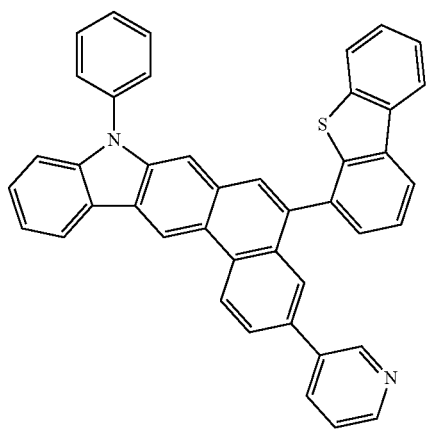

H61
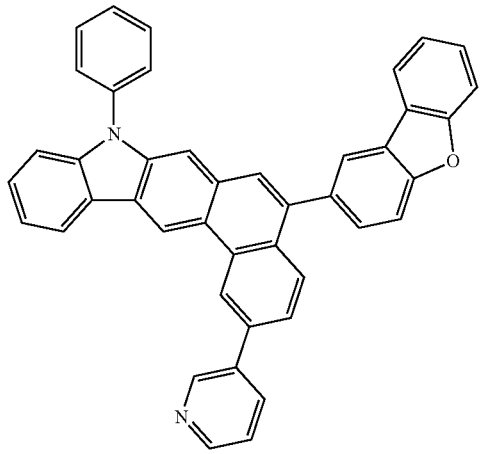

H62
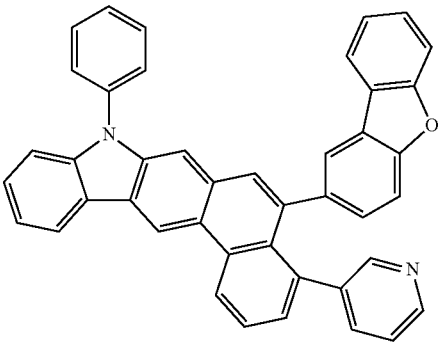

H63
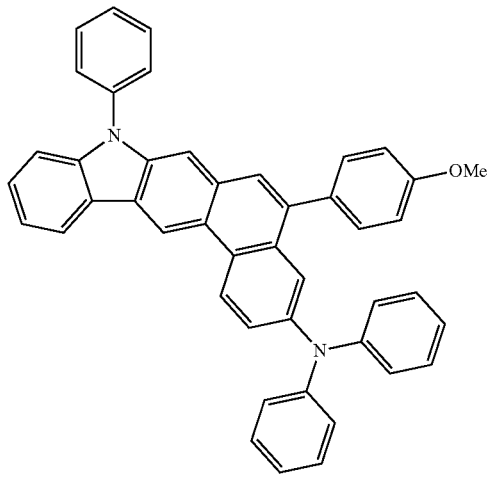

H64
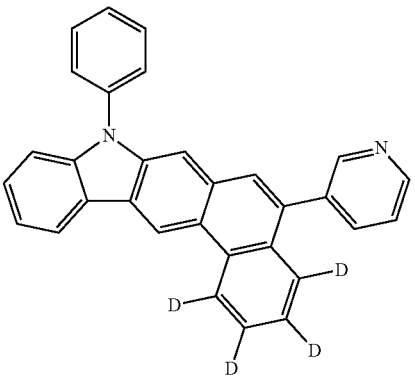

The second compound may have a high charge transporting ability and a high light-emitting efficiency. Also, the second compound may have a high energy gap between the highest occupied molecular orbital (HOMO) and the lowest unoccupied molecular orbital (LUMO), and thus easy energy level adjustment may be achieved using the second compound. Therefore, when using the second compound and the above-described first compound together as materials for formation of the EML material, an OLED may have improved efficiency and lifetime characteristics.

The EML in the OLED may include a dopant and a host. The EML may include the first compound as a dopant and the second compound as a host. The combination of the first compound as a dopant and the second compound as a host in the EML may be chosen arbitrarily within the ranges described herein.

For example, the dopant of the EML may include the first compound represented by Formula 1(1) above, and the host of the EML may include the second compound represented by Formula 100A or Formula 100B, but the host and dopant are not limited thereto.

In some embodiments, the dopant of the EML may include the first compound represented by one of Formulas 1A to 1R above, and the host of the EML may include the second compound represented by one of 100A-1 to 100A-8 and 100B-1 to 100B-8 above, but the host and dopant are not limited thereto.

In some embodiments, the dopant of the EML may include at least one of Compounds D1 to D35 above, and the host of the EML may include at least one of Compounds H1 to H64 above, but the host and dopant are not limited thereto.

The dopant of the EML may include the above-described first compound, and thus the EML may have light-emitting ability by a phosphorescent light-emitting mechanism. The EML may have light-emitting ability to emit red light, green light, and/or blue light. For example, the EML may emit red or green light.

The first compound of Formula 1 and the second compound of Formula 100 may be synthesized using any known organic synthesis method. The synthesis method of the first compound and second compound will be discernible to those of ordinary skill in the art by reference to the Examples described below.

The EML may further include another dopant other than the first compound, and another host other than the second compound.

The amount of the dopant in the EML may be, but is not limited to, about 0.01 to about 15 parts by weight based on 100 parts by weight of the host.

The thickness of the EML may be about 100 Å to about 1000 Å, and in some embodiments, may be about 200 Å to about 600 Å. When the thickness of the EML is within these ranges, the EML may have improved light-emitting ability without a substantial increase in driving voltage.

Then, a hole blocking layer (HBL) may be disposed on the EML in order to prevent diffusion of triplet excitons or holes into the ETL. When the HBL is formed using vacuum deposition or spin coating, the conditions for deposition or coating may be similar to those described above for the formation of the HIL, although the conditions for deposition or coating may vary depending on the material that is used to form the HBL. Any hole-blocking material may be used. Examples of hole-blocking materials include oxadiazole derivatives, triazole derivatives, and phenanthroline derivatives. For example, bathocuproine (BCP) represented by the following formula may be used as a material for forming the HBL:

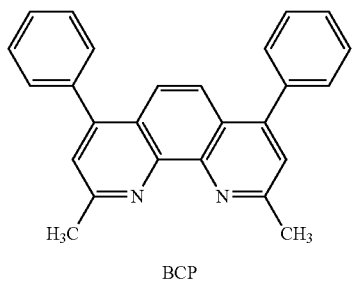

BCP

The thickness of the HBL may be about 20 Å to about 1000 Å, and in some embodiments, may be about 30 Å to about 300 Å. When the thickness of the HBL is within these ranges, the HBL may have improved hole blocking ability without a substantial increase in driving voltage.

Then, an electron transport layer (ETL) may be formed on the HBL using any of a variety of methods, such as vacuum deposition, spin coating, or casting. When the ETL is formed using vacuum deposition or spin coating, the conditions for deposition or coating may be similar to those described above for the formation of the HIL, although the conditions for the deposition or coating may vary depending on the material that is used to form the ETL. A material for forming the ETL may be any material that can stably transport electrons injected from the electron injecting electrode (cathode). Examples of materials for forming the ETL are a quinoline derivative, such as tris(8-quinolinorate)aluminum ($Alq_3$), TAZ, BAlq, beryllium bis(benzoquinolin-10-olate) ($Bebq_2$), 9,10-di(naphthalene-2-yl)anthracene (ADN), Compound 201, and Compound 202, but the material for forming the ETL is not limited thereto:

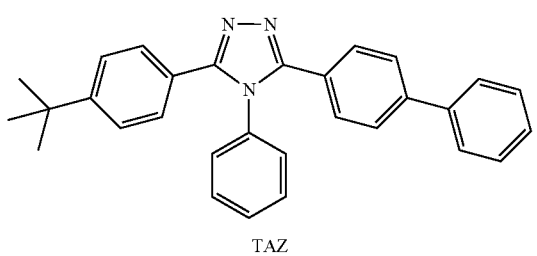

TAZ

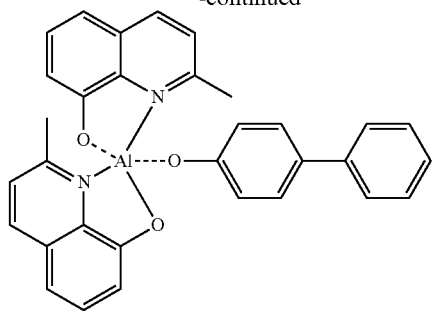

BAlq

<Compound 201>

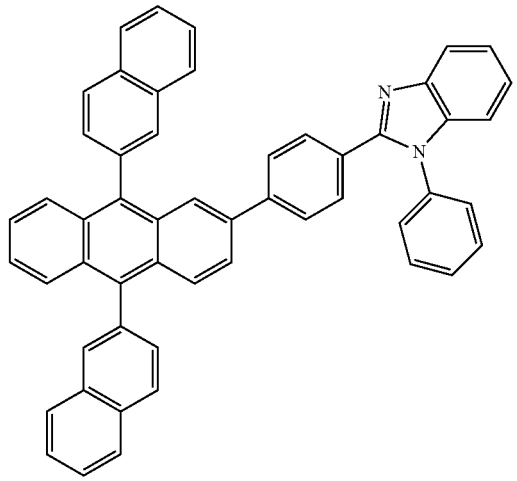

<Compound 202>

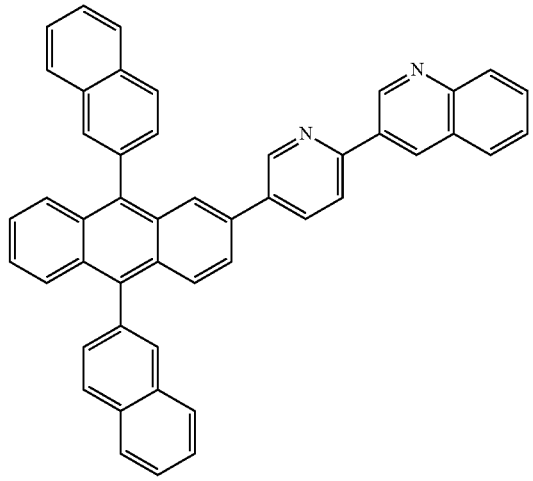

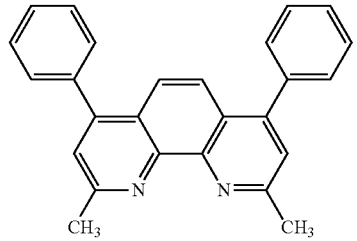

BCP

The thickness of the ETL may be about 100 Å to about 1,000 Å, and in some embodiments, may be about 150 Å to about 500 Å. When the thickness of the ETL is within these ranges, the ETL may have satisfactory electron transporting ability without a substantial increase in driving voltage.

In some embodiments the ETL may further include a metal-containing material, in addition to the electron-transporting organic compound.

The metal-containing material may include a lithium (Li)-containing compound. Non-limiting examples of the Li-containing compound include lithium quinolate (LiQ) and Compound 203 below:

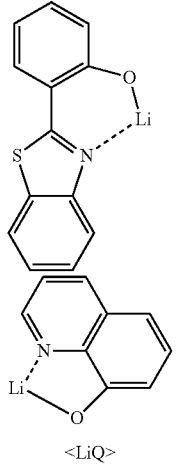

<Compound 203>

<LiQ>

Then, an EIL, which facilitates injection of electrons from the cathode, may be formed on the ETL. Any suitable electron-injecting material may be used to form the EIL.

Examples of materials for forming the EIL include LiF, NaCl, CsF, $Li_2O$, and BaO. The deposition or coating conditions for forming the EIL 18 may be similar to those described above for the formation of the HIL, although the deposition or coating conditions may vary depending on the material that is used to form the EIL.

The thickness of the EIL may be about 1 Å to about 100 Å, and in some embodiments, may be about 3A to about 90A. When the thickness of the EIL is within these ranges, the EIL may have satisfactory electron injection ability without a substantial increase in driving voltage.

The second electrode 17 may be a cathode, which is an electron injection electrode. A metal material for forming the second electrode 17 may be a metal, an alloy, or an electro-conductive compound, which have low work functions, or a mixture thereof. The second electrode 17 may be formed of lithium (Li), magnesium (Mg), aluminum (Al), aluminum-lithium (Al—Li), calcium (Ca), magnesium (Mg)-indium (In), magnesium-silver (Mg—Ag), or the like, and may be formed as a thin film type transmission electrode.

Although the OLED of FIG. 1 is described above, the present invention is not limited thereto.

As used herein, the unsubstituted $C_1$-$C_{60}$ alkyl group (or $C_1$-$C_{60}$ alkyl group) may be a linear or branched $C_1$-$C_{60}$ alkyl group, including a methyl group, an ethyl group, a propyl group, an isobutyl group, a sec-butyl group, a pentyl group, an iso-amyl group, or a hexyl group. The substituted $C_1$-$C_{60}$ alkyl group may be a $C_1$-$C_{60}$ alkyl group in which at least one hydrogen atom is substituted with at least one selected from a deuterium atom, a halogen atom, a hydroxyl group, a nitro group, a cyano group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_6$-$C_{60}$ aryl group, $C_2$-$C_{60}$ heteroaryl group, —N($Q_{11}$)($Q_{12}$), or a —Si($Q_{13}$)($Q_{14}$)($Q_{15}$) (where $Q_{11}$ to $Q_{15}$ may be each independently a hydrogen atom, a $C_1$-$C_{60}$alkyl group, a $C_2$-$C_{60}$ alkenyl group, a $C_2$-$C_{60}$ alkynyl group, a $C_5$-$C_{60}$aryl group, or a $C_2$-$C_{60}$heteroaryl group).

The unsubstituted $C_1$-$C_{60}$ alkoxy group (or $C_1$-$C_{60}$ alkoxy group) may be a group represented by —OA, where A is an unsubstituted $C_1$-$C_{60}$ alkyl group, described above. Examples of the unsubstituted $C_1$-$C_{60}$ alkoxy group include a methoxy group, an ethoxy group, and an isopropyloxy group. The unsubstituted $C_1$-$C_{60}$ alkoxy group refers to the substitution of at least one of the hydrogen atoms in the alkoxy group with the substituents described above in connection with the substituted $C_1$-$C_{60}$ alkyl group.

The unsubstituted $C_2$-$C_{60}$ alkenyl group (or $C_2$-$C_{60}$ alkenyl group) is a $C_2$-$C_{60}$ alkyl group having at least one carbon-carbon double bond in the center or at a terminal end thereof. Examples of the alkenyl group include an ethenyl group, a propenyl group, a butenyl group, and the like. The substituted $C_2$-$C_{60}$ alkenyl group refers to the substitution of at least one hydrogen atom in the unsubstituted $C_2$-$C_{60}$ alkenyl group with the substituents described above in connection with the substituted $C_1$-$C_{60}$ alkyl group.

The unsubstituted $C_2$-$C_{60}$ alkynyl group (or $C_2$-$C_{60}$ alkynyl group) is a $C_2$-$C_{60}$ alkyl group having at least one carbon-carbon triple bond in the center or at a terminal end thereof. Examples of the unsubstituted $C_2$-$C_{60}$ alkynyl group (or $C_2$-$C_{60}$ alkynyl group) include an ethynyl group, a propynyl group, and the like. The substituted $C_2$-$C_{60}$ alkynyl group refers to the substitution of at least one hydrogen atom in the alkynyl group with the substituents described above in connection with the substituted $C_1$-$C_{60}$ alkyl group.

The unsubstituted $C_6$-$C_{60}$ aryl group is a monovalent carbocyclic aromatic system having 6 to 60 carbon atoms including at least one aromatic ring. The unsubstituted $C_5$-$C_{60}$ arylene group is a divalent carbocyclic aromatic system having 6 to 60 carbon atoms including at least one aromatic ring. When the aryl group or the arylene group has at least two rings, the rings may be fused to each other or connected to each other via a single bond. The substituted $C_5$-$C_{60}$ aryl group or substituted $C_5$-$C_{60}$ arylene group refers to the substitution of at least one hydrogen atom in the aryl group or the arylene group with the substituents described above in connection with the $C_1$-$C_{60}$ alkyl group.

Examples of the substituted or unsubstituted $C_6$-$C_{60}$ aryl group include a phenyl group, a $C_1$-$C_{10}$ alkylphenyl group (e.g., an ethylphenyl group), a $C_1$-$C_{10}$ alkylbiphenyl group (e.g., an ethylbiphenyl group), a halophenyl group (e.g., an o-, m- or p-fluorophenyl group or a dichlorophenyl group), a dicyanophenyl group, a trifluoromethoxyphenyl group, an o-, m- or p-tolyl group, an o-, m- or p-cumenyl group, a mesityl group, a phenoxyphenyl group, a (α,α-dimethylbenzene)phenyl group, a (N,N'-dimethyl)aminophenyl group, a (N,N'-diphenyl)aminophenyl group, a pentalenyl group, an indenyl group, a naphthyl group, a halonaphthyl group (e.g., a fluoronaphthyl group), a $C_1$-$C_{10}$ alkylnaphthyl group (e.g., a methylnaphthyl group), a $C_1$-$C_{10}$ alkoxynaphthyl group (e.g., a methoxynaphthyl group), an anthracenyl group, an azulenyl group, a heptalenyl group, an acenaphthalenyl group, a phenalenyl group, a fluorenyl group, an anthraquinolyl group, a methylanthryl group, a phenanthryl group, a triphenylenyl group, a pyrenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coronenyl group, a trinaphthalenyl group, a heptaphenyl group, a heptacenyl group, a pyranthrenyl group, and an ovalenyl group. Examples of the substituted $C_6$-$C_{60}$ aryl group may be inferred from the examples of the unsubstituted $C_6$-$C_{60}$ aryl group and the substituted $C_1$-$C_{30}$ alkyl group, described above. Examples of the substituted or unsubstituted $C_5$-$C_{60}$ arylene group may be inferred from the examples of the substituted or unsubstituted $C_6$-$C_{60}$ aryl group, described above.

The unsubstituted $C_2$-$C_{60}$ heteroaryl group is a monovalent carbocyclic aromatic system having at least one aromatic ring and at least one heteroatom selected from N, O, P, and S. The unsubstituted $C_2$-$C_{60}$ heteroarylene group is a divalent carbocyclic aromatic system having at least one aromatic ring and at least one heteroatom selected from N, O, P, and S. When the heteroaryl group or the heteroarylene group has at least two rings, the rings may be fused to each or connected to each other via a single bond. The substituted $C_2$-$C_{60}$ heteroaryl group or $C_2$-$C_{60}$ heteroarylene group refers to the substitution of at least one hydrogen atom in the heteroaryl group or the heteroarylene group with the substituents described above with respect to the $C_1$-$C_{60}$ alkyl group.

Examples of the unsubstituted $C_2$-$C_{60}$ heteroaryl group include a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, a benzoimidazolyl group, an imidazopyridinyl group and an imidazopyrimidinyl group. Examples of the substituted or unsubstituted $C_2$-$C_{60}$ heteroarylene group may be inferred from the examples of the substituted or unsubstituted $C_2$-$C_{60}$ arylene group, described above.

The substituted or unsubstituted $C_6$-$C_{60}$ aryloxy group is represented by $OA_2$ (where $A_2$ is a substituted or unsubstituted $C_6$-$C_{60}$ aryl group, described above). The substituted or unsubstituted $C_5$-$C_{60}$ arylthiol group is represented by —$SA_3$ (where $A_3$ is a substituted or unsubstituted $C_6$-$C_{60}$ aryl group, described above).

Hereinafter, the present invention will be described with reference to the following synthesis examples and other examples. However, these examples are presented for illustrative purposes only and are not intended to limit the scope of the present invention.

SYNTHESIS EXAMPLE

Synthesis Example 1

Synthesis of Compound D5

Compound D5 was synthesized according to Reaction Scheme 1 below:

<Reaction Scheme 1>

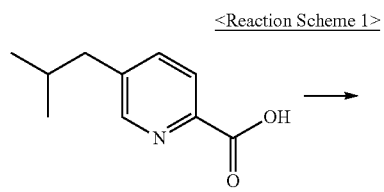

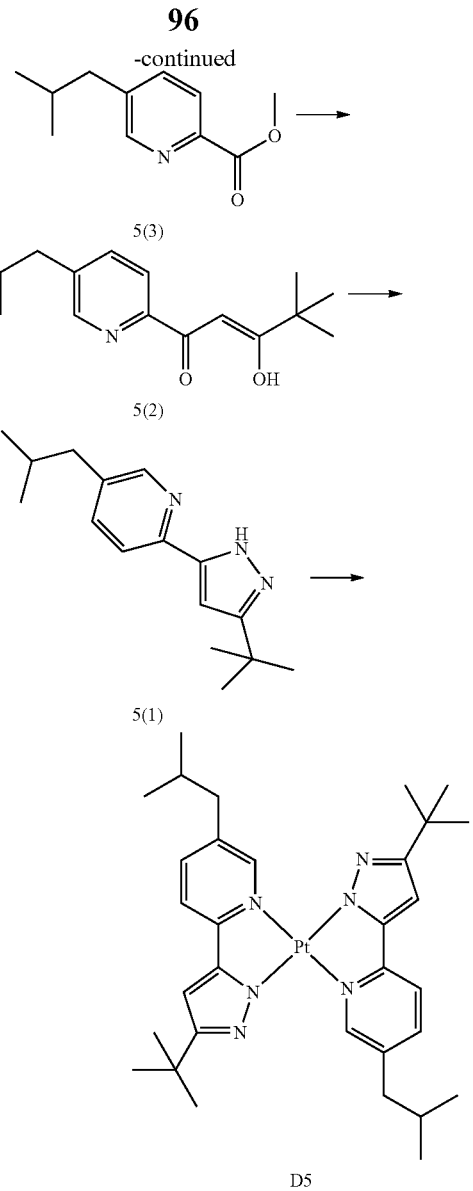

Synthesis of Intermediate 5(3)

After 25.7 g (143.6 mmol) of 5-isobutyl-pyridine-2-carboxylic acid was dissolved in 100 mL of methanol, 5 mL of a concentrated sulfuric acid was added to the solution and the solution was heated under reflux at a temperature of about 80° C. for about 18 hours. After completion of the reaction, the reaction mixture was concentrated under reduced pressure, and mixed with 100 mL of dichloromethane. A saturated sodium hydrogen carbonate aqueous solution was slowly added into the resulting mixture at a temperature of about 0° C. for alkalization and then extracted to collect the organic layer, which was then dried using magnesium sulfate, followed by distillation under reduced pressure to obtain 26.0 g (137.8 mmol) of Intermediate 31(2) (Yield: 96%).

LC-MS m/z=194 (M+H)$^+$ $^1$H NMR (500 MHz, CDCl$_3$) δ=8.87 (s, 1H), 8.31 (d, 1H), 8.19 (d, 1H), 3.92 (s, 3H), 2.55 (d, 2H), 2.01-1.99 (m, 1H), 1.01 (d, 6H).

Synthesis of Intermediate 5(2)

After 1.0 g (43.4 mmol) of NaH was added to 80 mL of anhydrous tetrahydrofuran, 4.5 mL (34.8 mmol) of 3,3-dimethyl-2-butanone was slowly added to the mixture. After an hour, 5.6 g (29.0 mmol) of Intermediate 5(3) was added to the mixture and the mixture was heated under reflux at a temperature of about 80° C. for about 16 hours. After completion of the reaction, 30 mL of distilled water, and then a 4N diluted HCl solution were slowly added for neutralization, followed by extraction five times each with 100 mL of dichloromethane to collect the organic layer, which was then dried using magnesium sulfate, followed by distillation under reduced pressure and column chromatography to obtain 3.9 g (15.1 mmol) of Intermediate 5(2) (Yield: 52%).

LC-MS m/z=262 (M+H)$^+$

Synthesis of Intermediate 5(1)

After 3.6 g (13.9 mmol) of Intermediate 5(2) was dissolved in 50 mL of ethanol at room temperature, 4.0 mL (140.0 mmol) of hydrazine hydrate was added to the mixture and the mixture was heated under reflux at a temperature of about 80° C. for about 18 hours. The reaction product was concentrated under reduced pressure, and extracted with 80 mL of distilled water and 100 ml of dichloromethane to collect the organic layer, which was then dried using magnesium sulfate, followed by distillation under reduced pressure and column chromatography to obtain 2.7 g (10.4 mmol) of Intermediate 5(1) (Yield: 75%).

LC-MS m/z=258 (M+H)$^+$
$^1$H NMR (500 MHz, CDCl$_3$) δ=8.67 (s, 1H), 7.81 (d, 1H), 7.36 (d, 1H), 6.75 (s, 1H), 2.52 (d, 2H), 1.98-1.96 (m, 1H), 1.31 (s, 9H), 0.98 (d, 6H).

Synthesis of Compound D5

After 0.6 g (2.5 mmol) of Intermediate 5(1) was dissolved in a mixed solvent of 30 mL of ethanol and 10 mL of distilled water at room temperature, 0.5 g (1.2 mmol) of K$_2$PtCl$_4$ was added to the mixture and the mixture was heated under reflux for about 18 hours. After the completion of the reaction was determined by liquid chromatography-mass spectrometry (LC-MS), the reaction product was filtered to obtain 0.7 g (1.0 mmol) of Compound D5 (Yield: 40%). This compound was identified using LC-MS and $^1$H NMR.

LC-MS m/z=708 (M+H)$^+$
$^1$H NMR (500 MHz, CDCl$_3$) δ=10.32 (s, 1H), 8.31 (d, 1H), 8.17 (d, 1H), 6.73 (s, 1H), 2.58 (d, 2H), 1.97-1.95 (m, 1H), 1.32 (s, 9H), 1.00 (d, 6H).

Synthesis Example 2

Synthesis of Compound D2

Compound D2 was synthesized according to Reaction Scheme 2 below:

<Reaction Scheme 2>

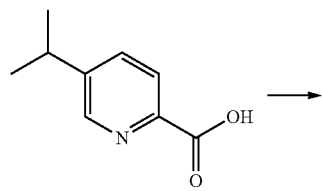

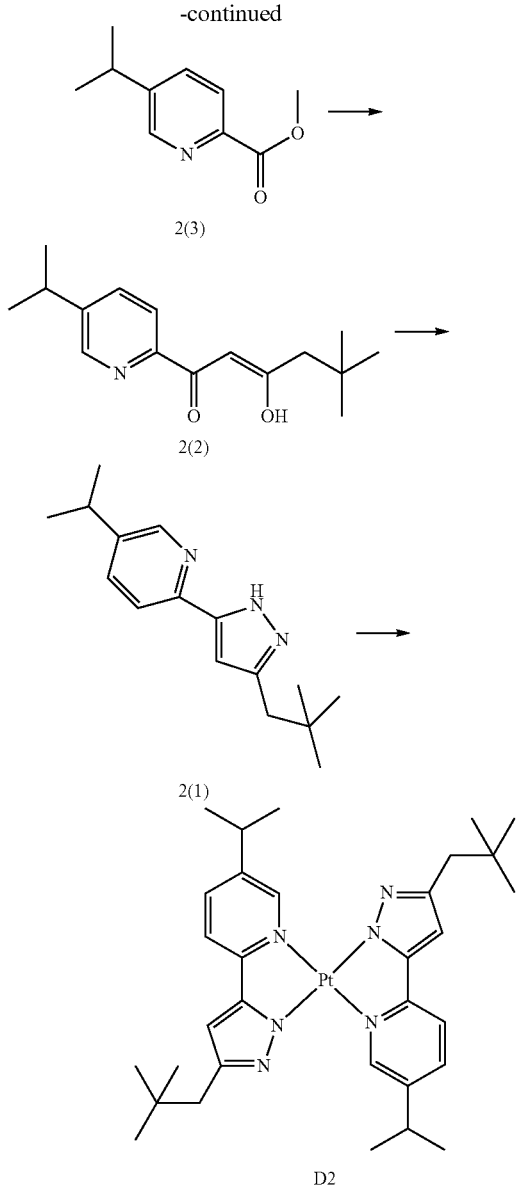

Synthesis of Intermediate 2(3)

Intermediate 2(3) was synthesized in the same manner as the synthesis of Intermediate 5(3) of Synthesis Example 1, except that 5-isopropyl-pyridine-2-carboxylic acid was used instead of 5-isobutyl-pyridine-2-carboxylic acid (Yield: 96%). This compound was identified using LC-MS.

LC-MS m/z=180 (M+H)$^+$

Synthesis of 2(2)

Intermediate 2(2) was synthesized in the same manner as the synthesis of Intermediate 5(2) of Synthesis Example 1, except that 4,4-dimethyl-pentan-2-one was used instead of 3,3-dimethyl-2-butanone (Yield: 12%). This compound was identified using LC-MS.

LC-MS m/z=262 (M+H)$^+$

Synthesis of 2(1)

Intermediate 2(1) was synthesized in the same manner as the synthesis of Intermediate 5(1) of Synthesis Example 1, except that Intermediate 2(2) was used instead of Intermediate 5(2) (Yield: 70%). This compound was identified using LC-MS and ¹H NMR.

LC-MS m/z=258 (M+H)⁺

¹H NMR (500 MHz, CDCl₃) δ=8.58 (s, 1H), 7.76 (d, 1H), 7.23 (d, 1H), 6.69 (s, 1H), 3.24-3.22 (m, 1H), 2.48 (s, 2H), 1.28 (d, 6H), 1.09 (t, 9H).

Synthesis of Compound D2

Compound D2 was synthesized in the same manner as the synthesis of Compound D5 of Synthesis Example 1, except that Intermediate 2(1) was used instead of Intermediate 5(1) (Yield: 45%). This compound was identified using LC-MS and ¹H NMR.

LC-MS m/z=708 (M+H)⁺

¹H NMR (500 MHz, CDCl₃) δ=10.18 (s, 1H), 8.21 (d, 1H), 8.15 (d, 1H), 6.76 (s, 1H), 3.23-3.21 (m, 1H), 2.45 (s, 2H), 1.25 (d, 6H), 1.08 (t, 9H).

Synthesis Example 3

Synthesis of Compound D11

Compound D11 was synthesized according to Reaction Scheme 3 below:

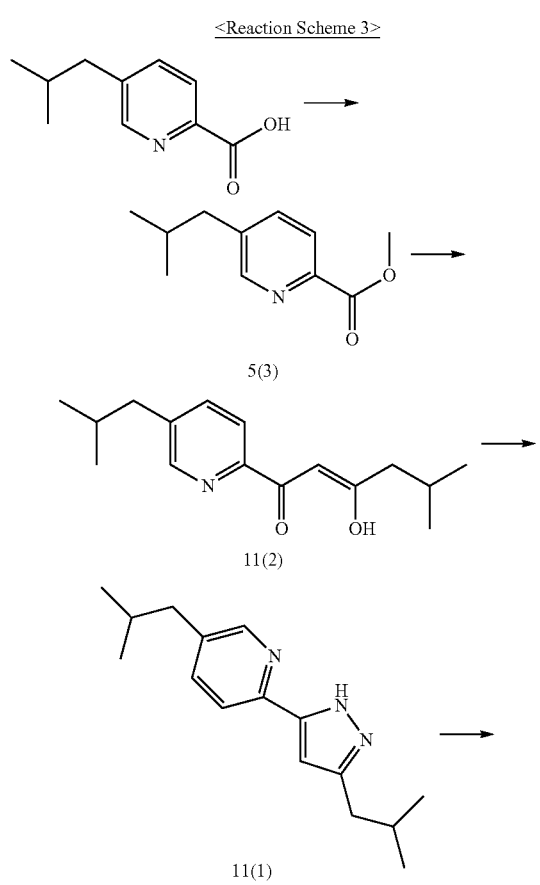

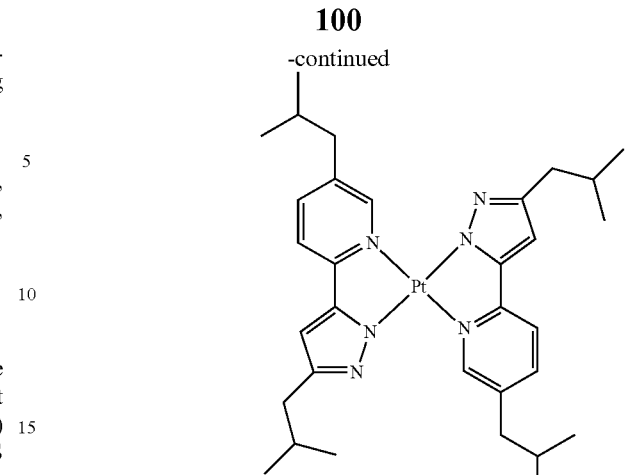

D11

Synthesis of Intermediate 11(2)

Intermediate 11(2) was synthesized in the same manner as the synthesis of Intermediate 5(2) of Synthesis Example 1, except that 4-methyl-pentan-2-one was used instead of 3,3-dimethyl-2-butanone (Yield: 16%). This compound was identified using LC-MS.

LC-MS m/z=262 (M+H)⁺

Synthesis of 11(1)

Intermediate 11(1) was synthesized in the same manner as the synthesis of Intermediate 5(1) of Synthesis Example 1, except that Intermediate 11(2) was used instead of Intermediate 5(2), was used (Yield: 50%). This compound was identified using LC-MS and ¹H NMR.

LC-MS m/z=258 (M+H)⁺

¹H NMR (500 MHz, CDCl₃) δ=8.59 (s, 1H), 7.72 (d, 1H), 7.41 (d, 1H), 6.54 (s, 1H), 2.53 (d, 2H), 2.49 (d, 2H), 1.96-1.92 (m, 2H), 1.03-0.98 (m, 12H).

Synthesis of Compound D11

Intermediate 11(1) was synthesized in the same manner as the synthesis of Compound D5 of Synthesis Example 1, except that Intermediate 11(1) was used instead of Intermediate 5(1) (Yield: 60%). This compound was identified using LCMS and ¹H NMR LC-MS m/z=708 (M+H)⁺

¹H NMR (500 MHz, CDCl₃) δ=10.46 (s, 1H), 8.31 (d, 1H), 8.12 (d, 1H), 6.77 (s, 1H), 2.49 (d, 2H), 2.47 (d, 2H), 1.95-1.91 (m, 2H), 1.04-1.00 (m, 12H).

Synthesis Example 4

Synthesis of Compound D12

Compound D12 was synthesized according to Reaction Scheme 4 below:

<Reaction Scheme 4>

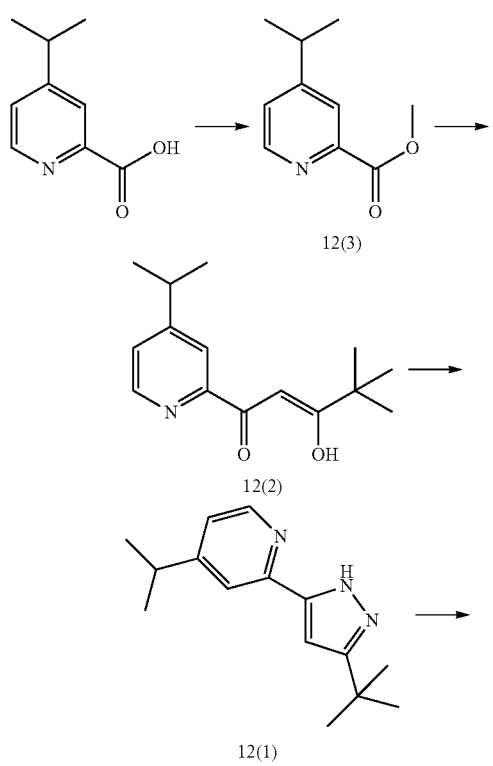

D12 except that Intermediate 12(2) was used instead of Intermediate 5(2) (Yield: 50%). This compound was identified using LC-MS and ¹H NMR.

LC-MS m/z=245 (M+H)⁺

¹H NMR (500 MHz, CDCl₃) δ=8.66 (d, 1H), 7.63 (s, 1H), 7.23 (d, 1H), 6.71 (s, 1H), 3.02-2.99 (m, 1H), 1.31 (s, 9H), 1.21 (d, 6H)

Synthesis of Compound D12

Compound D12 was synthesized in the same manner as the synthesis of Compound D5 of Synthesis Example 1, except that Intermediate 12(1) as used instead of Intermediate 5(1) (Yield: 71%). This compound was identified using LCMS and ¹H NMR.

LC-MS m/z=680 (M+H)⁺

¹H NMR (500 MHz, CDCl₃) δ=10.74 (d, 1H), 8.45 (s, 1H), 7.26-7.25 (m, 1H), 6.82 (s, 1H), 3.00-2.97 (m, 1H), 1.34 (s, 9H), 1.18 (d, 6H)

Synthesis Example 5

Synthesis of Compound D13

Compound D13 was synthesized according to Reaction Scheme 5 below:

<Reaction Scheme 5>

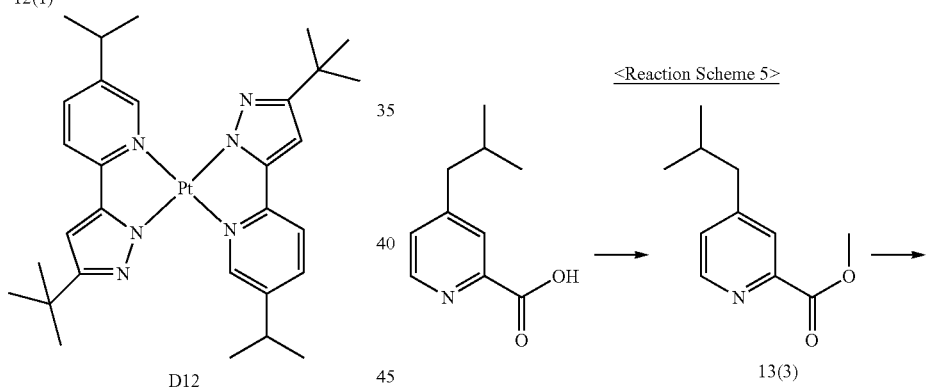

Synthesis of Intermediate 12(3)

Intermediate 12(3) was synthesized in the same manner as the synthesis of Intermediate 5(3) of Synthesis Example 1, except that 4-isopropyl-pyridine-2-carboxylic acid was used instead of 5-isobutyl-pyridine-2-carboxylic acid (Yield: 96%). This compound was identified using LC-MS.

LC-MS m/z=180 (M+H)⁺

Synthesis of Intermediate 12(2)

Intermediate 12(2) was synthesized in the same manner as the synthesis of Intermediate 5(2) of Synthesis Example 1, except that Intermediate 12(3) was used instead of Intermediate 5(3) (Yield: 46%). This compound was identified using LC-MS.

LC-MS m/z=248 (M+H)⁺

Synthesis of Intermediate 12(1)

Intermediate 12(1) was synthesized in the same manner as the synthesis of Intermediate 5(1) of Synthesis Example 1,

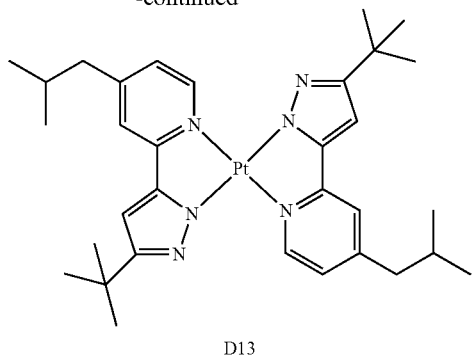

D13

Synthesis of Intermediate 13(3)

Intermediate 13(3) was synthesized in the same manner as the synthesis of Intermediate 5(3) of Synthesis Example 1, except that 4-isobutyl-pyridine-2-carboxylic acid was used instead of 5-isobutyl-pyridine-2-carboxylic acid (Yield: 95%). This compound was identified using LC-MS.

LC-MS m/z=194 (M+H)$^+$

Synthesis of Intermediate 13(2)

Intermediate 13(3) was synthesized in the same manner as the synthesis of Intermediate 5(2) of Synthesis Example 1, except that Intermediate 13(3) was used instead of Intermediate 5(3) (Yield: 50%). This compound was identified using LC-MS.

LC-MS m/z=262 (M+H)$^+$

Synthesis of Intermediate 13(1)

Intermediate 13(1) was synthesized in the same manner as the synthesis of Intermediate 5(1) of Synthesis Example 1, except that Intermediate 13(2) was used instead of Intermediate 5(2) (Yield: 50%). This compound was identified using LC-MS and $^1$H NMR.

LC-MS m/z=258 (M+H)$^+$ $^1$H NMR (500 MHz, CDCl$_3$) δ=8.48 (d, 1H), 7.69 (s, 1H), 7.34 (d, 1H), 6.65 (s, 1H), 2.45 (d, 2H), 2.23-2.21 (m, 1H), 1.27 (s, 9H), 0.97 (d, 6H)

Synthesis of Compound D13

Compound D13 was synthesized in the same manner as the synthesis of Compound D5 of Synthesis Example 1, except that Intermediate 13(1) was used instead of Intermediate 5(1) (Yield: 60%). This compound was identified using LCMS and $^1$H NMR.

LC-MS m/z=708 (M+H)$^+$ $^1$H NMR (500 MHz, CDCl$_3$) δ=10.71 (d, 1H), 8.84 (s, 1H), 7.524 (d, 1H), 6.78 (s, 1H), 2.32 (d, 2H), 2.21-2.20 (m, 1H), 1.30 (s, 9H), 1.01 (d, 6H)

Synthesis Example 6

Synthesis of Compound D15

Compound D15 was synthesized according to Reaction Scheme 6 below:

<Reaction Scheme 6>

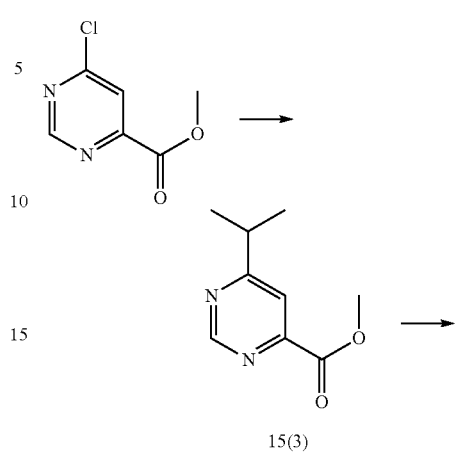

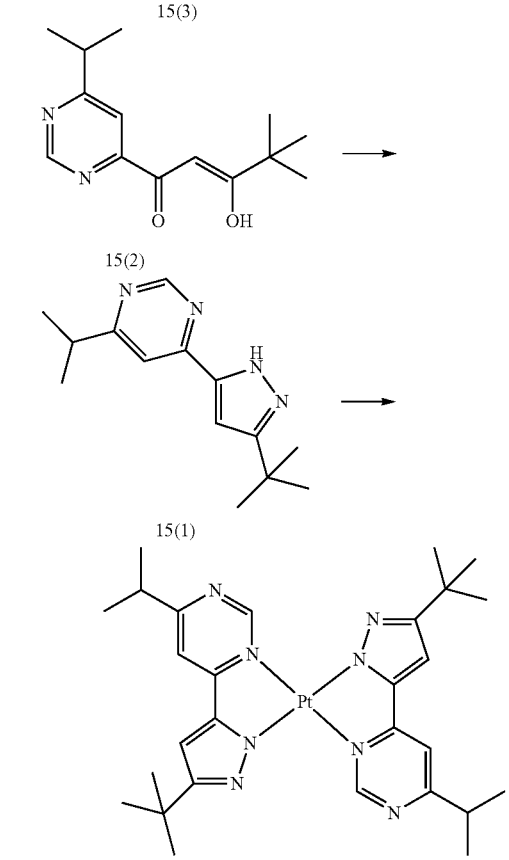

D15

Synthesis of Intermediate 15(3)

After 10 g (57.9 mmol) of 6-chloro-pyrimidine-4-carboxylic acid methyl ester was dissolved in 200 mL of a mixed solvent of toluene and water, 69.5 mmol of isopropylboronic acid, 2.0 g (9.3 mmol) of Pd(OAc)$_2$, 4.2 g (15.0 mmol) of tricyclohexyl phosphine, and 4.3 g (202 mmol) of K$_3$PO$_4$ were added to the solution and the solution was heated under reflux at a temperature of about 100° C. for about 18 hours. After completion of the reaction, the reaction product was filtered using Celite, followed by distillation under reduced pressure, extraction with 100 mL of distilled water and 300 mL of dichloromethane, drying using magnesium sulfate, and distillation under reduced pressure. The resulting product was purified by column chromatography to obtain Intermediate 15(3) (Yield: 42%). This compound was identified using LC-MS LC-MS m/z=181(M+H)$^+$ Synthesis of Intermediate 15(2)

Intermediate 15(2) was synthesized in the same manner as the synthesis of Intermediate 5(2) of Synthesis Example 1, except that Intermediate 15(3) was used instead of Intermediate 5(3) (Yield: 46%). This compound was identified using LC-MS.

LC-MS m/z=249(M+H)$^+$

Synthesis of Intermediate 15(1)

Intermediate 15(1) was synthesized in the same manner as the synthesis of Intermediate 5(1) of Synthesis Example 1, except that Intermediate 15(2) was used instead of Intermediate 5(2) (Yield: 55%). This compound was identified using LC-MS.

LC-MS m/z=245(M+H)$^+$

Synthesis of Compound D15

Compound D15 was synthesized in the same manner as the synthesis of Compound D5 of Synthesis Example 1, except that Intermediate 15(1) was used instead of Intermediate 5(1) (Yield: 65%). This compound was identified using LC-MS and $^1$H NMR.

LC-MS m/z=682(M+H)$^+$ $^1$H NMR (500 MHz, CDCl$_3$) δ=10.77 (s, 1H), 8.43 (s, 1H), 6.79 (s, 1H), 3.12-3.08 (m, 1H), 1.32 (s, 9H), 1.24 (d, 6H)

Synthesis Example 7

Synthesis of Compound D22

Compound D22 was synthesized according to Reaction Scheme 7 below:

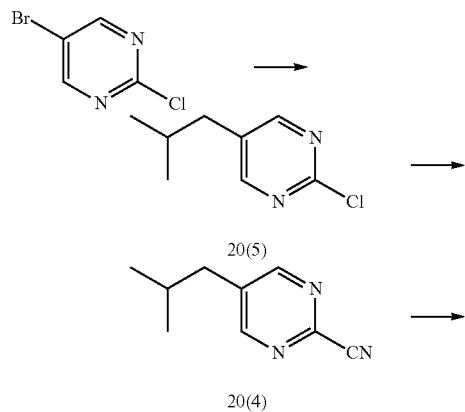

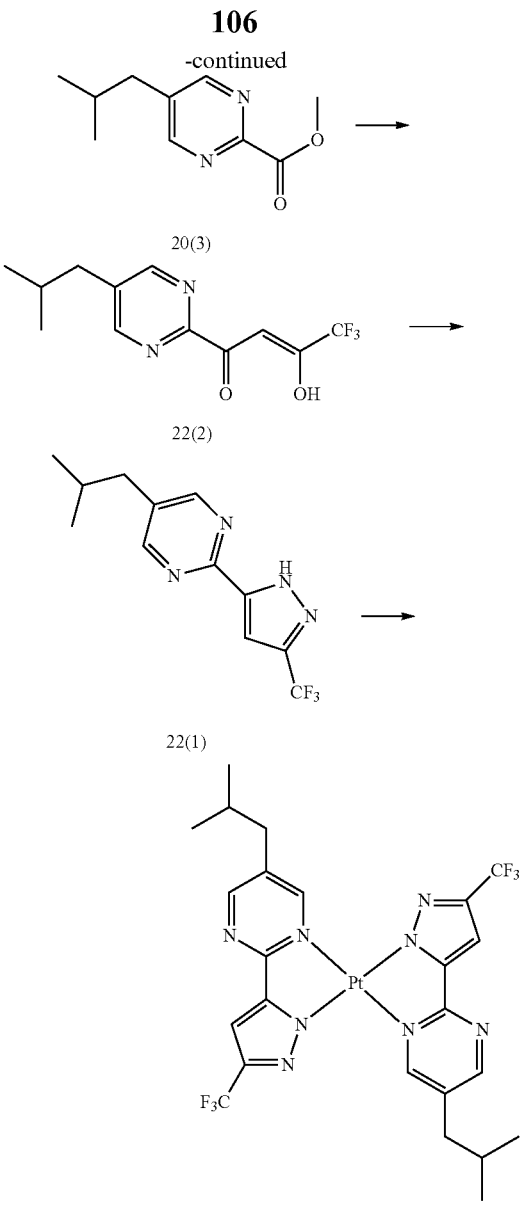

Synthesis of Intermediate 20(5)

After 5 g (25.9 mmol) of 5-bromo-2-chloropyrimidine, 3.1 g (31.0 mmol) of (2-methylpropyl)boronic acid, 0.9 g (3.8 mmol) of Pd(OAc)$_2$, 1.4 g (5.2 mmol) of tricyclohexyl phosphine, and 16.5 g (78 mmol) of K$_3$PO$_4$ were dissolved in a mixed solvent of toluene and water (90 ml/6 ml), the solution was heated under reflux at a temperature of about 80° C. for about 18 hours. After completion of the reaction, the reaction product was filtered using Celite, followed by distillation under reduced pressure. Then the resulting product was purified by column chromatography to obtain 2.2 g (12.7 mmol) of Intermediate 20(5) (Yield: 49%). This compound was identified using LC-MS and $^1$H NMR.

LC-MS m/z=171(M+H)$^+$ $^1$H NMR (500 MHz, CDCl$_3$) δ=8.43 (s, 2H), 2.47 (d, 2H), 1.91-1.83 (m, 1H), 0.94 (d, 6H).

Synthesis of Intermediate 20(4)

2.2 g (12.9 mmol) of Intermediate 20(5) was dissolved in a mixed solvent of 12 mL of dimethyl sulfoxide (DMSO) and 12 mL of water, 0.7 g (14.1 mmol) of NaCN and 0.3 g (2.6 mmol) of DABCO were added to the solution, and the solution was stirred at room temperature for about 2 hours, and then heated at a temperature of about 80° C. for about 16 hours. After completion of the reaction, the reaction product was extracted with water and ethyl acetate (EA), dried using magnesium sulfate, and then distilled under reduced pressure to obtain 2.0 g (12.2 mmol) of Intermediate 20(4) (Yield: 95%). This compound was identified using LC-MS and $^1$H NMR.

LC-MS m/z=162 (M+H)$^+$ $^1$H NMR (500 MHz, CDCl$_3$) δ=8.64 (s, 2H), 2.57 (d, 2H), 1.96-1.91 (m, 1H), 0.96 (d, 6H).

Synthesis of Intermediate 20(3)

After 2.0 g (12.2 mmol) of Intermediate 20(4) was dissolved in 40 mL of methanol, 10 mL of a 35% HCl solution was added to the solution, and then the solution was heated under reflux at a temperature of about 80° C. for about 18 hours. After completion of the reaction, the reaction product was distilled under reduced pressure to obtain a reaction mixture, which was dissolved in dichloromethane and then extracted with a saturated sodium hydrogen carbonate aqueous solution for neutralization. The organic layer was collected and dried using magnesium sulfate, followed by column chromatography to obtain 1.0 g (5.1 mmol) of Intermediate 20(3) (Yield: 42%). This compound was identified using LC-MS.

LC-MS m/z=195 (M+H)$^+$

Synthesis of Intermediate 22(2)

Intermediate 22(2) was synthesized in the same manner as the synthesis of Intermediate 5(2) of Synthesis Example 1, except that Intermediate 20(3) was used instead of Intermediate 5(3) (Yield: 46%). This compound was identified using LC-MS.

LC-MS m/z=275 (M+H)$^+$

Synthesis of Intermediate 22(1)

Intermediate 22(1) was synthesized in the same manner as the synthesis of Intermediate 5(1) of Synthesis Example 1, except that Intermediate 22(2) was used instead of Intermediate 5(2) (Yield: 60%). This compound was identified using LC-MS.

LC-MS m/z=271(M+H)$^+$

Synthesis of Compound D22

Compound D22 was synthesized in the same manner as the synthesis of Compound D5 of Synthesis Example 1, except that Intermediate 22(1) was used instead of Intermediate 5(1) (Yield: 53%). This compound was identified using LC-MS and $^1$H NMR.

LC-MS m/z=734 (M+H)$^+$ $^1$H NMR (500 MHz, CDCl$_3$) δ=10.71 (s, 1H), 8.57 (s, 1H), 6.79 (s, 1H), 2.25-2.23 (m, 1H), 1.03 (s, 6H)

Synthesis Example 8

Synthesis of Compound D30

Compound D30 was synthesized according to Reaction Scheme 8 below:

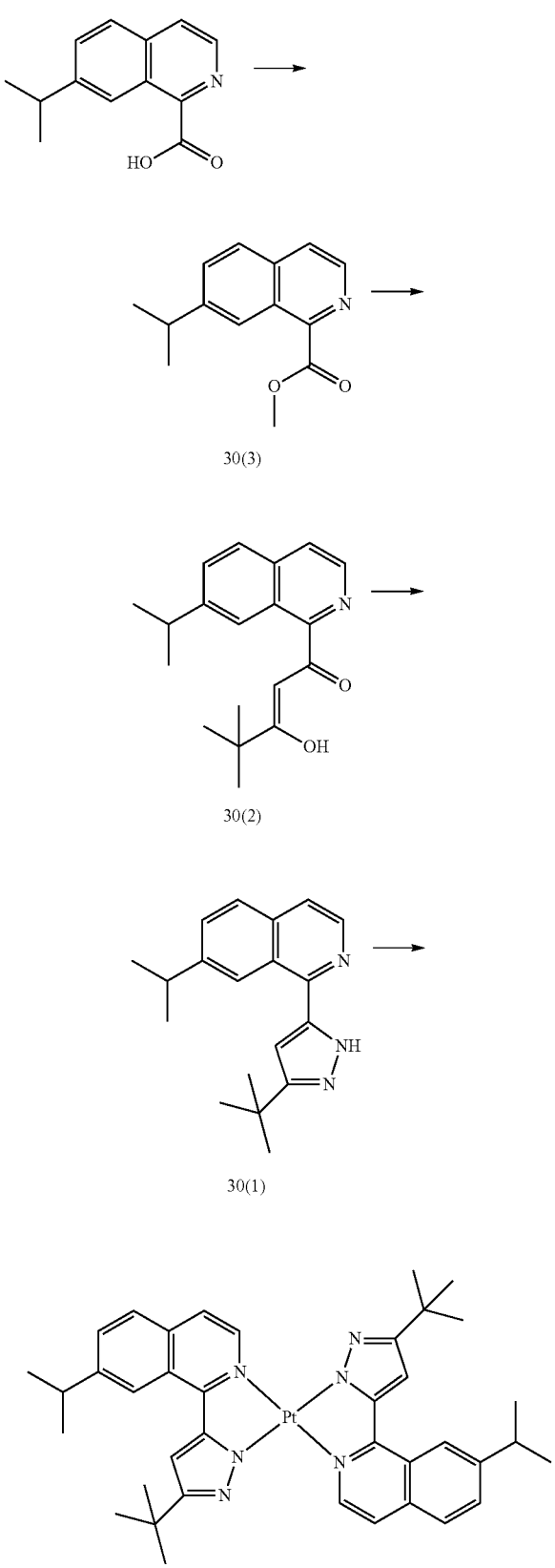

<Reaction Scheme 8>

Synthesis of Intermediate 30(3)

Intermediate 30(3) was synthesized in the same manner as the synthesis of Intermediate 5(3) of Synthesis Example 1, except that 7-isopropyl-isoquinoline-1-carboxylic acid was used instead of 5-isobutyl-pyridine-2-carboxylic acid (Yield: 95%). This compound was identified using LC-MS.

LC-MS m/z=230 (M+H)$^+$

Synthesis of Intermediate 30(2)

Intermediate 30(2) was synthesized in the same manner as the synthesis of Intermediate 5(2) of Synthesis Example 1, except that Intermediate 30(3) was used instead of Intermediate 5(3) (Yield: 41%). This compound was identified using LC-MS.

LC-MS m/z=298 (M+H)$^+$

Synthesis of Intermediate 30(1)

Intermediate 30(1) was synthesized in the same manner as the synthesis of Intermediate 5(1) of Synthesis Example 1, except that Intermediate 30(2) was used instead of Intermediate 5(2) (Yield: 63%). This compound was identified using LC-MS.

LC-MS m/z=294 (M+H)$^+$

Synthesis of Compound D30

Compound 30 was synthesized in the same manner as the synthesis of Compound D5 of Synthesis Example 1, except that Intermediate 30(1) was used instead of Intermediate 5(1) (Yield: 46%). This compound was identified using LC-MS and $^1$H NMR.

LC-MS m/z=780 (M+H)$^+$ $^1$H NMR (500 MHz, CDCl$_3$) δ=8.62 (d, 1H), 7.72-7.43 (m, 4H), 6.74 (s, 1H), 3.16-3.14 (m, 1H), 1.33 (s, 9H), 1.27 (s, 6H).

Synthesis Example 9

Synthesis of Compound H3

Compound H3 was synthesized according to the below Reaction Schemes:

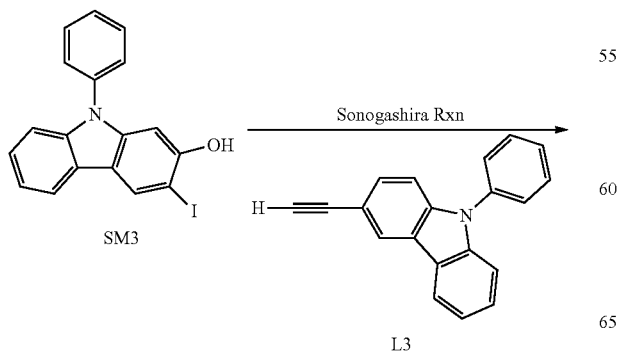

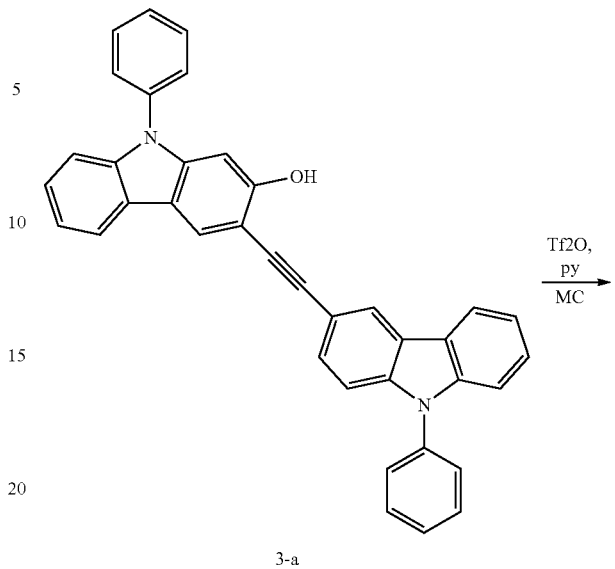

3-a

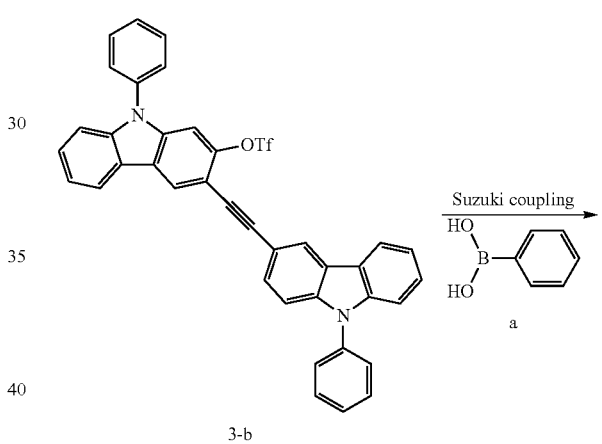

3-b

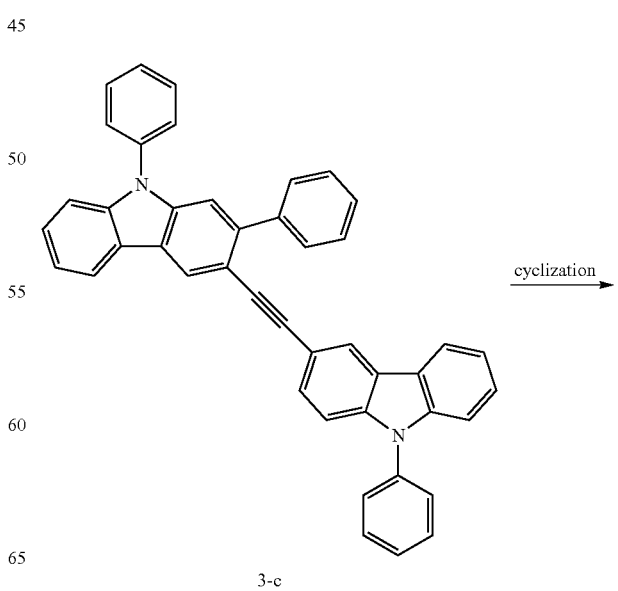

3-c

-continued

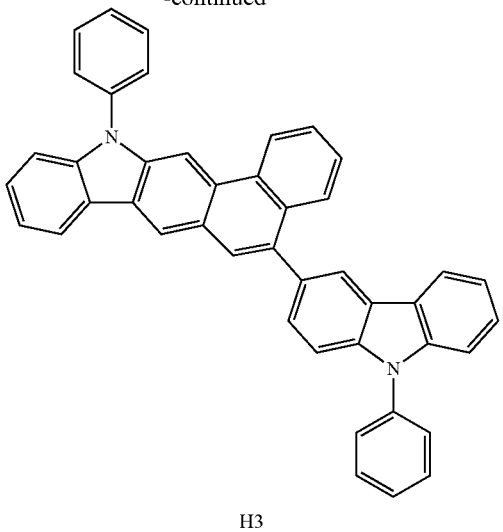

H3

Synthesis of Intermediate 3-a

After 13.6 g (1.2 eq) of Intermediate 3-iodo-9-phenyl-9H-carbazol-2-ol (SM3), 1.36 g (0.04 eq) of Pd(PPh$_3$)$_4$, and 450 mg (0.08 eq) of CuI were added to a flask, the mixture was provided in a vacuum environment followed by an N$_2$ atmosphere. Then, 200 mL of tetrahydrofuran (THF) was added thereto and stirred. Next, 2.2 mL (1.2 eq) of triethylamine and 3 g (1 eq) of Intermediate L3 were slowly added thereto, and then stirred in an N$_2$ atmosphere at room temperature for about 2 hours. The solvent was then removed using a rotary evaporator, and after that, the reaction solution was added to 100 mL of distilled water and extracted three times with 100 mL of diethylether to obtain the organic layer. The organic layer was then dried using magnesium sulfate to evaporate the solvent. The residue was separated and dissolved using silica gel column chromatography to obtain 7.74 g of Intermediate 3-a (Yield 62%).

Synthesis of Intermediate 3-b 5 g of Intermediate 3-a was dissolved in 100 mL of methylene chloride (MC) and cooled down to a temperature about 0° C. After adding 7.84 g of Tf$_2$O and 2 mL of pyridine thereto, the mixture was stirred at a temperature of about 0° C. for about an hour. Then, the temperature of the reaction solution was raised to room temperature, and the reaction solution was extracted three times with 100 mL of distilled water and 100 mL of MC to obtain the organic layer. The organic layer was then dried using magnesium sulfate to evaporate the solvent. The residue was separated and dissolved using silica gel column chromatography to obtain 5.48 g of Intermediate 3-b (Yield 91%).

Synthesis of Intermediate 3-c

After 5 g of Intermediate 3-b, 1.5 g (1.2 eq) of Compound a, 590 mg (0.05 eq) of Pd(PPh$_3$)$_4$, and 7.0 g (5 eq) of K$_2$CO$_3$ were dissolved in 100 mL of THF with 30 mL of distilled water, the solution was then heated under reflux and stirred at a temperature of about 120° C. for about 24 hours. The reaction solution was cooled down to room temperature, and extracted three times with 200 mL of water and 200 mL of diethylether to obtain the organic layer. The organic layer was then dried using magnesium sulfate to evaporate the solvent. The residue was separated and dissolved using silica gel column chromatography to obtain 3.24 g Intermediate 3-c (Yield 76%).

Synthesis of Compound 3H

After 3 g of Intermediate 3-c was dissolved in 50 mL of MC, 12.5 mL (20 eq) of trifluoroacetic acid was slowly added thereto followed by stirring at room temperature for about an hour. After completion of the reaction, the reaction mixture was extracted three times with 100 mL of water and 100 mL of diethylether to obtain the organic layer. The organic layer was then dried using magnesium sulfate to evaporate the solvent. The residue was separated and dissolved using silica gel column chromatography to obtain Compound H3 (Yield 93%). This compound was identified $^1$H NMR.

$^1$H NMR (CDCl$_3$, 400 MHz) δ (ppm) 8.93 (d, 2H), 8.12 (d, 2H), 7.93-7.88 (m, 2H), 7.82 (t, 1H), 7.77 (s, 1H), 7.55 (d, 2H), 7.46-7.40 (m, 3H), 7.30-7.28 (m, 11H), 7.08-7.00 (m, 4H)

Synthesis Example 10

Synthesis of Compound H12

Compound H2 (Yield: 94%) was synthesized in the same manner as Synthesis Example 9, except that Intermediate 3-iodo-9-(3-(4,6-diphenyl-1,3,5-triazin-2-yl)phenyl)-9H-carbazol-2-ol (SM12) was used instead of Intermediate SM3 in the synthesis of Intermediate 3-a. This compound was identified using $^1$H NMR.

$^1$H NMR (CDCl$_3$, 400 MHz) δ (ppm) 8.93 (d, 2H), 8.12 (d, 2H), 7.93-7.88 (m, 2H), 7.82-7.77 (m, 2H), 7.55 (d, 2H), 7.50-7.46 (m, 7H), 7.40 (d, 2H), 7.32-7.22 (m, 14H), 7.08-7.00 (m, 4H)

Synthesis Example 11

Synthesis of Compound H13

Compound H3 (Yield: 93%) was synthesized in the same manner as Synthesis Example 9, except that Intermediate 3-iodo-9-(4-phenylquinazolin-2-yl)-9H-carbazol-2-ol (SM13) was used instead of Intermediate SM3 in the synthesis of Intermediate 3-a. This compound was identified using $^1$H NMR.

$^1$H NMR (CDCl$_3$, 400 MHz) δ (ppm) 8.93 (d, 2H), 8.12 (d, 2H), 8.00 (d, 1H), 7.93 (s, 1H), 7.88-7.77 (m, 5H), 7.60-7.55 (m, 3H), 7.48-7.46 (m, 3H), 7.40 (d, 2H), 7.32-7.30 (m, 3H), 7.30-7.22 (m, 6H), 7.08-7.00 (m, 4H)

Synthesis Example 12

Synthesis of Compound H30

Compound H30 was synthesized according to the Reaction Schemes below:

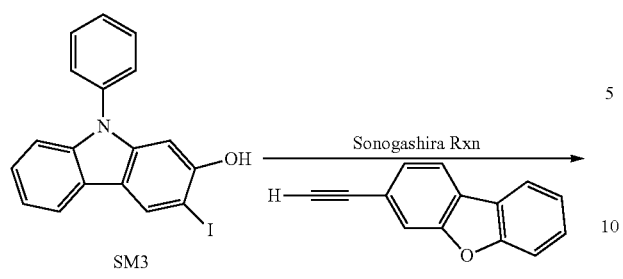
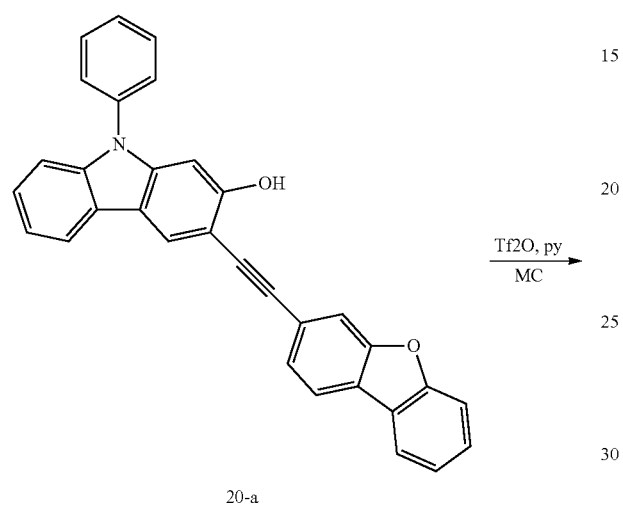
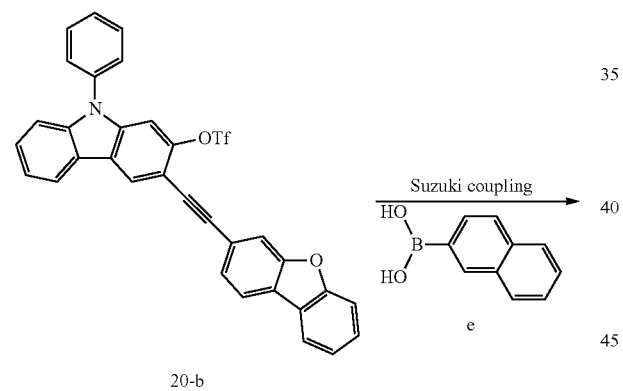
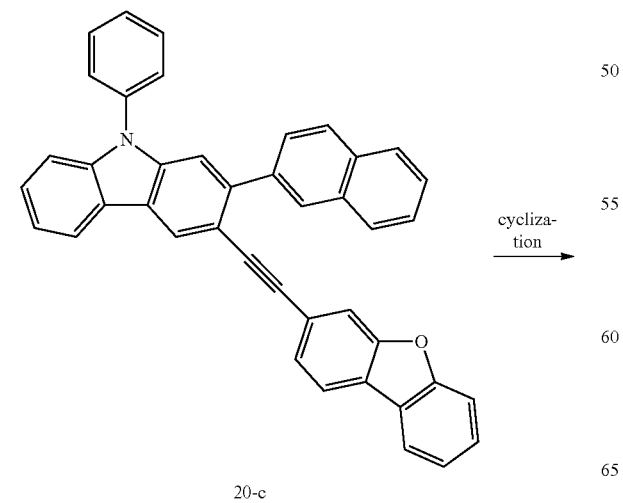

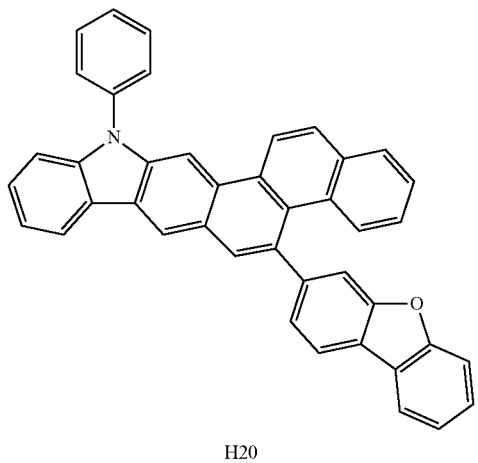

Compound H30 (Yield: 94%) was synthesized in the same manner as Synthesis Example 9, except that Intermediate L20 was used instead of Intermediate L3 in the synthesis of Intermediate 3-a, and Compound e was used instead of Compound a in the synthesis of Intermediate 20-c. This compound was identified using $^1$H NMR.

$^1$H NMR (CDCl$_3$, 400 MHz) δ (ppm) 8.93 (d, 3H), 8.12 (d, 2H), 7.93 (s, 1H), 7.88-7.82 (m, 3H), 7.64 (s, 1H), 7.55 (d, 2H), 7.49 (d, 1H), 7.42-7.40 (m, 2H), 7.35 (d, 1H), 7.30 (m, 5H), 7.19-7.00 (m, 4H)

Synthesis Example 13

Synthesis of Compound H43

Compound H43 was synthesized according to the Reaction Schemes below:

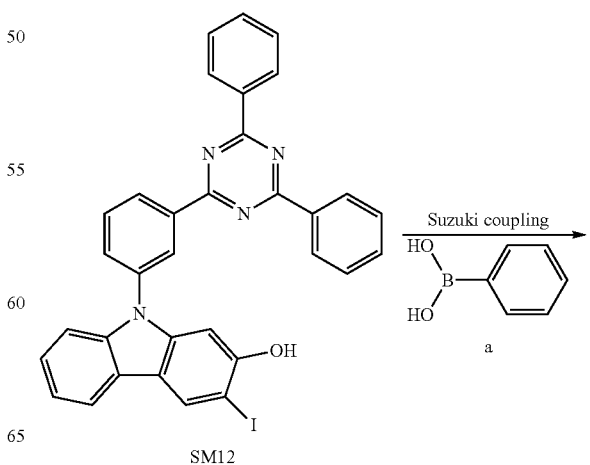

-continued

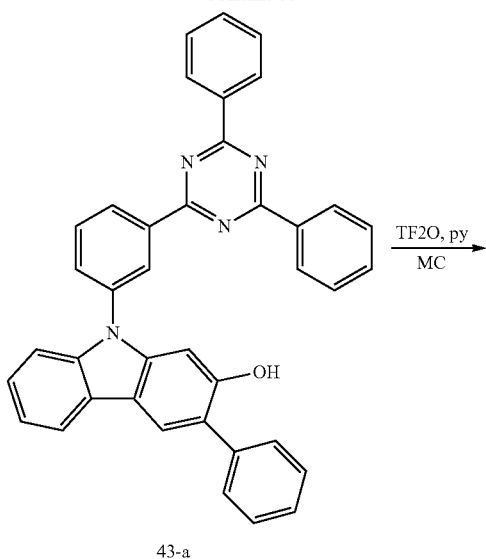

43-a

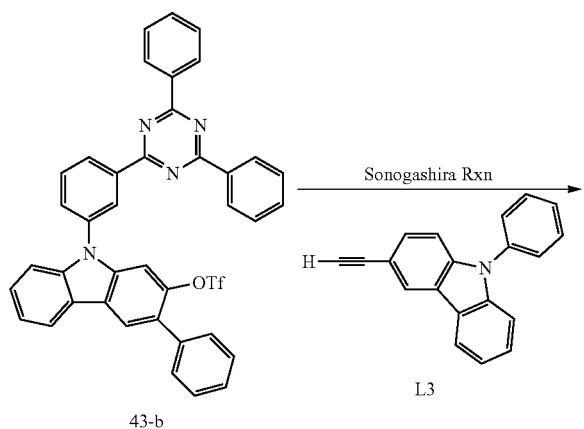

43-b

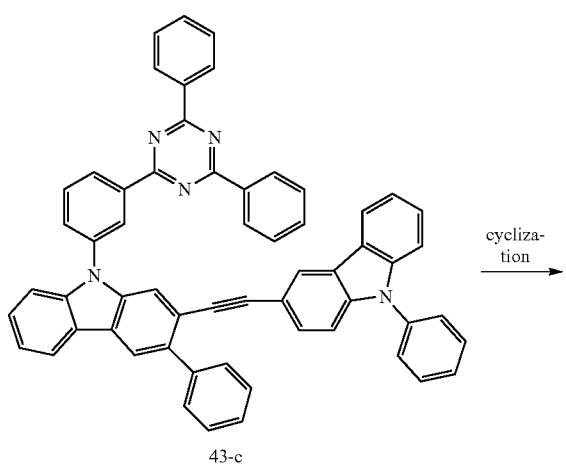

43-c

-continued

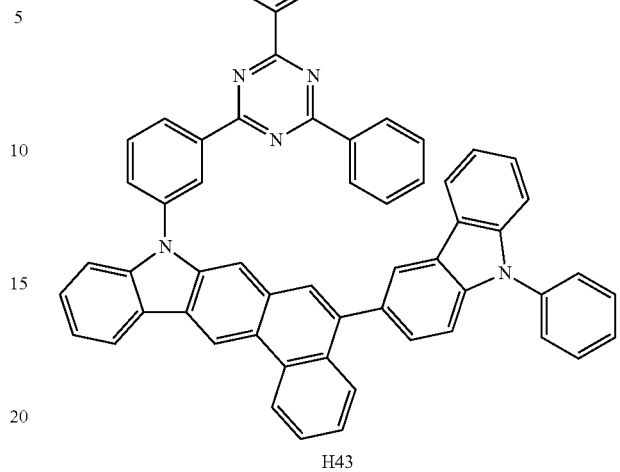

H43

Synthesis of Intermediate 43-a

After 10 g of Intermediate SM12, 3.8 g (1.2 eq) of Compound a, 1.5 mg (0.05 eq) of Pd(PPh$_3$)$_4$, and 18 g (5 eq) of K$_2$CO$_3$ were dissolved in 200 mL of THF with 60 mL of distilled water, the solution was heated under reflux and stirred at a temperature of 120° C. for about 24 hours to obtain the organic layer. The organic layer was cooled down to room temperature, and extracted three times with 200 mL of water and 200 mL of diethylether. The organic layer was then dried using magnesium sulfate to evaporate the solvent. The residue was separated and dissolved using silica gel column chromatography to obtain 8.2 g of Intermediate 43-a (Yield 73%).

Synthesis of Intermediate 43-b 5 g of Intermediate 43-a was dissolved in 100 mL of MC and cooled down to a temperature of about 0° C. After adding 8.4 g of Tf$_2$O and 2 mL of pyridine thereto, the mixture was stirred at a temperature of about 0° C. for about an hour. Then, the temperature of the reaction mixture was raised to room temperature, and the reaction solution was extracted three times with 100 mL of distilled water and 100 mL of MC to obtain the organic layer. The organic layer was then dried using magnesium sulfate to evaporate the solvent. The residue was separated and dissolved using silica gel column chromatography to obtain Intermediate 43-b (Yield 93%).

Synthesis of Intermediate 43-c

After 5.67 g (1.2 eq) of Intermediate 43-b, 470 g (0.04 eq) of Pd(PPh$_3$)$_4$, and 160 mg (0.08 eq) CuI were added to a flask, the mixture was provided in a vacuum environment followed by an N$_2$ atmosphere. Then, 200 mL of THF was added thereto and the mixture was stirred. Next, 0.9 mL (1.2 eq) of triethylamine and 4 g (1 eq) of Intermediate L3 were slowly added thereto, and the mixture was then stirred in an N$_2$ atmosphere at room temperature for about 2 hours. The solvent was then removed using a rotary evaporator, and after that, the reaction solution was added to 100 mL of distilled water and extracted three times with 100 mL of diethylether to obtain the organic layer. The organic layer was then dried using magnesium sulfate to evaporate the solvent. The residue was separated and dissolved using silica gel column chromatography to obtain Intermediate 43-c (Yield 67%).

Synthesis of Compound H43

After 3 g of Intermediate 43-c was dissolved in 50 mL of MC, 7.4 mL (20 eq) of trifluoroacetic acid was slowly added thereto followed by stirring at room temperature for about an hour. After completion of the reaction, the reaction mixture was extracted three times with 100 mL of water and 100 mL of diethylether to obtain the organic layer. The organic layer was then dried using magnesium sulfate to evaporate the solvent. The residue was separated and dissolved using silica gel column chromatography to obtain 2.76 g of Compound H43. This compound was identified $^1$H NMR $^1$H NMR (CDCl3, 400 MHz) δ (ppm) 8.93 (s, 2H), 8.12 (d, 2H), 7.93-7.77 (m, 4H), 7.55-7.20 (m, 25H), 7.08-7.00 (m, 4H)

Example 1

To manufacture an anode, a glass substrate with ITO/Ag/ITO deposited layers having respective thicknesses of 70 Å/1000 Å/70 Å was cut to a size of 50 mm×50 mm×0.5 mm and then ultrasonicated in isopropyl alcohol and pure water each for five minutes, and then cleaned by irradiation with ultraviolet rays for about 30 minutes and exposure to ozone. The resulting glass substrate was loaded into a vacuum deposition apparatus.

2-TNATA was deposited to form an HIL having a thickness of 600 Å on the anode, and then 4,4'-bis[N-(1-naphthyl)-N-phenylamino]biphenyl (NPB) was deposited on the HIL to form a HTL having a thickness of about 1000 Å.

Compound H3 (host) and Compound D13 (dopant) were co-deposited at a weight ratio of about 91:9 on the HTL to form an EML having a thickness of about 250 Å, followed by deposition of BCP on the EML to form a HBL having a thickness of about 50 Å. After deposition of Alq$_3$ on the HBL to form an ETL having a thickness of about 350 Å, LiF was deposited on the ETL to form an EIL having a thickness of about 10 Å, followed by deposition of Mg and Ag at a weight ratio of about 90:10 on the EIL to form a cathode having a thickness of about 120 Å, thereby completing the manufacture of the OLED (emitting green light).

Example 2

An OLED was manufactured in the same manner as Example 1, except that Compound D5 was used instead of Compound D13 to form the EML.

Example 3

An OLED was manufactured in the same manner as Example 1, except that Compound H12 (host) and Compound D12 (dopant), respectively, were used instead of Compound H3 and Compound D13 to form the EML.

Example 4

An OLED was manufactured in the same manner as Example 1, except that Compound H12 (host) and Compound D11 (dopant), respectively, were used instead of Compound H3 and Compound D13 to form the EML.

Example 5

An OLED was manufactured in the same manner as Example 1, except that Compound H30 (host) and Compound D2 (dopant), respectively, were used instead of Compound H3 and Compound D13 to form the EML.

Example 6

An OLED was manufactured in the same manner as Example 1, except that Compound H43 (host) and Compound D15 (dopant), respectively, were used instead of Compound H3 and Compound D13 to form the EML.

Example 7

An OLED (emitting red light) was manufactured in the same manner as Example 1, except that the thickness of the HTL was varied to about 1350 Å, and Compound H13 (host) and Compound D22 (dopant) were co-deposited at a weight ratio of about 94:6 on the HTL to form an EML having a thickness of about 400 Å.

Example 8

An OLED was manufactured in the same manner as Example 7, except that Compound D30 was used instead of Compound D22 as the dopant to form the EML.

Comparative Example 1

An OLED was manufactured in the same manner as Example 1, except that Compound CBP (host) and Compound Ir(ppy)$_3$ (dopant), respectively, were used instead of Compound H3 and Compound D13 to form an EML.

Comparative Example 2

An OLED was manufactured in the same manner as Example 7, except that Compound CBP (host) and Compound PtOEP (dopant), respectively, were used instead of Compound H3 and Compound D22 to form an EML.

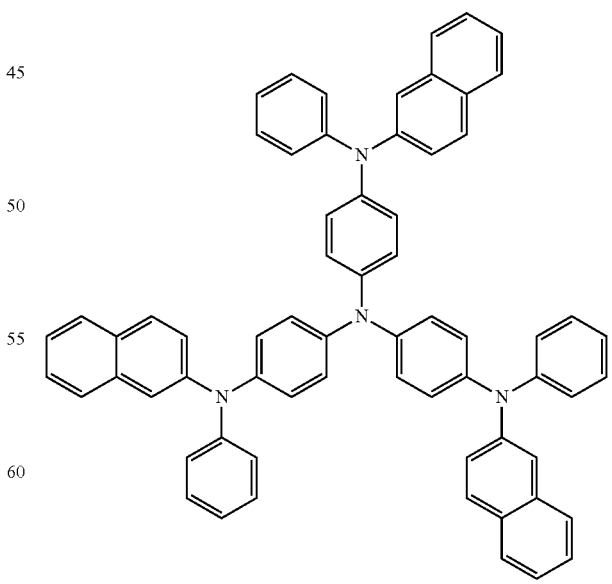

2-TNATA

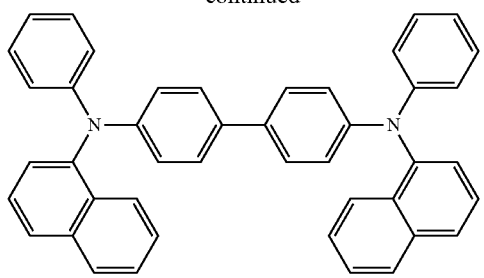

NPB

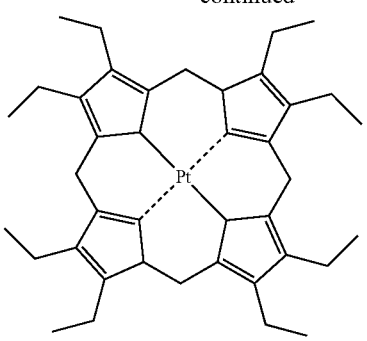

PtOEP

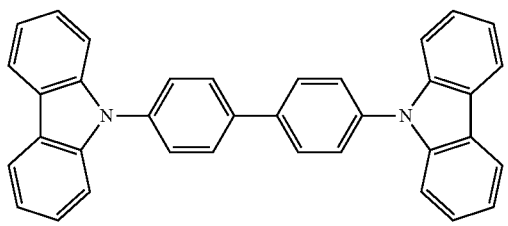

CBP

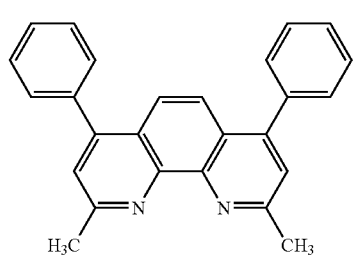

BCP

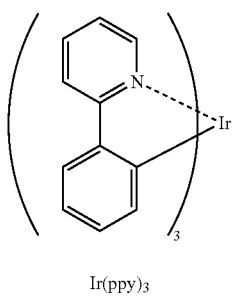

Ir(ppy)₃

Evaluation Example 1

The driving voltages, current densities, luminance, efficiencies, color purities, and lifetime characteristics of the OLEDs of Examples 1 to 8 and Comparative Examples 1 and 2 were measured using a PR650 (Spectroscan) Source Measurement Unit (available from Photo Research, Inc.). The results are shown in Table 1 below. In Table 1, $LT_{97}$ is a measurement of lifetime, indicating the time taken until the initial brightness (assumed as 100%) measured at a current density of about 10 mA/cm² is reduced to 97%.

TABLE 1

| Example | Host | Dopant | Driving voltage (V) | Current density (mA/cm2) | Brightness (cd/m2) | Efficiency (cd/A) | Emission color | Color coordinates | LT97 (HR) |
|---|---|---|---|---|---|---|---|---|---|
| Example 1 | H3 | D13 | 5.8 | 10 | 6,315 | 63.2 | Green | 0.25, 0.72 | 76 |
| Example 2 | H3 | D5 | 5.7 | 10 | 6,674 | 66.7 | Green | 0.28, 0.65 | 87 |
| Example 3 | H12 | D12 | 5.9 | 10 | 6,542 | 65.4 | Green | 0.24, 0.70 | 78 |
| Example 4 | H12 | D11 | 5.8 | 10 | 6,732 | 67.3 | Green | 0.27, 0.70 | 72 |
| Example 5 | H30 | D2 | 6.0 | 10 | 6,214 | 62.1 | Green | 0.26, 0.71 | 83 |
| Example 6 | H43 | D15 | 5.7 | 10 | 6,354 | 63.5 | Green | 0.26, 0.71 | 81 |
| Example 7 | H13 | D22 | 6.0 | 10 | 3,276 | 32.8 | Red | 0.65, 0.35 | 101 |
| Example 8 | H13 | D30 | 6.0 | 10 | 3,221 | 32.2 | Red | 0.66, 0.33 | 96 |
| Comp. Example 1 | CBP | Ir(ppy)3 | 6.8 | 10 | 4,766 | 47.7 | Green | 0.27, 0.70 | 61 |
| Comp. Example 2 | CBP | PtOEP | 7.3 | 10 | 2,212 | 22.1 | Red | 0.67, 0.32 | 89 |

Referring to Table 1, the OLEDs of Examples 1 to 6 were found to have better driving voltages, higher brightness, higher efficiencies, and longer lifetimes than the OLED of Comparative Example 1. Also, the OLEDs of Examples 7 and 8 were found to have better driving voltages, higher brightness, higher efficiencies, and longer lifetimes then the OLED of Comparative Example 2.

While the present invention has been illustrated and described with reference to certain exemplary embodiments, it will be understood by those of ordinary skill in the art that various changes may be made to the described embodiments without departing from the spirit and scope of the present invention as defined by the following claims.

What is claimed is:

1. An organic light-emitting diode, comprising:
    a substrate;
    a first electrode;
    a second electrode facing the first electrode; and
    an organic layer between the first electrode and the second electrode and including an emission layer, the emission layer including a first compound represented by Formula 1 and a second compound represented by Formula 100:

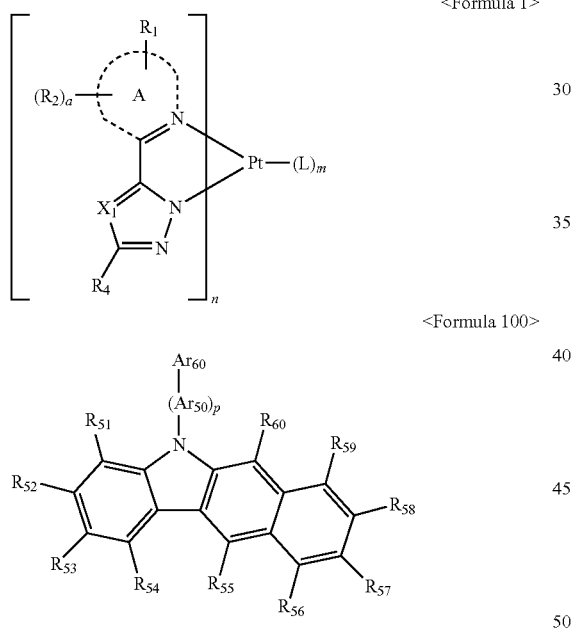

wherein, in Formula 1,
    ring A is a 6-membered ring having at least one nitrogen atom (N), a 6-membered ring fused with at least one 5-membered ring and having at least one N, or a 6-membered ring fused with at least one 6-membered ring and having at least one N;
    $X_1$ is N or $C(R_3)$;
    $R_1$ to $R_4$ are each independently selected from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, $-N(Q_1)(Q_2)$, $-Si(Q_3)(Q_4)(Q_5)$, $-C(=O)(Q_6)$, or a binding site of an adjacent ligand via a single bond or a divalent linking group,
    $Q_1$ to $Q_6$ are each independently a hydrogen atom, a substituted or unsubstituted $C_1$-$C_{60}$ alkyl group, a substituted or unsubstituted $C_6$-$C_{60}$ aryl group, or a substituted or unsubstituted $C_2$-$C_{60}$ heteroaryl group;
    $R_3$ and $R_4$ are optionally linked to each other to form a substituted or unsubstituted $C_4$-$C_{20}$ alicyclic group, a substituted or unsubstituted $C_2$-$C_{20}$ heteroalicyclic, a substituted or unsubstituted $C_6$-$C_{20}$ aromatic group, or a substituted or unsubstituted $C_2$-$C_{20}$ heteroaromatic group;
    a is an integer 0 to 10, and when a is 2 or greater, the at least two $R_2$s are identical to or different from each other;
    n is 1 or 2, and when n is 2, the two groups represented by

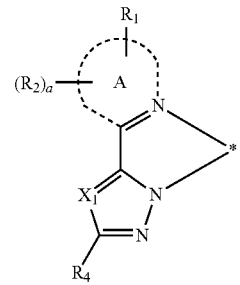

are identical to or different from each other;
    L is an organic ligand; and
    m is an integer of 0 to 2; and
    in Formula 100,
    i) $R_{56}$ and $R_{57}$ are linked together to form a substituted or unsubstituted $C_3$-$C_{60}$ cyclic moiety or a substituted or unsubstituted $C_2$-$C_{60}$ heterocyclic moiety, and $R_{51}$ to $R_{55}$, and $R_{58}$ to $R_{60}$ are each independently a substituent represented by $-(Ar_{51})_q$-$(Ar_{61})$; or
    ii) $R_{58}$ and $R_{59}$ are linked together to form a substituted or unsubstituted $C_3$-$C_{60}$ cyclic moiety or a substituted or unsubstituted $C_2$-$C_{60}$ heterocyclic moiety, and $R_{51}$ to $R_{57}$, and $R_{60}$ are each independently a substituent represented by $-(Ar_{51})_q$-$(Ar_{61})$;
    $Ar_{50}$ and $Ar_{51}$ are each independently selected from a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, $C_2$-$C_{10}$ heterocycloalkenyl group, a substituted or unsubstituted $C_6$-$C_{60}$ arylene group, or a substituted or unsubstituted $C_2$-$C_{60}$ heteroarylene group;

Ar$_{60}$ and Ar$_{61}$ are each independently selected from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted C$_1$-C$_{60}$ alkyl group, a substituted or unsubstituted C$_2$-C$_{60}$ alkenyl group, a substituted or unsubstituted C$_2$-C$_{60}$ alkynyl group, a substituted or unsubstituted C$_1$-C$_{60}$ alkoxy group, a substituted or unsubstituted C$_3$-C$_{10}$ cycloalkyl group, a substituted or unsubstituted C$_2$-C$_{10}$ heterocycloalkyl group, a substituted or unsubstituted C$_3$-C$_{10}$ cycloalkenyl group, C$_2$-C$_{10}$ heterocycloalkenyl group, a substituted or unsubstituted C$_6$-C$_{60}$ aryl group, a substituted or unsubstituted C$_2$-C$_{60}$ heteroaryl group, —N(Q$_{21}$)(Q$_{22}$), or —Si(Q$_{23}$)(Q$_{24}$)(Q$_{25}$);

Q$_{21}$ and Q$_{22}$ are each independently selected from a substituted or unsubstituted C$_3$-C$_{10}$ cycloalkyl group, a substituted or unsubstituted C$_2$-C$_{10}$ heterocycloalkyl group, a substituted or unsubstituted C$_3$-C$_{10}$ cycloalkenyl group, a substituted or unsubstituted C$_2$-C$_{10}$ heterocycloalkenyl group, a substituted or unsubstituted C$_6$-C$_{60}$ aryl group, and a substituted or unsubstituted C$_2$-C$_{60}$ heteroaryl group; and Q$_{23}$ to Q$_{25}$ are each independently selected from among a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted C$_1$-C$_{60}$ alkyl group, a substituted or unsubstituted C$_1$-C$_{60}$ alkoxy group, a substituted or unsubstituted C$_3$-C$_{10}$ cycloalkyl group, a substituted or unsubstituted C$_2$-C$_{10}$ heterocycloalkyl group, a substituted or unsubstituted C$_3$-C$_{10}$ cycloalkenyl group, a substituted or unsubstituted C$_2$-C$_{10}$ heterocycloalkenyl group, a substituted or unsubstituted C$_6$-C$_{60}$ aryl group, or a substituted or unsubstituted C$_2$-C$_{60}$ heteroaryl group; and p and q are each independently an integer of 0 to 5.

2. The organic light-emitting diode of claim 1, wherein in Formula 1, the ring A is selected from pyridine, pyrazine, pyrimidine, pyridazine, purine, isoquinoline, quinoline, phthalazine, 1,8-naphthyridin, quinoxaline, quinazoline, cinnoline, phenanthridine, 1,7-phenanthroline, or pyrrolopyrimidine.

3. The organic light-emitting diode of claim 1, wherein in Formula 1, R$_1$ is a substituted or unsubstituted linear or branched C$_2$-C$_{60}$ alkyl group.

4. The organic light-emitting diode of claim 1, wherein in Formula 1, R$_1$ is selected from an ethyl group, an n-propyl group, an i-propyl group, an n-butyl group, an i-butyl group, a t-butyl group, a pentyl group, a hexyl group, a heptyl group, an octyl group, a nonyl group, or a decyl group; or an ethyl group, an n-propyl group, an i-propyl group, an n-butyl group, an i-butyl group, a t-butyl group, a pentyl group, a hexyl group, a heptyl group, an octyl group, a nonyl group, and a decyl group, substituted with at least one of a deuterium atom, —F, a hydroxyl group, a cyano group, a nitro group, or an amino group.

5. The organic light-emitting diode of claim 1, wherein in Formula 1, a is an integer of 1 to 10, and at least one of the R$_2$s is a substituted or unsubstituted linear or branched C$_1$-C$_{60}$ alkyl group.

6. The organic light-emitting diode of claim 1, wherein the first compound is represented by Formula 1(1):

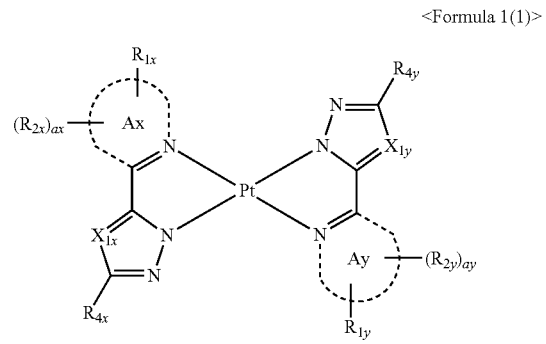

<Formula 1(1)> wherein in Formula 1(1), ring Ax and ring Ay are each independently a 6-membered ring including at least one nitrogen atom (N), a 6-membered ring fused with at least one 5-membered ring and including at least one N, or a 6-membered ring fused with at least one 6-membered ring and including at least one N;

R$_{1x}$ and R$_{1y}$ are each independently selected from a substituted or unsubstituted linear or branched C$_2$-C$_{60}$ alkyl group;

X$_{1x}$ is N or C(R$_{3x}$);

X$_{1y}$ is N or C(R$_{3y}$);

R$_{2x}$ to R$_{4x}$ and R$_{2y}$ to R$_{4y}$ are each independently selected from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted C$_1$-C$_{60}$ alkyl group, a substituted or unsubstituted C$_2$-C$_{60}$ alkenyl group, a substituted or unsubstituted C$_2$-C$_{60}$ alkynyl group, a substituted or unsubstituted C$_1$-C$_{60}$ alkoxy group, a substituted or unsubstituted C$_3$-C$_{10}$ cycloalkyl group, a substituted or unsubstituted C$_3$-C$_{10}$ cycloalkenyl group, a substituted or unsubstituted C$_3$-C$_{10}$ heterocycloalkyl group, a substituted or unsubstituted C$_3$-C$_{10}$ heterocycloalkenyl group, a substituted or unsubstituted C$_6$-C$_{60}$ aryl group, a substituted or unsubstituted C$_6$-C$_{60}$ aryloxy group, a substituted or unsubstituted C$_6$-C$_{60}$ arylthio group, a substituted or unsubstituted C$_2$-C$_{60}$ heteroaryl group, —N(Q$_1$)(Q$_2$), —Si(Q$_3$)(Q$_4$)(Q$_5$), —C(=O)(Q$_6$), or a binding site of an adjacent ligand via a single bond or a divalent linking group;

Q$_1$ to Q$_6$ are each independently a hydrogen atom, a substituted or unsubstituted C$_1$-C$_{60}$ alkyl group, a substituted or unsubstituted C$_6$-C$_{60}$ aryl group, or a substituted or unsubstituted C$_2$-C$_{60}$ heteroaryl group;

R$_{3x}$ and R$_{4x}$ and/or R$_{3y}$ and R$_{4y}$ are optionally linked to each other to form a substituted or unsubstituted C$_4$-C$_{20}$ alicyclic group, a substituted or unsubstituted C$_2$-C$_{20}$ heteroalicyclic group, a substituted or unsubstituted C$_6$-C$_{20}$ aromatic group, or a substituted or unsubstituted C$_2$-C$_{20}$ heteroaromatic group; and a$_x$ and a$_y$ are each independently an integer of 0 to 10.

7. The organic light-emitting diode of claim 6, wherein, in Formula 1(1), R$_{1x}$ are R$_{1y}$ are each independently selected from an ethyl group, an n-propyl group, an i-propyl group, an n-butyl group, an i-butyl group, a t-butyl group, a pentyl group, a hexyl group, a heptyl group, an octyl group, a nonyl group, or a decyl group; or an ethyl group, an n-propyl group, an i-propyl group, an n-butyl group, an i-butyl group, a t-butyl group, a pentyl group, a, hexyl group, a heptyl group, an octyl group, a nonyl group, and a decyl group, substituted with at least one of a deuterium atom, —F, a hydroxyl group, a cyano group, a nitro group, or an amino group.

8. The organic light-emitting diode of claim 1, wherein the first compound is represented by one of Formulas 1A to 1R:

<Formula 1A>

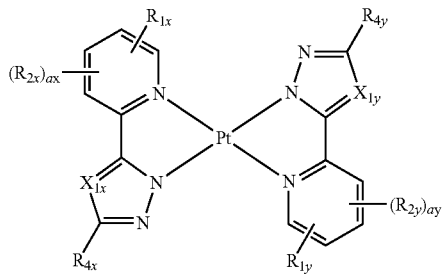

<Formula 1B>

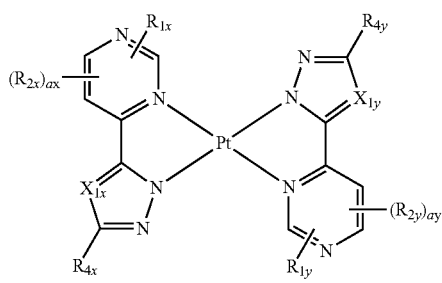

<Formula 1C>

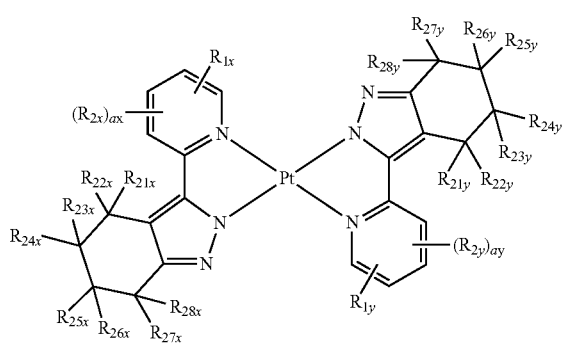

<Formula 1D>

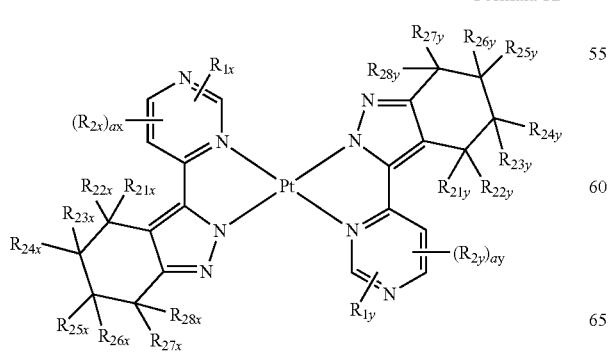

-continued

<Formula 1E>

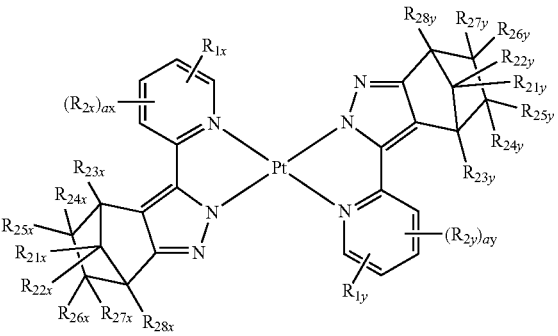

<Formula 1F>

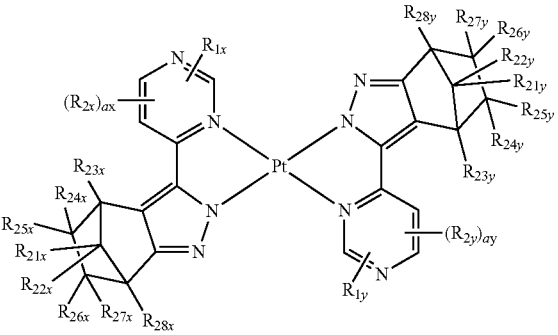

<Formula 1G>

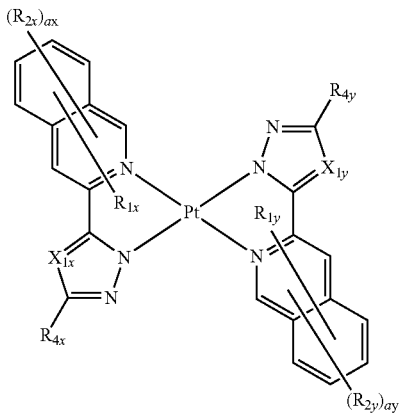

<Formula 1H>

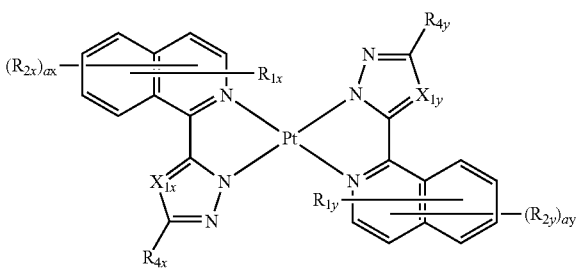

<Formula 1I>
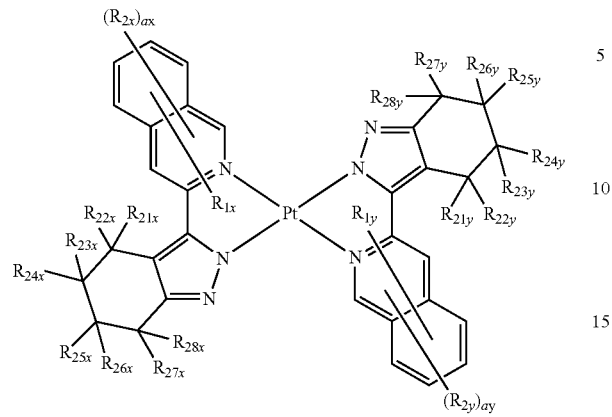
<Formula 1J>
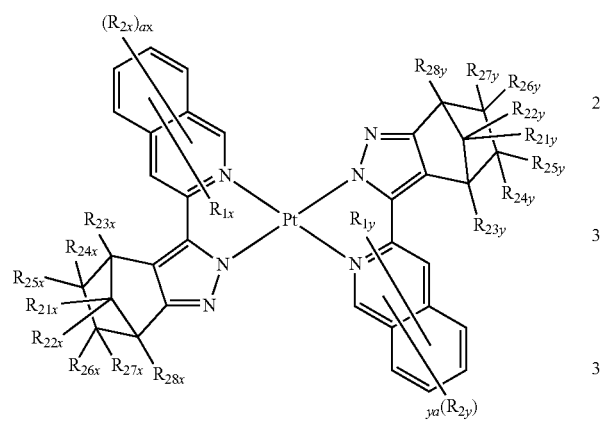
<Formula 1K>
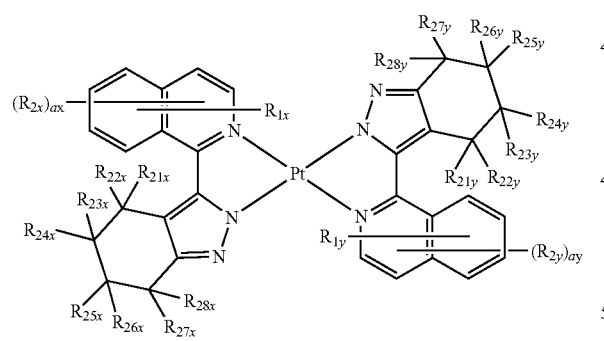
<Formula 1L>
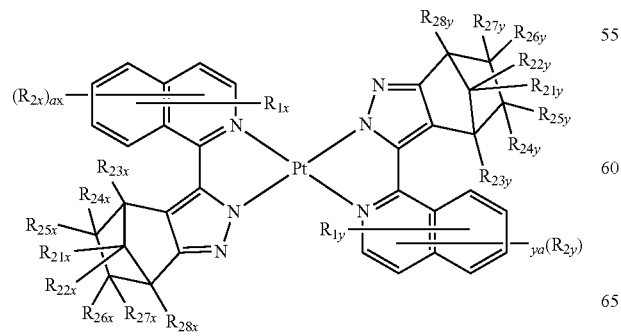
<Formula 1M>
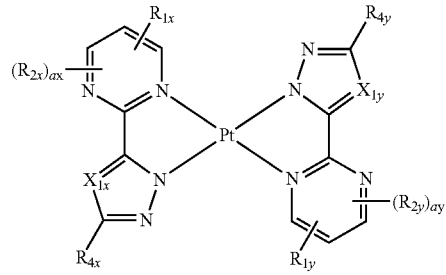
<Formula 1N>
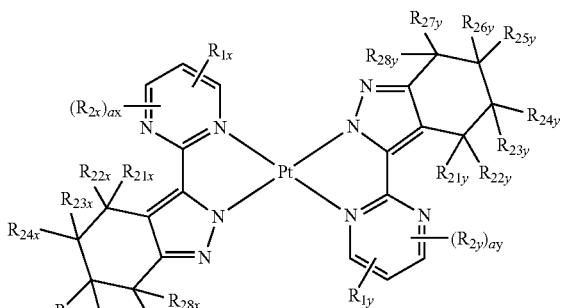
<Formula 1O>
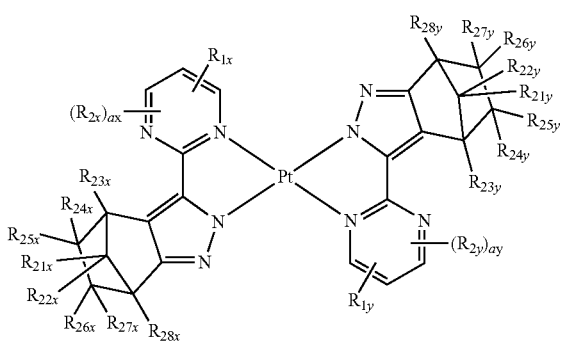
<Formula 1P>
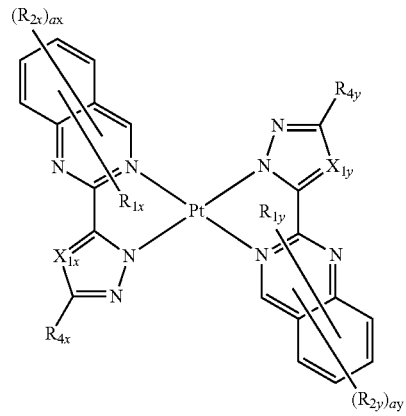

-continued

<Formula 1Q>

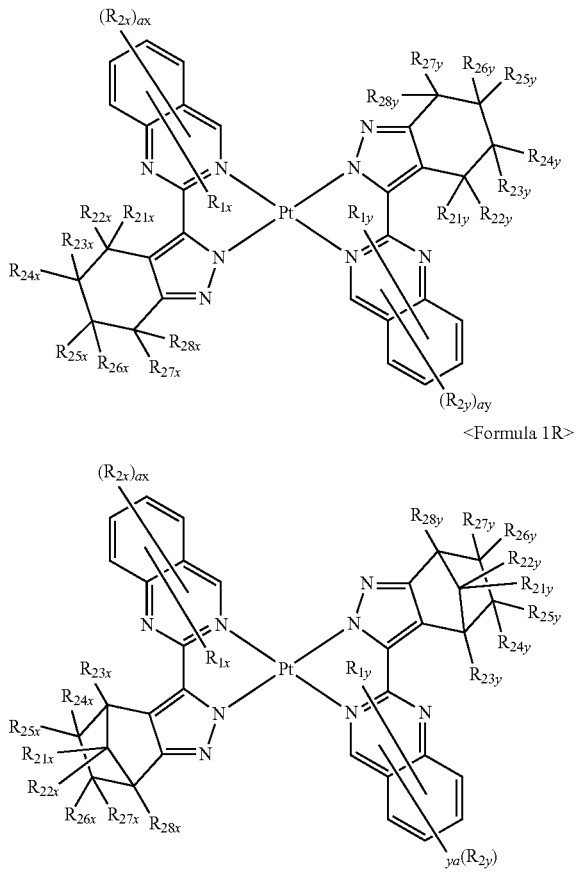

<Formula 1R> wherein, in Formulas 1A to 1R,
$X_{1x}$ is N or $C(R_{3x})$;
$X_{1y}$ is N or $C(R_{3y})$;
$R_{1x}$ and $R_{1y}$ are each independently selected from:
an ethyl group, an n-propyl group, an i-propyl group, an n-butyl group, an i-butyl group, a t-butyl group, a pentyl group, a hexyl group, a heptyl group, an octyl group, a nonyl group, or a decyl group, or
an ethyl group, an n-propyl group, an i-propyl group, an n-butyl group, an i-butyl group, a t-butyl group, a pentyl group, a hexyl group, a heptyl group, an octyl group, a nonyl group, and a decyl group, substituted with at least one of a deuterium atom, —F, a hydroxyl group, a cyano group, a nitro group, or an amino group;
$R_{2x}$ to $R_{4x}$, $R_{21x}$ to $R_{28x}$, $R_{2y}$ to $R_{4y}$, and $R_{21y}$ to $R_{28y}$ are each independently selected from:
a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof; a methyl group, an ethyl group, an n-propyl group, an i-propyl group, an n-butyl group, an i-butyl group, a t-butyl group, a pentyl group, a hexyl group, a heptyl group, an octyl group, a nonyl group, a decyl group, a methoxy group, an ethoxy group, a propoxy group, a butoxy group, or a pentoxy group, or a methyl group, an ethyl group, an n-propyl group, an i-propyl group, an n-butyl group, an i-butyl group, a t-butyl group, a pentyl group, a hexyl group, a heptyl group, an octyl group, a nonyl group, a decyl group, a methoxy group, an ethoxy group, a propoxy group, a butoxy group, and a pentoxy group, substituted with at least one of a deuterium atom, —F, a hydroxyl group, a cyano group, a nitro group, or an amino group; and $a_x$ and $a_y$ are each independently an integer of 1 to 3.

9. The organic light-emitting diode of claim 1, wherein in Formula 1,
n is 2, the two ligands represented by

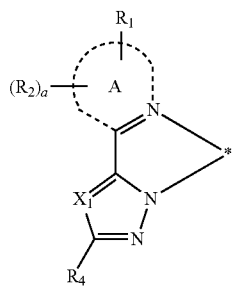

are identical to each other, and the first compound is in trans configuration.

10. The organic light-emitting diode of claim 1, wherein the first compound comprises at least one of Compounds D1 to D35:

D1

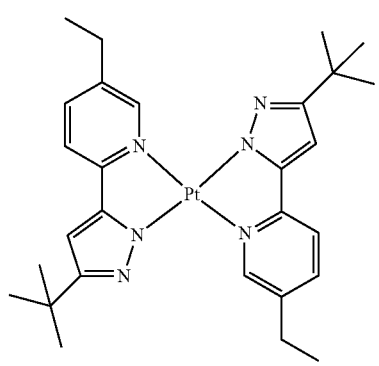

D2

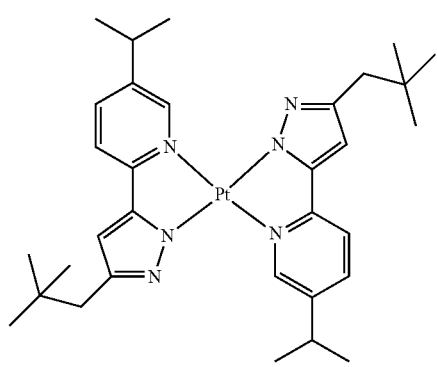

D3
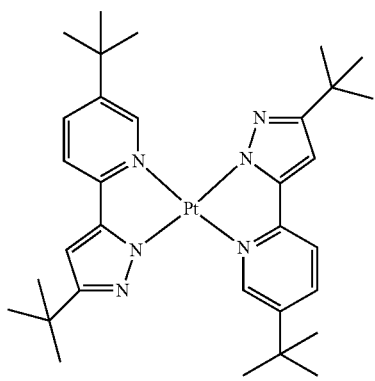
D4
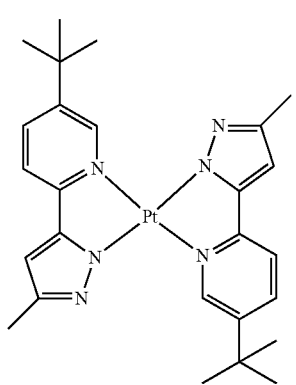
D5
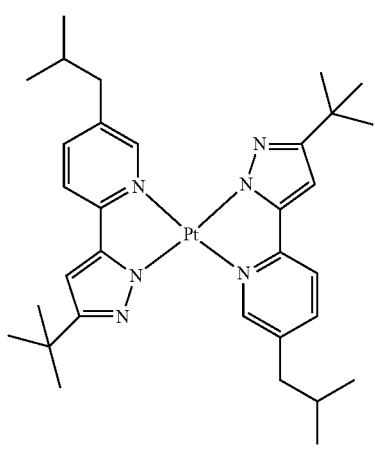
D6
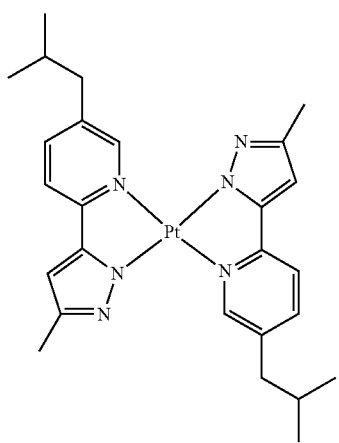
D7
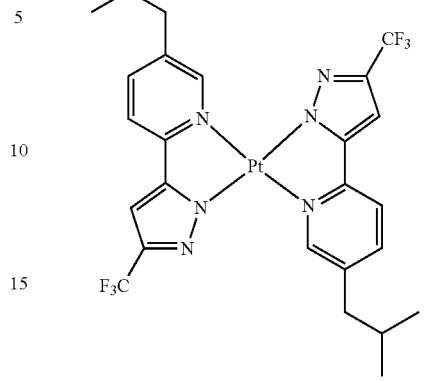
D8
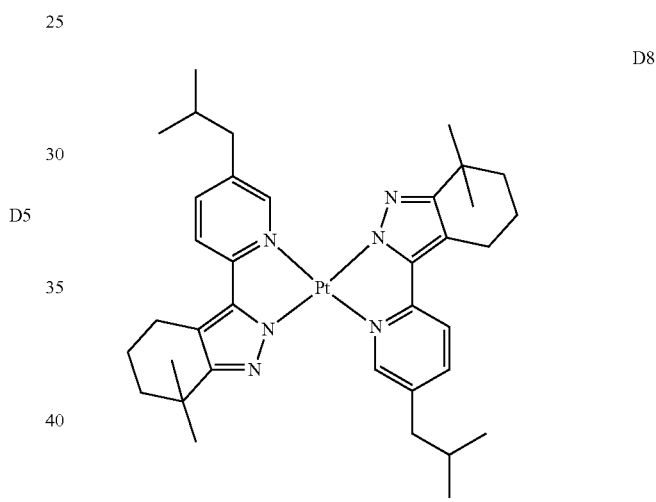
D9
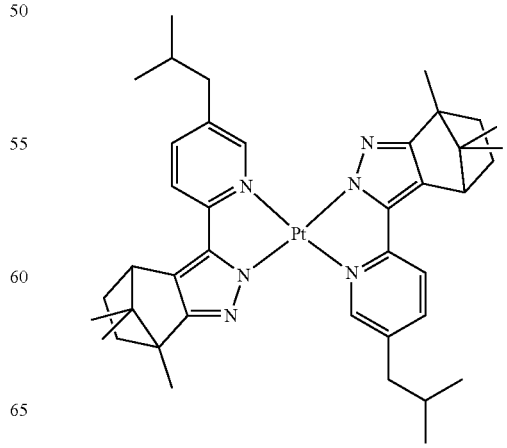

-continued
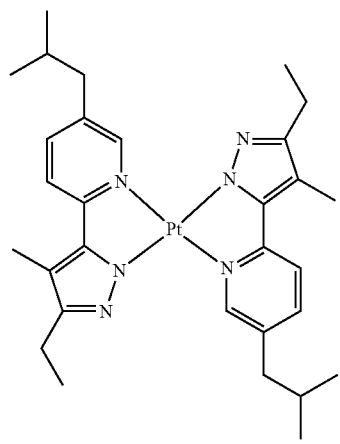
D10
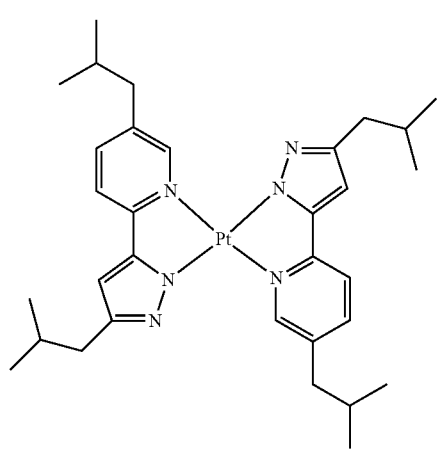
D11
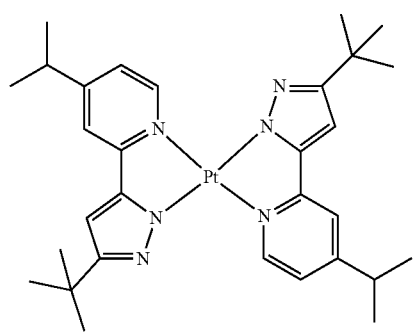
D12
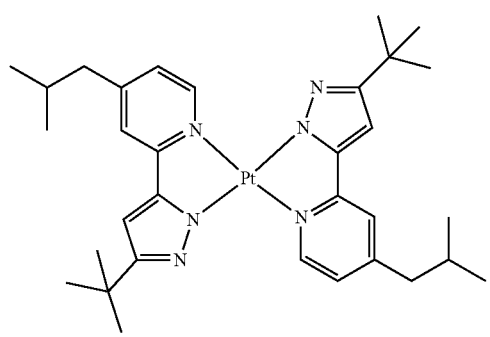
D13
-continued
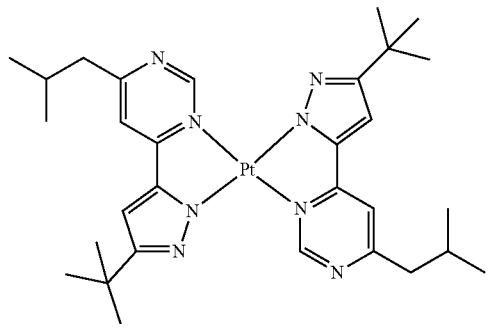
D14
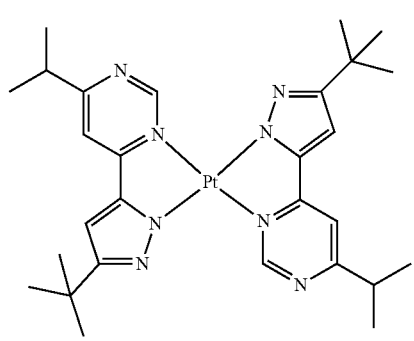
D15
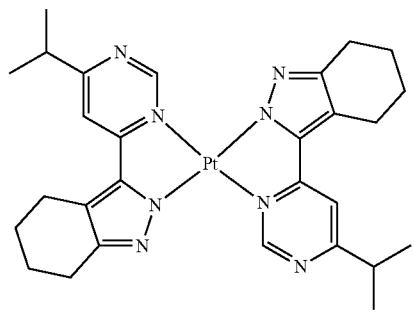
D16
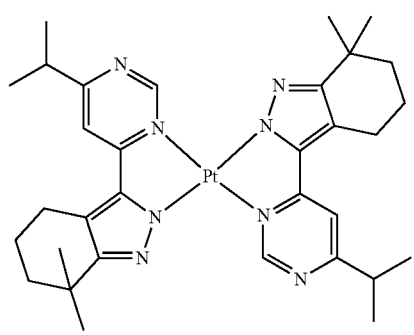
D17

D18
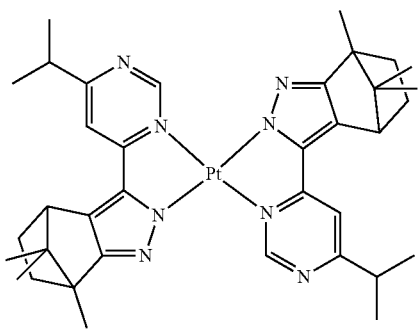
D19
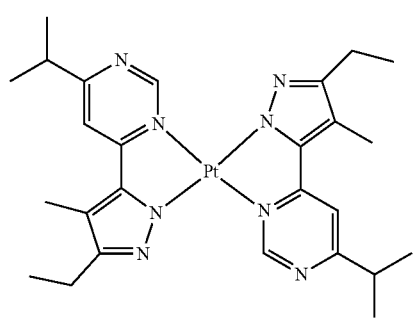
D20
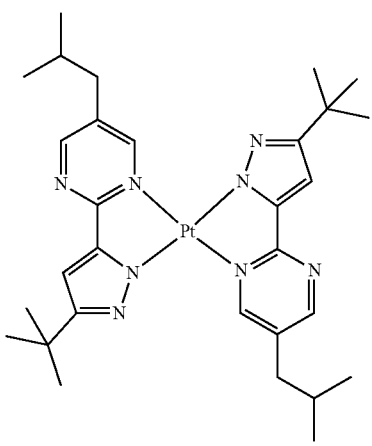
D21
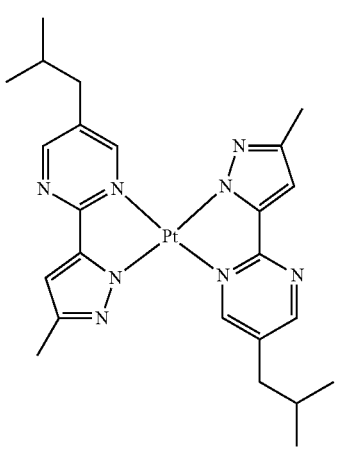
D22
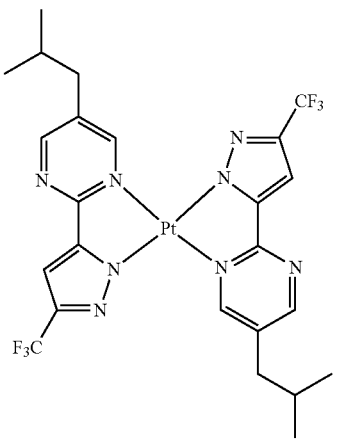
D23
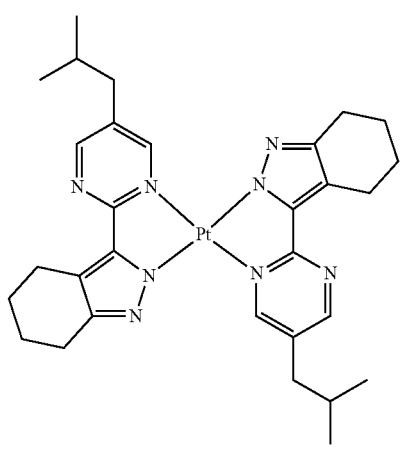
D24
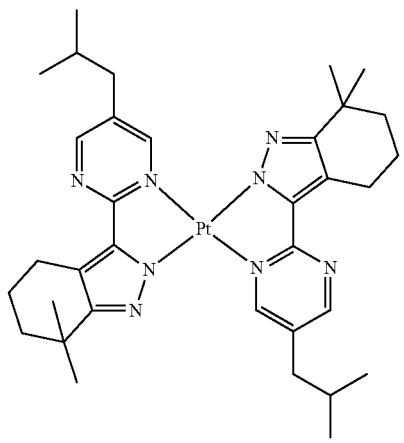

-continued
D25
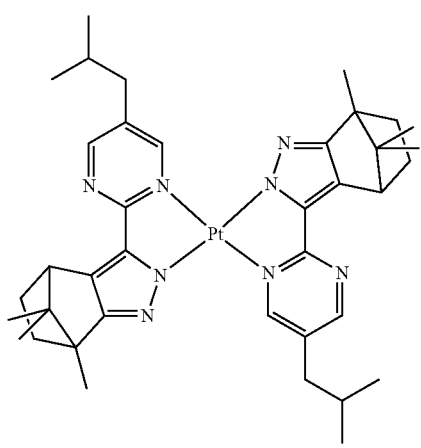
D26
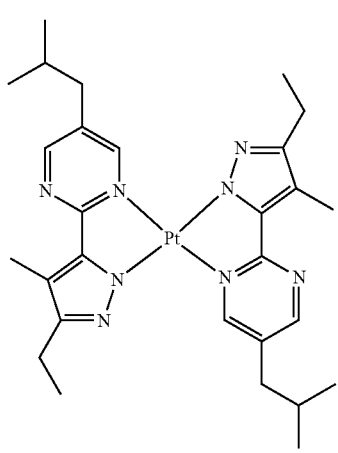
D27
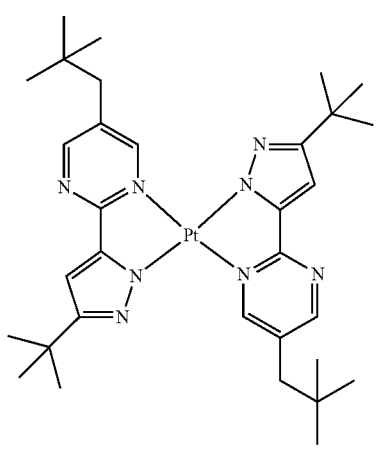
-continued
D28
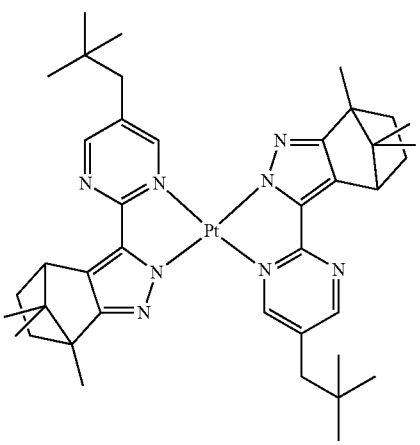
D29
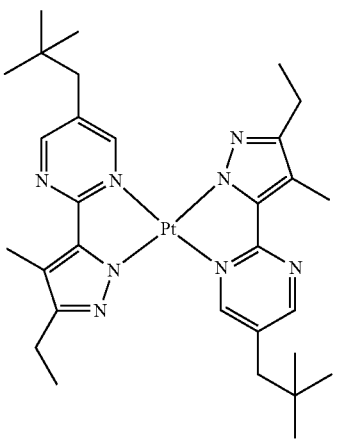
D30
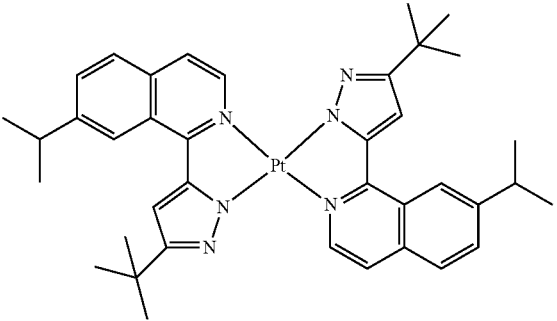

139
-continued

D31
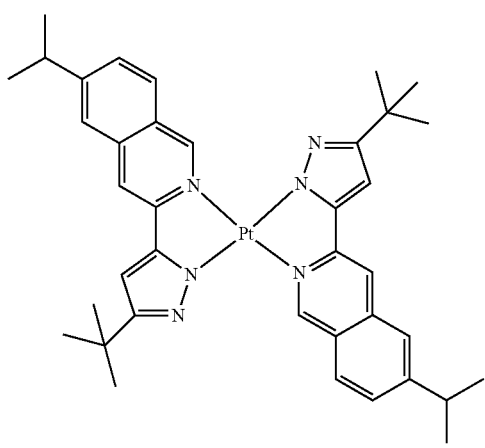

D32
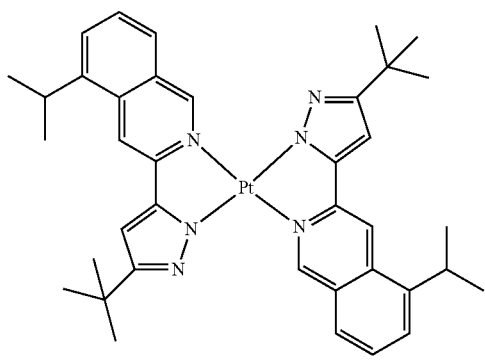

D33
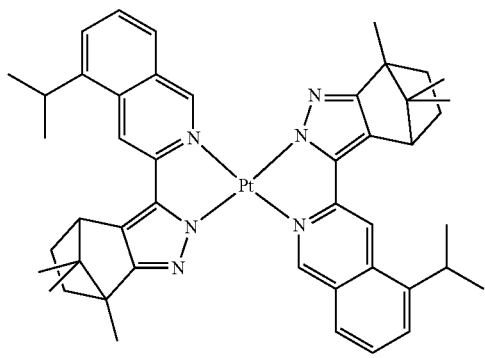

D34
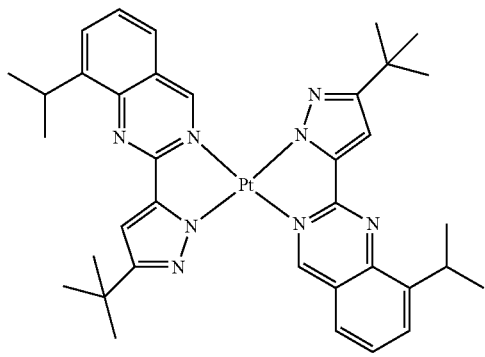

140
-continued

D35
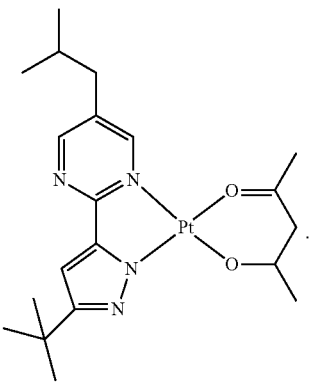

11. The organic light-emitting diode of claim 1, wherein the second compound is represented by Formula 100A or 100B:

<Formula 100A>
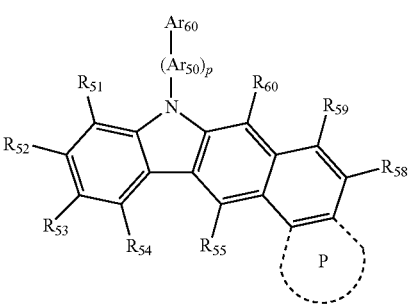

<Formula 100B>
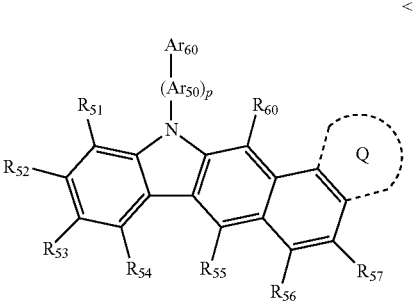

wherein in Formulas 100A and 100B, ring P and ring Q are each independently selected from:
  i) benzene, naphthalene, fluorene, carbazole, dibenzofuran, or dibenzothiophene; or
  ii) benzene, naphthalene, fluorene, carbazole, dibenzofuran, or dibenzothiophene substituted with at least one of:
    a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, or a $C_1$-$C_{20}$ alkoxy group, a $C_1$-$C_{20}$ alkyl group or a $C_1$-$C_{60}$ alkoxy group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, or a phosphoric acid group or a salt thereof, or a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, or an isoquinolinyl group, or a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, or an isoquinolinyl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, dimethyfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group, or —$N(Q_{11})(Q_{12})$ where $Q_{11}$ and $Q_{12}$ are each independently selected from a phenyl group, a naphthyl group, an anthryl group, a fluorenyl group, a dimethyfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group.

12. The organic light-emitting diode of claim 1, wherein the second compound is represented by one of Formulas 100A-1 to 100A-8 and 100B-1 to 100B-8:

<Formula 100A-1>

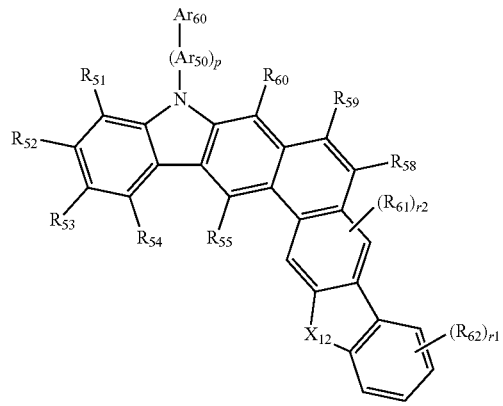

<Formula 100A-2>

<Formula 100A-3>

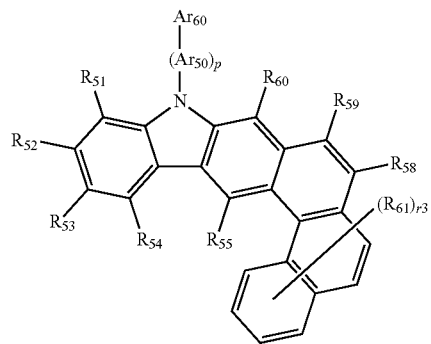

<Formula 100A-4>

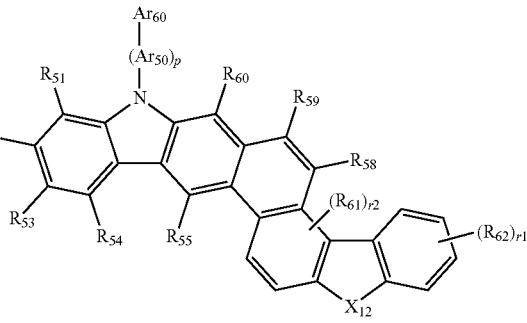

<Formula 100A-5>

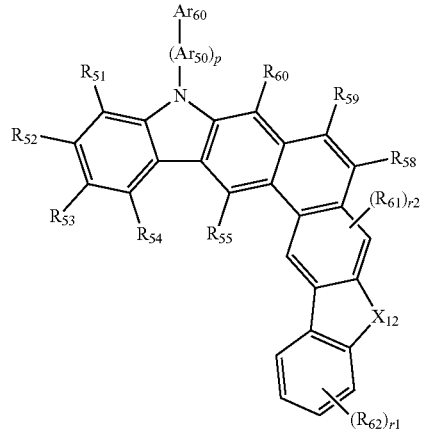

<100A-6>
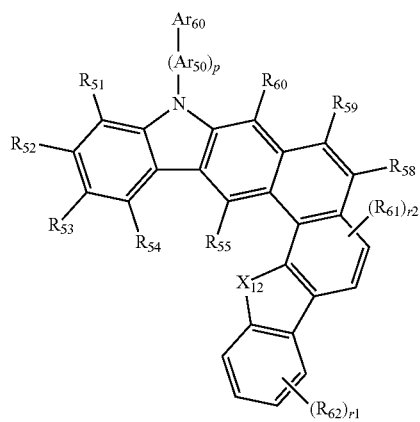
<100A-7>
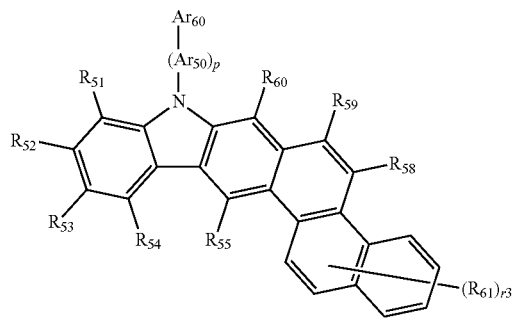
{100A-8}
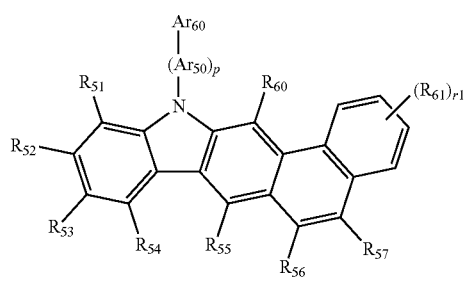
<100B-1>
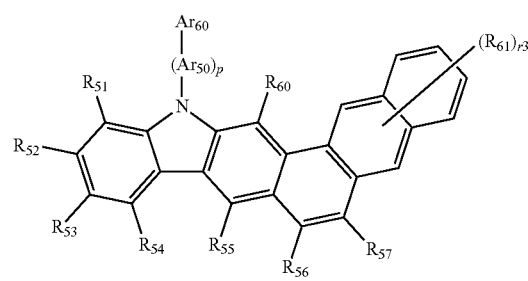
<100B-2>
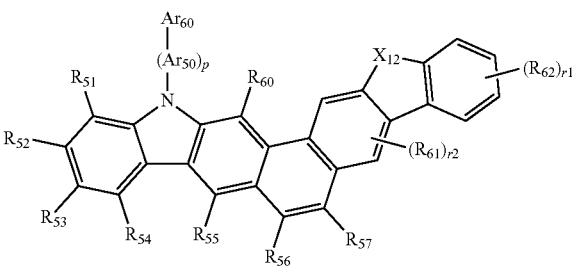
<100B-3>
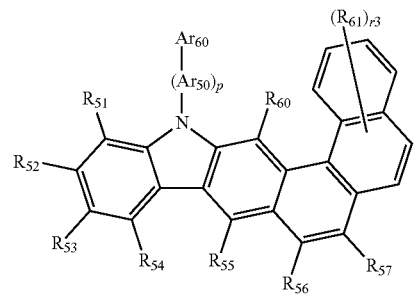
<100B-4>
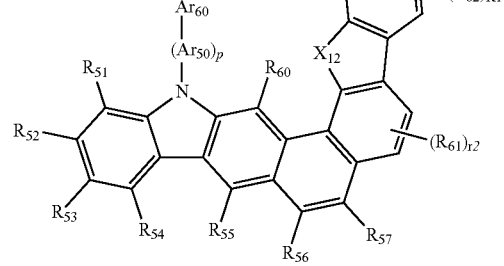
<100B-5>
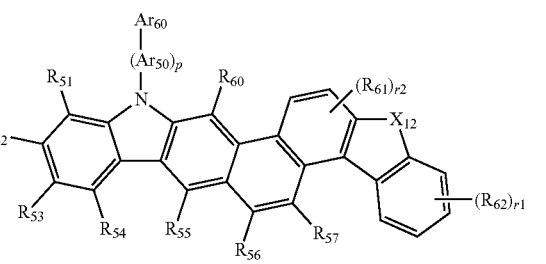
<100B-6>

-continued

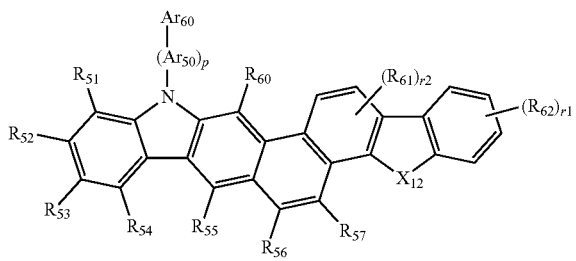

<100B-7>

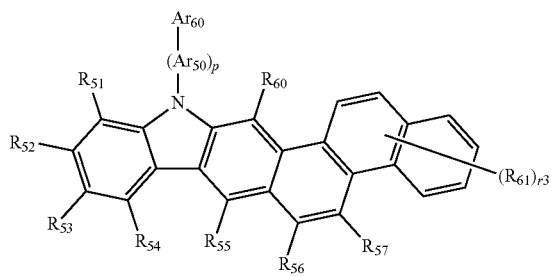

<100B-8>

Wherein, in Formulas 100A-1 to 100A-8 and 100B-1 to 100B-8, $X_{12}$ is O, S, $C(R_{71})(R_{72})$, or $N(R_{73})$;

$R_{61}$, $R_{62}$, and $R_{71}$ to $R_{73}$ are each independently selected from:
- i) a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group, or
- ii) a $C_1$-$C_{60}$ alkyl group, a $C_2$-$C_{60}$ alkenyl group, a $C_2$-$C_{60}$ alkynyl group, or a $C_1$-$C_{60}$ alkoxy group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, or
- iii) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, or a $C_2$-$C_{60}$ heteroaryl group, or
- iv) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, or a $C_2$-$C_{60}$ heteroaryl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group, or
- v) $—N(Q_{11})(Q_{12})$ or $—Si(Q_{11})(Q_{12})(Q_{13})$ where $Q_{11}$ and $Q_{12}$ are each independently a $C_6$-$C_{60}$ aryl group or a $C_2$-$C_{60}$ heteroaryl group, and $Q_{13}$ to $Q_{15}$ are each independently a $C_1$-$C_{60}$ alkyl group, a $C_1$-$C_{60}$ alkoxy group, a $C_6$-$C_{60}$ aryl group, or a $C_2$-$C_{60}$ heteroaryl group;

r1 is an integer of 1 to 4;
r2 is 1 or 2; and
r3 is an integer of 1 to 6.

13. The organic light-emitting diode of claim 1, wherein in Formula 2, $Ar_{50}$ and $Ar_{51}$ are each independently selected from:
- i) a phenylene group, a naphthalene group, a fluorenylene group, a pyridinyl group, a pyrazinylene group, a pyrimidinyl group, a pyridazinyl group, a quinolinyl group, a carbazolylene group, a triazinylene group, a dibenzofuranylene group, or a dibenzothiophenylene group; or
- ii) a phenylene group, a naphthalene group, a fluorenylene group, a pyridinyl group, a pyrazinylene group, a pyrimidinyl group, a pyridazinyl group, a quinolinyl group, a carbazolylene group, a triazinylene group, a dibenzofuranylene group, or a dibenzothiophenylene group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, $C_1$-$C_{20}$ alkyl group, $C_1$-$C_{20}$ alkoxy group, a phenyl group, a naphthyl group, an anthryl group, a fluorenyl group, a dimethyfluorenyl group, a diphenylfluorenyi group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group.

14. The organic light-emitting diode of claim 1, wherein in Formula 2, $Ar_{60}$ and $Ar_{61}$ are each independently selected from Formulas 103-1 to 103-16:

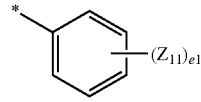

Formula 103-1

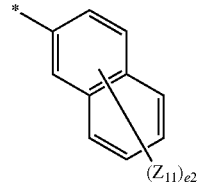

Formula 103-2

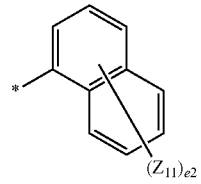

Formula 103-3

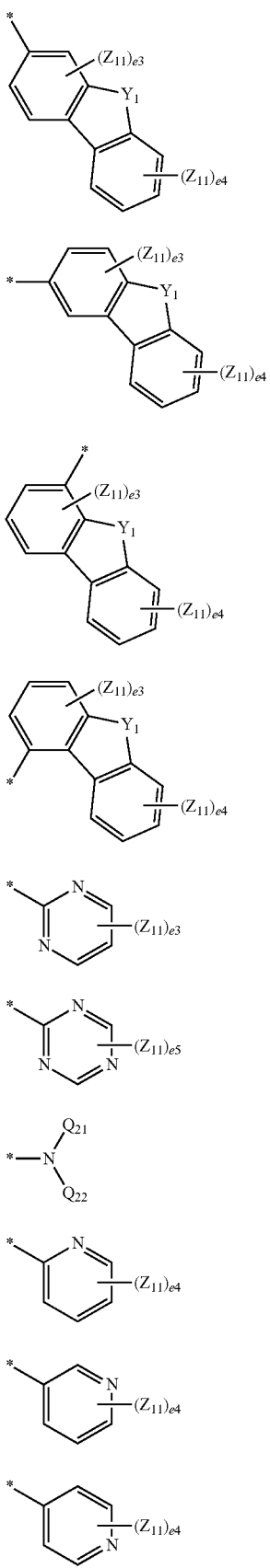

Formula 103-4

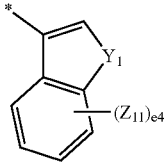

Formula 103-14

Formula 103-5

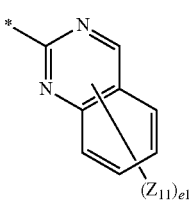

Formula 103-15

Formula 103-6

Formula 103-7

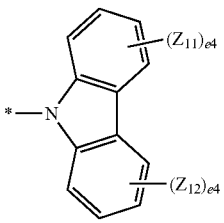

Formula 103-16

Formula 103-8

Formula 103-9

Formula 103-10

Formula 103-11

Formula 103-12

Formula 103-13

Wherein, in Formulas 103-1 to 103-16, $Y_1$ is O, S, $C(Z_{21})(Z_{22})$, or $N(Z_{23})$;

$Z_{11}$, $Z_{12}$, and $Z_{21}$ to $Z_{23}$ are each independently selected from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethyfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group;

$Q_{21}$ and $Q_{22}$ are each independently selected from a phenyl group, a naphthyl group, an anthryl group, a fluorenyl group, a dimethyfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group;

e1 is an integer of 1 to 5;

e2 is an integer of 1 to 7;

e3 is an integer of 1 to 3;

e4 is an integer of 1 to 4; and e5 is 1 or 2.

15. The organic light-emitting diode of claim 1, wherein the second compound is represented by Formula 100A-H1, 100A-H2, 100B-H1, or 100B-H2:

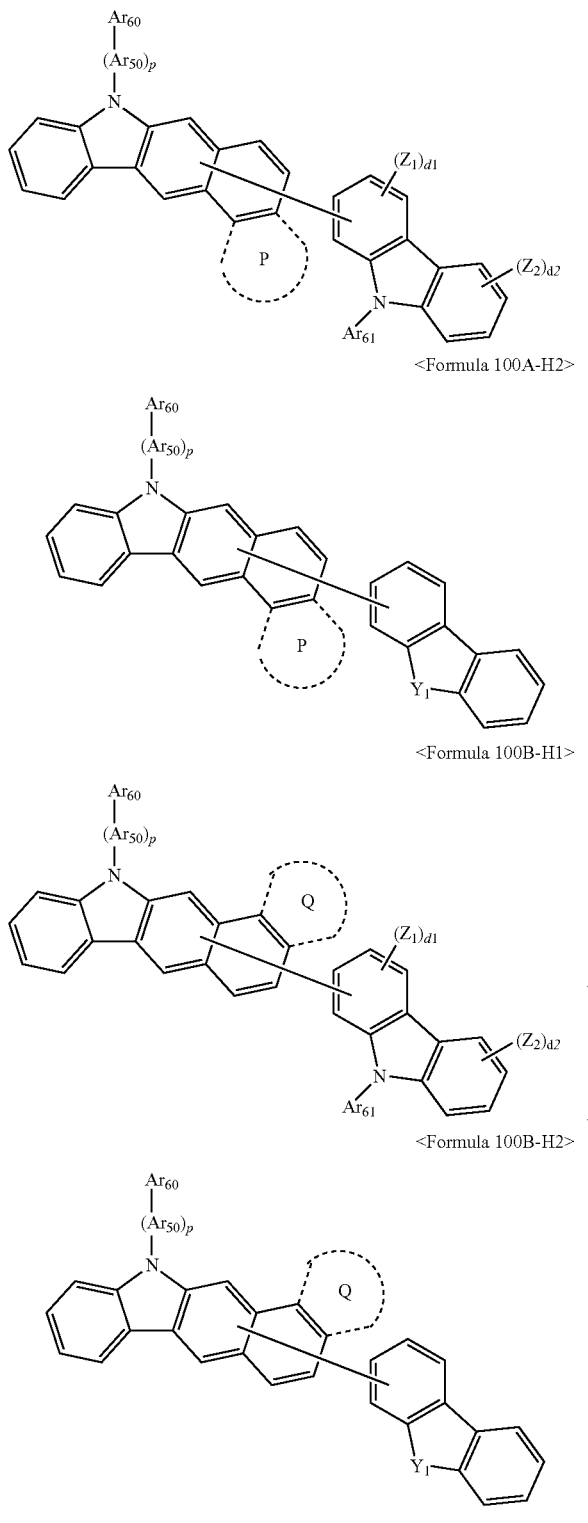

wherein, in Formula 100A-H1, 100A-H2, 100B-H1, or 100B-H2:

ring P and ring Q are each independently selected from:
i) benzene, naphthalene, fluorene, carbazole, dibenzofuran, or dibenzothiophene, or ii) benzene, naphthalene, fluorene, carbazole, dibenzofuran, or dibenzothiophene, substituted with at least one of:

a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, or a $C_1$-$C_{20}$ alkoxy group, or a $C_1$-$C_{20}$ alkyl group or a $C_1$-$C_{60}$ alkoxy group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, or a phosphoric acid group or a salt thereof, or a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, or an isoquinolinyl group, or a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, or an isoquinolinyl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group, or —$N(Q_{11})(Q_{12})$ where $Q_{11}$ and $Q_{12}$ are each independently selected from a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group;

$Z_1$ and $Z_2$ are each independently selected from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group;

$d_1$ is an integer of 1 to 3;
$d_2$ is an integer of 1 to 4;
$Y_1$ is O or S;
$Ar_{61}$ is represented by one of Formulas 103-1 to 103-16:

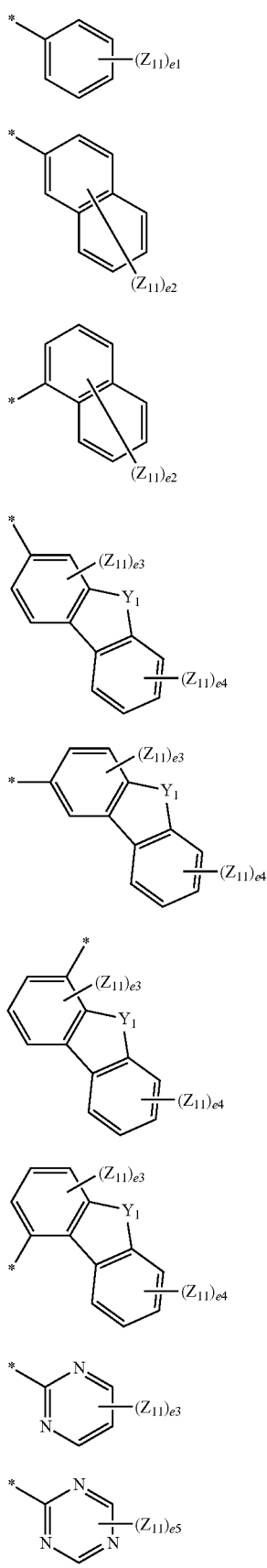
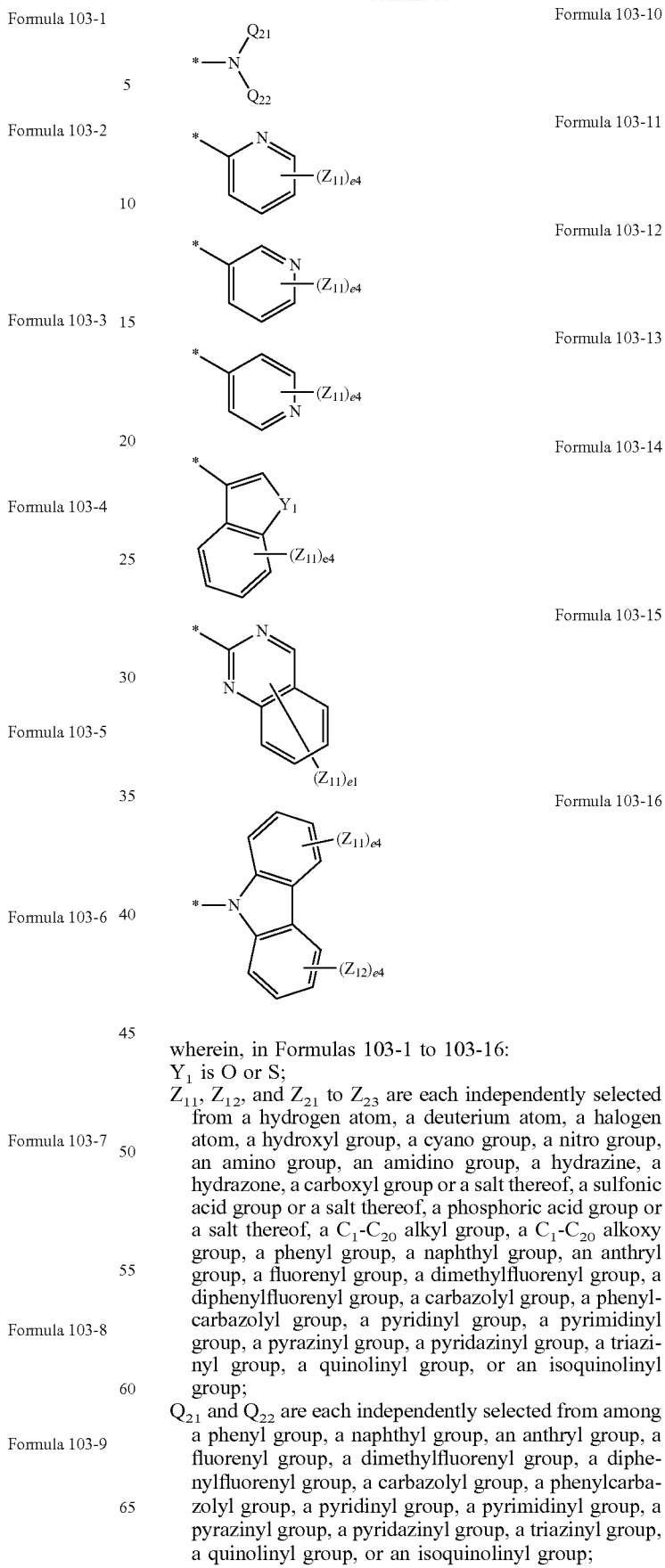

wherein, in Formulas 103-1 to 103-16:

$Y_1$ is O or S;

$Z_{11}$, $Z_{12}$, and $Z_{21}$ to $Z_{23}$ are each independently selected from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group;

$Q_{21}$ and $Q_{22}$ are each independently selected from among a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group;

e1 is an integer of 1 to 5;
e2 is an integer of 1 to 7;
e3 is an integer of 1 to 3;
e4 is an integer of 1 to 4; and
e5 is 1 or 2.
16. The organic light-emitting diode of claim 1, wherein the second compound comprises at least one of Compounds H1 to H64:
H1
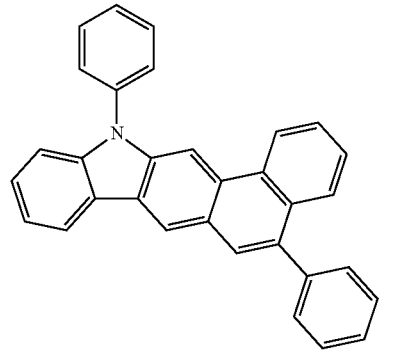
H2
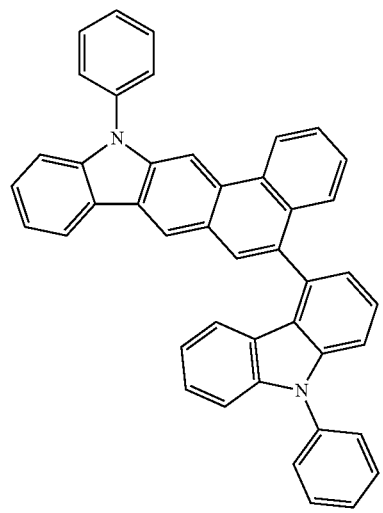
H3
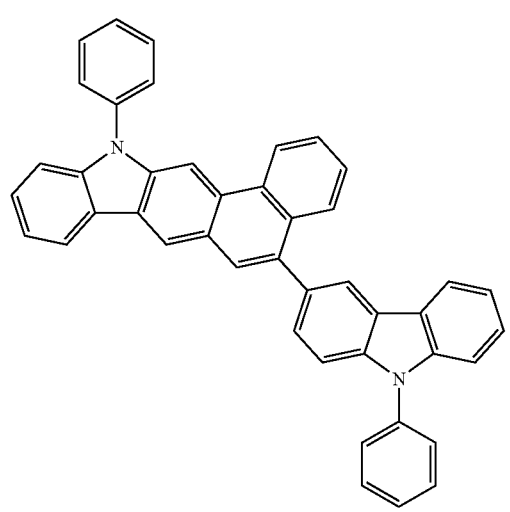
H4
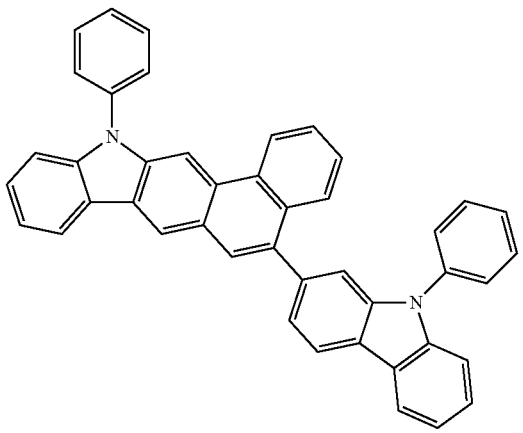
H5
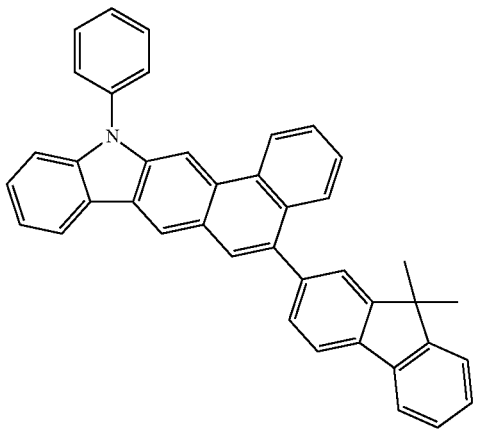
H6
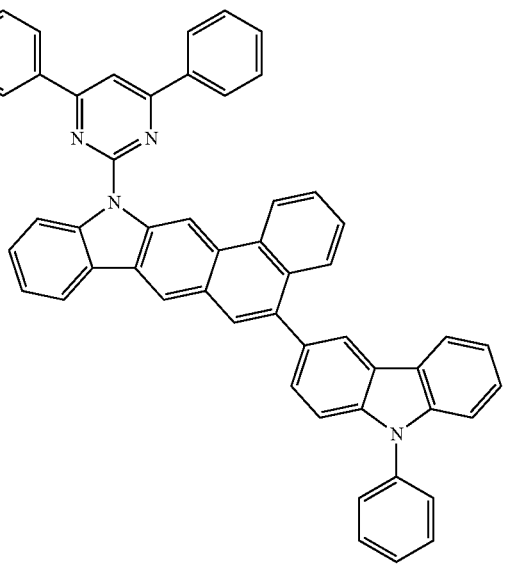

H7
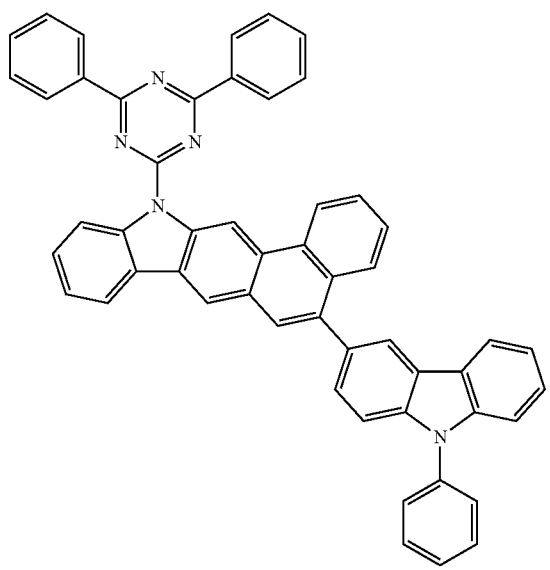
H8
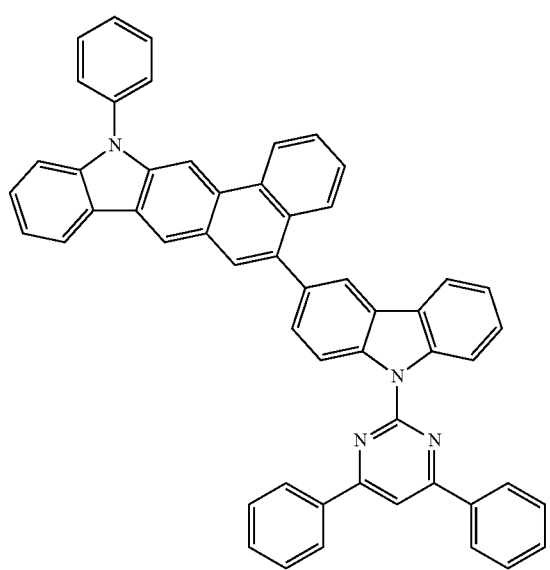
H9
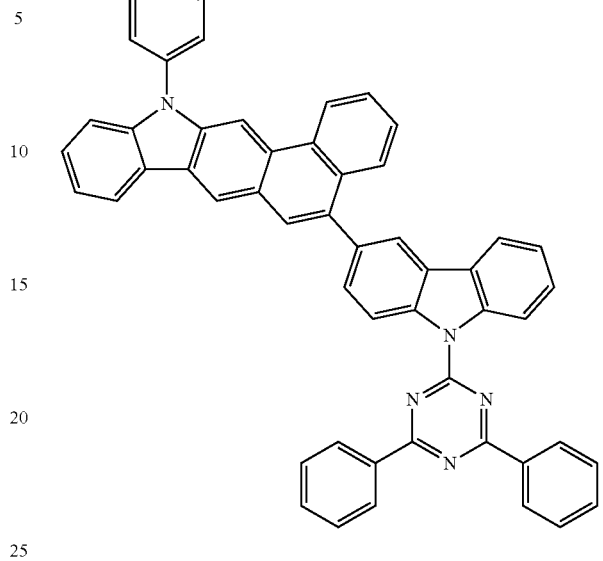
H10
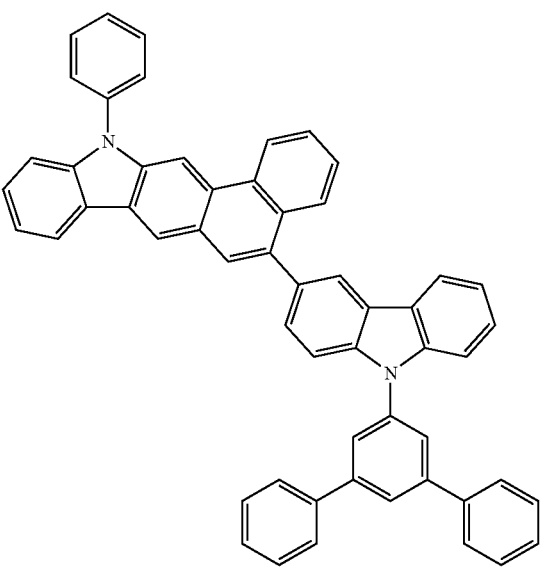

157
-continued
158
-continued
H11
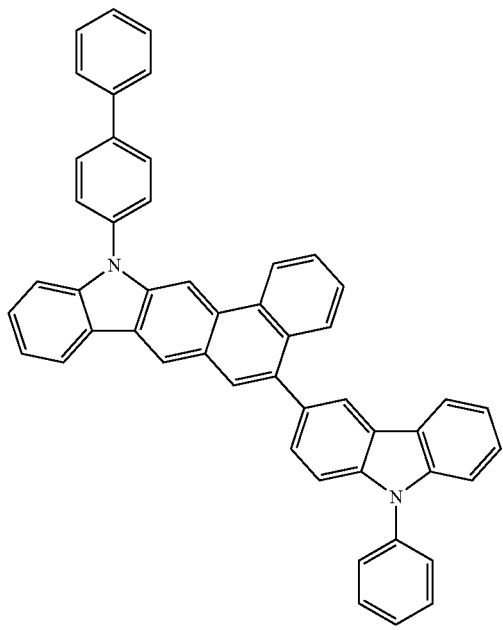
H13
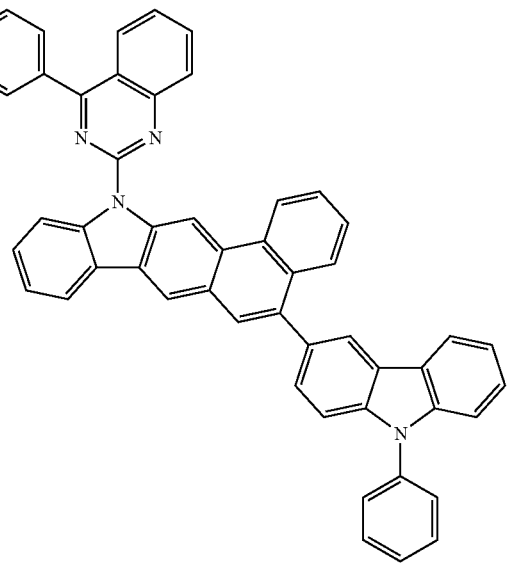
H12
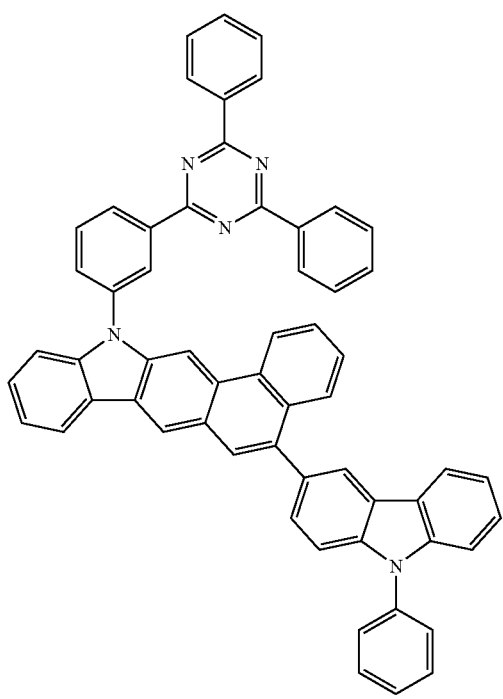
H14
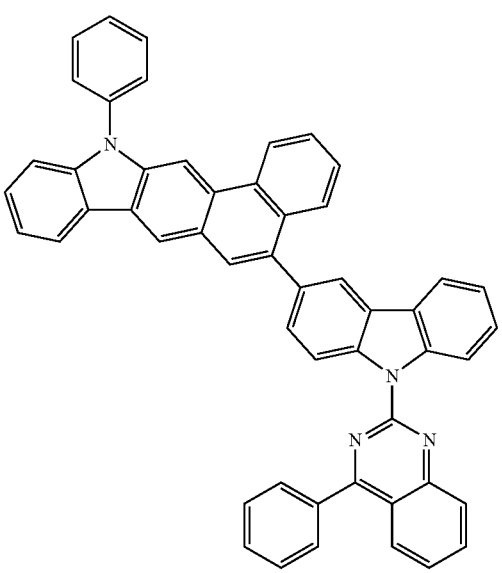

H15
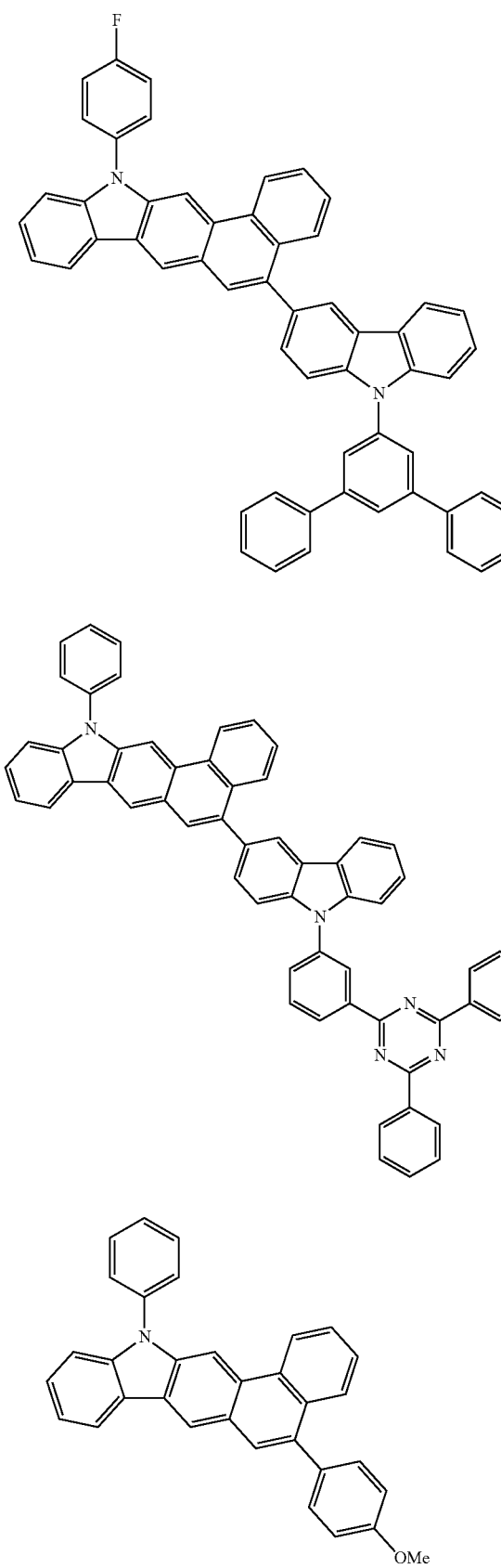
H16
H17
H18
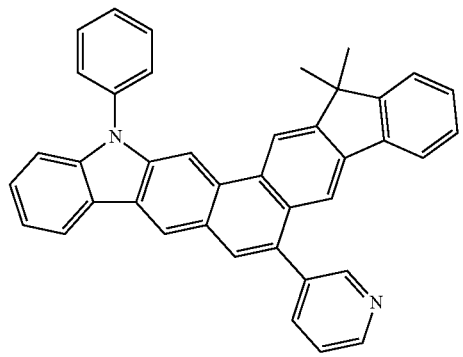
H19
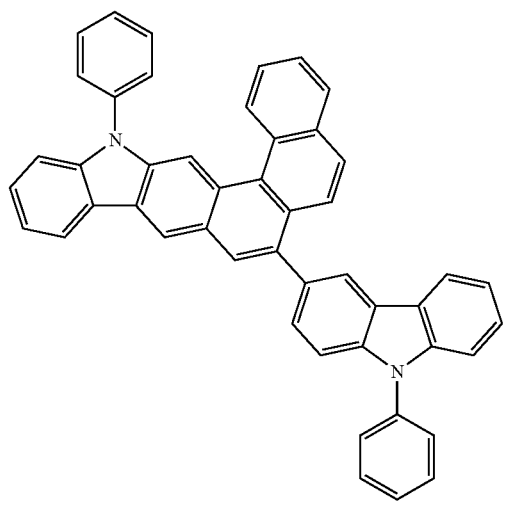
H20
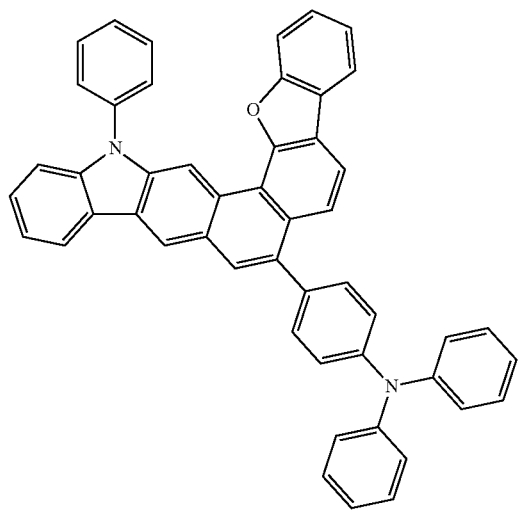

-continued
H21
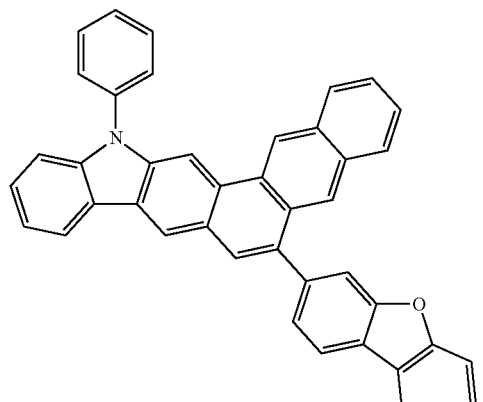
H22
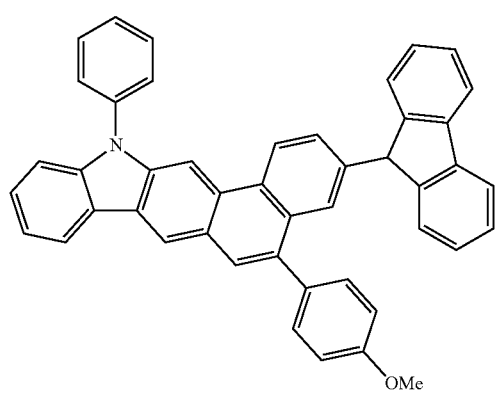
H23
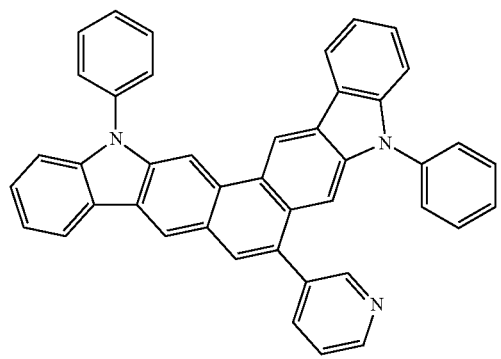
H24
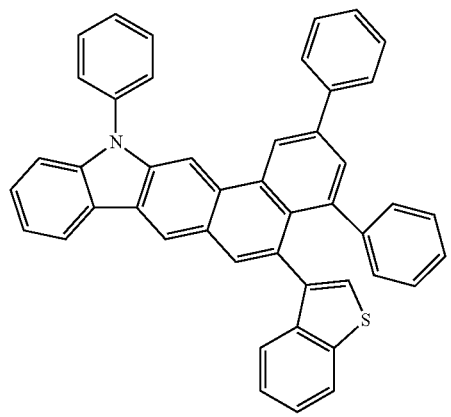
-continued
H25
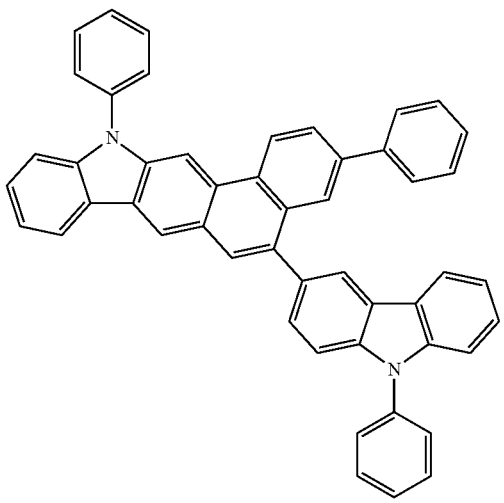
H26
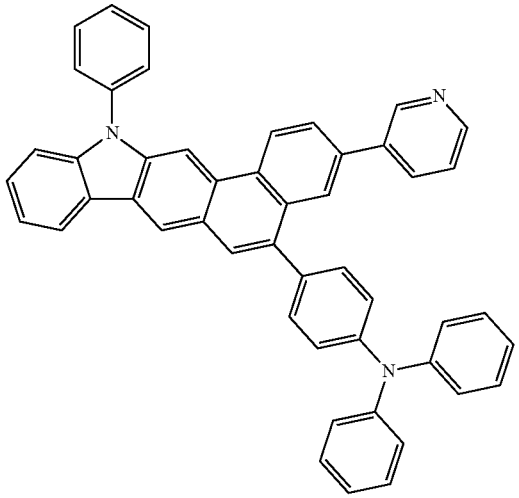
H27

H28
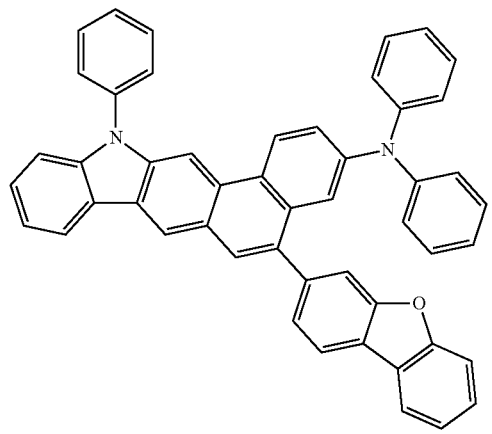
H29
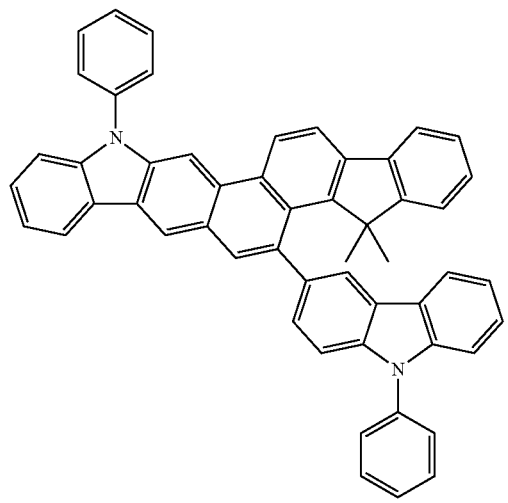
H30
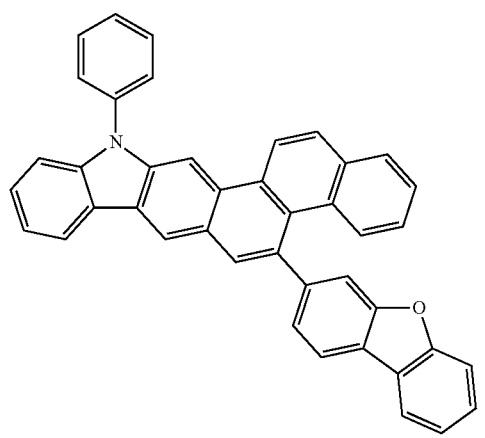
H31
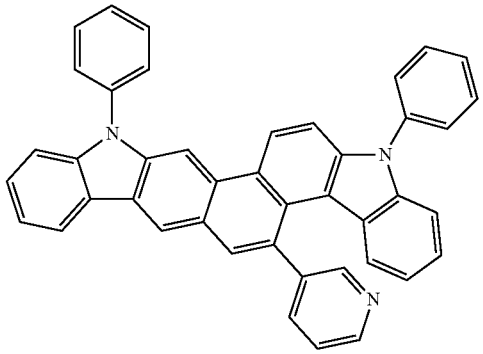
H32
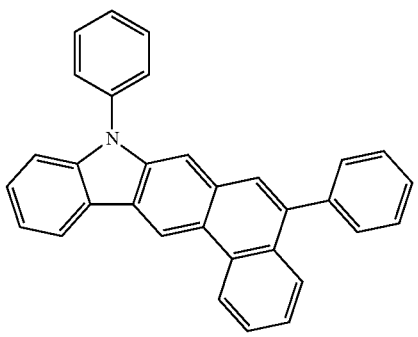
H33
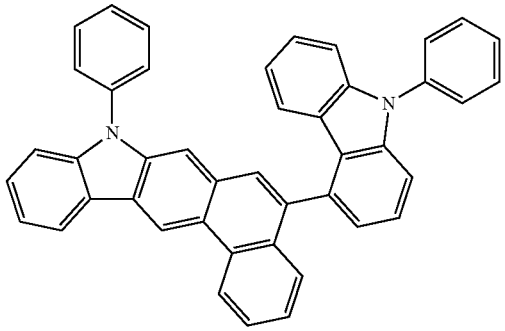
H34
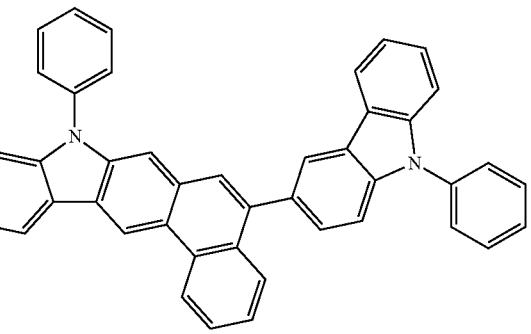

-continued
H35
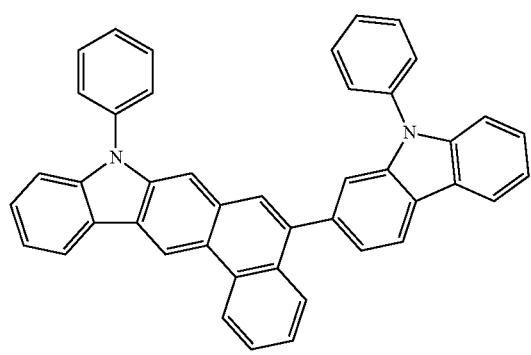
H36
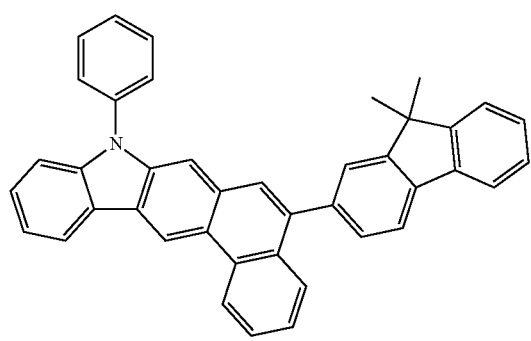
H37
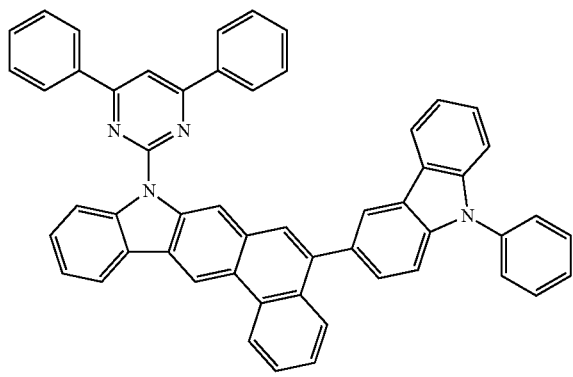
H38
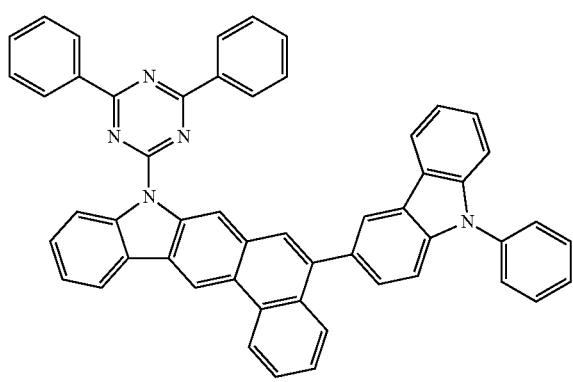
-continued
H39
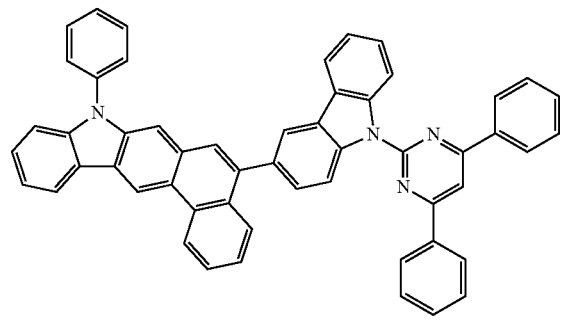
H40
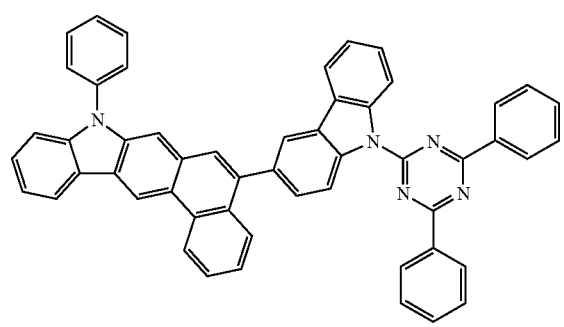
H41
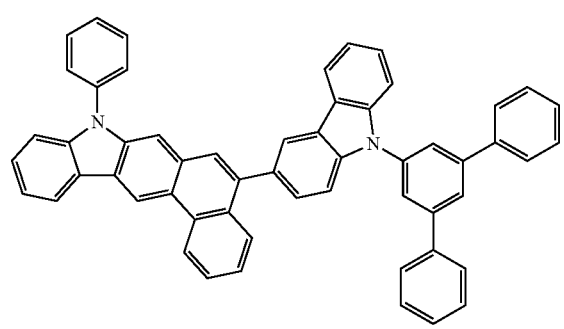
H42
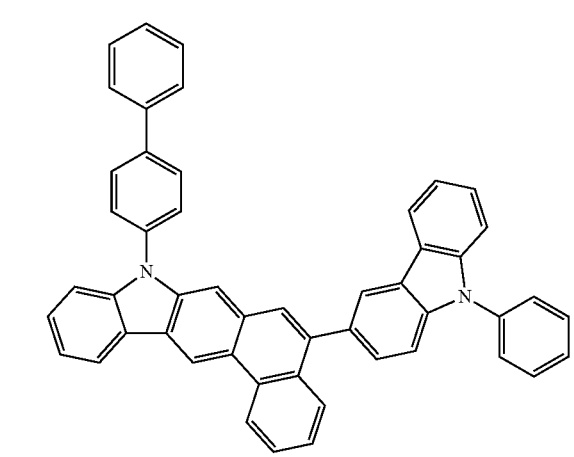

H43
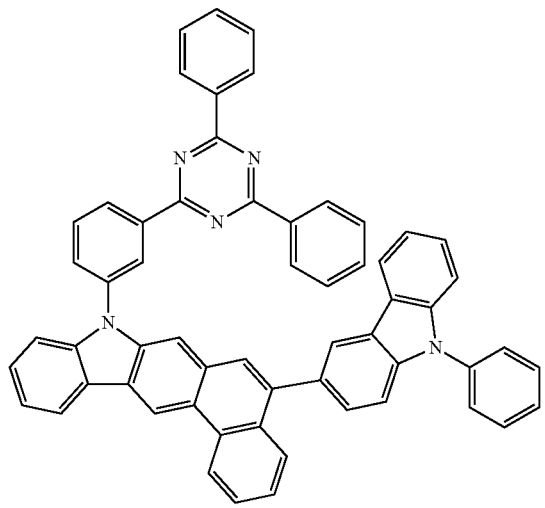
H44
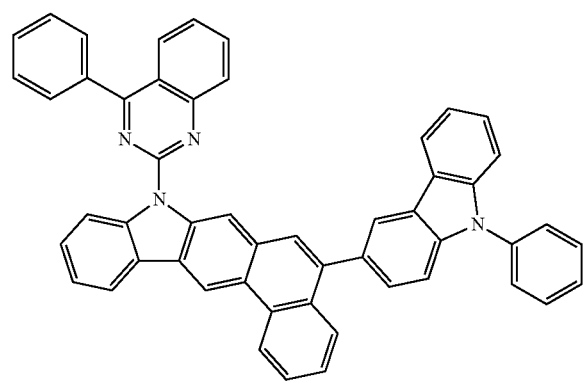
H45
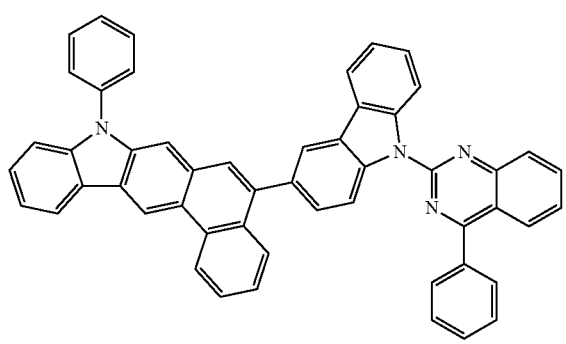
H46
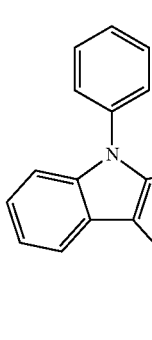
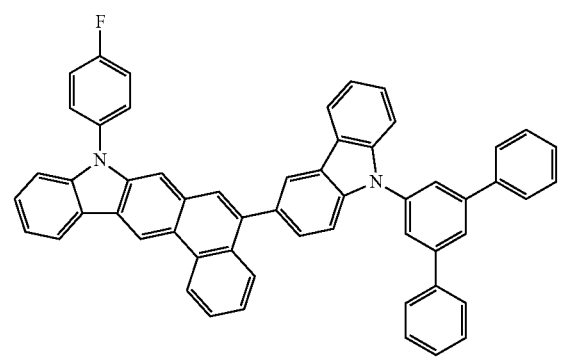
H47
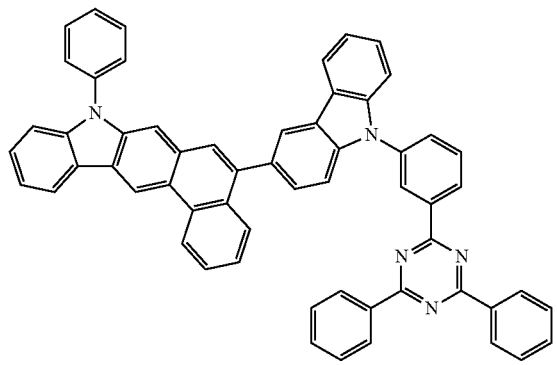
H48
H49
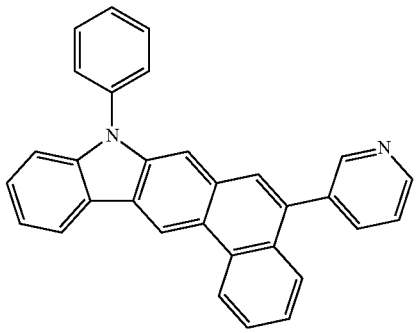
H50
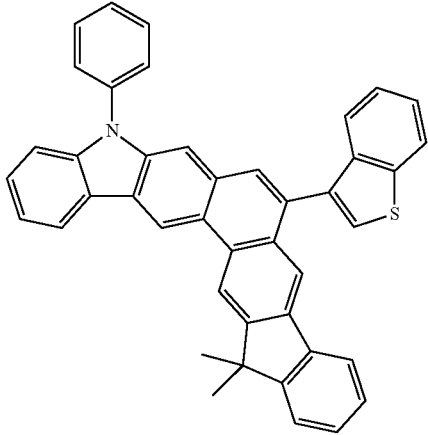

-continued
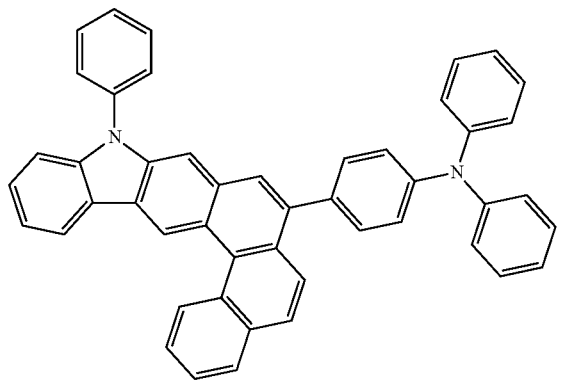
H51
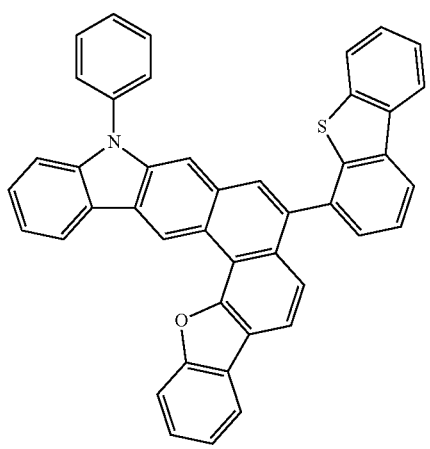
H52
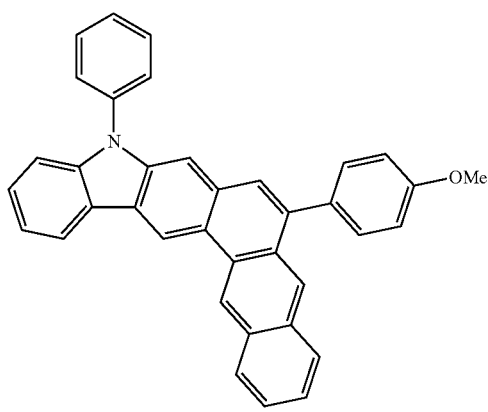
H53
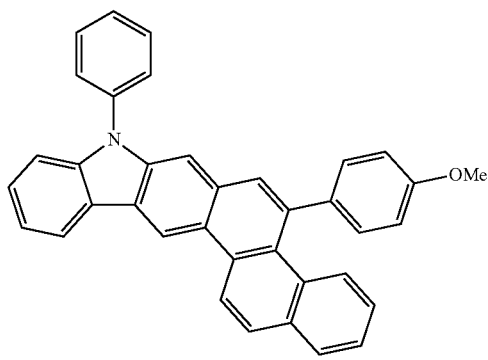
H54
-continued
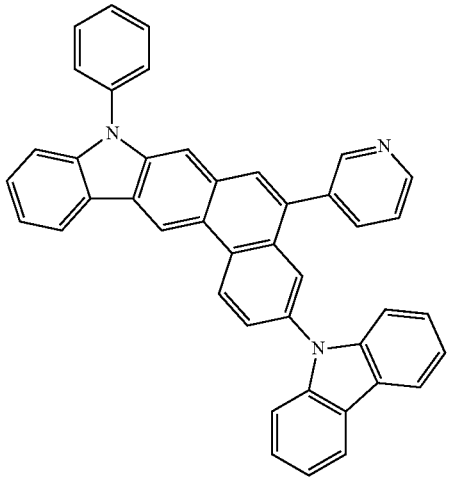
H55
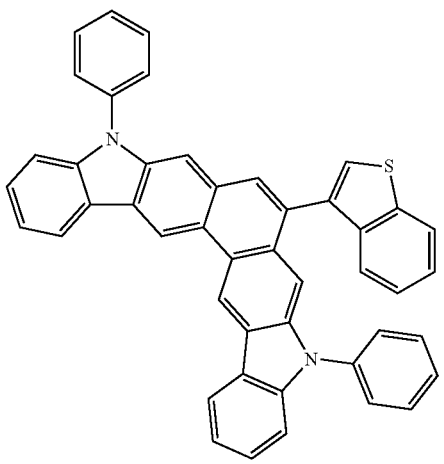
H56
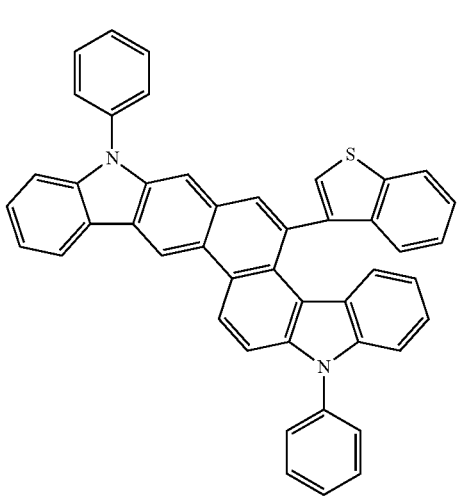
H57

-continued
H58
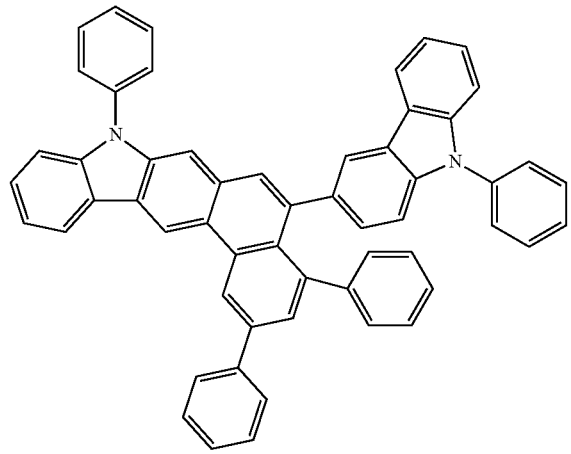
H59
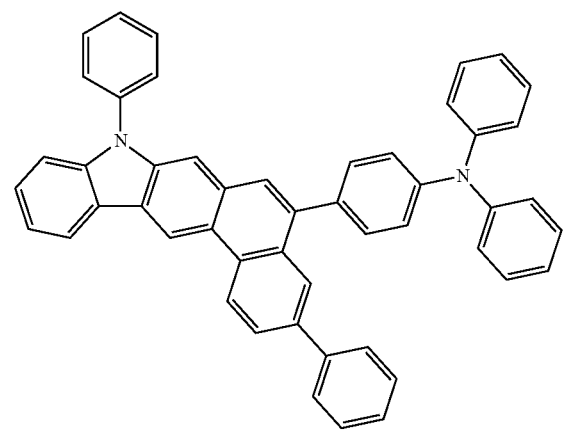
H60
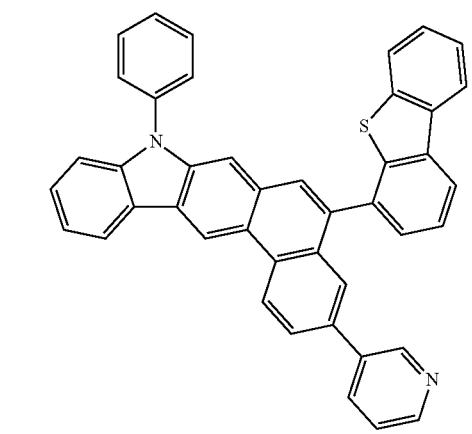
-continued
H61
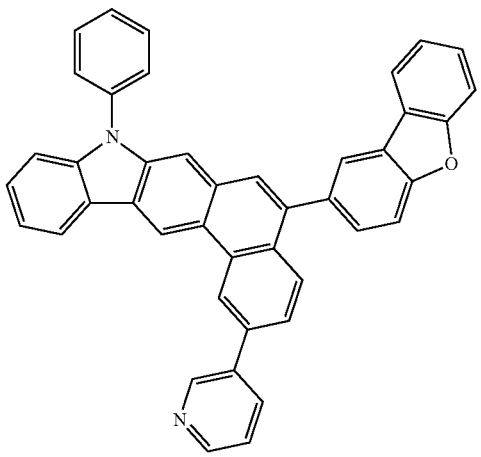
H62
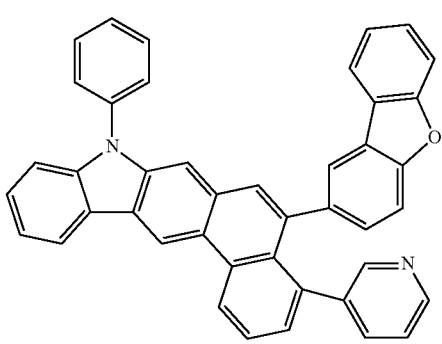
H63
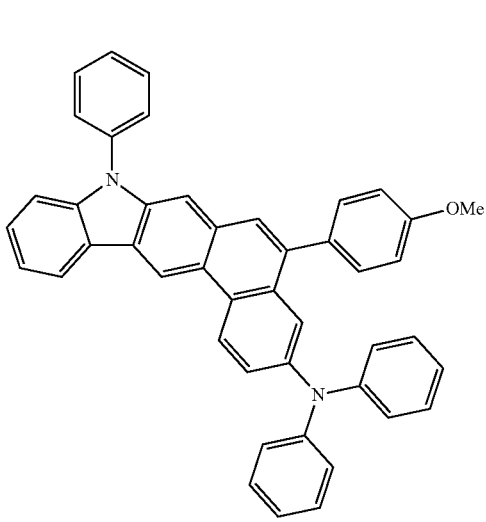

H64
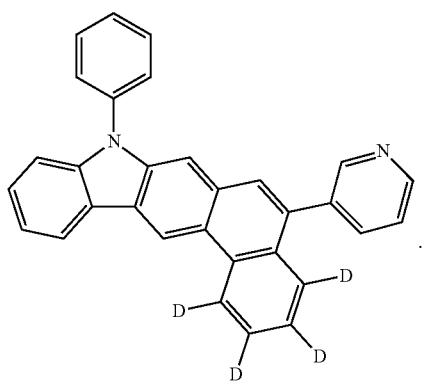
D4
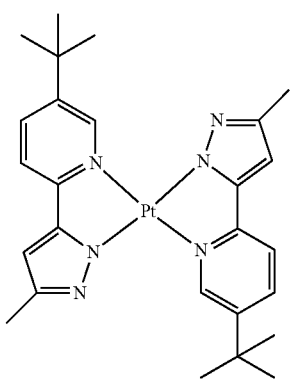
17. The organic light-emitting diode of claim 1, wherein the first compound comprises at least one of Compounds D1 to D35, and the second compound comprises at least one of Compounds H1 to H64:
D1
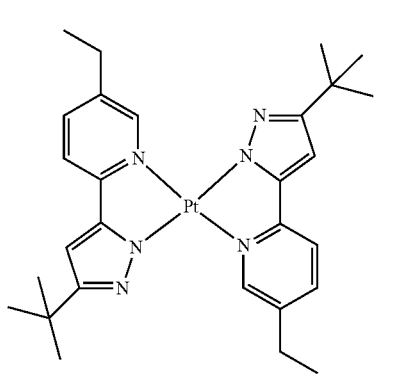
D5
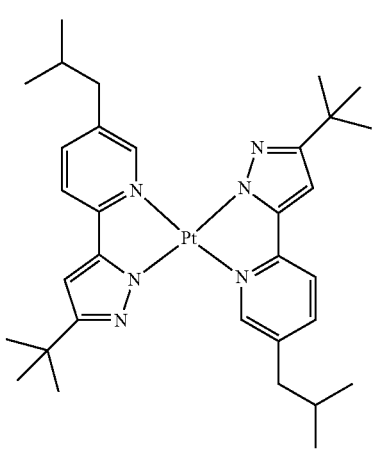
D2
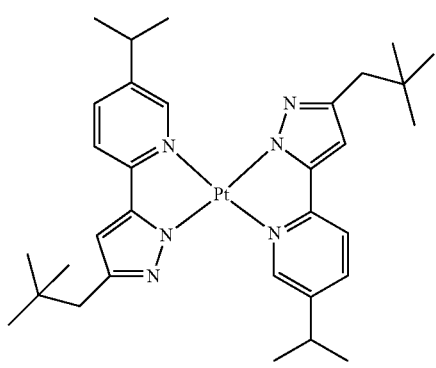
D3
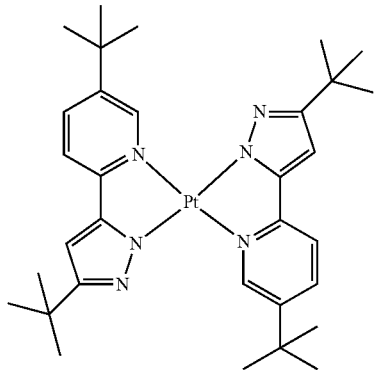
D6
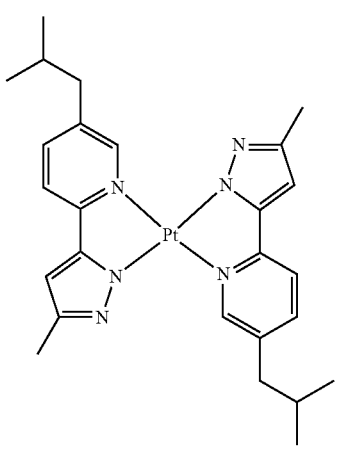

-continued
D7
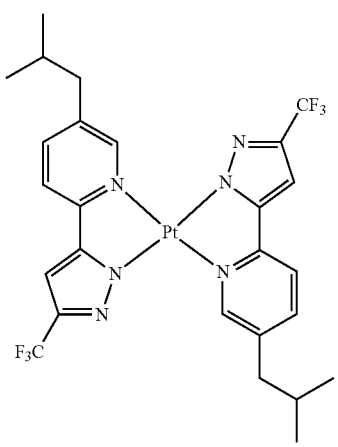
D8
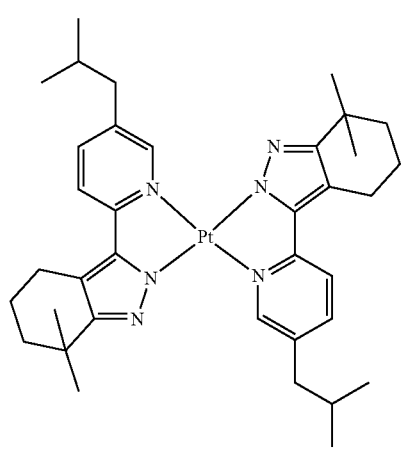
D9
D10
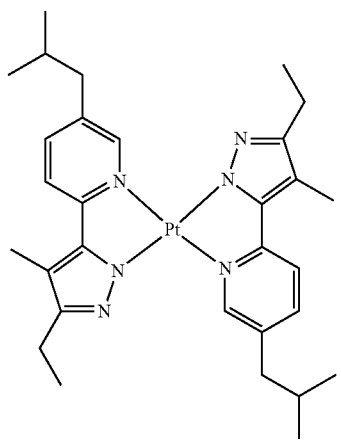
D11
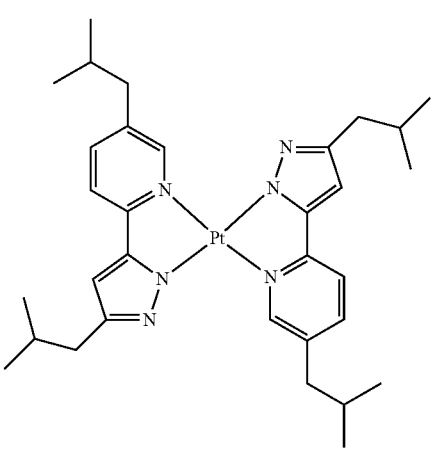
D12
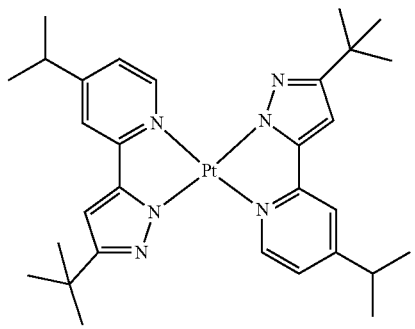
D13
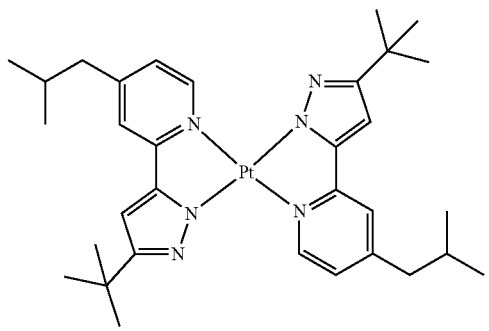

-continued
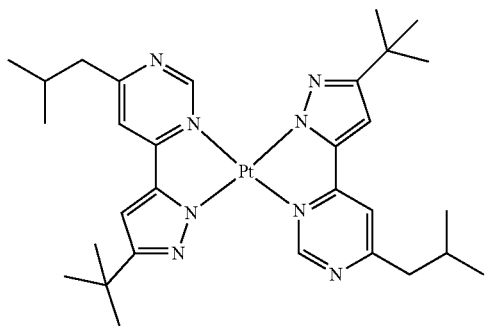
D14
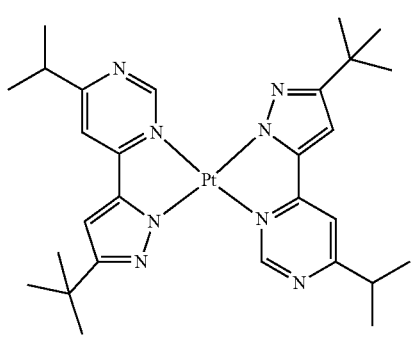
D15
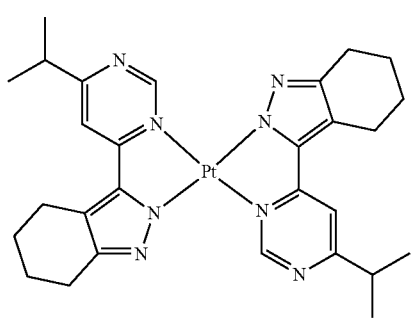
D16
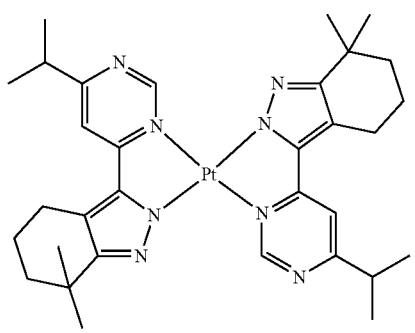
D17
-continued
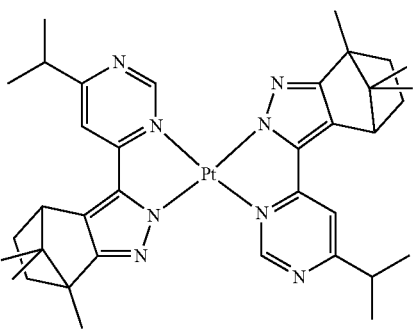
D18
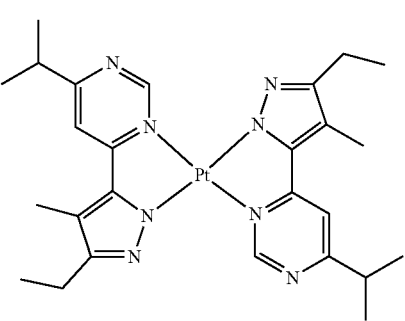
D19
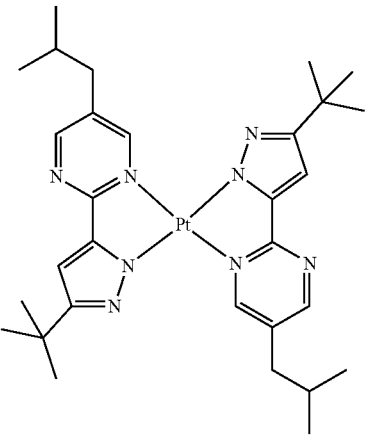
D20
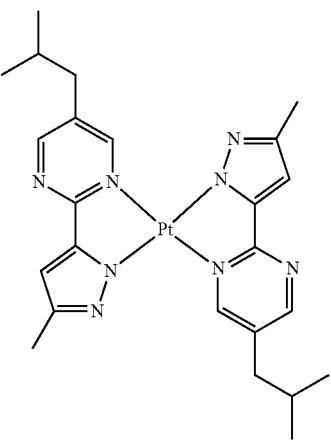
D21

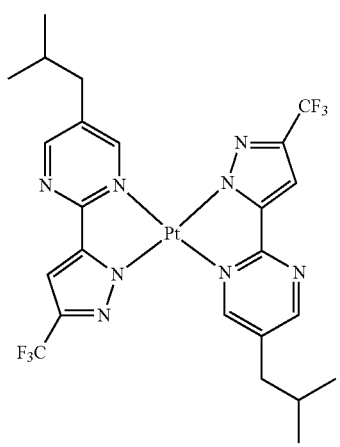
D22
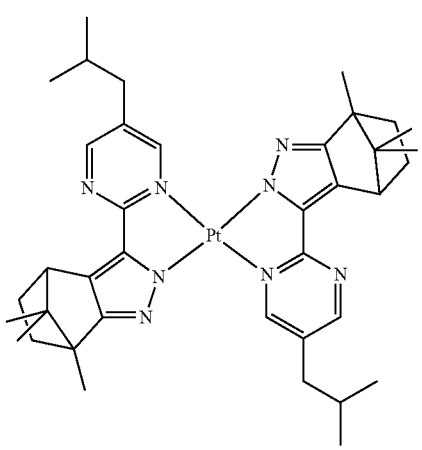
D25
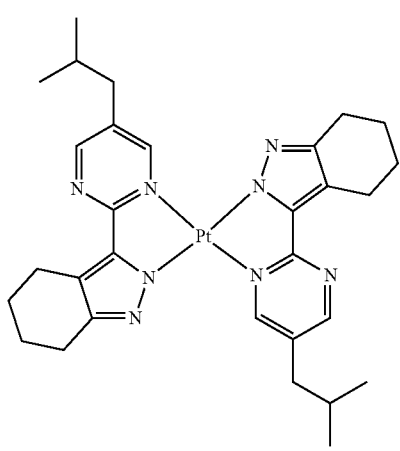
D23
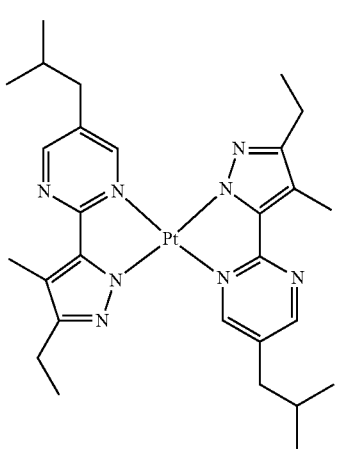
D26
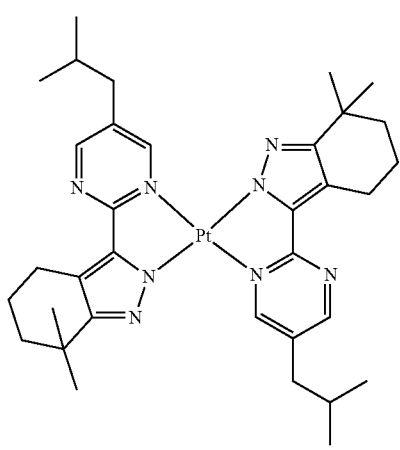
D24
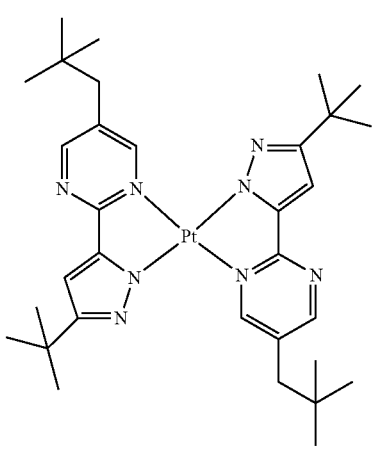
D27

D28
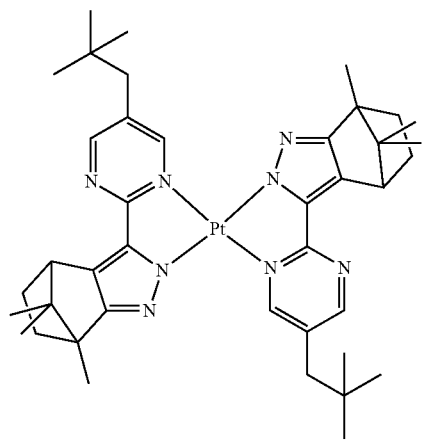
D29
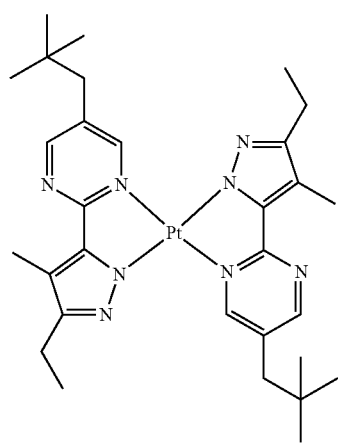
D30
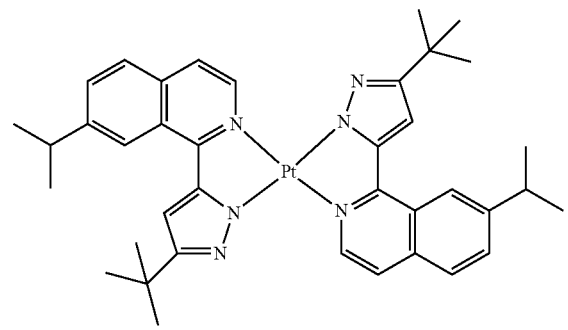
D31
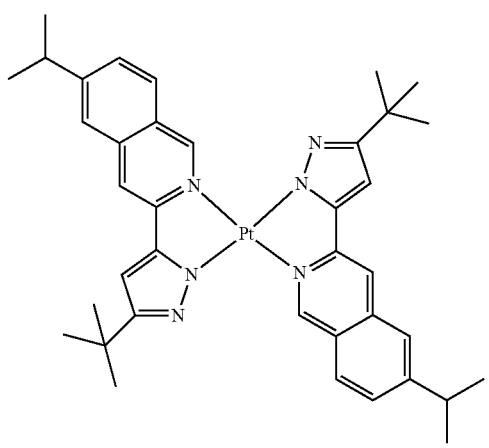
D32
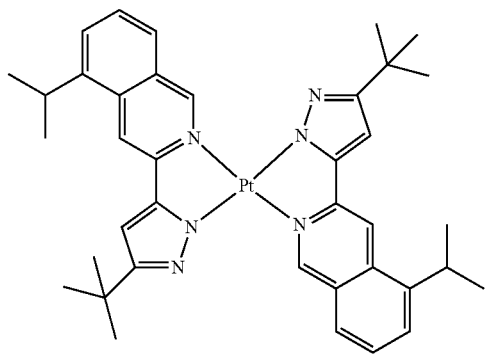
D33
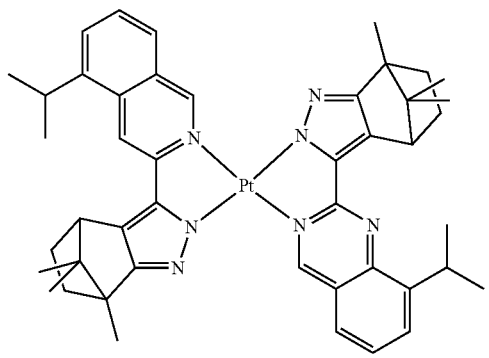
D34
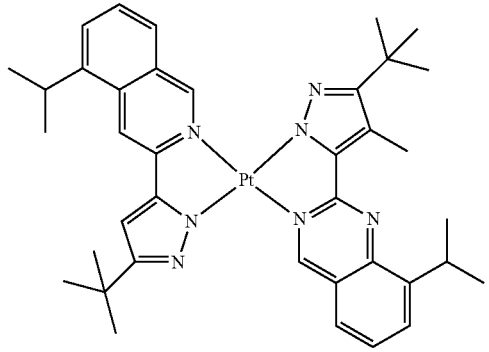

D35
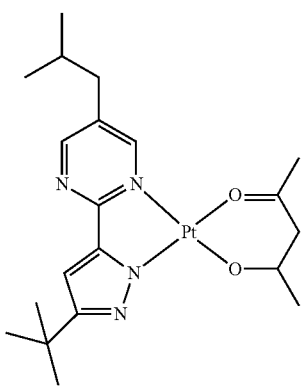
H1
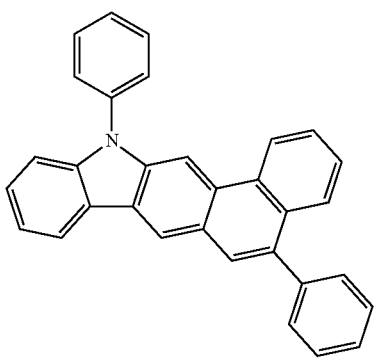
H2
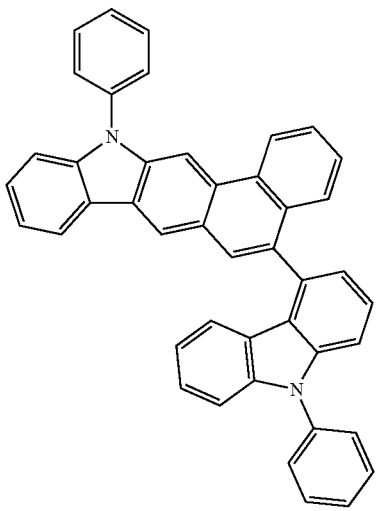
H3
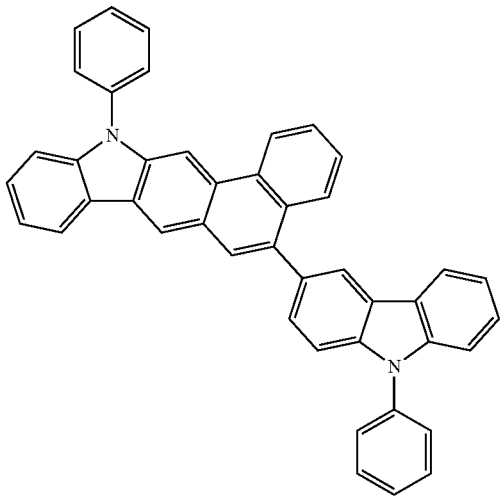
H4
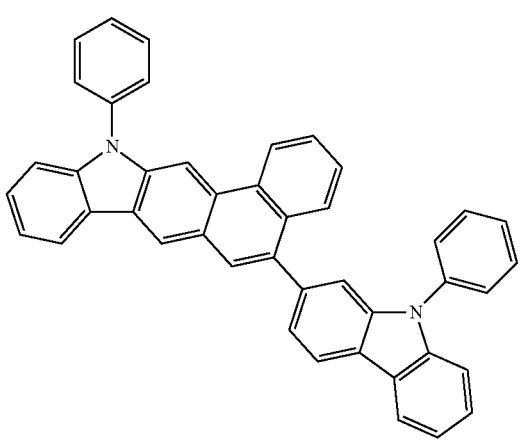
H5
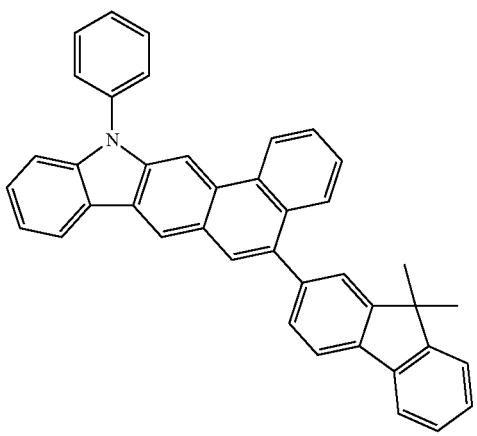

H6
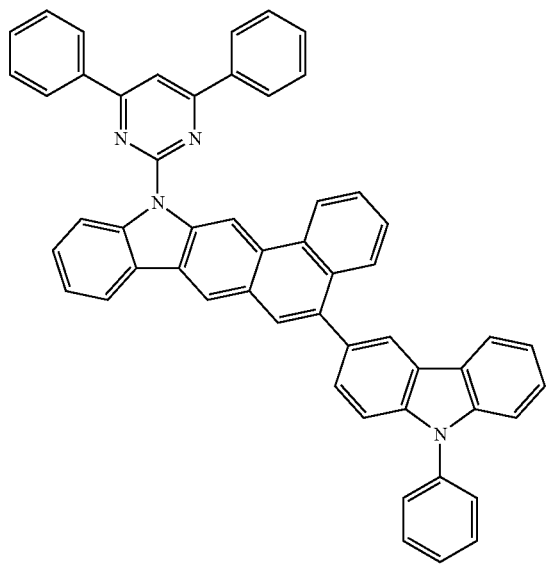
H8
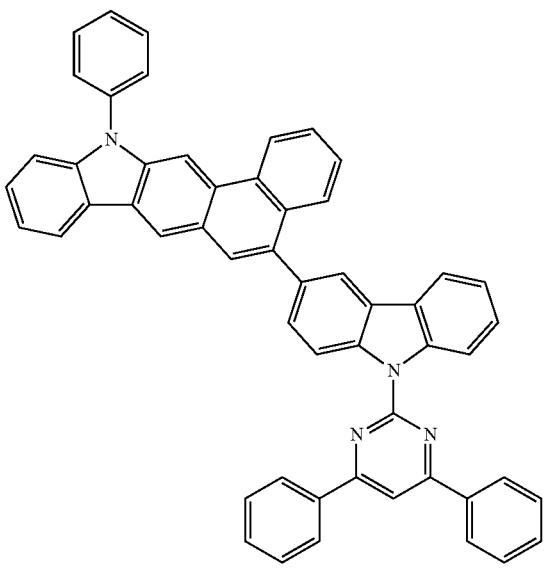
H7
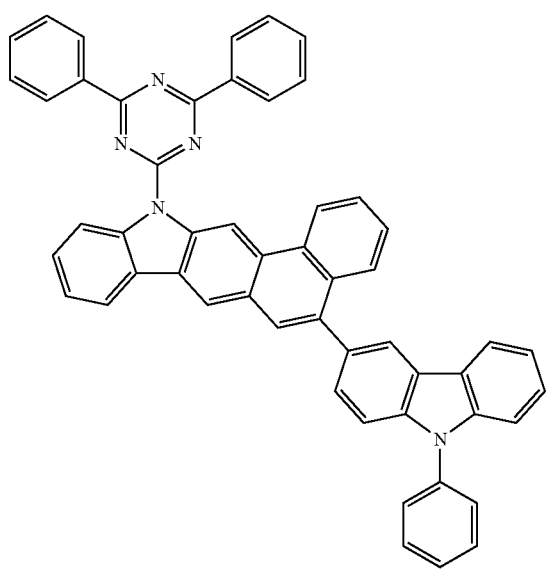
H9
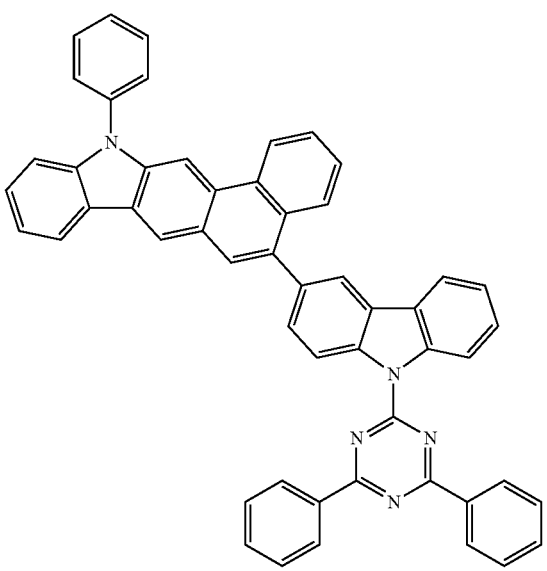

187
-continued
H10
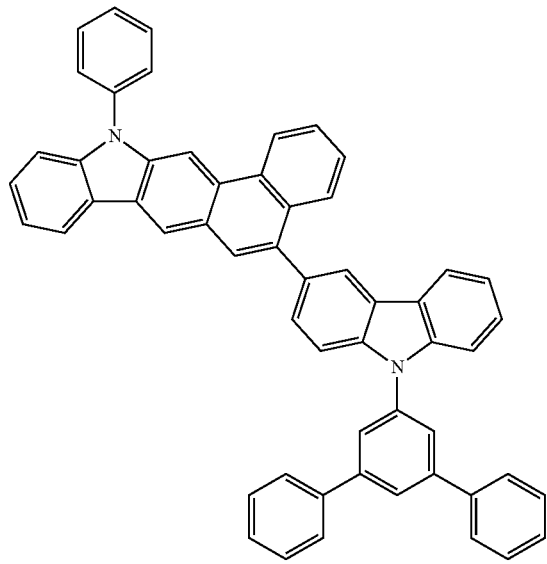
H11
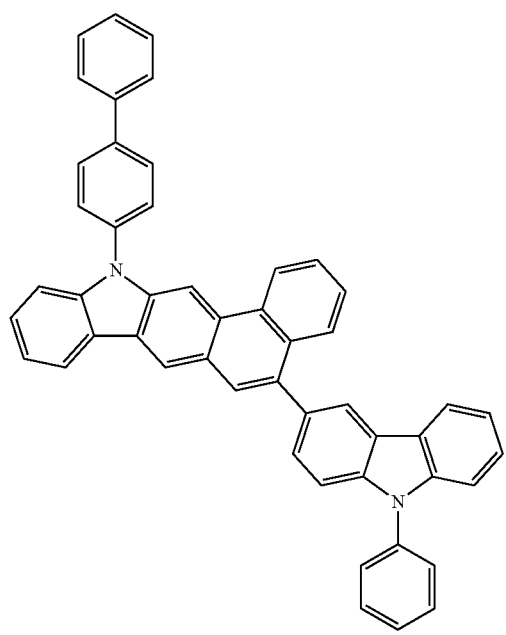
188
-continued
H12
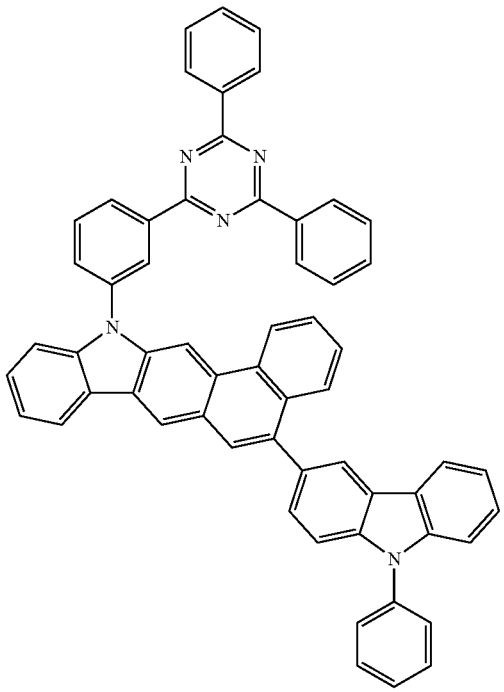
H13
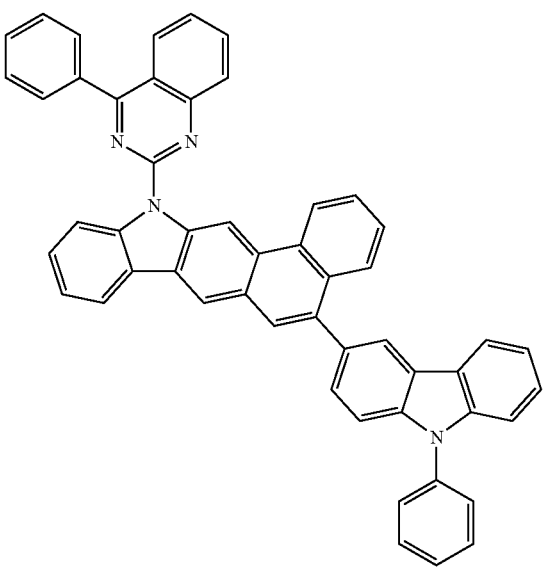

H14
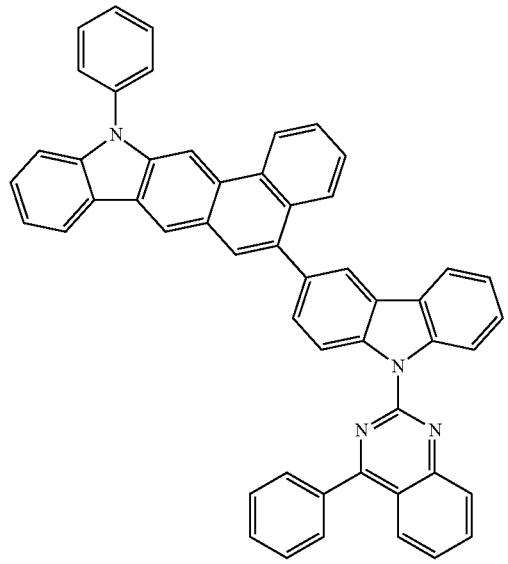
H15
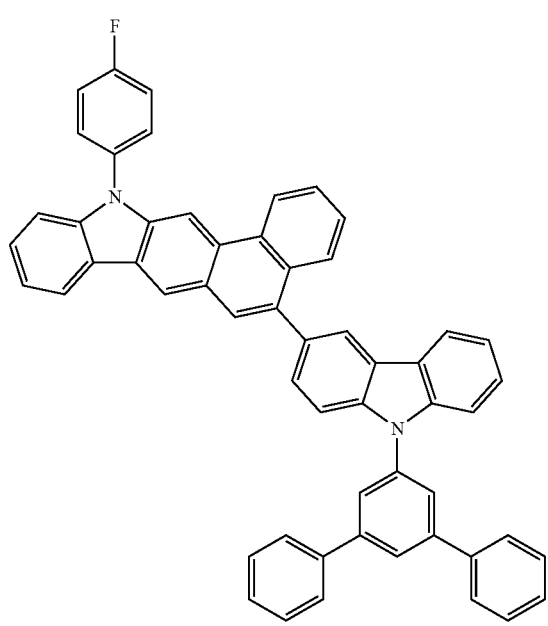
H16
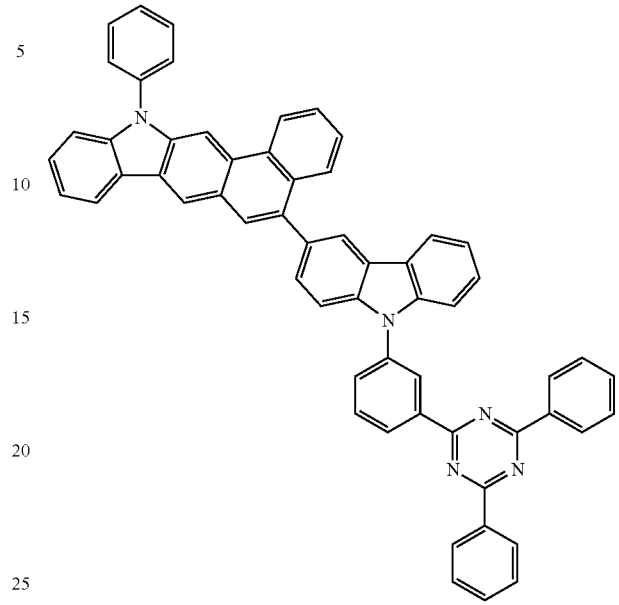
H17
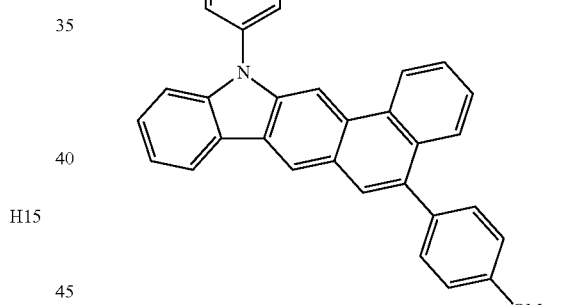
H18
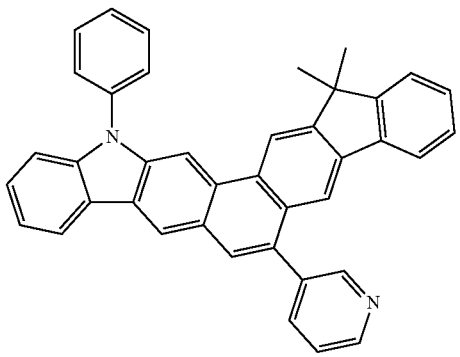

191
-continued
192
-continued
H19
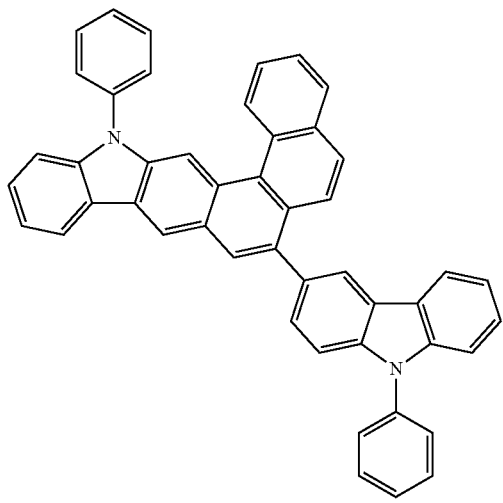
H22
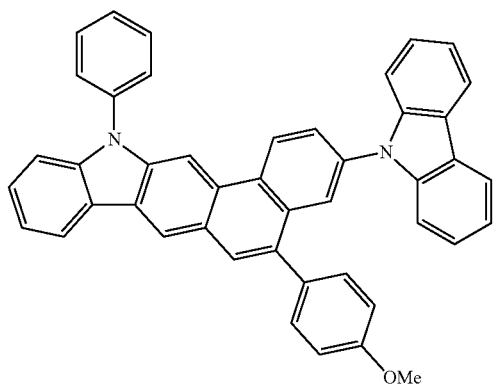
H20
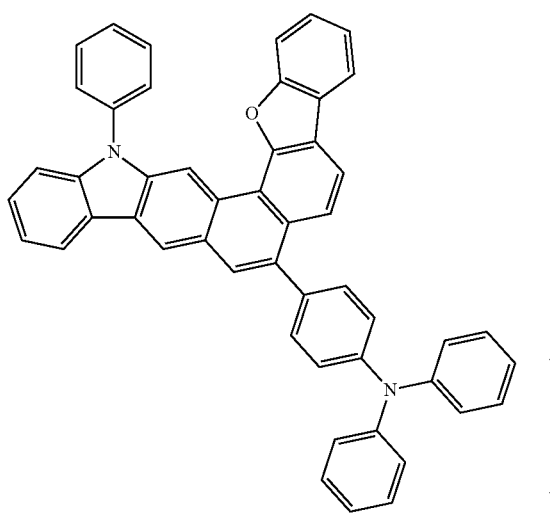
H23
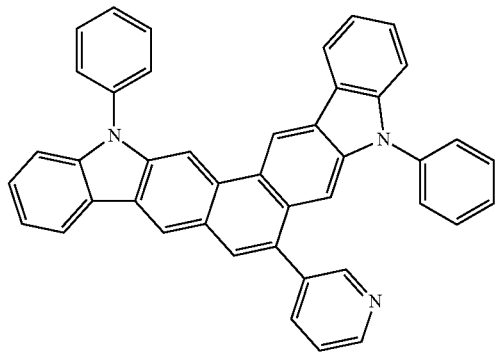
H21
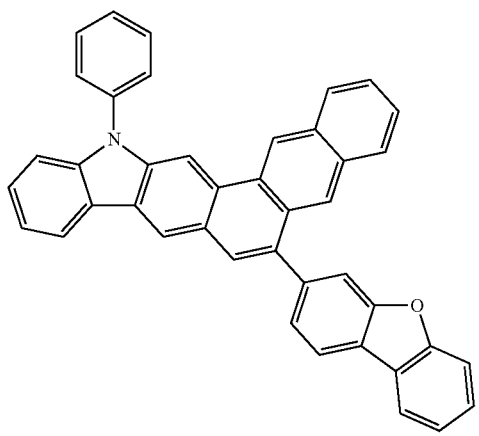
H24
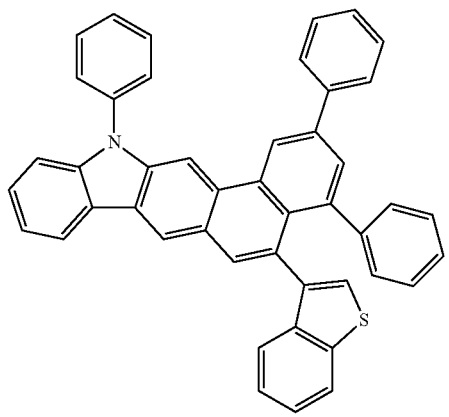

193
-continued
H25
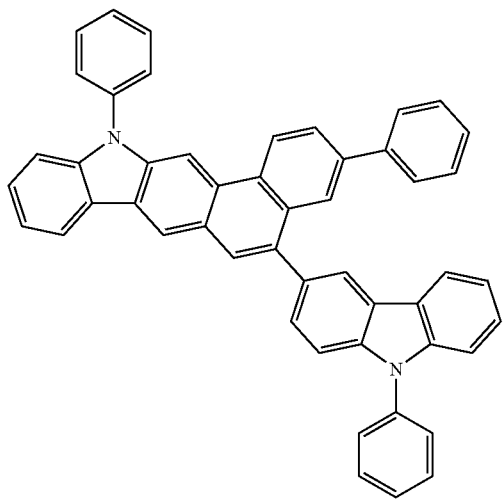
H26
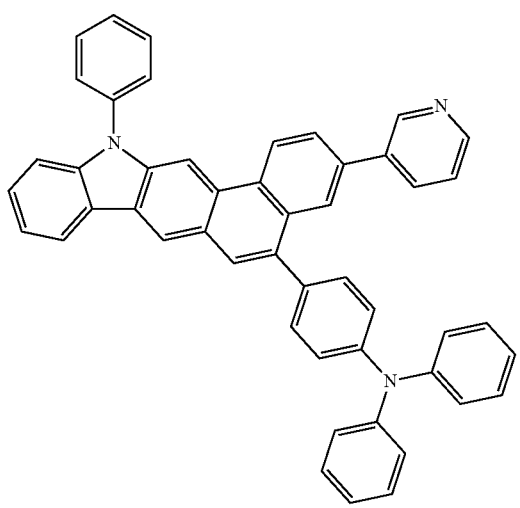
H27
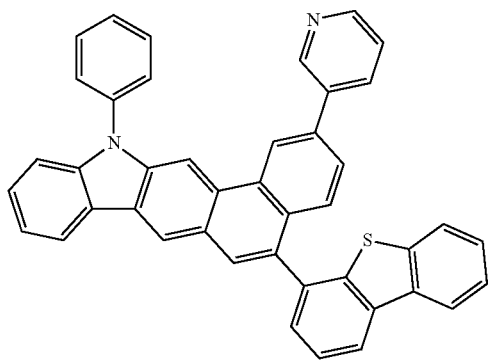
194
-continued
H28
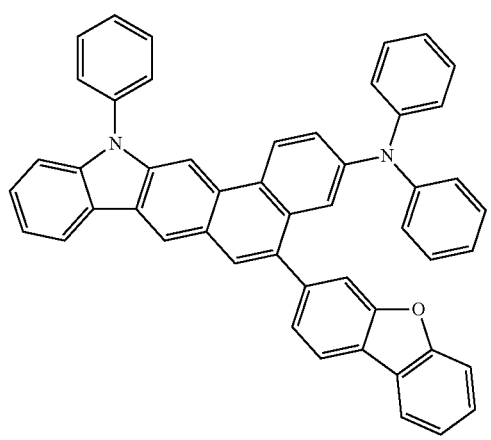
H29
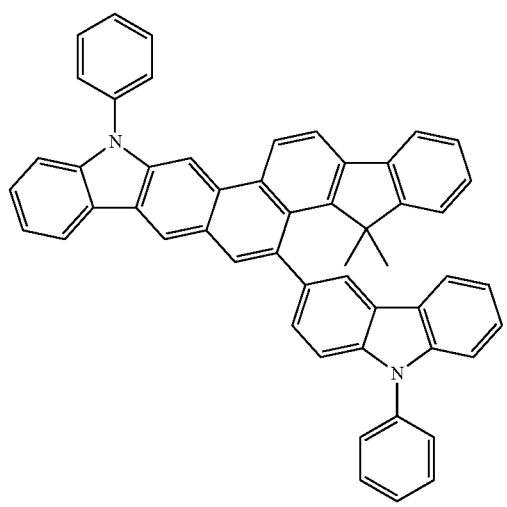
H30
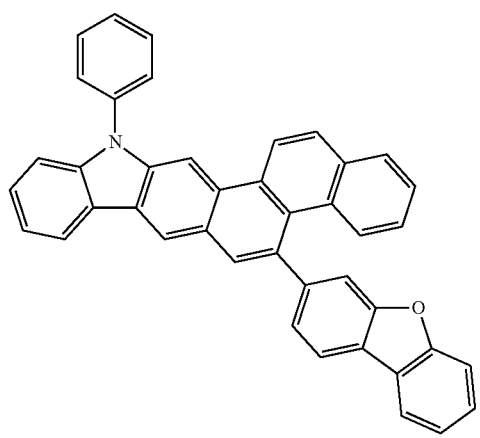

195
-continued
H31
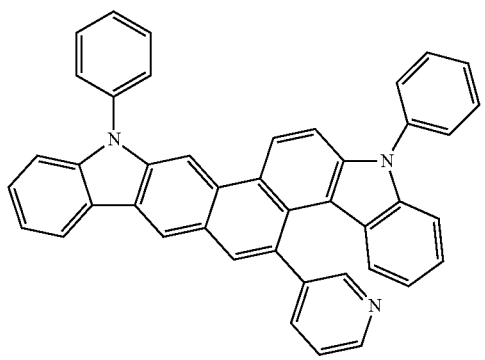
H32
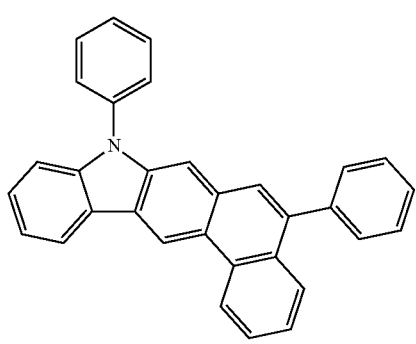
H33
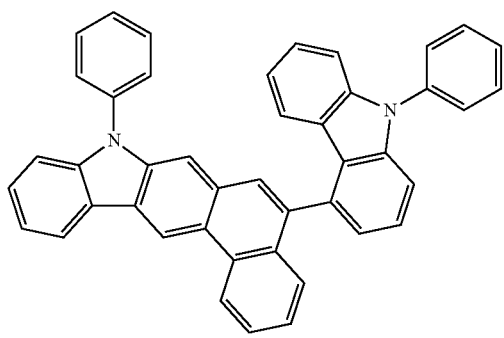
H34
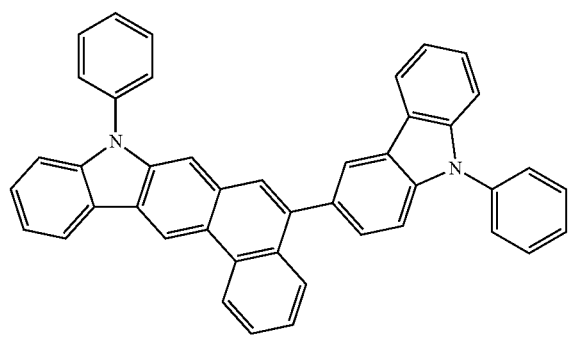
196
-continued
H35
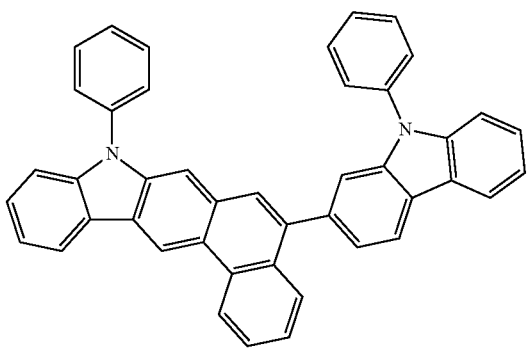
H36
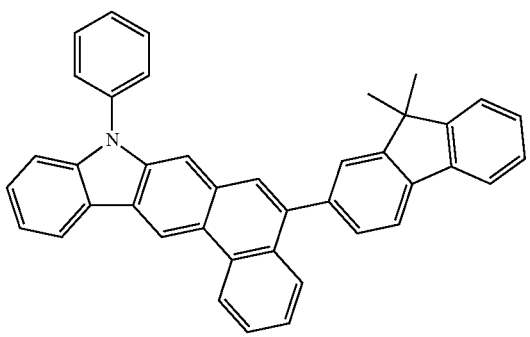
H37
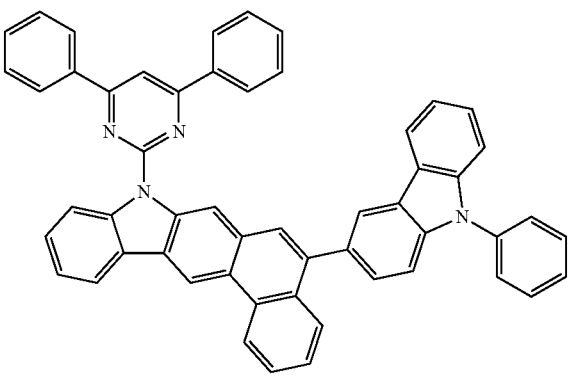
H38
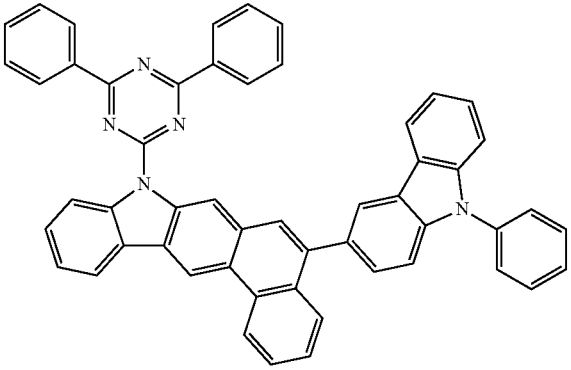

H39
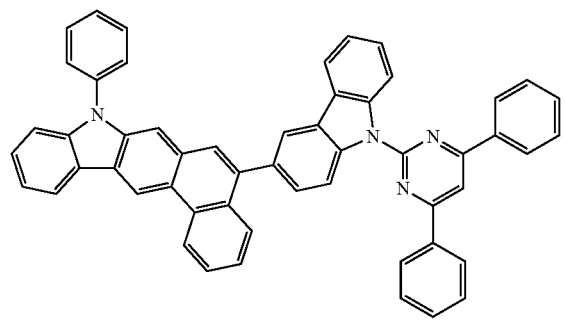
H40
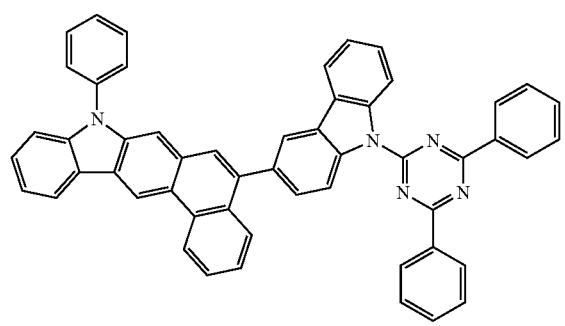
H41
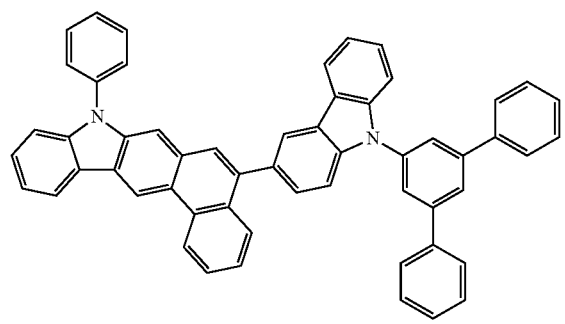
H42
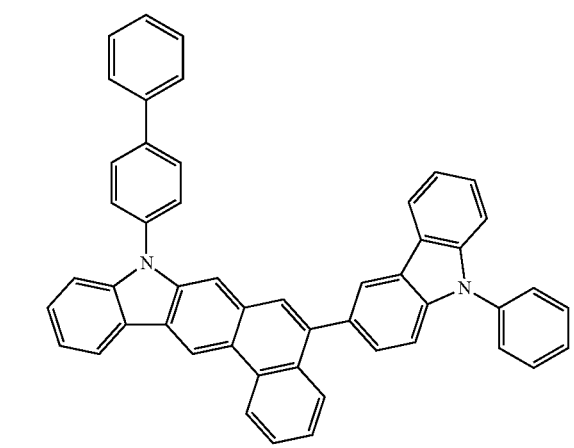
H43
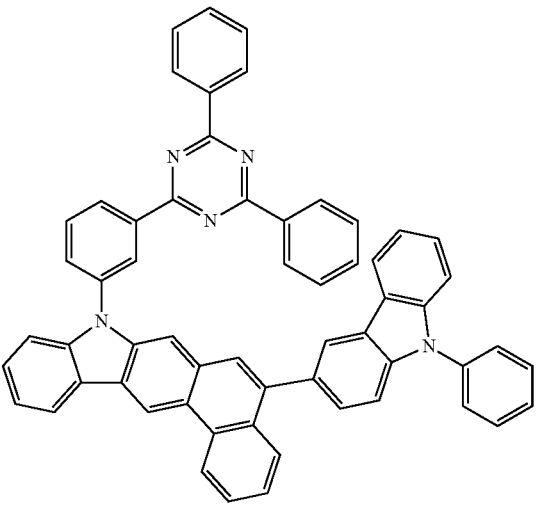
H44
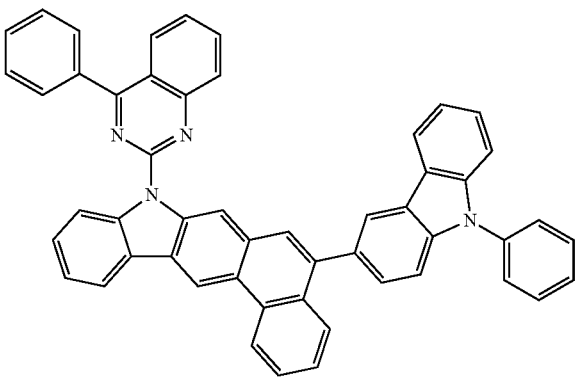
H45
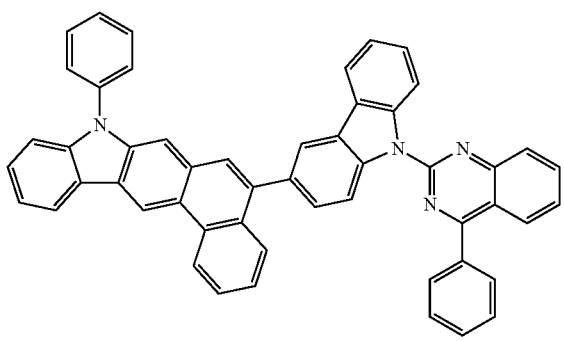

199
-continued
H46
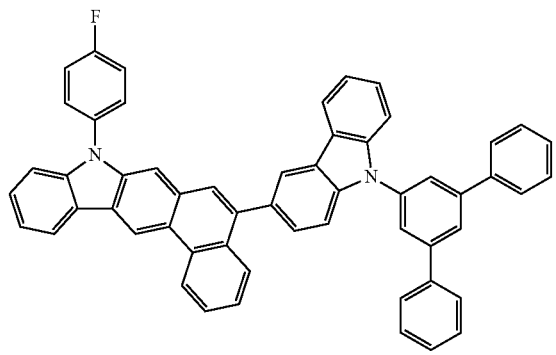
H47
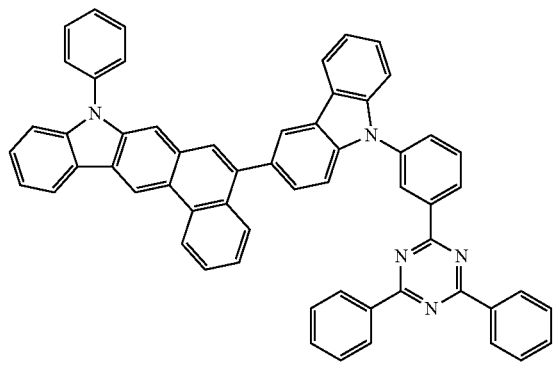
H48
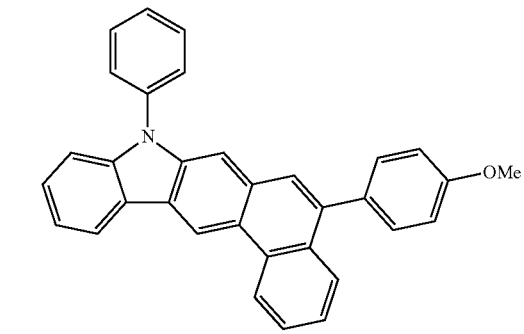
H49
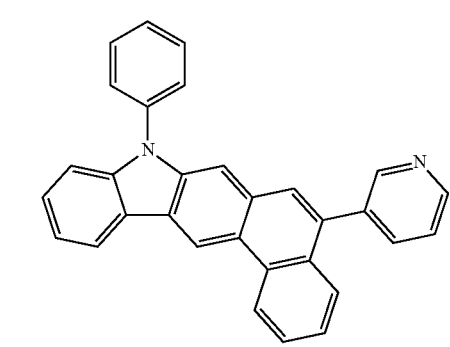
200
-continued
H50
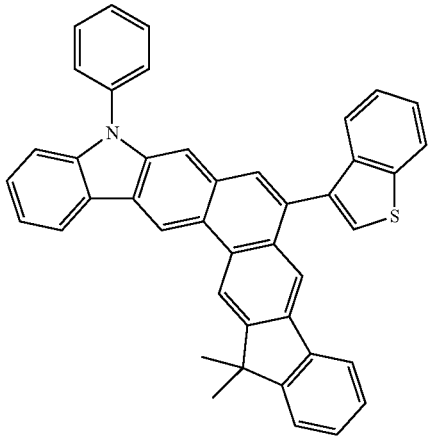
H51
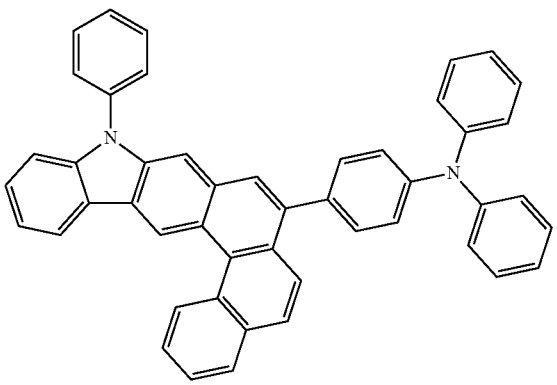
H52
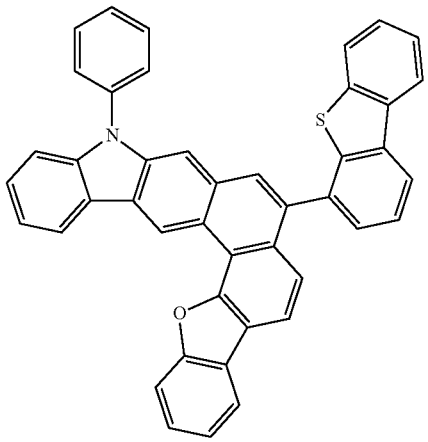

201
-continued
H53
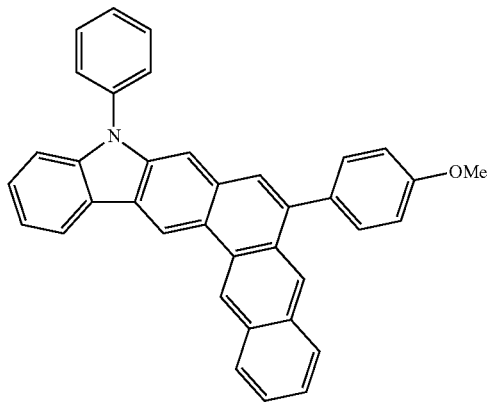
H54
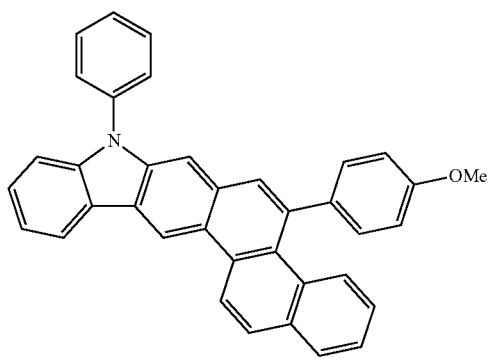
H55
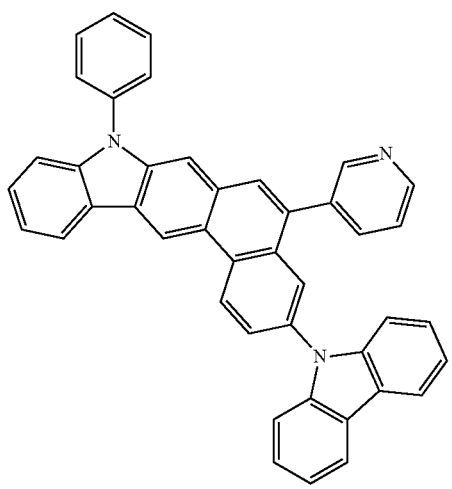
202
-continued
H56
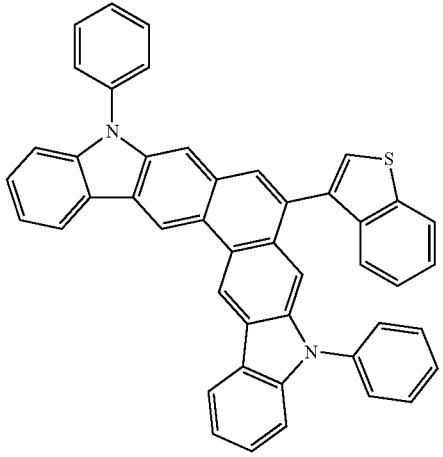
H57
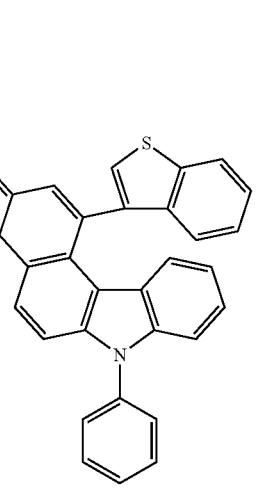
H58
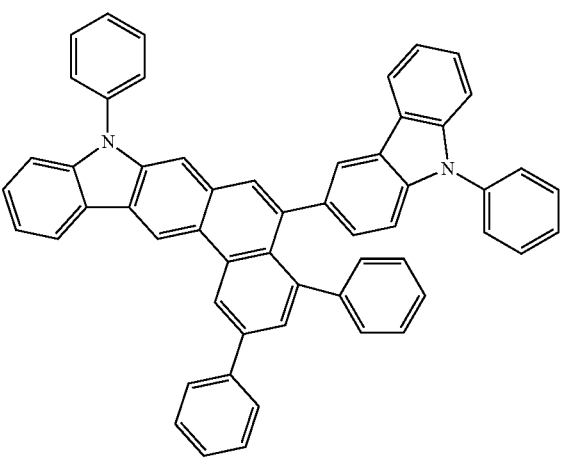

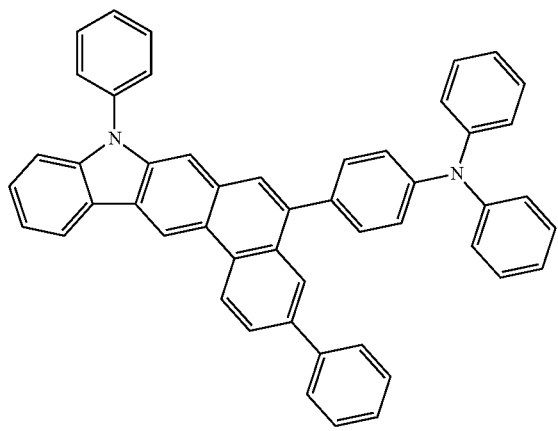

18. The organic light-emitting diode of claim 1, wherein the first compound acts as a dopant, and the second compound acts as a host.

19. The organic light-emitting diode of claim 1, wherein the organic layer further comprises:
  i) at least one of a hole injection layer, a hole transport layer, a functional layer having both hole injection and hole transport capabilities, a buffer layer, or an electron blocking layer between the first electrode and the emission layer; and
  ii) at least one of a hole blocking layer, an electron transport layer, or an electron injection layer between the emission layer and the second electrode.

20. The organic light-emitting diode of claim 1, wherein the organic layer further comprises a charge-generating material between the first electrode and the EML.

* * * * *